(12) United States Patent
Okuda et al.

(10) Patent No.: US 7,428,907 B2
(45) Date of Patent: Sep. 30, 2008

(54) SUBSTRATE PROCESSING APPARATUS

(75) Inventors: Seiichiro Okuda, Kyoto (JP); Hiroaki Sugimoto, Kyoto (JP); Takuya Kuroda, Kyoto (JP); Masanobu Sato, Kyoto (JP); Sadao Hirae, Kyoto (JP); Shuichi Yasuda, Kyoto (JP); Kenya Morinishi, Kyoto (JP); Masayoshi Imai, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 0 days.

(21) Appl. No.: 10/838,926

(22) Filed: May 5, 2004

(65) Prior Publication Data

US 2004/0206378 A1    Oct. 21, 2004

Related U.S. Application Data

(62) Division of application No. 09/957,652, filed on Sep. 21, 2001, now Pat. No. 6,951,221.

(30) Foreign Application Priority Data

| Sep. 22, 2000 | (JP) | ............................ P2000-288076 |
| Sep. 22, 2000 | (JP) | ............................ P2000-288077 |
| Oct. 5, 2000 | (JP) | ............................ P2000-305607 |
| Oct. 20, 2000 | (JP) | ............................ P2000-320323 |
| Nov. 20, 2000 | (JP) | ............................ P2000-352076 |
| Mar. 30, 2001 | (JP) | ............................ P2001-098046 |
| Jul. 13, 2001 | (JP) | ............................ P2001-212948 |
| Jul. 26, 2001 | (JP) | ............................ P2001-225219 |

(51) Int. Cl.
*B08B 3/02* (2006.01)

(52) U.S. Cl. ..................... 134/148; 134/153; 134/902

(58) Field of Classification Search ................. 134/902, 134/153, 148
See application file for complete search history.

(56) References Cited

U.S. PATENT DOCUMENTS

| 5,345,639 | A | * | 9/1994 | Tanoue et al. | ................. 15/88.2 |
| 5,555,234 | A | * | 9/1996 | Sugimoto | ................... 396/604 |

(Continued)

FOREIGN PATENT DOCUMENTS

JP   49-040011   4/1974

(Continued)

OTHER PUBLICATIONS

Japanese Office Action issued in Japanese Patent Application No. JP 2001-225219, dated Jan. 23, 2007.

(Continued)

*Primary Examiner*—Frankie L Stinson
(74) *Attorney, Agent, or Firm*—McDermott Will & Emery LLP

(57) ABSTRACT

The substrate processing apparatus is provided with a gas-liquid mixing nozzle for generating a process liquid mist by mixing a liquid and a pressurized gas, to discharge the process liquid mist to a substrate at high speeds. The liquid may be remover liquid, intermediate rinse liquid or deionized water. The reaction products which having been generated on the substrate in etching process is removed at high speeds with the flow of the mist, whereby the quality of the process is improved.

19 Claims, 91 Drawing Sheets

U.S. PATENT DOCUMENTS

| | | | |
|---|---|---|---|
| 5,634,980 A | 6/1997 | Tomita et al. | |
| 5,882,433 A * | 3/1999 | Ueno | 134/31 |
| 5,934,566 A | 8/1999 | Kanno et al. | |
| 5,958,145 A * | 9/1999 | Yonemizu et al. | 134/2 |
| 5,975,098 A * | 11/1999 | Yoshitani et al. | 134/148 |
| 5,997,653 A | 12/1999 | Yamasaka | |
| 6,003,527 A | 12/1999 | Netsu et al. | |
| 6,106,635 A * | 8/2000 | Hamada et al. | 134/33 |
| 6,151,744 A * | 11/2000 | Ohtani et al. | 15/88.2 |
| 6,222,936 B1 | 4/2001 | Phan et al. | |
| 6,240,933 B1 | 6/2001 | Bergman | |
| 6,309,981 B1 | 10/2001 | Mayer et al. | |
| 6,325,081 B1 | 12/2001 | Miki et al. | |
| 6,343,609 B1 * | 2/2002 | Kim | 134/1.3 |
| 6,357,457 B1 | 3/2002 | Taniyama et al. | |
| 6,367,490 B1 * | 4/2002 | Namba | 134/95.3 |
| 6,423,638 B1 | 7/2002 | Vanell | |
| 6,494,219 B1 | 12/2002 | Nayak et al. | |
| 6,558,478 B1 | 5/2003 | Katakabe et al. | |
| 6,634,368 B1 * | 10/2003 | Jung et al. | 134/1.3 |
| 2002/0062840 A1 * | 5/2002 | Verhaverbeke et al. | 134/1.3 |

FOREIGN PATENT DOCUMENTS

| | | | |
|---|---|---|---|
| JP | 59-215725 | * | 12/1984 |
| JP | 60-95991 U | | 6/1985 |
| JP | 3-186369 A | | 8/1991 |
| JP | 3-215867 | * | 9/1991 |
| JP | 6-120191 A | | 4/1994 |
| JP | 7-201793 A | | 8/1995 |
| JP | 8-162425 A | | 6/1996 |
| JP | 8-195377 A | | 7/1996 |
| JP | 8-299918 | | 11/1996 |
| JP | 9-36075 A | | 2/1997 |
| JP | 9-251953 | * | 9/1997 |
| JP | 9-260278 | * | 10/1997 |
| JP | 9-260321 | * | 10/1997 |
| JP | 10-41263 A | | 2/1998 |
| JP | 10-125641 A | | 5/1998 |
| JP | 11-25522 | * | 1/1999 |
| JP | 11-121421 A | | 4/1999 |
| JP | 11-165136 A | | 6/1999 |
| JP | 11-168042 | | 6/1999 |
| JP | 11-323394 A | | 11/1999 |
| JP | 2000-70874 A | | 3/2000 |
| JP | 2000311846 | * | 11/2000 |

OTHER PUBLICATIONS

Japanese Office Action in corresponding Japanese Patent Application No. 2001-351830, dated on Sep. 26, 2006.

Japanese Office Action issued in corresponding Japanese patent Application No. 2001-287949, dated Aug. 29, 2006.

Japanese Office Action issued in corresponding Japanese Patent Application No. 2001-212948, dated Sep. 12, 2006.

Japanese Office Action issued in corresponding Japanese Patent Application No. 2001-239004, dated Sep. 19, 2006.

* cited by examiner

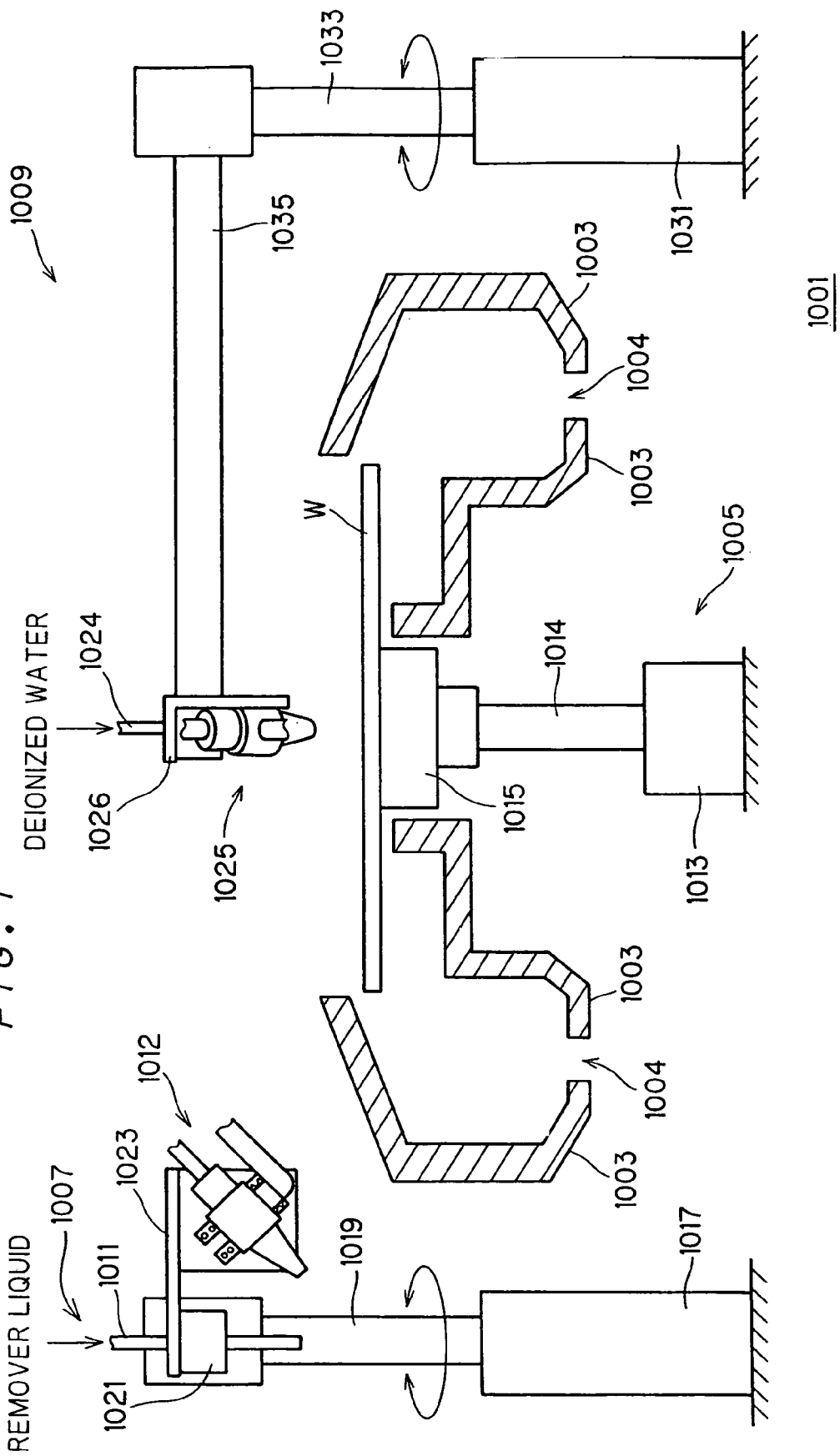

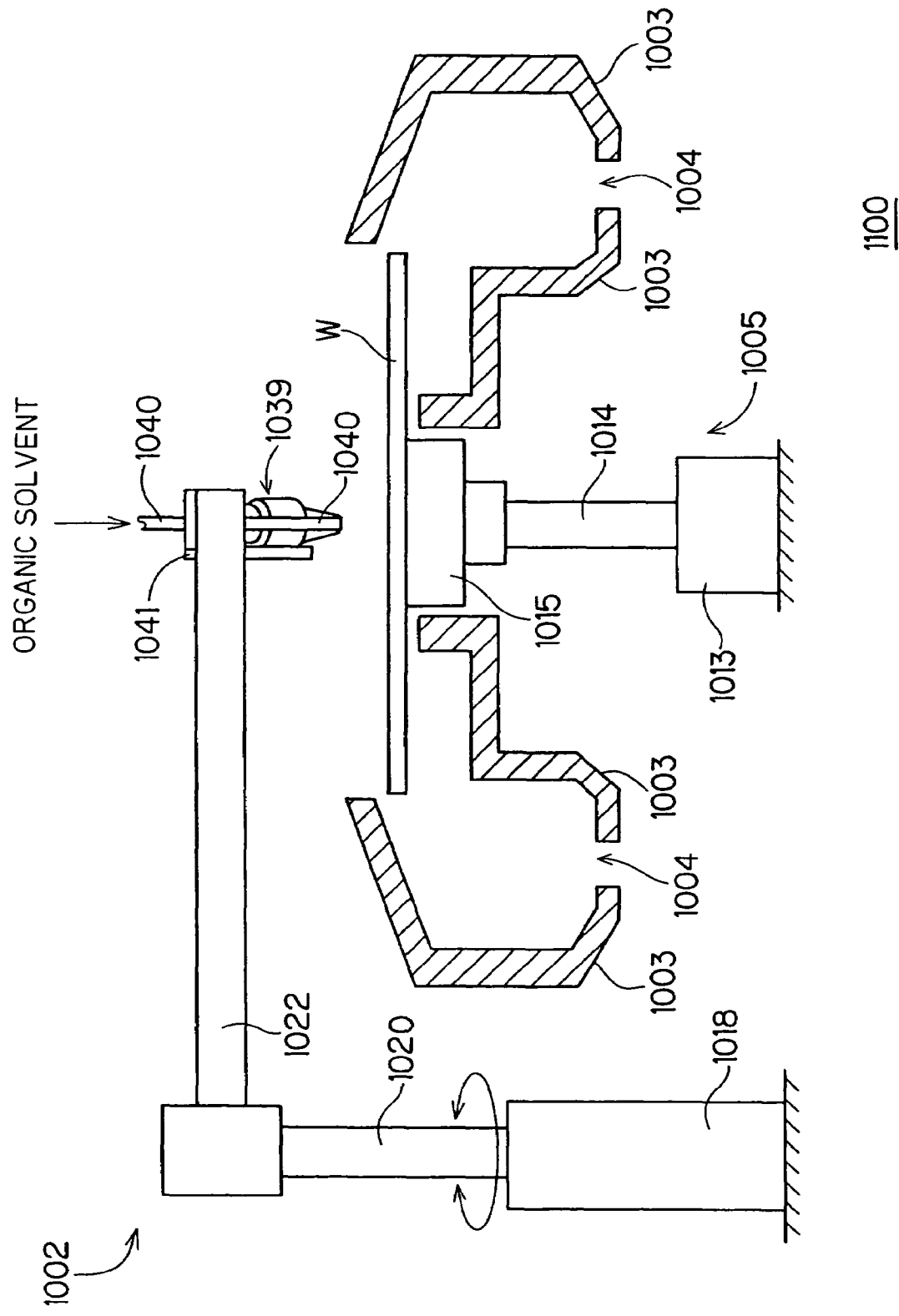

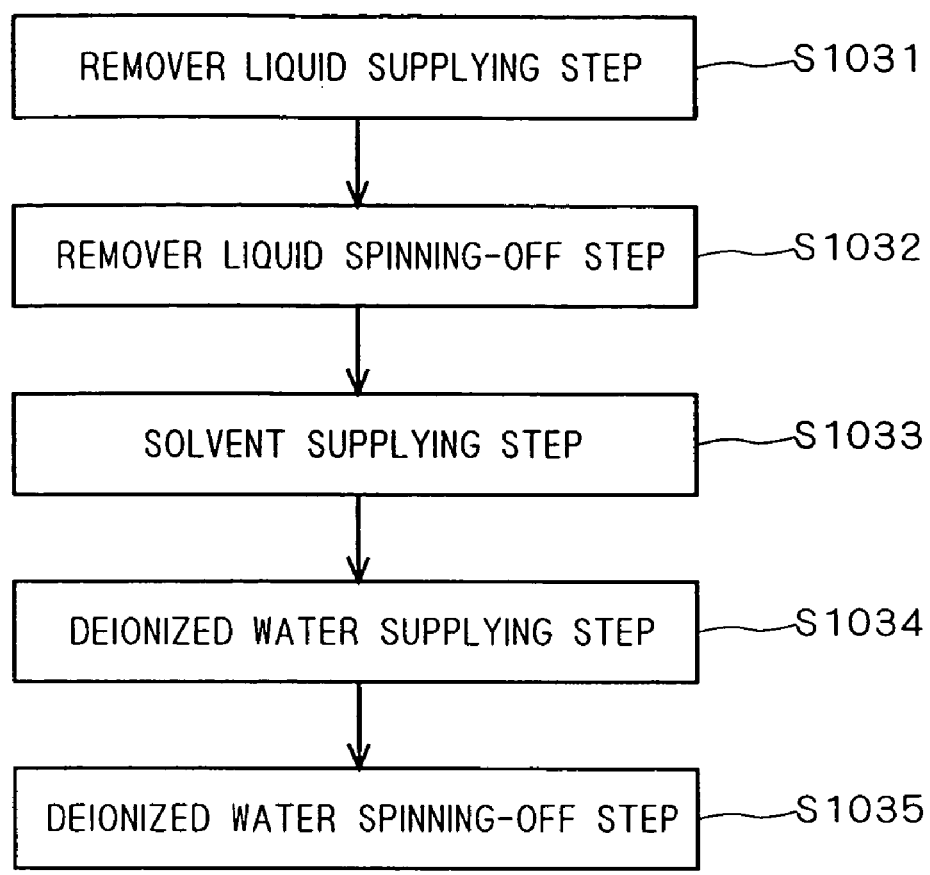
F I G. 1 0

F I G. 28
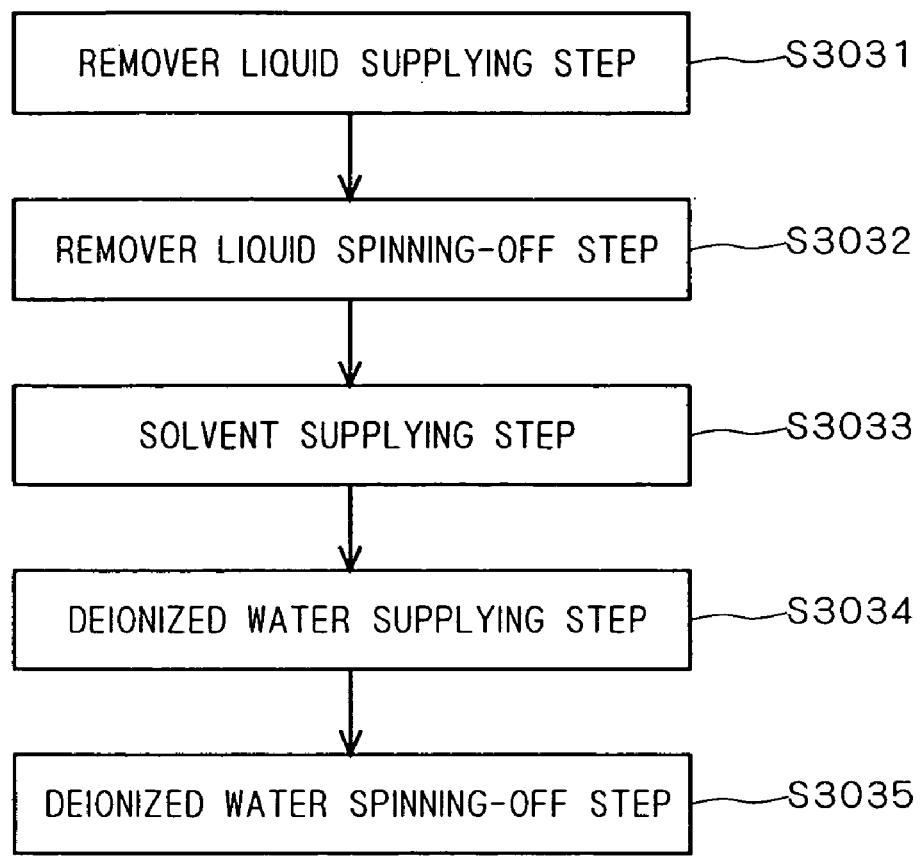

F I G. 37
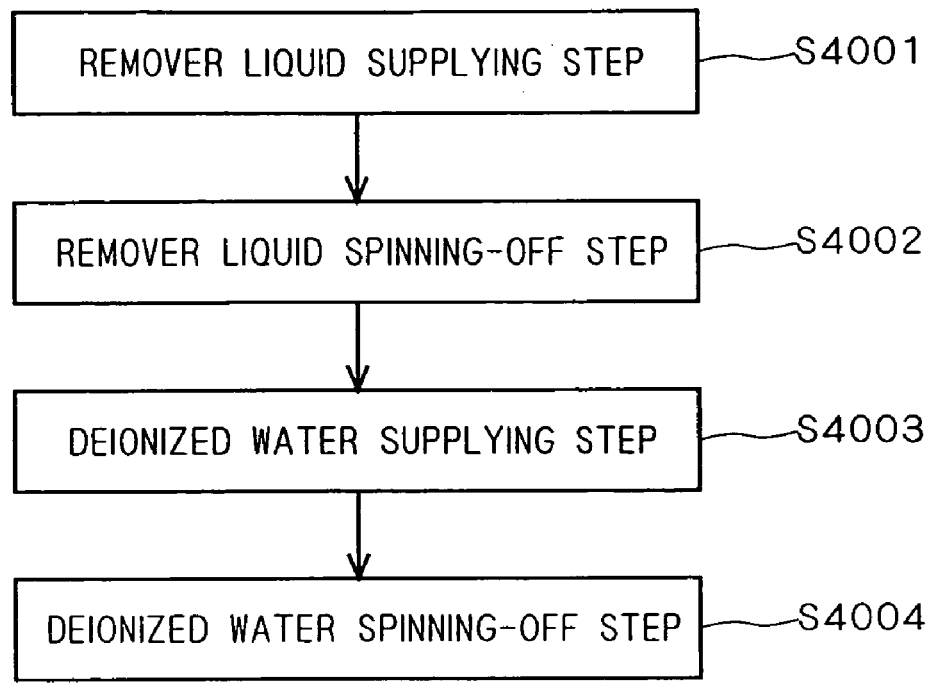

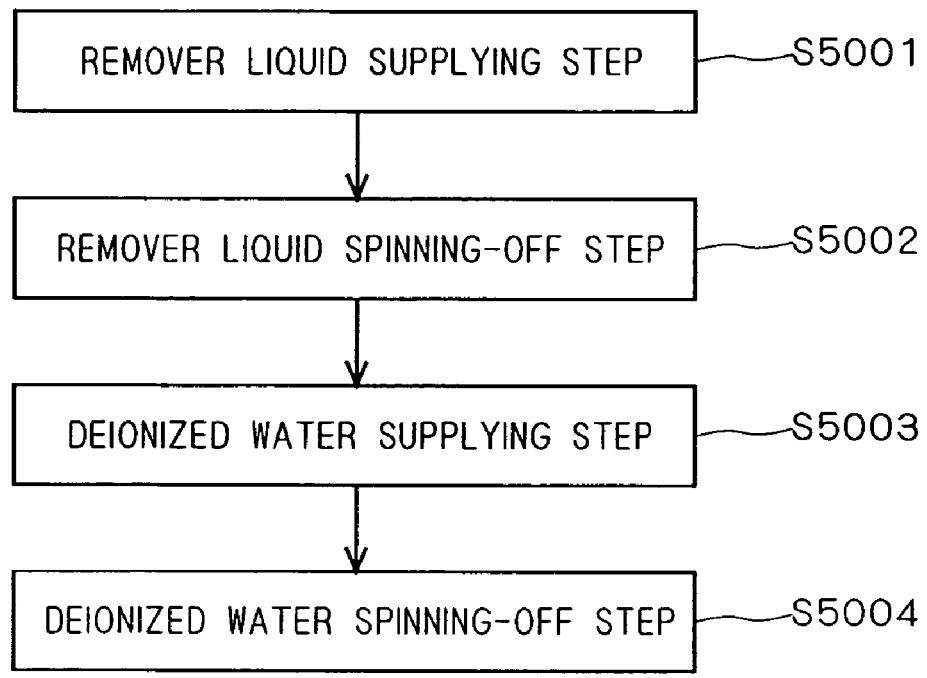
F I G. 54

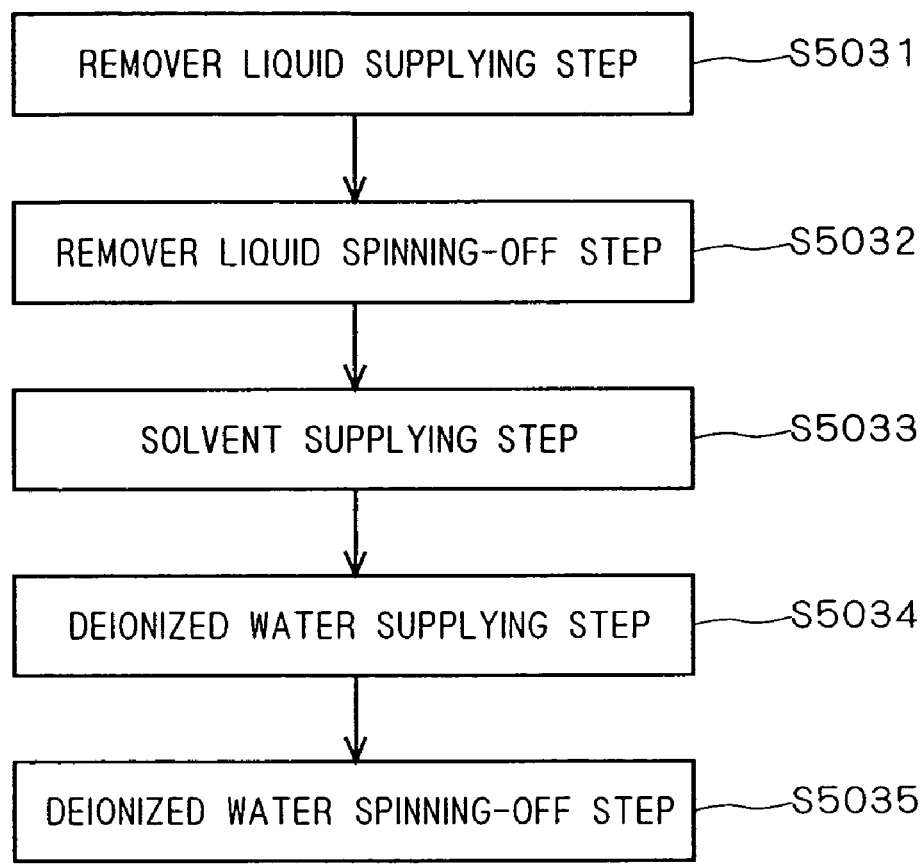
F I G. 58

F I G. 62
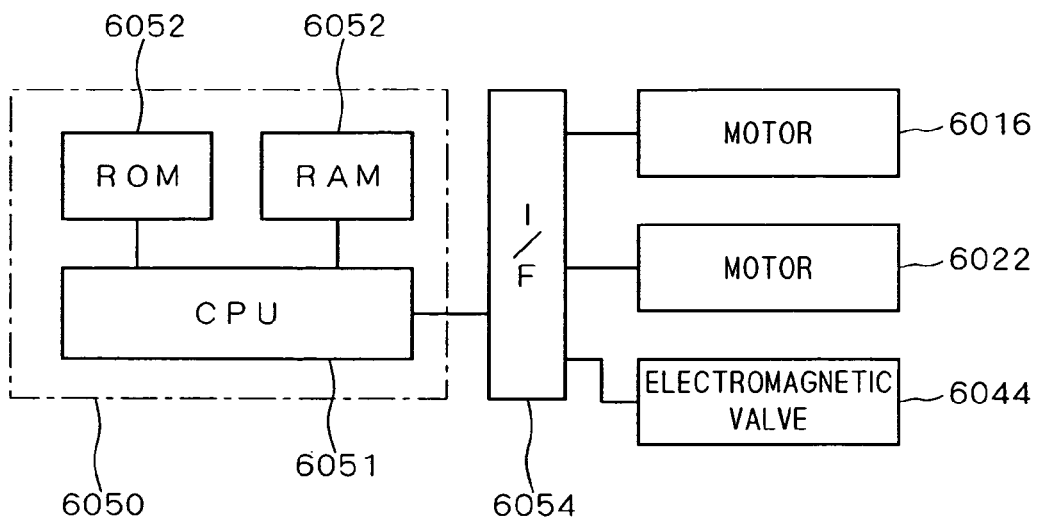
F I G. 63
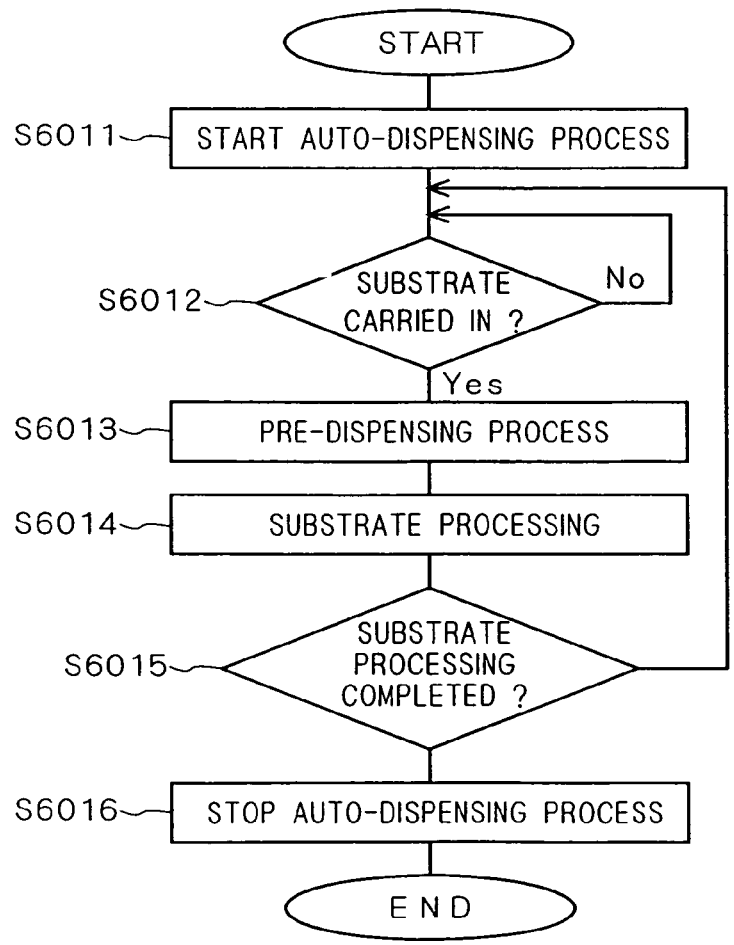

F I G. 64
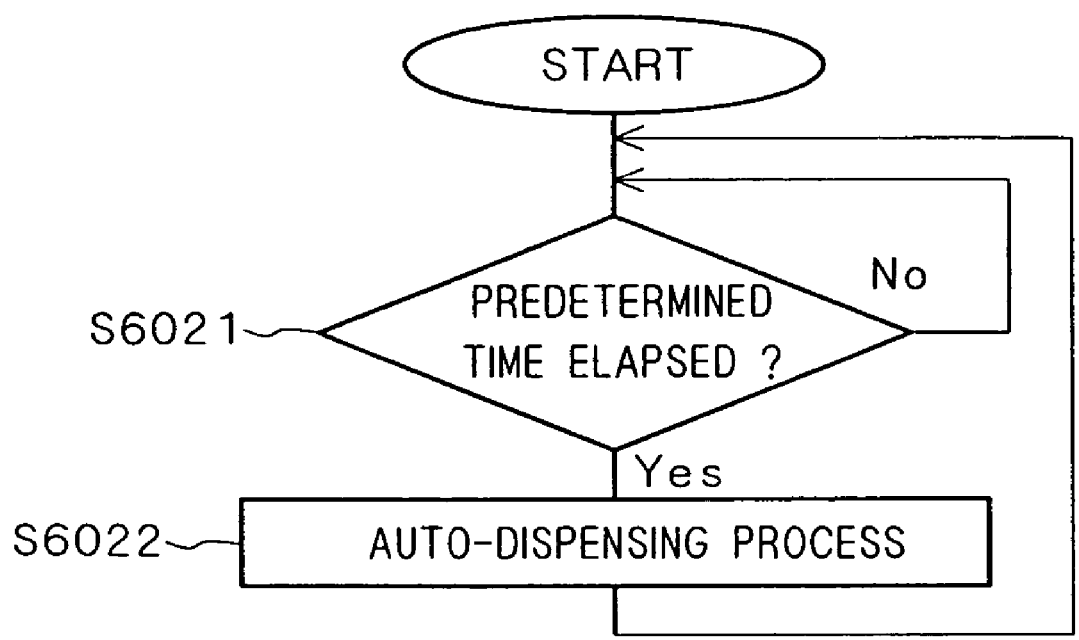

F I G . 6 5
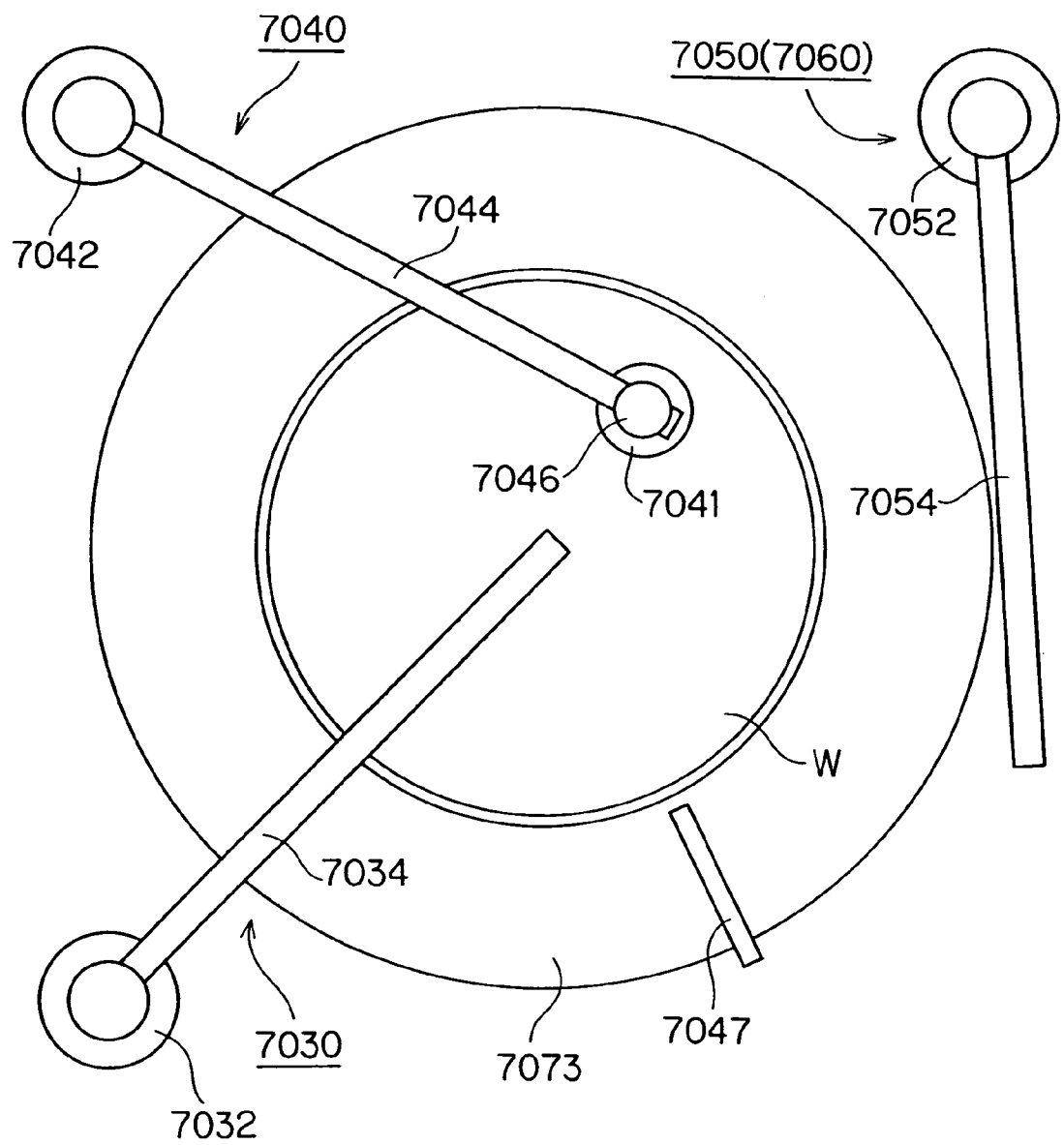

F I G. 71
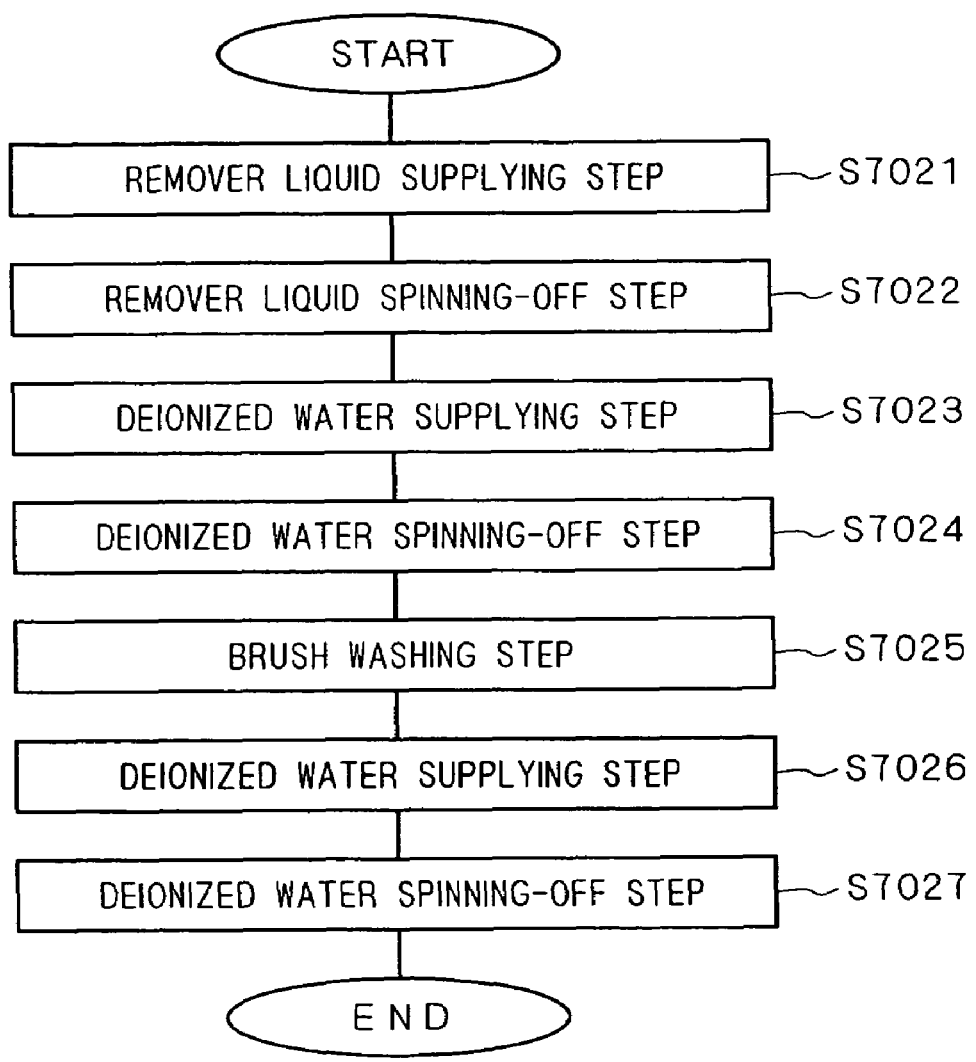

F I G. 73
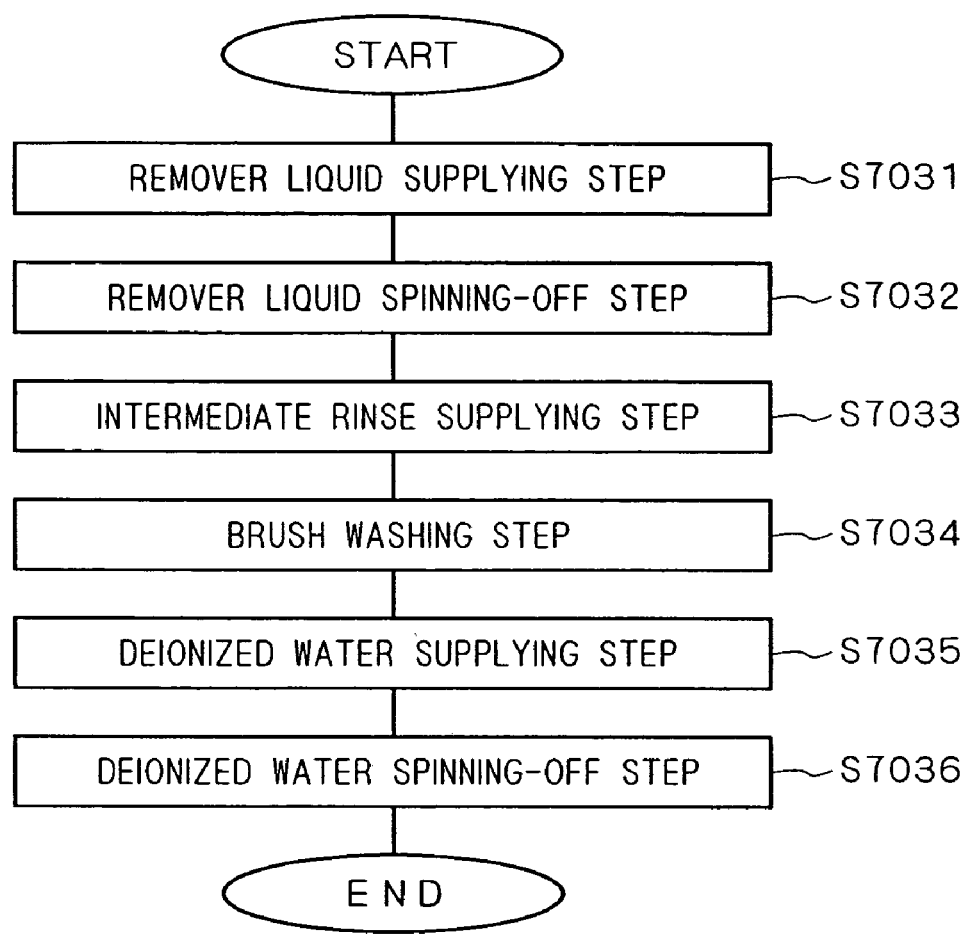

F I G. 74
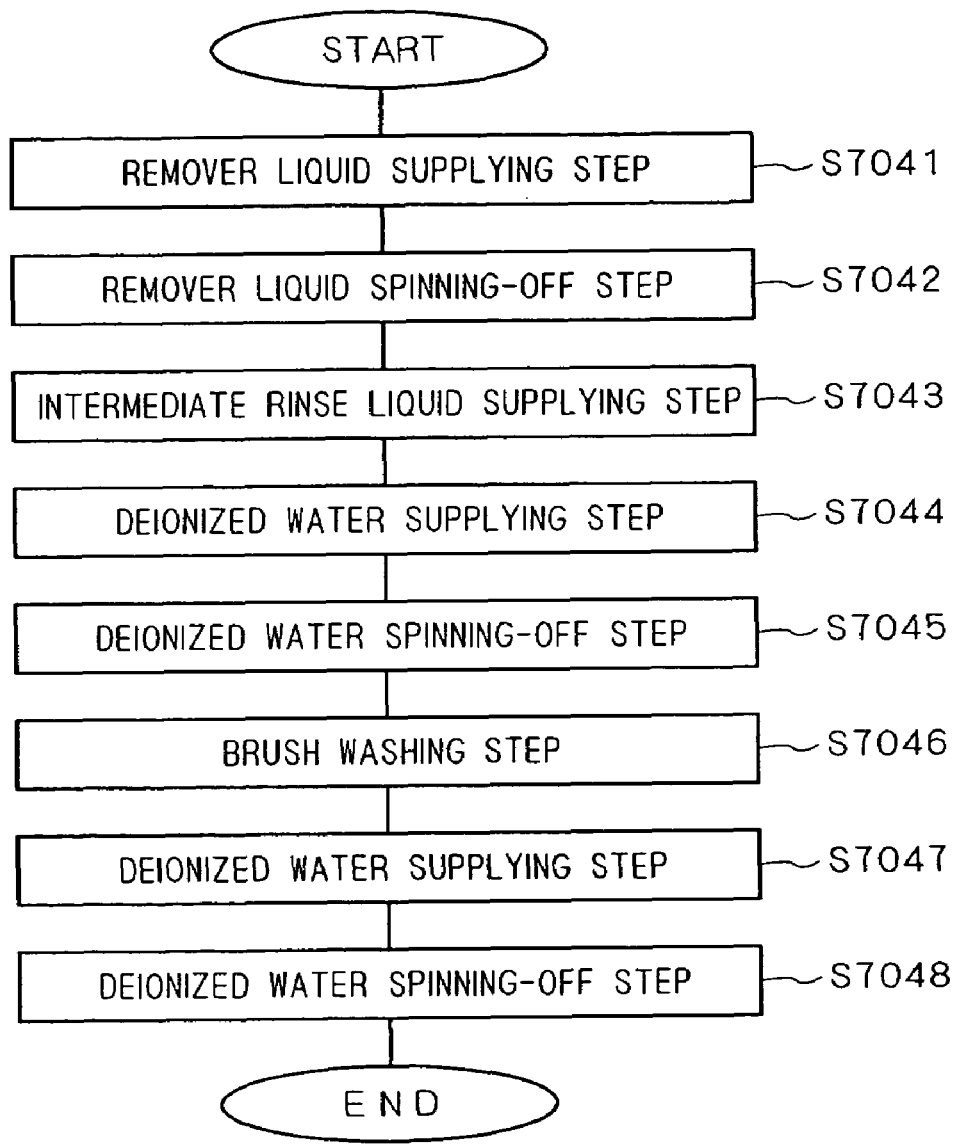

F I G . 77A
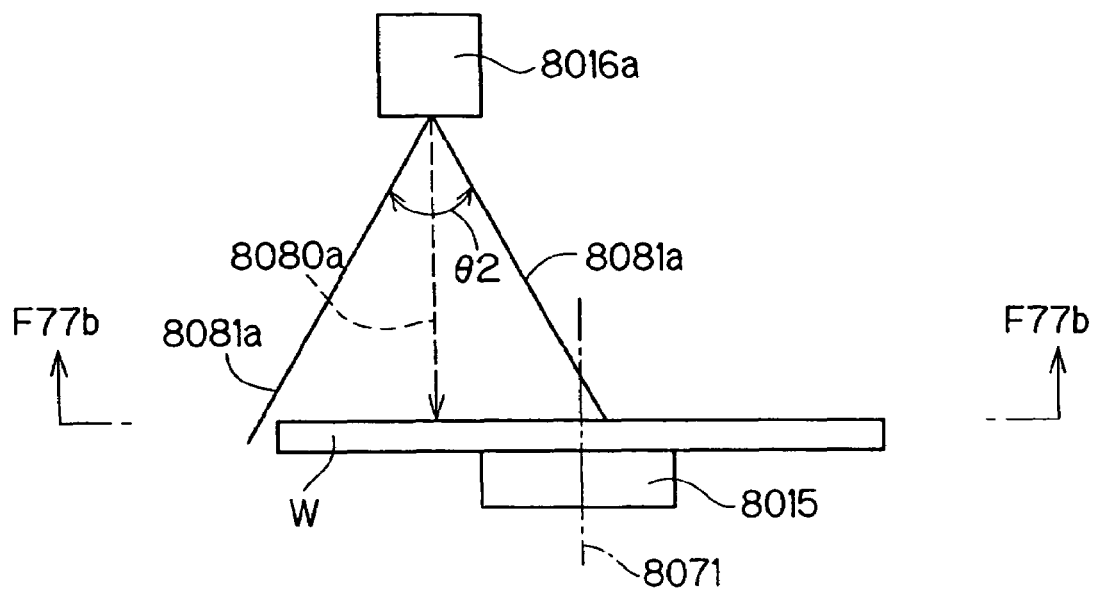
F I G . 77B
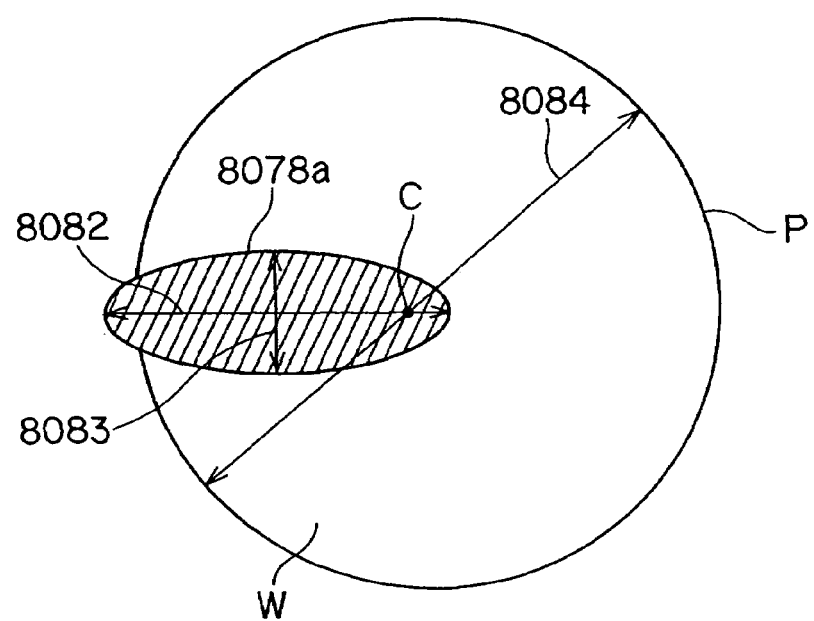

F I G. 82
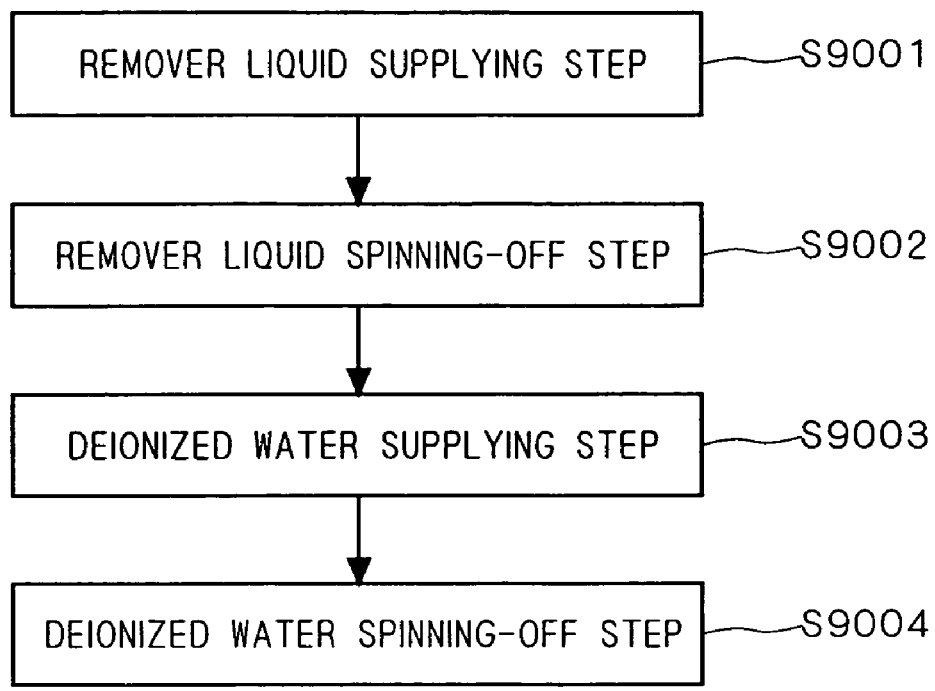

F I G. 89
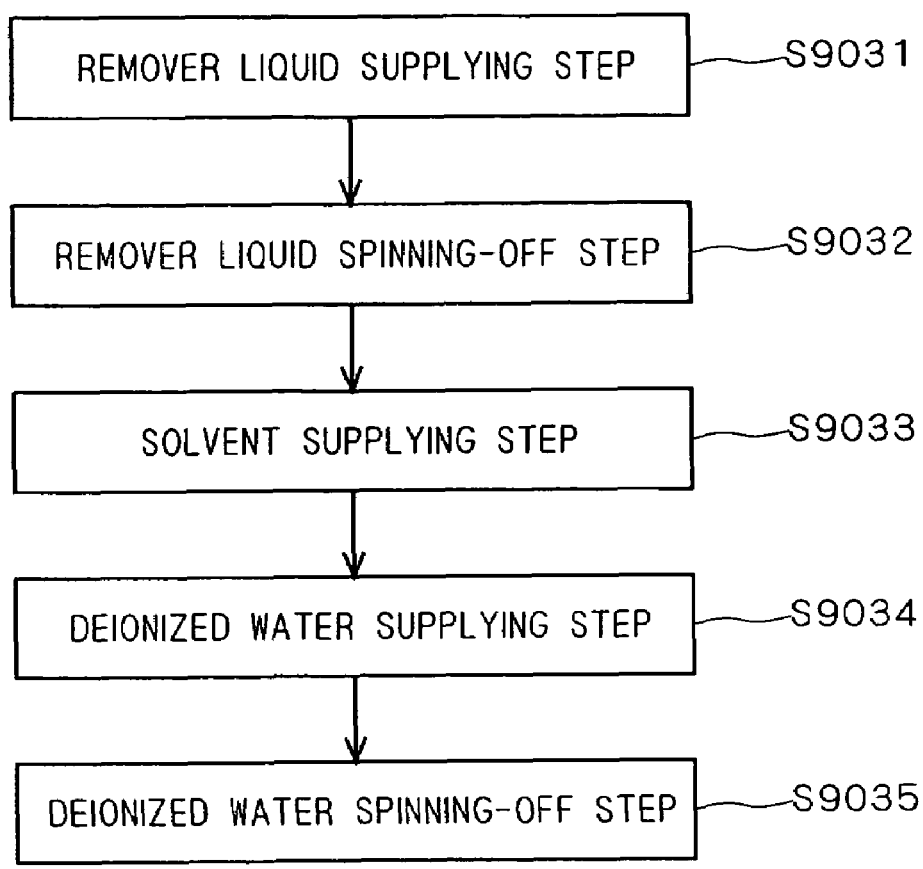

SUBSTRATE PROCESSING APPARATUS

This application is a divisional of application Ser. No. 09/957,652 filed Sep. 21, 2001 now U.S. Pat. No. 6,951,221.

BACKGROUND OF THE INVENTION

1. Field of the Invention

The present invention relates to an apparatus for removing residuary pollution from various substrates such as a semiconductor wafer, a glass substrate for a liquid crystal display, a PDP (Plasma Display Panel) substrate or a glass substrate and a ceramic substrate for magnetic discs.

2. Description of the Background Art

In a substrate processing system, an apparatus for removing remaining contaminants from a substrate is used. Such remaining contaminants may include reaction products generated on the substrate due to quality change of a resist. In most cases, the reaction products are an organic substance. For example, when dry-etching is effected on a thin film existing on the surface of the substrate with the use of a resist film as a mask, reaction products are generated on the substrate. This reaction products need to be removed efficiently. In the following, this circumstance will be explained more concretely.

Manufacturing processes of a semiconductor device include a process in which a metal thin film such as aluminum or copper formed on a substrate such as a semiconductor wafer is subjected to etching by using a resist film as a mask to form wiring of semiconductor elements.

For example, as illustrated in FIG. 91A, electronic elements 8102 are formed on a semiconductor substrate 8101, and a metal film 8103 is formed thereon. This metal film 8103 is made of, for example, aluminum.

Further, a resist film 8104 is formed on the metal film 8103. This resist film 8104 is formed through the following processes: resist is applied to a top surface of the metal film 8103 to be dried thereon, the dried resist is selectively exposed by an exposing device in the form of a wiring pattern, and a developing liquid is supplied to the exposed resist to remove unnecessary portions therefrom. In this manner, only the necessary portions of the metal film 8103 are masked by the resist film 8103, and in the succeeding etching process, the necessary portions of the metal film 103 are allowed to remain without being etched.

Next, a dry-etching process such as RIE (Reactive Ion Etching) is carried out on the metal film 8103 masked by the resist film 8103 so that portions of the metal film 8103 that have not been masked by the resist film 8103 are etched and removed and the portions remaining without having been etched are allowed to form metal wiring 8106.

When the dry-etching is carried out as described above, reaction products 8105, derived from the resist film 8103, etc., accumulate on the sides of the metal wiring 8106, as shown in FIG. 91B.

In most cases, these reaction products 8105 are not removed in the succeeding resist-removing process, and tend to remain on the substrate 8101 as shown in FIG. 91C, even after the removal of the resist film 8104.

When the substrate 8101 is sent to the next process without removing such reaction products 8105, they tend to give adverse effects on the quality of the next process and thereafter; therefore, it is necessary to remove them before the next process.

In order to remove the reaction products 8105, in the conventional substrate processing apparatus, a plurality of process liquids, such as a remover liquid, an intermediate rinse liquid and deionized water, are successively supplied from respective nozzles while the substrate is being rotated. In the apparatus of this type, the following improvements have been demanded.

(1) Improvements in the Throughput

Here, it has been known that, when the remover liquid and deionized water are mixed, a phenomenon referred to as "pH shock" in which a strong alkali is generated, occurs, resulting in damages to the metal wiring.

For this reason, in the conventional method, in order not to directly mix the remover liquid and deionized water, an intermediate rinse liquid is supplied so as to once remove the remover liquid from the substrate, and deionized water is then supplied to the substrate so as to carry out a deionized water cleaning process.

In such a conventional technique, the intermediate rinse step takes a long time, resulting in adverse effects on the throughput.

Moreover, in the conventional technique, a large amount of intermediate rinse liquid is required in the intermediate rinse step, resulting in high costs.

(2) Improvements in the Temperature Control in Process Liquids

Conventionally, with respect to the remover liquid used in the removing process of these reaction products that have been generated through dry-etching, those liquids adapted to a room temperature have been generally used. However, in recent years, remover liquids, which exert an improved removing function on the removing products when used at high temperatures, have been developed.

In the case when such a high-temperature type remover liquid is used, the remover liquid is heated to a temperature in the range of approximately 50 to 80degrees in Celsius by using a temperature-raising mechanism for the remover liquid, and the temperature of the remover liquid is controlled with high precision. In other words, when the temperature of the remover liquid to be supplied to the substrate varies, it becomes impossible to carry out the removing process of the reaction products with high precision. For this reason, the temperature control of the remover liquid needs to be carried out so as to always maintain the temperature of the remover liquid to be supplied to the substrate at a fixed temperature.

However, in such a substrate processing apparatus, during a non-processing period of time up to the start of the process on substrates in the next lot after substrates in the preceding lot have been processed, or during a non-processing period of time up to the start of the process on the next substrate after the process of a preceding substrate, the remover liquid tends to be cooled off inside pipes, etc., between the temperature-raising mechanism of the remover liquid and the remover liquid discharging section for discharging the remover liquid to the surface of the substrate, resulting in a failure to carry out the removing process of the reaction products with high precision.

(3) Improvements in Nozzles

In the conventional substrate processing apparatus of this type for removing the reaction products, the remover liquid is supplied to a fixed portion on the substrate. For this reason, there is a difference in the process quality between the fixed portion and the other portions, failing to maintain the in-plane uniformity of the substrate.

In particular, the remover liquids have such a characteristic that they exert the highest removing efficiency of the reaction products when used at the respective predetermined temperatures. For this reason, in the case when the remover liquid is supplied to the fixed portion of the substrate, it becomes difficult to maintain the in-plane uniformity of the substrate.

Further, the remover liquid supplying nozzle of such a conventional substrate processing apparatus is formed by a simple straight tube that is directed toward the substrate with its tip being open. For this reason, since the remover liquid hits the substrate in a dot form, it is difficult to maintain the in-plane uniformity in the process.

More specifically, the portion (referred to as a liquid arrival portion) at which the remover liquid hits the substrate in the dot form makes it possible to remove the reaction products in a comparatively short time, since a fresh remover liquid is always supplied thereto. However, the other portion (referred to as a liquid non-arrival portion) tends to have a slower process in comparison with the liquid arrival portion. In other words, there are deviations in the time required for completing the process on the surface of the substrate.

For this reason, in the conventional substrate processing apparatus, it is necessary to wait for the completion of the process in the liquid non-arrival portion in order to remove the reaction products from the substrate. However, in contrast, the remover liquid slightly has a corrosion effect on the metal film 8103, with the result that during the waiting time for the completion of the process on the liquid non-arrival portion, the corrosion might take place on the metal film 8103 in the liquid arrival portion to a degree exceeding a permissible range.

Here, with respect to the substrate cleaning device, a droplet-injection cleaning method, which uses a cleaning double fluids nozzle for strongly removing contaminants adhering the surface of the substrate, has been proposed.

FIG. 92 is a schematic drawing of a cleaning device in which the conventional cleaning double fluids nozzle is used. This cleaning device is provided with a cleaning cup 2051, a spin chuck 2052 for holding a substrate W inside the cleaning cup 2051, an electric motor 2053 for rotating this spin chuck 2052, a gas supplying means 2055 for supplying pressurized gas to the cleaning double fluids nozzle 2060 for discharging droplets onto the surface of the substrate W, and a liquid supplying means 2056 for supplying a pressurized liquid to the cleaning double fluids nozzle 2060. Moreover, a robot arm 2057 for holding and shifting the cleaning double fluids nozzle 2060 is installed.

FIG. 93 shows a cross-sectional view of the conventional cleaning double fluids nozzle 2060. The cleaning double fluids nozzle is provided with a first tube path 2061 through which gas is transmitted, and a second tube path 2062 the tip of which is allowed to penetrate the side wall of the first tube path 2061 from the outside of the first tube path 2061, and extended to the inside of the first tube path 2061 and through which a fluid is transmitted. The tip of the second tube path 2062 is extended in the same direction as the direction in which the first tube path 2061 is extended.

A substrate W is fixed to the spin chuck 2052, and rotated at a predetermined number of revolutions. Pressurized gas is supplied from a gas supplying means 2055 to the cleaning double fluids nozzle 2060, and a pressurized liquid is supplied from a liquid supplying means 2056 thereto, respectively. In the cleaning double fluids nozzle 2060, the gas and the liquid are mixed with each other so that the liquid is changed to droplets in the form of mist. These droplets are accelerated by the gas flow inside the first tube path 2061, and discharged from the tip of the first tube path 2061. The atomized droplets thus discharged are made to collide with the surface of the substrate W, thereby removing the contaminants adhering to the surface of the substrate W.

However, in the above-mentioned cleaning device, the gas and the liquid are mixed inside the cleaning double fluids nozzle 2060. Therefore, when the flow rate of one fluid is attempted to be changed independently of the flow rate of the other fluid, the latter is also changed since the respective pressures interfere with each other inside the first tube path 2061.

In other words, in the case when the gas flow rate is increased so as to increase the cleaning strength, since the pressure of the gas inside the first tube path 2061 increases so that the flow rate of the liquid supplied from the second tube path 2062 is suppressed. Consequently, the droplets to be discharged from the tip opening of the nozzle of the double fluids nozzle 2060 tend to have cleaning strength different from the initial cleaning strength due to the suppressed liquid flow rate.

Consequently, fine particles such as dusts and slurries tend to remain on the surface of the substrate W, resulting in a serious problem of a reduced yield in the manufacturing process of the semiconductor device.

Moreover, in the above-mentioned cleaning device, since the gas and the liquid are mixed inside the cleaning double fluids nozzle 2060, dusts are generated because irregularities on the inner wall of the nozzle 2060 are cut. The dusts may be also generated during the mixing operation. The substances resulting from the dried liquid and adhering to the inside of the nozzle 2060 are taken off by the flow in the nozzle.

SUMMARY OF THE INVENTION

The present invention is directed to an apparatus for removing residuary pollution from a substrate.

According to the present invention, the apparatus comprising: a) a spin mechanism for holding and rotating the substrate; and b) a liquid supply mechanism for supplying at least one liquid onto the substrate being rotated, comprising b-1) a mist supply mechanism for mixing a gas with a processing liquid to generate mist and supplying the mist onto the substrate being rotated in a removing process for removing the residuary pollution from the substrate.

In an aspect of the present invention, the mist supply mechanism comprising a mixing part having a mixing room for mixing gas with the processing liquid to generate the mist, and a nozzle having a tapered channel for receiving the mist from the mixing room and supplying the mist onto the substrate, the channel having a tapered part being tapered-off toward a discharge end of the channel. The mist may be remover liquid, intermediate rinse for removing the remover liquid from the substrate being rotated, and/or deionized water.

In another aspect of the present invention, the mist supply mechanism comprising: a gas discharge mechanism for discharging the gas into an open space on the substrate; and a processing liquid discharge mechanism for discharging the processing liquid into the gas in the open space to generate the mist to be applied to the substrate.

In a preferred embodiment of the present invention, the mist supply mechanism comprising: a processing liquid discharge mechanism having a first discharging outlet for discharging the processing liquid into an open space; and a gas discharge mechanism having a second discharging outlet for discharging the gas into the processing liquid in the open space just after the processing liquid is discharged from the first discharging outlet, to thereby convert the processing liquid into liquid drops constituting the mist.

The present invention also provides an apparatus for removing residuary pollution from a substrate, comprising: a) a spin mechanism for holding and rotating the substrate; and b) a remover liquid supply unit for supplying remover liquid onto the substrate being rotated to remove the residuary pollution from the substrate, c) a deionized water supply unit for supplying a deionized water onto the substrate being rotated, and d) at least one ultrasonic oscillator for applying ultrasonic wave to at least one of the remover liquid and the deionized water.

The residuary pollution may be caused in a dry-etching process in which a thin film formed on the substrate is removed through a dry-etching step using a resist film as a mask. The origin of the residuary pollution may be a resist used in an etching process of a thin film formed on the substrate. In a preferred embodiment of the present invention, the residuary pollution is an organic matter.

In another preferred embodiment of the present invention, an apparatus for removing residuary pollution caused in an dry-etching process from a substrate, the apparatus comprising: a) a spin mechanism for holding and rotating the substrate; and b) a remover liquid supply unit for supplying remover liquid onto the substrate being rotated to remove the residuary pollution from the substrate while scanning the substrate with the remover liquid.

In a further another preferred embodiment of the present invention, provided is an apparatus for removing residuary pollution caused in an dry-etching process from a substrate, the apparatus comprising: a) a spin mechanism for holding and rotating the substrate; and b) a remover liquid supply mechanism comprising: b-1) a pressured generator for applying pressure to a remover liquid which is effective for removing the chemical residuary pollution to generate a pressured remover liquid, and b-2) a nozzle for discharging the pressured remover liquid onto the substrate being rotated, and c) a deionized water supply mechanism for supplying deionized water onto the substrate being rotated.

In a further another preferred embodiment of the present invention, provided is an apparatus for removing residuary pollution caused in an dry-etching process from a substrate, the apparatus comprising: a) a remover liquid supply unit comprising a remover liquid discharging unit for discharging remover liquid onto the substrate being rotated to remove the residuary pollution from the substrate, b) a temperature controller for controlling a temperature of the remover liquid, c) a driver for moving the remover liquid discharging unit between a processing position from which the remover liquid is discharged onto the substrate, and a stand-by position from which the remover liquid is discharged to a position defined out of the substrate, and d) a controller for controlling the driver and the remover liquid discharging unit such that the remover liquid discharging unit is located at the stand-by position and discharges the remover liquid to the position defined out of the substrate, and the remover liquid discharging unit is then moved to the processing position and discharges the remover liquid onto the substrate.

In a further another preferred embodiment of the present invention, provided is an apparatus for removing residuary pollution from a substrate, comprising: a) a spin mechanism for holding and rotating the substrate; b) a remover liquid supply unit for supplying remover liquid onto the substrate being rotated to remove the residuary pollution from the substrate; c) a brush unit for brushing the substrate; d) a deionized water supply unit for supplying a deionized water onto the substrate being rotated; and d) a controller comprising a first control procedure element for controlling the remover liquid supply unit to supply the remover liquid onto the substrate being rotated, a second control procedure element for controlling the brush unit to brush the substrate after the remover liquid is supplied onto the substrate being rotated, a third control procedure element for controlling the deionized water supply unit to supply the deionized water onto the substrate being rotated after the substrate is brushed, and a fourth control procedure element for controlling the spin mechanism to rotate the substrate to disperse the deionized water from the substrate.

In another aspect of the present invention, an apparatus for removing residuary pollution from a substrate, comprising: a) a spin mechanism for holding and rotating the substrate; and b) a processing liquid supply unit comprising a nozzle for discharging a spreading current of a processing liquid toward the substrate.

A cross section of the spreading current on the substrate may be substantially an ellipse including a rotation center of the substrate and at least one point on a rotation circle defined by an edge of the substrate being rotated.

In another aspect of the present invention, an apparatus for removing residuary pollution from a substrate, comprising: a) a spin mechanism for holding and rotating the substrate; b) a remover-liquid supply unit for supplying remover liquid onto the substrate being rotated to remove the residuary pollution from the substrate, c) a deionized water supply unit for supplying a deionized water onto the substrate being rotated; and d) a controller comprising a first control procedure element for controlling the remover liquid supply unit to supply the remover liquid onto the substrate being rotated, a second control procedure element for controlling the spin mechanism to rotate the substrate to disperse the remover liquid from the substrate, and a third control procedure element for controlling the deionized water supply unit to supply the deionized water onto the substrate being rotated after the remover liquid is dispersed.

Accordingly, an object of the present invention is to uniformly carry out the substrate processing.

Another object of the present invention is to improve the throughput in the substrate processing.

Still another objective of the present invention is to properly carry out the temperature management on process liquid.

The other objective of the present invention is to improve the structure of a nozzle for discharging each process liquid.

These and other objects, features, aspects, and advantages of the present invention will becomes more apparent from the following detailed description of the present invention when taken in conjunction with the accompanying drawings.

BRIEF DESCRIPTIONS OF THE DRAWINGS

FIG. 1 is a side view of a substrate processing apparatus 1001;

FIG. 9 is a side view of a substrate processing apparatus 1100;

FIG. 10 is a flow chart that shows a substrate processing method using the substrate processing apparatus 1100;

FIG. 28 is a flow chart of the substrate processing method according to the third preferred embodiment of the third aspect;

FIG. 37 is a flow chart that shows a substrate processing method in accordance with the first preferred embodiment of the fourth aspect;

FIG. 54 is a flow chart that shows a substrate processing method using the substrate processing apparatus 5001;

FIG. 58 is a flow chart that shows a substrate processing method using the substrate processing apparatus 5100;

FIG. 62 is a block diagram that shows an essential electrical construction of the substrate processing apparatus;

FIG. 63 is a flow chart that shows a processing operation in the substrate processing apparatus at the time when a pre-dispensing process is executed;

FIG. 64 is a flow chart that shows a processing operation in the substrate processing apparatus at the time when an auto-dispensing process is executed;

FIG. 65 is a schematic plan view that shows a substrate processing apparatus in accordance with a first preferred embodiment of a seventh aspect;

FIG. 71 is a flow chart that shows a processing operation carried out on a substrate W by another preferred embodiment of the substrate processing apparatus in accordance with the first preferred embodiment;

FIG. 73 is a flow chart that shows a processing operation carried out on a substrate W by the substrate processing apparatus in accordance with the second preferred embodiment;

FIG. 74 is a flow chart that shows a processing operation carried out on a substrate W by another preferred embodiment of the substrate processing apparatus in accordance with the second preferred embodiment;

FIGS. 77A and 77B are drawings explaining a dispersing nozzle 8016a;

FIG. 82 is a flow chart that shows a substrate processing method in accordance with the first preferred embodiment of the ninth aspect;

FIG. 89 is a flow chart that shows a substrate processing method in accordance with the third preferred embodiment of the ninth aspect;

DESCRIPTION OF THE PREFERRED EMBODIMENTS

<Definitions>

Figure 2:
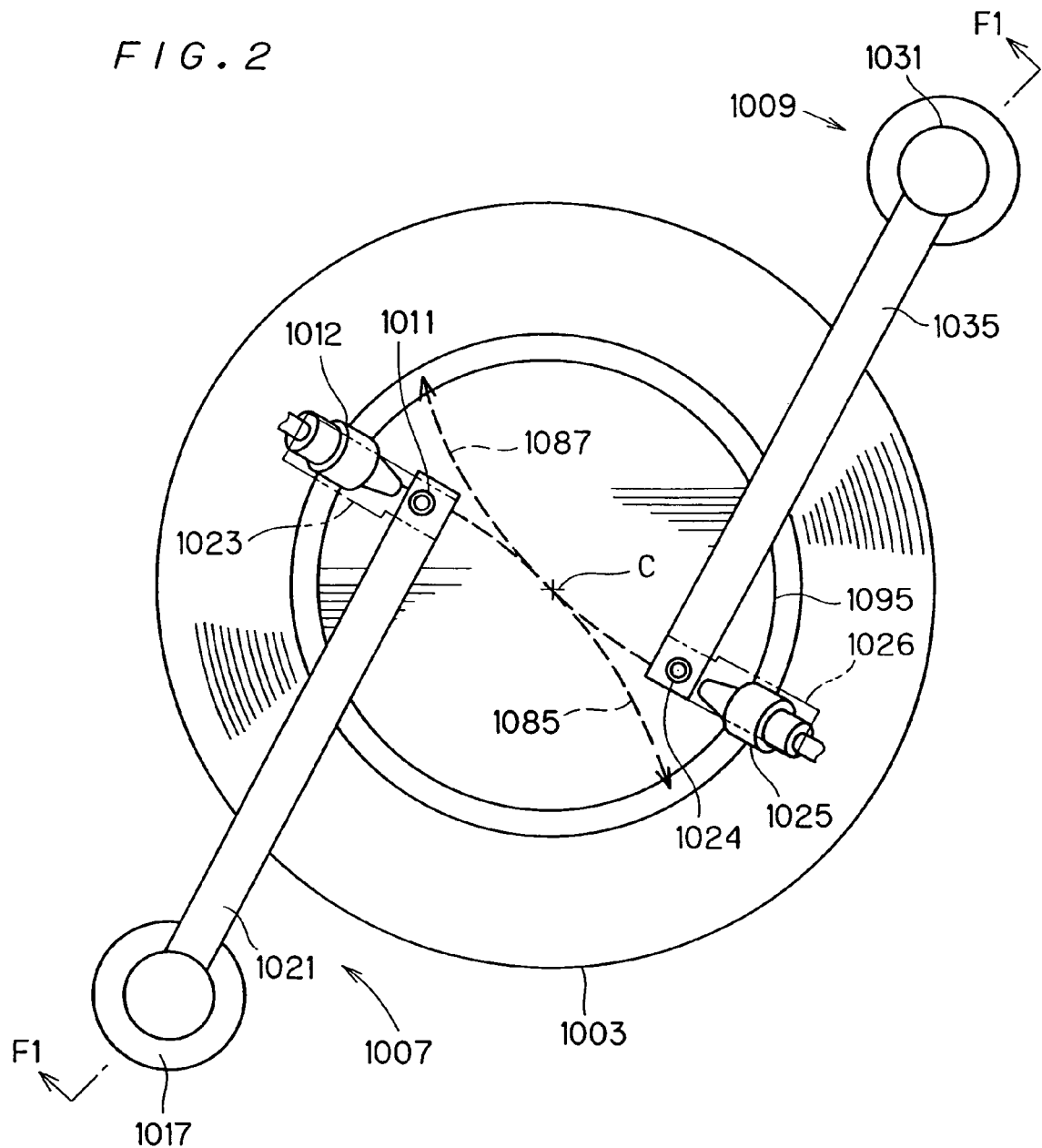
FIG. 2 is a top view of the substrate processing apparatus 1001.

In the following preferred embodiments of the present invention, the "substrate" is a semiconductor substrate, and more specifically, a silicon substrate. Moreover, the substrate is provided with a thin film formed on the top major surface of the substrate.

The "thin film" may be a metal film or an insulating film. With respect to metals forming the metal film, examples thereof include copper, aluminum, titanium and tungsten. With respect to the insulating film, examples thereof include a silicon oxide film and a silicon nitride film.

The "thin film" may include a film made of a mixture of metals such as copper, aluminum, titanium, tungsten and the like. Furthermore, the insulation film includes an organic insulation film and a low dielectric interlayer insulation film. In this context, the term "thin film" includes not only the films in which the height dimension in the cross section of the direction perpendicular to the substrate on which the film is formed is shorter than the length of the bottom but also the films in which the height dimension is longer than the length of the bottom. Therefore, the thin film also includes those existing in the form of line or island when viewed toward the substrate, such as film or wiring which is locally formed on the substrate.

On the substrate that has been subjected to a dry-etching process for the thin film by using a resist film as a mask, there are polymers that are reaction products derived from the resist and the thin film in the dry-etching process. The "substrate processing" is a process for removing a residuary pollution which undesirably residues on a substrate and may include a polymer removing process for removing polymers from the substrate on which the polymers are generated.

The "remover liquid" is, for example, a polymer remover liquid. Examples of the polymer remover liquid include a liquid containing an organic alkali liquid, a liquid containing an inorganic acid and a liquid containing an anmon-bifluoride-based substance. With respect to the liquid containing an organic alkali liquid, DMF (dimethyl formamide), DMSO (dimethyl sulfoxide) and hydroxylamine may be used. Moreover, with respect to the liquid containing an inorganic acid, hydrofluoric acid and phosphoric acid are listed.

Besides these, examples of the polymer remover liquid are liquids of 1-methyl-2-pyrrolidone, tetrahydrothiophene 1,1-dioxide, isopropanol amine, monoethanolamine, 2-(2-aminoethoxy) ethanol, catechol, N-methylpyrrolidone, aromatic diol, tetrachloroethylene, and phenol, and, more specifically, a mixed solution of 1-methyl-2-pyrrolidone, tetrahydrothiophene 1,1-dioxide and isopropanol amine, a mixed solution of dimethylsulfoxide and monoethanol amine, a mixed solution of 2-(2-aminoethoxy)ethanol, hydroxylamine and catechol, a mixed solution of 2-(2-aminoethoxy)ethanol and N-methylpyrrolidone, a mixed solution of monoethanol amine, water and aromatic diol, and a mixed solution of tetrachloroethylene and phenol.

Examples of the liquid containing organic amine (referred to as an organic amine series remover liquid) include a mixture of monoethanolamine, water and aromatic triol, a mixture of 2-(2-aminoethoxy)ethanol, hydroxylamine and catechol, a mixture of alkanolamine, water, dialkylsulfoxide, hydroxylamine, water, dialkylsulfoxide and an amine anticorrosive, a mixture of alkanolamine, glycol ether and water, a mixture of dimethylsulfoxide, hydroxylamine, triethylenetetramine, pyrocatechol and water, a mixture of water, hydroxylamine and pyrogallol, a mixture of 2-aminoethanol, ethers and sugar alcohols, and a mixture of 2-(2-aminoethoxy)ethanol, N-dimetylacetoacetoamide, water and triethanolamine. Furthermore, the liquid containing ammonium fluoride series substance (referred to as an ammonium fluoride series remover liquid) includes a mixture of an organic alkali, a sugar alcohol and water, a mixture of a fluorinated compound, an organic carboxylic acid and an acid amide solvent, a mixture of alkyl amide, water and ammonium fluoride, a mixture of dimethyl sulfoxide, 2-aminoethanol, an organic alkali aqueous liquid and an aromatic hydrocarbon, a mixture of dimethyl sulfoxide, ammonium bifluoride and water, a mixture of ammonium bifluoride, triethanolamine, pentametyldiethylenetriamine, iminodiacetic acid and water, a mixture of glycol, an alkyl sulfate, an organic salt, an organic acid and an inorganic salt, a mixture of an amide, an organic salt, an organic acid and an inorganic salt, and a mixture of an amide, an organic salt and an inorganic salt.

Furthermore, examples of the inorganic remover liquid containing an inorganic substance include a mixture of water and phosphoric acid derivative.

The "intermediate rinse liquid" is a liquid for removing the remover liquid from the substrate, and examples thereof include an organic solvent such as isopropyl alcohol (IPA) or functional water such as ozone water prepared by dissolving ozone in deionized water and hydrogen water prepared by dissolving hydrogen in deionized water.

When the ozone water in which ozone is dissolved in deionized water is used as the intermediate rinse liquid, it is possible to remove the reaction products and polymer resulting from quality change of organic substance and resist more completely.

The remover liquid, intermediate rinse liquid and deionized water are generally referred to as "process liquid" or "cleaning liquid".

The "pH shock" refers to a phenomenon in which upon contact of a remover liquid and deionized water, a strong alkali is generated, and since the generation of such a strong alkali causes damages to a metal film, this needs to be reduced to a minimum.

A. Preferred Embodiments According to First Aspect of the Present Invention

<1. Substrate Processing Apparatus 1001>

FIGS. 1 and 2 are drawings that show the construction of a substrate processing apparatus 1001 according to a preferred embodiment of the present invention. Here, FIG. 1 is a cross-sectional view taken along line F1-F1 of FIG. 2, and for convenience of explanation, hatching is partially omitted from some portions.

As illustrated in FIG. 1, the substrate processing apparatus 1001 is provided with a cup 1003 which has a virtually U-letter shape in its cross-section, and also has a virtually ring shape with an opening in the center portion thereof as shown in FIG. 2, when viewed from above, a holding rotary section 1005 that is formed in a manner so as to stick out through the opening of the cup 1003 in the vertical direction as shown in FIG. 1 and that rotates while holding a substrate W, a remover liquid supplying section 1007 for supplying a remover liquid to the substrate W held by the holding rotary section 1005 and a deionized water supplying section 1009 for supplying deionized water to the substrate W held by the holding rotary section 1005.

The cup 1003 has a plurality of discharging outlets 1004 on the bottom thereof. Thus, an excessive portion of the liquid supplied to the substrate W drops along the inner wall of the cup 1003 to reach the discharging outlets 1004, and is discharged out of the apparatus through the discharging outlets 1004.

The holding rotary section 1005 is provided with a spin motor 1013 which is secured to an apparatus frame, not shown, and has a driving shaft placed in the vertical direction, a spin shaft 1014 that is secured to the driving shaft of the spin motor 1013 and a vacuum chuck 1015 serving as a substrate holding member placed on the top of the spin shaft 1014.

The vacuum chuck 1015 has suction holes, formed in a suction surface that is an upper surface thereof, and air is sucked through the suction holes. Thus, the substrate W, placed on the vacuum chuck 1015, is held by air suction applied through the suction holes. In this manner, the vacuum chuck 1015 holds the substrate W by contacting only the back surface of the substrate W.

In this arrangement, the holding rotary section 1005 holds the substrate W placed on the vacuum chuck 1015 through suction applied by the vacuum chuck 1015, and rotates the substrate W held on the vacuum chuck 1015 by driving the spin motor 1013.

The remover liquid supplying section 1007 is provided with a first rotary motor 1017 which is secured to the apparatus frame, and has a driving shaft placed in the vertical direction, a first rotary shaft 1019 secured to the driving shaft of the first rotary motor 1017 and a first arm 1021 connected to the top of the first rotary shaft 1019.

A remover liquid discharging nozzle 1011 is attached to the tip of the first arm 1021. The remover liquid discharging nozzle 1011 is a tube-shaped member with its length direction set virtually in the vertical direction, and a remover liquid is supplied from one end thereof, with the other end supplying the remover liquid to the substrate W.

Moreover, a remover liquid spray nozzle 1012 is attached to the same tip of the first arm 1021 through a bracket 1023 (indicated by an alternate long and two short dashes line in FIG. 2). The remover liquid spray nozzle 1012, which sprays a remover liquid mist as will be described later, is arranged so as to spray the remover liquid mist with an inclination of 45 degrees with respect to the surface of the substrate W. In other words, the remover liquid spray nozzle 1012 is inclined by 45 degrees with respect to the normal direction of the top major surface of the substrate W.

The above-mentioned remover liquid discharging nozzle 1011 and remover liquid spray nozzle 1012 are arranged so that the remover liquid discharged from the remover liquid discharging nozzle 1011 and the remover liquid mist sprayed from the remover liquid spray nozzle 1012 are allowed to intersect each other on the surface of the substrate W, and so that, when the remover liquid discharging nozzle 1011 and the remover liquid spray nozzle 1012 are allowed to pivot by the first rotary motor 1017, the remover liquid discharged from the remover liquid discharging nozzle 1011 and the remover liquid mist sprayed from the remover liquid spray nozzle 1012 are reciprocally shifted, as illustrated in FIG. 2, on a circular arc 1085 that passes through the rotation center C of the substrate W and also intersects a rotation circle 1095 that the end edge of the rotating substrate W forms at two points on the circumference thereof.

The deionized water supplying section 1009, which is secured to the apparatus frame is provided with a second rotary motor 1031 having a driving shaft directed in the vertical direction, a second rotary shaft 1033 secured to the driving shaft of the second rotary motor 1031 and a second arm 1035 connected to the top of the second rotary shaft 1033.

A deionized water discharging nozzle 1024 is attached to the tip of the second arm 1035. The deionized water discharging nozzle 1024 is a tube-shaped member with its length direction set virtually in the vertical direction, and deionized water is supplied from one end thereof, with the other end supplying the deionized water to the substrate W.

Moreover, a deionized water spray nozzle 1025 is attached to the same tip of the second arm 1035 through a bracket 1026 (indicated by an alternate two dots dash line in FIG. 2). The deionized water spray nozzle 1025, which sprays a deionized water mist as will be described later, is arranged so as to spray the deionized water mist with an inclination of 45 degrees with respect to the surface of the substrate W. In other words, the deionized water spray nozzle 1025 is inclined by 45 degrees with respect to the normal direction of the top major surface of the substrate W.

The deionized water discharging nozzle 1024 and deionized water spray nozzle 1025 are arranged so that the deionized water discharged from the deionized water discharging nozzle 1024 and the deionized water mist sprayed from the deionized water spray nozzle 1025 are allowed to intersect each other on the surface of the substrate W, and so that, when the deionized water discharging nozzle 1024 and the deionized water spray nozzle 1025 are allowed to pivot by the second rotary motor 1031, the deionized water discharged from the deionized water discharging nozzle 1024 and the deionized water mist sprayed from the deionized water spray nozzle 1025 are reciprocally shifted, as illustrated in FIG. 2, on a circular arc 1087 that passes through the rotation center C of the substrate W and also intersects a rotation circle 1095 that the end edge of the rotating substrate W forms at two points on the circumference thereof.

<2. Gas-Liquid Mixing Nozzle>

Figure 3:
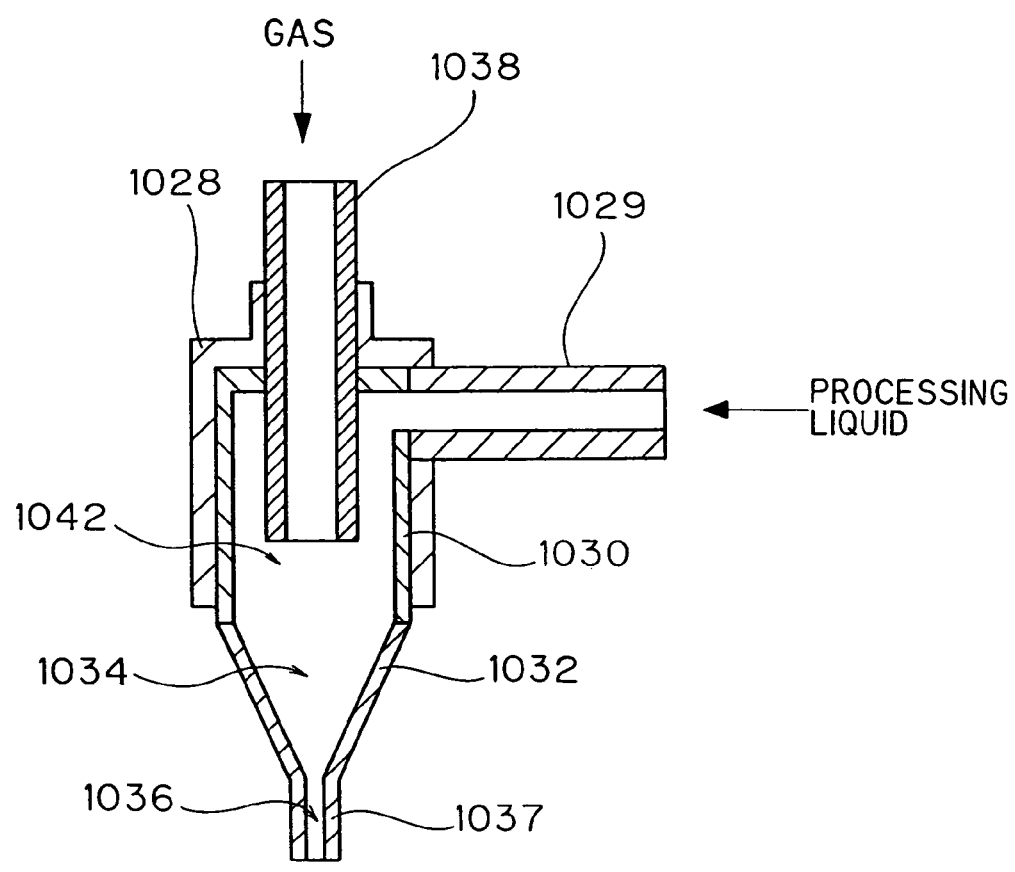
FIG. 3 is a cross-sectional view of a gas-liquid mixing nozzle 1027.

The remover liquid spray nozzle 1012 and deionized water spray nozzle 1025 have the same structure, and a gas-liquid mixing nozzle 1027 as illustrated in FIG. 3 is adopted as these nozzles.

The gas-liquid mixing nozzle 1027 is provided with a cylinder-shaped mixing section 1030 forming a mixing chamber 1042 in which a gas and a liquid are mixed, a taper section or tapered channel 1032 which has a tapered flowing path 1034 that has one end connected to the mixing chamber 1042, and is narrowed toward the other end, and which is connected to the mixing section 1030, and a straight flow section 1037 which has a straight flowing path 1036 that has one end connected to the tapered flowing path 1034, and continuously has a cross-section having the same shape toward the other end, and which is connected to the above-mentioned tapered section 1032. Moreover, a gas introducing tube 1038 and a process liquid introducing tube 1029 are connected to the mixing section 1030, and the mixing section 1030, the gas introducing tube 1038 and the process liquid introducing tube 1029 are fixed by a housing 1028.

The mixing section 1030 is a member having a virtually cylinder shape, through which a cylinder shape gas introducing tube 1038 having an outer diameter smaller than the inner diameter of the mixing section 1030 is inserted. More specifically, the mixing section 1030 and the gas introducing tube 1038 respectively have cylinder shapes, with their center axes being coincident with each other. The end portions of the gas introducing tube 1038 are housed inside the mixing section 1030. In other words, the mixing section 1030 is allowed to regulate a ring-shaped space enclosing the end part of the gas introducing tube 1038.

The taper section 1032 connected to the mixing section 1030 has a cone shape. One end of the taper section 1032, connected to the mixing section 1030, has an inner diameter that is the same dimension as the inner diameter of the portion of the mixing section 1030 to which it is connected. The taper section 1032 has such a structure that the inner diameter thereof is continuously narrowed from the one end toward the other end, and with this structure, the tapered flowing path 1034 that is gradually narrowed inside the taper section 1032 is formed.

The straight flow section 1037, connected to the taper section 1032, has a cylinder shape. One end of the straight flow section 1037, which is connected to the taper section 1032, has the same dimension as the inner diameter of the portion of the taper section 1032 to which it is connected. Further, the inner diameter of the straight flow section 1037 continuously has the same dimension from the above-mentioned one end toward the other end. In other words, the straight flow section 1037 has a flowing path whose cross-section continuously has the same shape (in this case, round shape) from one end to the other end, and this flowing path whose cross-section continuously has the same shape forms a straight flowing path 1036.

These taper section 1032 and straight flow section 1037 are integrally formed as one part.

In such a gas-liquid mixing nozzle 1027, a pressurized gas is supplied from the gas introducing tube 1038, and when a process liquid is supplied from the process liquid introducing tube 1029, the gas and the process liquid are mixed inside the mixing chamber 1042 so that the process liquid forms a process liquid mist made of fine droplets. Then, the process liquid mist has its moving velocity accelerated through the tapered flowing path 1034 and the straight flowing path 1036, and the process liquid mist is finally sprayed from the tip of the straight flow section 1037. In this case, the pressure of the gas supplied from the gas introducing tube 1038 is adjusted so that the velocity of the process liquid mist to be finally sprayed from the straight flow section 1037 is accelerated to approximately sound velocity.

On the inner wall of the gas-liquid mixing nozzle 1027, particles might be generated due to failings from the inner wall since the gas and the process liquid collide therewith at high speeds. However, since at least the inner wall surface of the mixing chamber 1042, that is, the surface of the inner wall surface of the mixing section 1030, is allowed to have a smooth surface so that the possibility of the particles is reduced. Here, the irregularities of the surface of the inner wall surface of the mixing chamber 1042 are set to not more than 0.3 μm (preferably, not more than 0.1 μm) to form a smooth surface. Moreover, the mixing section 1030 is made from quartz and the taper section 1032 and the straight flow section 1037 is made from fluoro-resin so that it is possible to reduce elusion of contaminants caused by the process liquids.

In the case when the gas-liquid mixing nozzle 1027 is adopted as the remover liquid spray nozzle 1012, pressurized nitrogen gas is supplied to the gas introducing tube 1038 from a nitrogen supplying system 1093, which will be described later, and a remover liquid is supplied to the process liquid introducing tube 1029 from a remover liquid supplying system 1089. Thus, a remover liquid mist is sprayed from the remover liquid spray nozzle 1012.

Moreover, in the case when the gas-liquid mixing nozzle 1027 is adopted as the deionized water spray nozzle 1025, pressurized nitrogen gas is supplied to the gas introducing tube 1038 from the nitrogen supplying system 1093, and deionized water is supplied to the process liquid introducing tube 1029 from a deionized water supplying system 1091. Thus, a deionized water mist is sprayed from the deionized water spray nozzle 1025.

<3. Remover Liquid Supplying System, Deionized Water Supplying System, Nitrogen Supplying System>

Figure 6:
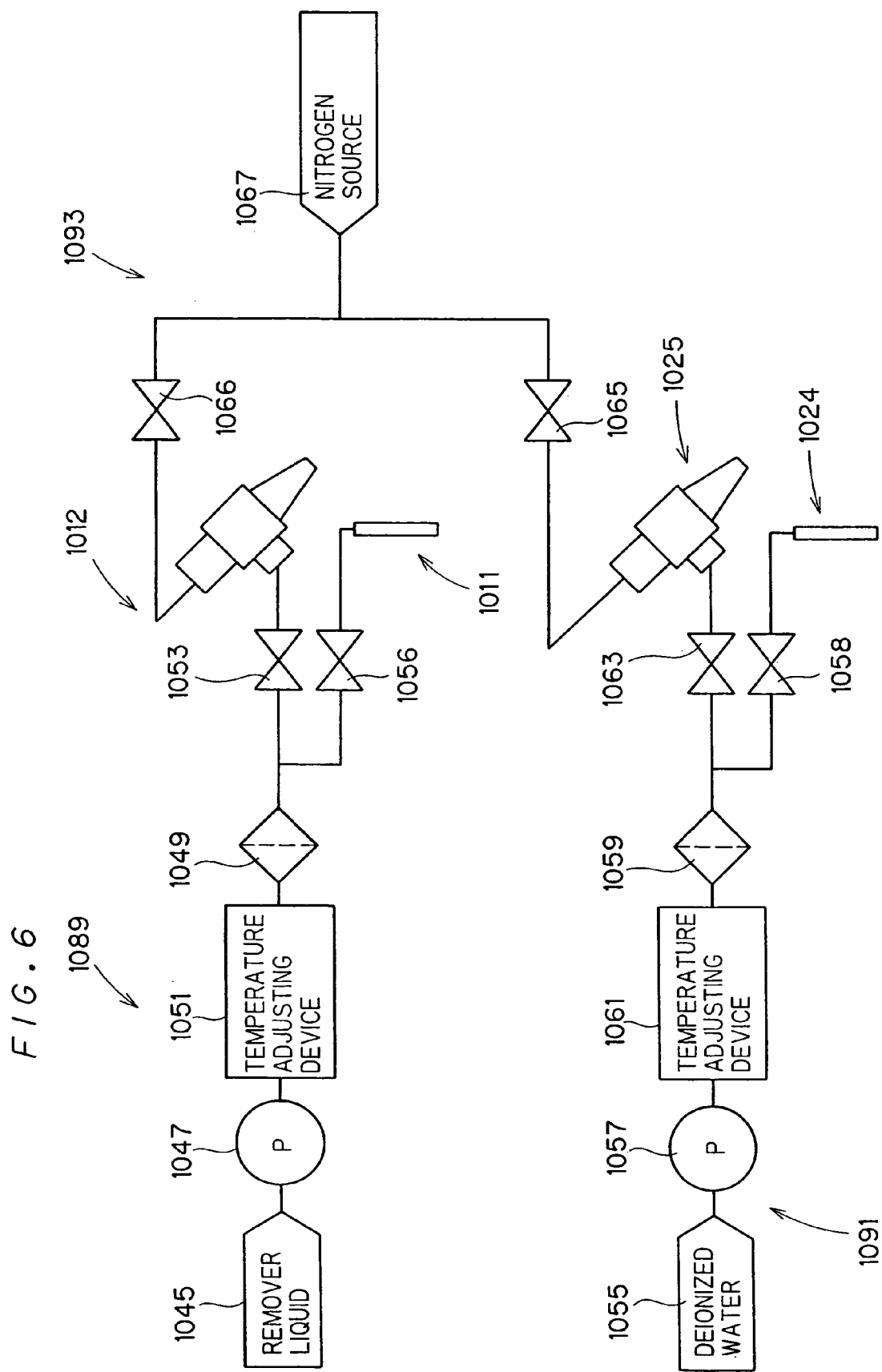
FIG. 6 is a drawing that shows a remover liquid supplying system 1089, a deionized water supplying system 1091 and a nitrogen supplying system 1093.
Figure 7:
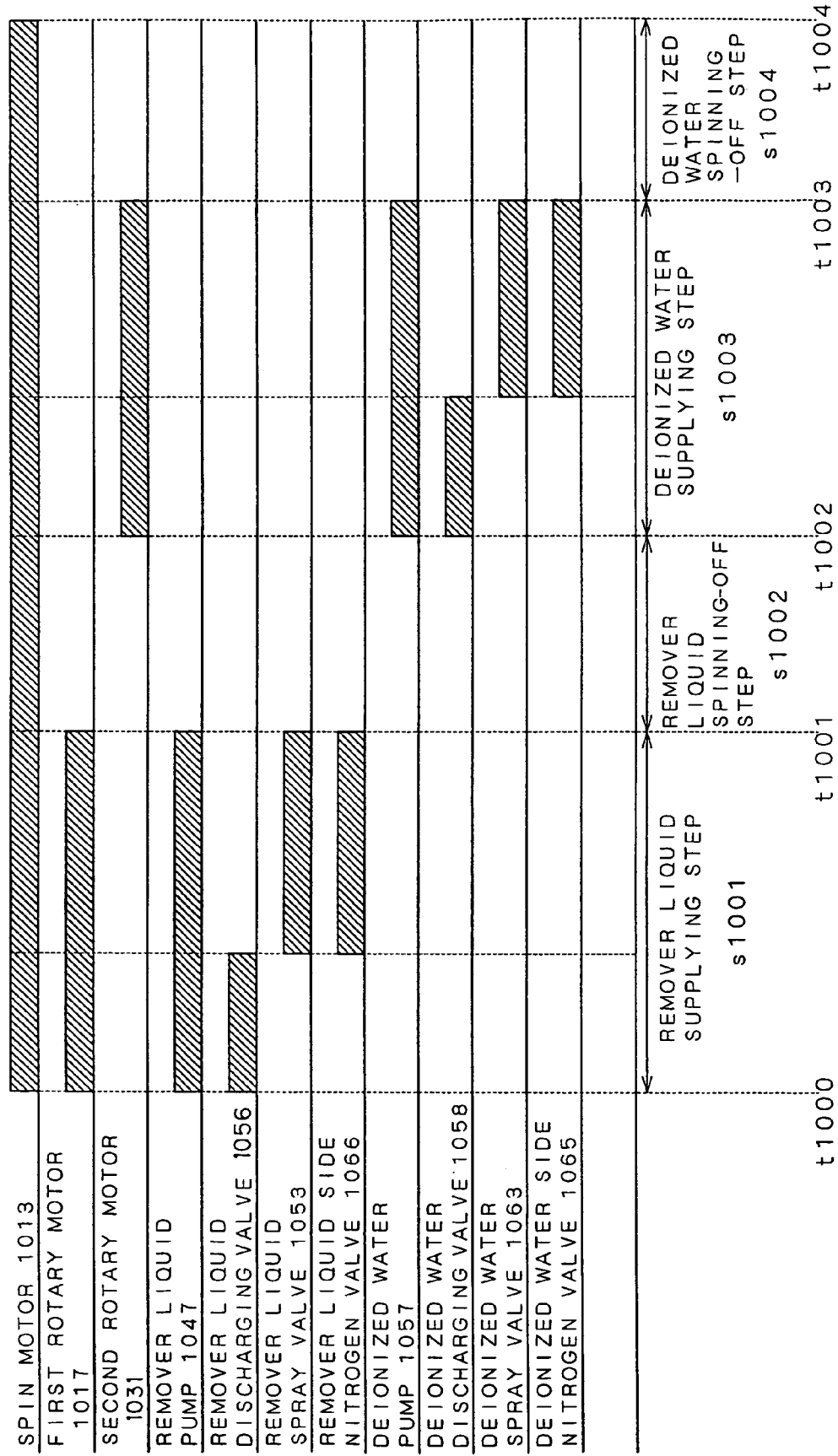
FIG. 7 is a detailed flow chart of the substrate processing method using the substrate processing apparatus 1001.

FIG. 6 shows the remover liquid supplying system 1089, the deionized water supplying system 1091 and the nitrogen supplying system 1093. The remover liquid supplying system 1089 is provided with a remover liquid pump 1047 for pumping the remover liquid from a remover liquid source 1045 outside the apparatus, a temperature-adjusting device 1051 for adjusting the temperature of the remover liquid by heating or cooling the remover liquid pumped out by the remover liquid pump 1047 to a predetermined temperature, a filter 1049 for filtering contaminants from the remover liquid that has been temperature-adjusted by the temperature-adjusting device 1051, and a remover liquid nozzle valve 1053 for opening and closing the flowing path of the filtered remover liquid to the remover liquid spray nozzle 1012.

This arrangement allows the remover liquid supplying system 1089 to supply the remover liquid that has been temperature-adjusted to a predetermined temperature by the temperature-adjusting device 1051 and purified by the filter 1049 to the remover liquid spray nozzle 1012.

Moreover, the remover liquid supplying system 1089 also has a remover liquid discharging valve 1056 for opening and closing the flowing path of the remover liquid having been filtered to a remover liquid discharging nozzle 1011, and the discharging and discharge-stopping operations of the remover liquid from the remover liquid discharging nozzle 1011 are controlled by opening and closing the remover liquid discharging valve 1056.

The deionized water supplying system 1091 is provided with a deionized water pump 1057 for pumping deionized water from a deionized water source 1055 outside the apparatus, a temperature-adjusting device 1052 for adjusting the temperature of the deionized water by heating or cooling the deionized water pumped out by the deionized water pump 1057 to a predetermined temperature, a filter 1059 for filtering contaminants from the deionized water that has been temperature-adjusted by the temperature-adjusting device 1052, and a deionized water spray valve 1063 for opening and closing the flowing path of the filtered deionized water liquid to the deionized water spray nozzle 1025.

This arrangement allows the deionized water supplying system 1091 to supply the deionized water that has been temperature-adjusted to a predetermined temperature by the temperature-adjusting device 1052 and purified by the filter 1059 to the deionized water spray nozzle 1025.

Moreover, the deionized water supplying system 1091 also has a deionized water discharging valve 1058 for opening and closing the flowing path of the deionized water having been filtered to a deionized water discharging nozzle 1024, and the discharging and discharge-stopping operations of the deionized water from the deionized water discharging nozzle 1024 are controlled by opening and closing the deionized water discharging valve 1058.

The nitrogen supplying system 1093 is provided with a nitrogen source 1067 for supplying pressurized nitrogen gas, a remover liquid side nitrogen valve 1066 for opening and closing the tube path from the nitrogen source 1067 to the remover liquid spray nozzle 1012, and a deionized water side nitrogen valve 1065 for opening and closing the tube path from the nitrogen source 1067 to the deionized water spray nozzle 1025. Thus, the supplying and supply-stopping operations of nitrogen gas to the remover liquid spray nozzle 1012 are controlled by opening and closing the remover liquid side nitrogen valve 1066, and the supplying and supply-stopping operations of nitrogen gas to the deionized water spray nozzle 1025 are controlled by opening and closing the deionized water side nitrogen valve 1065.

<4. Control Means>

Figure 5:
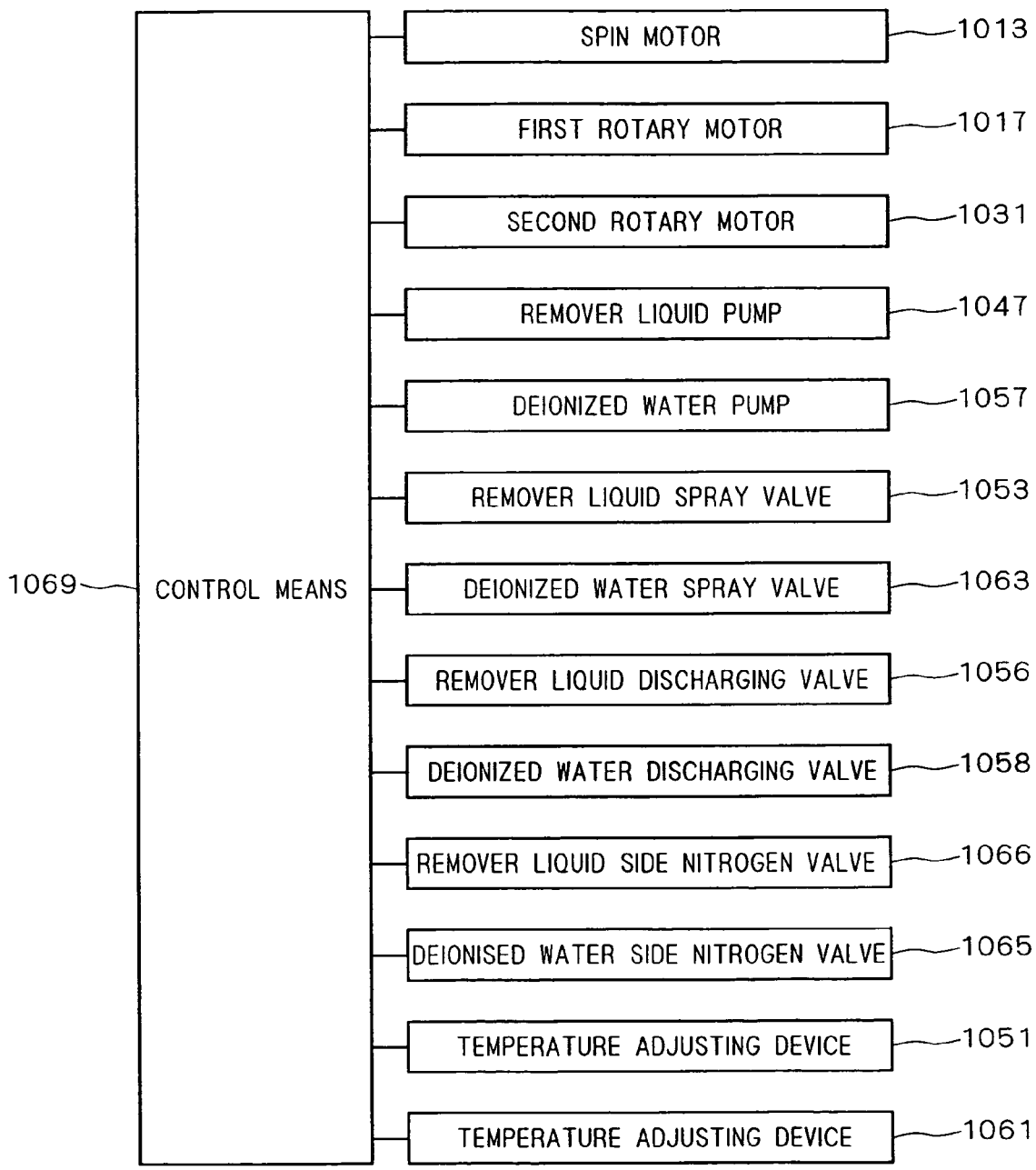
FIG. 5 is a drawing that shows a hardware construction of the substrate processing apparatus 1001.

FIG. 5 shows a control means 1069 of the substrate processing apparatus 1001.

To the control means 1069 are connected the spin motor 1013, the first rotary motor 1017, the second rotary motor 1031, the remover liquid pump 1047, the deionized water pump 1057, the remover liquid spray valve 1053, the deionized water spray valve 1063, the remover liquid discharging valve 1056, the deionized water discharging valve 1058, the remover liquid side nitrogen valve 1066, the deionized water side nitrogen valve 1065, the temperature-adjusting device 1051 and the temperature-adjusting device 1061. As will be described in a substrate processing method, the control means 1069 controls these devices connected thereto.

In the present substrate processing apparatus 1001, the gas-liquid mixing nozzle 1027 is adopted as the remover liquid spray nozzle 1012 and the deionized water spray nozzle 1025. Since the gas-liquid mixing nozzle 1027 has a straight flow section 1037, it is possible to regulate the remover liquid mist and the deionized water mist from dispersing. For this reason, the remover liquid mist and the deionized water mist are accelerated to a predetermined velocity, and the remover liquid mist and the deionized water mist are allowed to reach the substrate W with their velocity less attenuated.

In the present substrate processing apparatus 1001, the remover liquid mist and the deionized water mist from the remover liquid spray nozzle 1012 and the deionized water spray nozzle 1025 are sprayed with an angle of 45 degrees with respect to the surface of the substrate W. In general, each of them can be discharged in a direction tilted from the normal direction to the substrate W. In order to properly remove the reaction products of the side walls, the angle between the discharging direction of the remover liquid mist and the deionized water mist and the surface of the substrate W is preferably set in the range of not less than 30 degrees to not more than 60 degrees, in particular, at 45 degrees.

<5. Substrate Processing Method Using the Substrate Processing Apparatus 1001>

Figure 4:
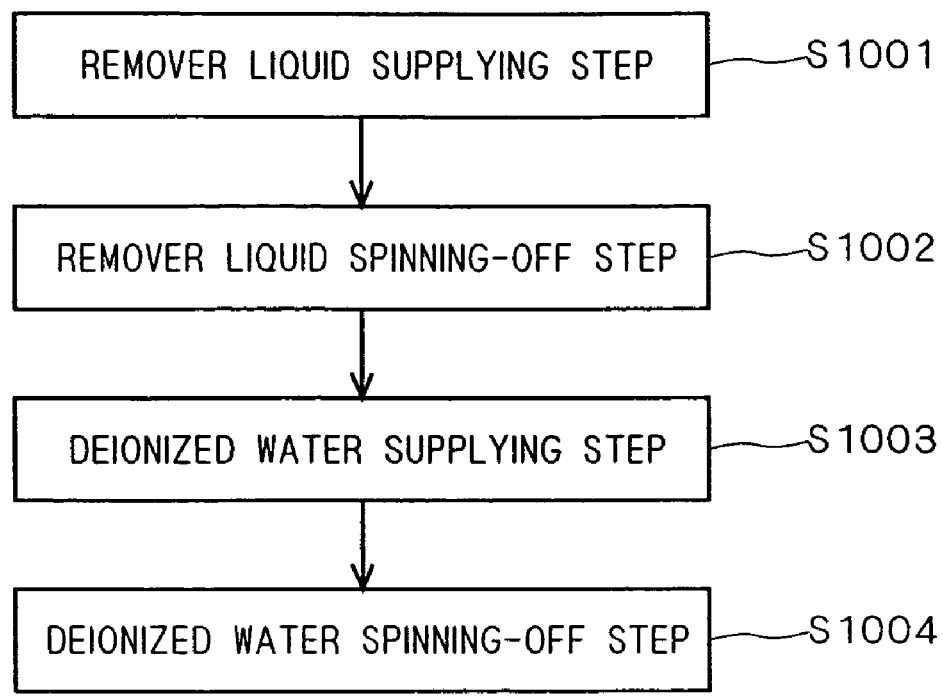
FIG. 4 is a flow chart that shows a substrate processing method using the substrate processing apparatus 1001.

As illustrated in FIG. 4, the present substrate processing method using the substrate processing apparatus 1001 includes a remover liquid supplying step s1001, a remover liquid spinning-off step s1002, a deionized water supplying step s1003, and a deionized water spinning-off step s1004. Referring to FIG. 4, the following description will discuss the respective steps.

In FIG. 4, the described respective elements are plotted on the axis of ordinates and the described times are plotted on the axis of abscissas. With respect to the valves, the opened state is indicated with hatching and with respect to the other factors, the operative state is indicated with hatching.

(1. Remover Liquid Supplying Step s1001)

First, the control means 1069 has controlled the temperature-adjusting devices 1051 and 1061 so that the temperatures of the remover liquid and deionized water are set to predetermined temperatures before the sequence has reached the time t1000.

Moreover, before the sequence has reached the time t1000, the control means 1069 drives the spin motor 1013 to rotate the substrate W so that at the time t1000, the substrate W is being rotated at a predetermined number of revolutions.

Then at the time t1000, the control means 1069 rotates the first rotary motor 1017.

Furthermore, at the time t1000, the control means 1069 drives the remover liquid pump 1047 with the remover liquid discharging valve 1058 being opened so that the remover liquid is supplied to the substrate W from the remover liquid discharging nozzle 1011. Thus, the substrate W is supplied with a comparatively large amount of the remover liquid, with the result that the reaction products on the substrate W start to swell.

Next, after a lapse of a first predetermined time period from time t1000, the remover liquid discharging valve 1058 is closed to stop the supply of the remover liquid from the remover liquid discharging nozzle 1011, while the remover liquid spray valve 1053 and the remover liquid side nitrogen valve 1066 are opened so that the remover liquid mist is sprayed from the remover liquid spray nozzle 1012 onto the substrate W. Thus, the remover liquid mist, which has been accelerated to approximately sound velocity, is sprayed onto the reaction products that are swelling and softening. Thus, the remover liquid is firmly driven into the reaction products, thereby allowing the reaction products to further swell, and the swelled reaction products come off the substrate W.

Moreover, since the remover liquid spray nozzle 1012 sprays the remover liquid mist with an angle of 45 degrees with respect to the substrate W, the remover liquid mist is allowed to reach the reaction products adhering to the irregular side walls of the substrate W without being weakened in its force against the reaction products. Consequently, it is possible to further accelerate the swelling and coming off of the reaction products from the substrate W.

The first predetermined time period is a period of time from the time t1000 to the time at which the reaction products on the substrate W start to swell by the remover liquid supplied from the remover liquid discharging nozzle 1011, and this has been preliminarily found through experiments.

Then, at the time t1001, the control means 1069 stops the driving operation of the first rotary motor 1017 with the remover liquid spray nozzle 1012 having retreated from a position above the cup 1003. Moreover, the control means 1069 closes the remover liquid spray valve 1053 and the remover liquid side nitrogen valve 1086, and also stops the driving operation of the remover liquid pump 1047 so as to stop the supply of the remover liquid from the remover liquid supplying section 1007.

(2. Remover Liquid Spinning-Off Step s1002)

Next, at the time t1001, the control means 1069 stops the supply of the remover liquid to the substrate W, while it successively rotates the spin motor 1013 so as to maintain the rotating state of the substrate W. Thus, a remover liquid spinning-off step s1002 is executed.

In this remover liquid spinning-off step s1002, the substrate W is rotated at not less than 500 rpm, more preferably, in the range from 1000 rpm to 4000 rpm.

Moreover, the time during which the rotation is maintained is set to not less than 1 second, preferably, in the range of 2 to 5 seconds.

In this manner, the rotating state of the substrate is maintained with the supply of the remover liquid being stopped with respect to the substrate W, the remover liquid on the substrate W is spun off from the substrate W by a centrifugal force.

(3. Deionized Water Supplying Step s1003)

At the time t1002, the control means 1069 rotates the second rotary motor 1031.

At the time t1002 also, the control means 1069 drives the deionized water pump 1057 so as to supply deionized water from the deionized water discharging nozzle 1024 with the deionized water discharging valve 1058 being open. Thus, the substrate W is supplied with a comparatively large amount of deionized water so that the reaction products that have swelled on the substrate W start to be washed away.

Next, after a lapse of a second predetermined time period from the time t1002, the deionized water discharging valve 1058 is closed to stop the supply of the deionized water from the deionized water discharging nozzle 1024, while the deionized water spray valve 1053 and the deionized water side nitrogen valve 1065 are opened so that the deionized water mist is sprayed from the deionized water spray nozzle 1025 onto the substrate W. Thus, the deionized water mist, which has been accelerated to approximately sound velocity, is sprayed onto the reaction products that are swelling and softening, with the result that the reaction products come off the substrate W.

Moreover, since the deionized water spray nozzle 1025 sprays the deionized water mist with an angle of 45 degrees with respect to the substrate W, the deionized water mist is allowed to reach the reaction products adhering to the irregular side walls of the substrate W without being weakened in its force against the reaction products. Consequently, it is possible to further accelerate the coming off of the reaction products from the substrate W. In general, the mist can be discharged in a direction tilted from the normal to the substrate W.

The second predetermined time period is a period of time from the time t1002 to the time at which the reaction products on the substrate W have come off to a certain degree by the deionized water supplied from the deionized water discharging nozzle 1024, and this has been preliminarily found through experiments.

Then, at the time t1003, the control means 1069 stops the driving operation of the second rotary motor 1031 with the deionized water spray nozzle 1025 having retreated from a position above the cup 1003. Moreover, the control means 1069 closes the deionized water spray valve 1053 and the deionized water side nitrogen valve 1065, and also stops the driving operation of the deionized water pump 1057 so as to stop the supply of the deionized water from the deionized water supplying section 1009.

(4. Deionized Water Spinning-Off Step s1004)

At the time t1003, the control means 1069 stops the supply of the deionized water to the substrate W, while it successively rotates the spin motor 1013 so as to maintain the rotating state of the substrate W. Thus, a deionized water spinning-off step s1004 is executed.

In this manner, by supplying the remover liquid and deionized water to the substrate W, the reaction products are removed therefrom.

In accordance with the present substrate processing method, until the first predetermined time period has elapsed since the start of the remover liquid supplying step s1001, dense current of the liquid-state remover liquid is continuously supplied from the remover liquid discharging nozzle 1011, however, after the lapse of the first predetermined time, the remover liquid mist is supplied from the remover liquid spray nozzle 1012. Thus, in comparison with a case in which dense current (non-mist current) of the remover liquid is continuously supplied from the remover liquid discharging nozzle 1011 for the entire remover liquid supplying process s1001, it is possible to reduce the amount of consumption of the remover liquid. Moreover, since the high-speed remover liquid mist is discharged from the remover liquid spray nozzle 1012, the time required for the swelling of the reaction products on the substrate W and coming-off thereof from the substrate W is shortened, thereby making it possible to improve the throughput.

Furthermore, until the second predetermined time period has elapsed since the start of the deionized water supplying step s1003, dense current of the deionized water is continuously supplied from the deionized water discharging nozzle 1024, however, after the lapse of the second predetermined time period, the deionized water mist is supplied from the deionized water spray nozzle 1025. Thus, in comparison with a case in which dense current of the deionized water is continuously supplied from the deionized water discharging nozzle 1024 for the entire deionized water supplying process s1003, it is possible to reduce the amount of consumption of the deionized water. Moreover, since the high-speed deionized water mist is discharged from the deionized water spray nozzle 1025, the time period required for the coming-off of the reaction products from the substrate W is shortened, thereby making it possible to improve the throughput.

In accordance with the present substrate processing method, at the remover liquid spinning-off step s1002, the remover liquid on the substrate W is spun off so that the remover liquid remaining on the substrate W becomes very little, or no longer exists. Therefore, in the case when, in this state, the deionized water is supplied to the substrate W at the deionized water supplying step s1003, the amount of the remover liquid that comes to contact the deionized water becomes very little or none. Therefore, even in the event of a pH shock, hardly any adverse effect is given to the substrate W, or no pH shock occurs.

Moreover, in the present substrate processing method, until the first predetermined time period has elapsed since the time t1000, dense current of the remover liquid is supplied from the remover liquid discharging nozzle 1011, and up to the time t1001 after the lapse of the first predetermined time, the remover liquid mist is sprayed onto the substrate W from the remover liquid spray nozzle 1012. Instead of this arrangement, the following method may be adopted.

That is, the remover liquid mist may be supplied from the remover liquid spray nozzle 1012 from the time t1000 to the time t1001. In this case, it is not necessary to install the remover liquid discharging nozzle 1011 in the substrate processing apparatus 1001.

Moreover, until a predetermined time period has elapsed from the time t1000, the remover liquid mist may be supplied from the remover liquid spray nozzle 1012, and after the lapse of the predetermined time period, dense current of the remover liquid may be supplied from the remover liquid discharging nozzle 1011.

In the present substrate processing method, until the second predetermined time period has elapsed since the time t1002, dense current of the deionized water is supplied from the deionized water discharging nozzle 1024, and up to the time t1003 after the lapse of the second predetermined time period, the deionized water mist is sprayed onto the substrate W from the deionized water spray nozzle 1025, however, instead of this arrangement, the following method may be adopted.

That is, the deionized water mist may be supplied from the deionized water spray nozzle 1025 from time t1002 to time t1003. In this case, it is not necessary to install the deionized water discharging nozzle 1024 in the substrate processing apparatus 1001.

Moreover, until a predetermined time period has elapsed from the time t1002, the deionized water mist may be supplied from the deionized water spray nozzle 1025, and after the lapse of the predetermined time period, the liquid-state deionized water may be supplied from the deionized water discharging nozzle 1024.

<6. Substrate Processing Apparatus 1100>

Figure 8:
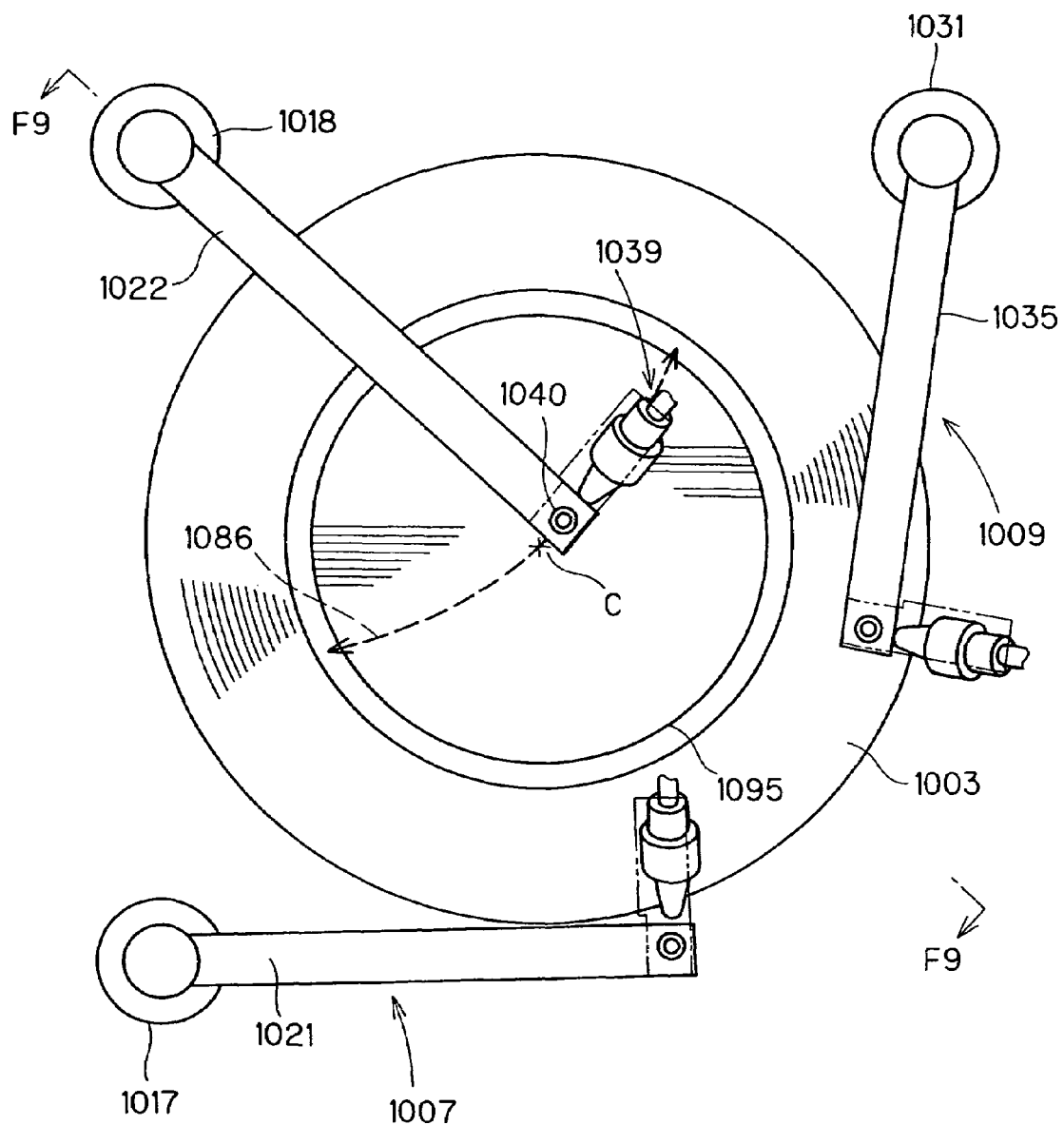
FIG. 8 is a top view of the substrate processing apparatus 1100.

Referring to FIGS. 8 and 9, an explanation will be given of a substrate processing apparatus 1100. FIG. 9 is a cross-sectional view taken along line F9-F9 of FIG. 8; and, for convenience of explanation, hatching is omitted from some portions.

The substrate processing apparatus 1100 is provided with a solvent supplying section 1002 serving as an intermediate rinse supplying section, in addition to the aforementioned substrate processing apparatus 1001. The substrate processing apparatus 1100 has many parts that are in common with the substrate processing section 1001. Therefore, the same parts as the substrate processing apparatus 1001 are indicated by the same reference numerals, and the description thereof is omitted.

The substrate processing apparatus 1100 has the solvent supplying section 1002, and the solvent supplying section 1002, which is secured to the apparatus frame is provided with a third rotary motor 1018 having a driving shaft placed in the vertical direction, a third rotary shaft 1020 secured to the rotary shaft of the third rotary motor 1018 and a third arm 1022 connected to the top of the third rotary shaft 1020.

A solvent discharging nozzle 1040 is installed on the tip of the third arm 1022. The solvent discharging nozzle 1040 is a tube-shaped member with its length direction set virtually in the vertical direction, and an organic solvent is supplied to one end thereof with the other end supplying the organic solvent to the substrate W.

Moreover, a solvent spray nozzle 1039 is attached to the same tip of the third arm 1022 through a bracket 1041 (indicated by an alternate long and two short dashes line in FIG. 9). The solvent spray nozzle 1039, which sprays a solvent mist as will be described later, is arranged so as to spray the solvent mist with an inclination of 45 degrees with respect to the surface of the substrate W.

The solvent discharging nozzle 1040 and solvent spray nozzle 1039 are arranged so that the organic solvent discharged from the organic solvent discharging nozzle 1040 and the solvent mist sprayed from the solvent spray nozzle 1039 are allowed to intersect each other on the surface of the substrate W, and so that, when the solvent discharging nozzle 1040 and the solvent spray nozzle 1039 are allowed to pivot by the third rotary motor 1018, the organic solvent discharged from the solvent discharging nozzle 1040 and the solvent mist sprayed from the solvent spray nozzle 1039 are reciprocally shifted, as illustrated in FIG. 9, on a circular arc 1086 that passes through the rotation center C of the substrate W and also intersects a rotation circle 1095 that the end edge of the rotating substrate W forms at two points on the circumference thereof.

The gas-liquid mixing nozzle 1027 shown in FIG. 3 is used as the solvent spray nozzle 1039, and pressurized nitrogen gas is supplied to the gas introducing tube 1038 from a nitrogen supplying system 1094, which will be described later, and an organic solvent is supplied from a solvent supplying system 1090 to the process liquid introducing tube 1029. Thus, the solvent mist is sprayed from the solvent spray nozzle 1039.

<7. Solvent Supplying System>

Figure 11:
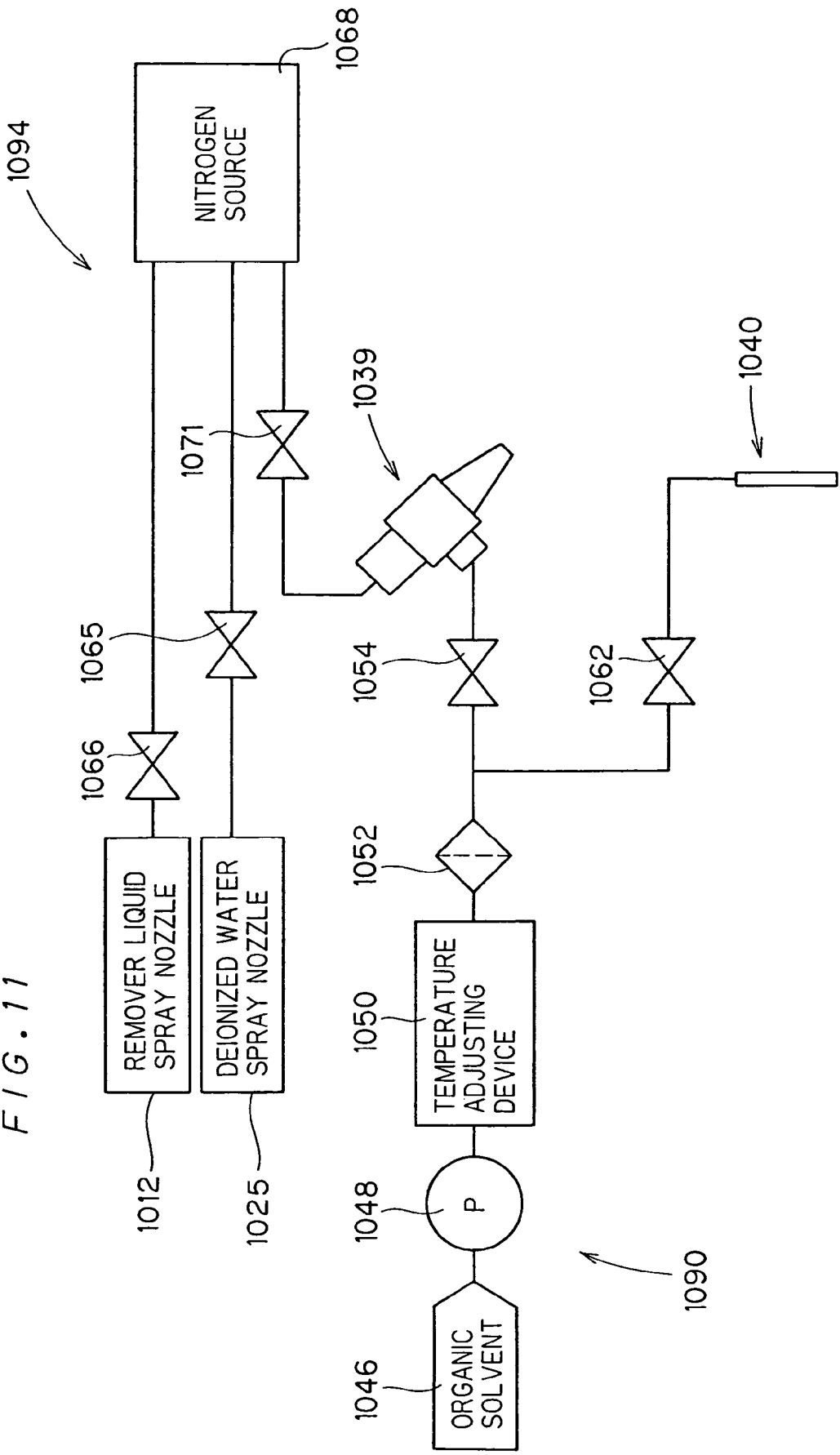
FIG. 11 is a drawing that shows a solvent supplying system 1090 and a nitrogen supplying system 1094.

FIG. 11 shows the solvent supplying system 1090 and the nitrogen supplying system 1094.

The solvent supplying system 1090 is provided with a solvent pump 1048 for pumping the organic solvent from an organic solvent source 1046 outside the apparatus, a temperature-adjusting device 1050 for adjusting the temperature of the organic solvent by heating or cooling the organic solvent pumped out by the solvent pump 1048 to a predetermined temperature, a filter 1052 for filtering contaminants from the organic solvent that has been temperature-adjusted by the temperature-adjusting device 1050, and a solvent spray valve 1054 for opening and closing the flowing path of the filtered organic solvent to the organic solvent spray nozzle 1039.

This arrangement allows the solvent supplying system 1090 to supply the organic solvent that has been temperature-adjusted to a predetermined temperature by the temperature-adjusting device 1050 and purified by the filter 1052 to the organic solvent spray nozzle 1012.

Moreover, the solvent supplying system 1090 also has a solvent discharging valve 1062 for opening and closing the flowing path of the organic solvent having been filtered to a solvent discharging nozzle 1040, and the discharging and discharge-stopping operations of the organic solvent from the solvent discharging nozzle 1040 are controlled by opening and closing the solvent discharging valve 1062.

The nitrogen supplying system 1094 is provided with a nitrogen source 1068 for supplying pressurized nitrogen gas, a remover liquid side nitrogen valve 1066 for opening and closing the tube path from the nitrogen source 1068 to the remover liquid spray nozzle 1012, a deionized water side nitrogen valve 1065 for opening and closing the tube path from the nitrogen source 1068 to the deionized water spray nozzle 1025, and a solvent side nitrogen valve 1071 for opening and closing the tube path toward the solvent spray nozzle 1039. Thus, the supplying and supply-stopping operations of nitrogen gas to the remover liquid spray nozzle 1012 are controlled by opening and closing the remover liquid side nitrogen valve 1066, the supplying and supply-stopping operations of nitrogen gas to the deionized water spray nozzle 1025 are controlled by opening and closing the deionized water side nitrogen valve 1065, and the supplying and supply- stopping operations of nitrogen gas to the solvent spray nozzle 1039 are controlled by opening and closing the solvent side nitrogen valve 1071.

Moreover, the substrate processing apparatus 1100 has a control means and in the same manner as the control means 1069 of the substrate processing apparatus 1001, to the control means are connected the spin motor 1013, the first rotary motor 1017, the second rotary motor 1031, the remover liquid pump 1047, the deionized water pump 1057, the remover liquid spray valve 1053, the deionized water spray valve 1083, the remover liquid discharging valve 1056, the deionized water discharging valve 1058, the remover liquid side nitrogen valve 1066, the deionized water side nitrogen valve 1065, the temperature-adjusting device 1051 and the temperature-adjusting device 1061, and to the control means are further connected the third rotary motor 1018, the solvent pump 1048, the solvent spray valve 1054, the solvent discharging valve 1062, the solvent side nitrogen valve 1071 and the temperature-adjusting device 1050.

In the present substrate processing apparatus 1100, the gas-liquid mixing nozzle 1027 is used as the solvent spray nozzle 1039. Since the gas-liquid mixing nozzle 1027 has the straight flow section 1037, the dispersion of the solvent mist is regulated. For this reason, the solvent mist is accelerated to a predetermined velocity, and the solvent mist is allowed to reach the substrate W with its velocity being less attenuated.

In the present substrate processing apparatus 1100, the solvent spray nozzle 1039 discharges the solvent mist with an angle of 45 degrees with respect to the surface of the substrate W. In general, it can be discharged in a direction tilted from the normal direction to the substrate W, in order to properly remove the reaction products on side walls, the angle between the discharging direction of the solvent mist and the top major surface of the substrate W is preferably set in the range of 30 degrees to 60 degrees, more preferably, at 45 degrees.

<8. Substrate Processing Method Using the Substrate Processing Apparatus 1100>

Referring to FIG. 10, an explanation will be given of a substrate processing method in which the above-mentioned substrate processing apparatus 1100 is used.

The present substrate processing method using the substrate processing apparatus 1100 includes a remover liquid supplying step s1031, a remover liquid spinning-off step s1032, a solvent supplying step s1033 serving as an intermediate rinse process, a deionized water supplying step s1034, and a deionized water spinning-off step s1035.

The present substrate processing method is virtually the same as the substrate processing method using the substrate processing apparatus 1001 having the remover liquid supplying step s1001, the remover liquid spinning-off step s1002, the deionized water supplying step s1003 and the deionized water spinning-off step s1004, except that the solvent supplying step is interpolated between the remover liquid spinning-off step s1002 and the deionized water supplying step s1003.

Therefore, the above-mentioned remover liquid supplying step s1031, the remover liquid spinning-off step s1032, the deionized water supplying step s1034 and the deionized water spinning-off step s1035 are respectively the same as the remover liquid supplying step s1001, the remover liquid spinning-off step s1002, the deionized water supplying step s1003 and the deionized water spinning-off step s1004 in the substrate processing method using the substrate processing apparatus 1001. Therefore, the description thereof is omitted.

Figure 12:
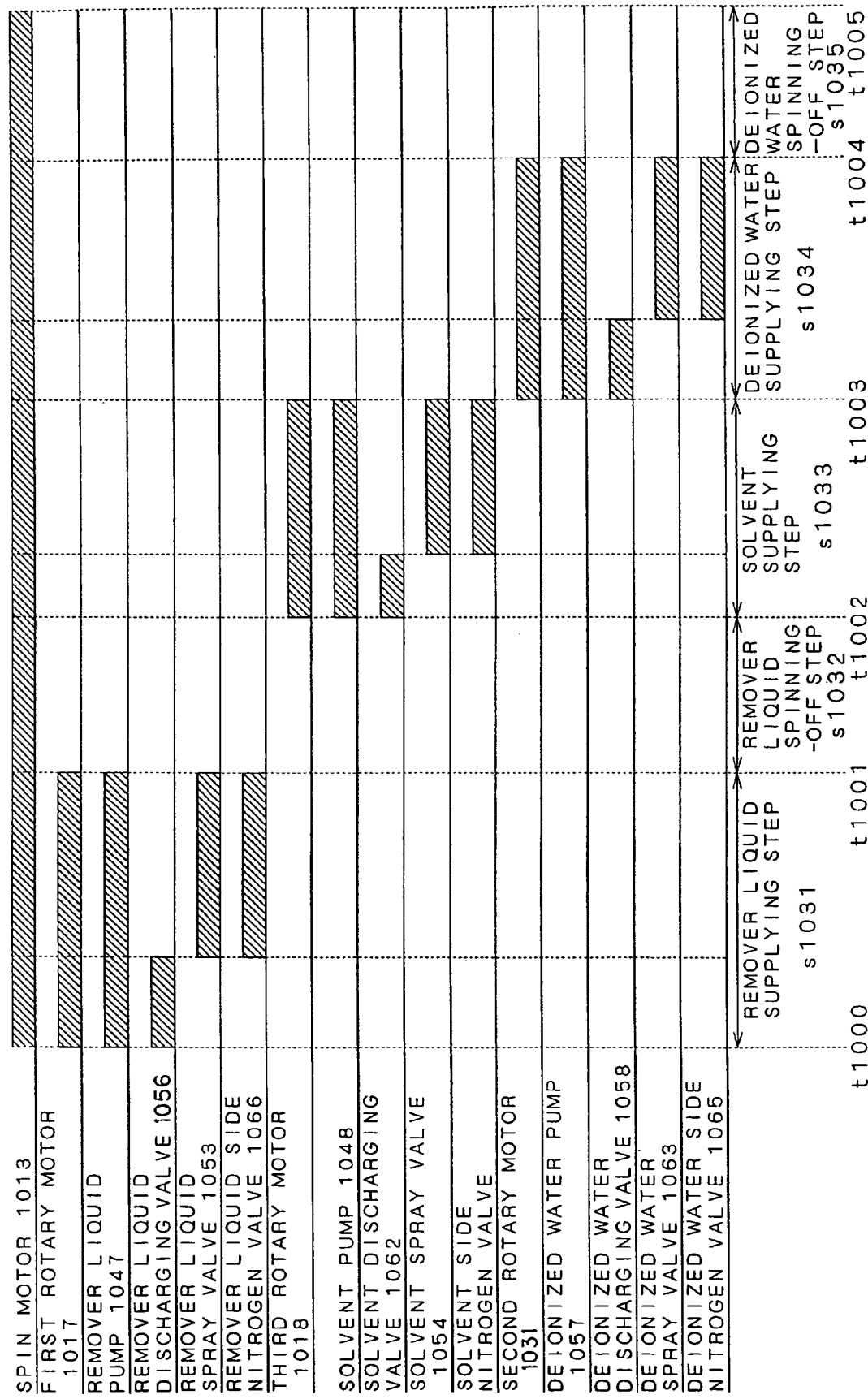
FIG. 12 is a detailed flow chart that shows the substrate processing method using the substrate processing apparatus 1100.

Next, referring to FIG. 12, the following description will discuss the solvent supplying process s1033. In FIG. 12, the described respective elements are plotted on the axis of ordinates and the described times are plotted on the axis of abscissas. With respect to the valves, the opened state is indicated with hatching, and with respect to the other factors, the operative state is indicated with hatching.

The solvent supplying step s1033 is carried out after the remover liquid supplying step s1031 and the remover liquid spinning-off step s1032 have been finished. In the remover liquid spinning-off step s1032, the substrate is kept rotating with the supply of the remover liquid to the substrate W being stopped so that the remover liquid on the substrate W is spun off from the substrate W by a centrifugal force. Thus, the remover liquid remaining on the substrate W is reduced to a minimum.

At the time t1002, the control mean rotates the third rotary motor 1018.

At the time t1002 also, the control means drives the solvent pump 1048 so as to supply the organic solvent from the solvent discharging nozzle 1040, with the solvent discharging valve 1062 being opened. Thus, the substrate W is supplied with a comparatively large amount of the organic solvent so that the remover liquid on the substrate W starts to be washed away.

Next, after a lapse of a third predetermined time period since the time t1002, the solvent discharging valve 1062 is closed so that the supply of the organic solvent from the solvent discharging nozzle 1040 is stopped, and the solvent spray valve 1054 and the solvent side nitrogen valve 1071 are opened so that the solvent mist is sprayed from the solvent spray nozzle 1039 toward the substrate W. Thus, the solvent mist, which has been accelerated to approximately sound velocity, is sprayed onto the reaction products that have swelled and softened, with the result that the reaction products come off from the substrate W.

Moreover, since the solvent spray nozzle 1039 sprays the solvent mist with an angle of 45 degrees with respect to the major surface of the substrate W, the solvent mist is allowed to reach the reaction products adhering to the irregular side walls of the substrate W without being weakened in its force against the reaction products. Consequently, it is possible to further accelerate the swelling and coming-off of the reaction products from the substrate W. Thus, it becomes possible to shorten the time required for the process. In general, the mist can be discharged in a direction tilted from the normal to the substrate W.

The third predetermined time period is a period of time from the time t1002 to the time at which the remover liquid on the substrate W has been washed away to a certain degree by the organic solvent supplied from the solvent discharging nozzle 1040, and this has been preliminarily found through experiments.

Then, at the time t1003, the control means stops the driving operation of the third rotary motor 1018 with the solvent spray nozzle 1039 having retreated from a position above the cup 1003. Moreover, the control means closes the solvent spray valve 1054 and the solvent side nitrogen valve 1071, and also stops the driving operation of the solvent pump 1048 so as to stop the supply of the organic solvent from the solvent spray nozzle 1039.

In this manner, in the solvent supplying step s1033, the organic solvent is supplied to the substrate W so that the remover liquid is washed away from the substrate W. For this reason, even when deionized water is supplied to the substrate W in the succeeding deionized water supplying step s1034, no remover liquid contacting the deionized water exists, thereby making it possible to prevent the occurrence of a pH shock. Consequently, it is possible to prevent the resulting damages to the thin films on the substrate W.

In accordance with the present substrate processing method, at the remover liquid spinning-off step s1032, the remover liquid on the substrate W is spun off so that the remover liquid remaining on the substrate W at this point of time is very little. For this reason, it is possible to shorten the time required for the organic solvent to remove the remover liquid at the solvent supplying step s1033. Thus, it is possible to improve the throughput. In the same manner, since the remover liquid remaining on the substrate W is very little, it is possible to reduce the amount of the organic solvent required for the solvent supplying process s1033, and consequently to reduce the costs.

In the present substrate processing method, immediately after the solvent supplying step s1033, the deionized water supplying process s1034 is executed. However, a solvent spinning-off step for spinning the solvent off from the substrate W may be interpolated between the solvent supplying step s1033 and the deionized water supplying step s1034.

Moreover, in the present substrate processing method, the rotation of the substrate W has not been stopped from the start of the remover liquid supplying step s1031 to the completion of the deionized water spinning-off step s1035. However, the rotation of the substrate W may be stopped in any one of the intervals between the remover liquid supplying step s1031 and the remover liquid spinning-off step s1032, between the remover liquid spinning-off step s1032 and the solvent supplying step s1033, between the solvent supplying step s1033 and the deionized water supplying step s1034, and between the deionized water supplying step s1034 and the deionized water spinning-off process s1035.

Moreover, in the present substrate processing method, until the first predetermined time has elapsed since time t1000, the liquid-state remover liquid is supplied from the remover liquid discharging nozzle 1011, and up to time t1001 after the lapse of the first predetermined time, the remover liquid mist is sprayed onto the substrate W from the remover liquid spray nozzle 1012. However, instead of this arrangement, the following method may be adopted.

That is the remover liquid mist may be supplied from the remover liquid spray nozzle 1012 from the time t1000 to the time t1001. In this case, it is not necessary to install the remover liquid discharging nozzle 1011 in the substrate processing apparatus 1100.

Moreover, until a predetermined time has elapsed from the time t1000, the remover liquid mist may be supplied from the remover liquid spray nozzle 1012, and up to the time t1001 after the lapse of the predetermined time, the liquid-state remover liquid may be supplied from the remover liquid discharging nozzle 1011.

Moreover, in the present substrate processing method, until the third predetermined time period has elapsed since the time t1002, the liquid-state organic solvent is supplied from the solvent discharging nozzle 1040, and up to the time t1003 after the lapse of the third predetermined time, the solvent mist is sprayed onto the substrate W from the solvent spray nozzle 1039. However, instead of this arrangement, the following method may be adopted.

That is, the solvent mist may be supplied from the solvent spray nozzle 1039 from the time t1002 to the time t1003. In this case, it is not necessary to install the solvent discharging nozzle 1040 in the substrate processing apparatus 1100. Moreover, until a predetermined time has elapsed from the time t1002, the solvent mist may be supplied from the solvent spray nozzle 1039, and up to the time t1003 after the lapse of the predetermined time period, organic solvent in the form of dense-liquid current may be supplied from the solvent discharging nozzle 1040.

Moreover, in the present substrate processing method, until the second predetermined time period has elapsed since time t1002, the liquid-state deionized water is supplied from the deionized water discharging nozzle 1024, and up to the time t1004 after the lapse of the second predetermined time period, the deionized water mist is sprayed onto the substrate W from the deionized water spray nozzle 1025. However, instead of this arrangement, the following method may be adopted.

That is, the deionized water mist may be supplied from the deionized water spray nozzle 1025 from the time t1003 to the time t1004. In this case, it is not necessary to install the deionized water discharging nozzle 1024 in the substrate processing apparatus 1100.

Moreover, until a predetermined time period has elapsed from the time t1003, the deionized water mist may be supplied from the deionized water spray nozzle 1025, and up to the time t1004 after the lapse of the predetermined time period, dense-current of the deionized water may be supplied from the deionized water discharging nozzle 1024.

Furthermore, in the present preferred embodiment, a sequence of processes including the remover liquid supplying step s1031, the remover liquid spinning-off step s1032, the solvent supplying step s1033, the deionized water supplying step s1034 and the deionized water spinning-off step s1035 is carried out only once. However, this sequence of processes may be repeated several times.

<9. Supplement>

In the above-mentioned substrate processing apparatuses 1001, 1100, the holding rotary section rotates the substrate while maintaining it horizontally. However, the holding rotary section may rotate the substrate with its major surface being tilted with respect the horizontal plane, or may rotate the substrate with its major surface being maintained in the vertical direction.

Moreover, in the above-mentioned substrate processing apparatuses 1001, 1100, the holding rotary section holds only one substrate. However, the holding rotary section may be designed to hold a plurality of substrates.

In the above-mentioned substrate processing apparatuses 1001, 1100, nitrogen gas supplying systems 1093, 1094 for supplying nitrogen gas to the remover liquid spray nozzle 1012, the deionized water spray nozzle 1025 and the solvent spray nozzle 1039 are installed. Instead of the nitrogen sources 1067, 1068 of the nitrogen supplying systems 1093, 1094, pressurized air sources for supplying pressurized air may be installed, and instead of the nitrogen supplying systems 1093, 1094, pressurized air supplying systems may be installed. In this case, the process liquid mists are formed by pressurized air.

Moreover, in the above-mentioned substrate processing apparatuses 1001, 1100, nitrogen gas is supplied to the remover liquid spray nozzle 1012, the deionized water spray nozzle 1025 and the solvent spray nozzle 1039 so that when the process liquid mists are supplied to the substrate having metal films, it is possible to prevent oxidation of the metal films, and consequently to reduce degradation in the quality of the processed substrate. Example of the metal films include aluminum films. In particular, in the case of copper (Cu) that is easily oxidized, the present invention is effectively applied to a substrate having copper films. In this case, an inert gas such as argon may be used in place of nitrogen gas with the same effects.

In the substrate processing apparatus 1001, the gas-liquid mixing nozzle 1027 is applied to both of the remover liquid supplying section 1007 and the deionized water supplying section 1009. This may be applied to either of them.

Moreover, in the substrate processing apparatus 1100, the gas-liquid mixing nozzle 1027 is applied to all the three parts, that is, the remover liquid supplying section 1007, the deionized water supplying section 1009 and the solvent supplying section 1002. This may be applied to any one or any two of them.

Furthermore, in the above-mentioned substrate processing apparatuses 1001, 1100, the substrate treatment deals with a substrate having a surface on which polymers are formed through dry-etching. The present substrate treatment is more effectively applied to a substrate that has been further subjected to ashing after the dry-etching.

The ashing is carried out with a substrate having a resist film being placed in an oxygen plasma, and after the ashing, more polymers are generated. For this reason, in the case when a process for removing polymers from the substrate that has been subjected to the dry-etching and ashing, the present invention makes it possible to further improve the throughput, and to reduce the costs more effectively.

In the above-mentioned substrate processing apparatuses 1001, 1100, even in the case when the reaction products are accumulated on the substrate W in a protruding form, the process liquid mist is discharged onto the substrate W in a direction tilted with respect to the substrate W so that the reaction products, accumulated in the protruding form, is broken by the process liquid mist that is discharged thereto with high speeds. For this reason, it is possible to finish the removing process of the reaction products more quickly.

B. Preferred Embodiments According to Second Aspect of the Present Invention

1. First Preferred Embodiment

Figure 13:
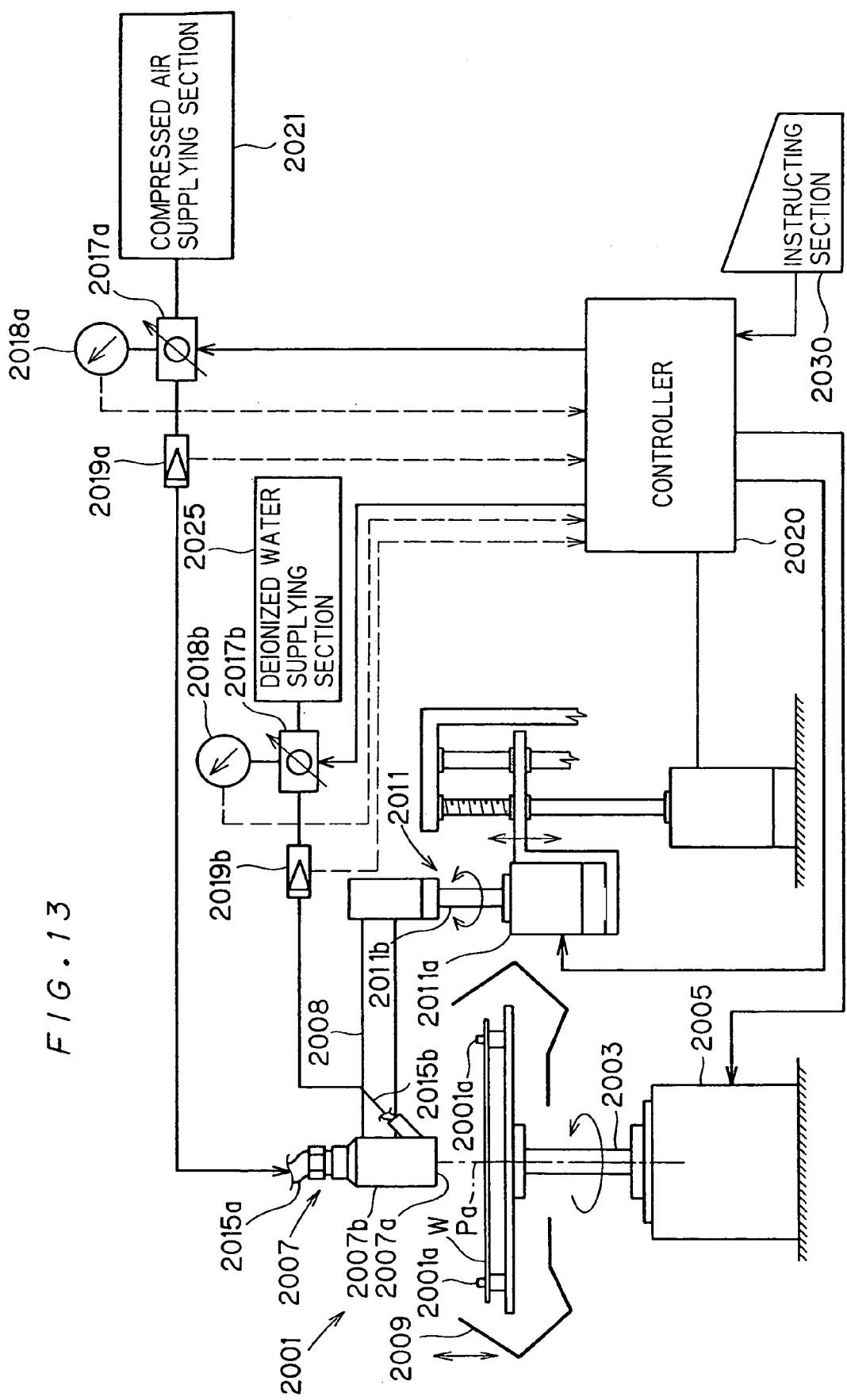
FIG. 13 is a drawing that shows a schematic construction of a substrate cleaning device in accordance with a first preferred embodiment of a second aspect.
Figure 14:
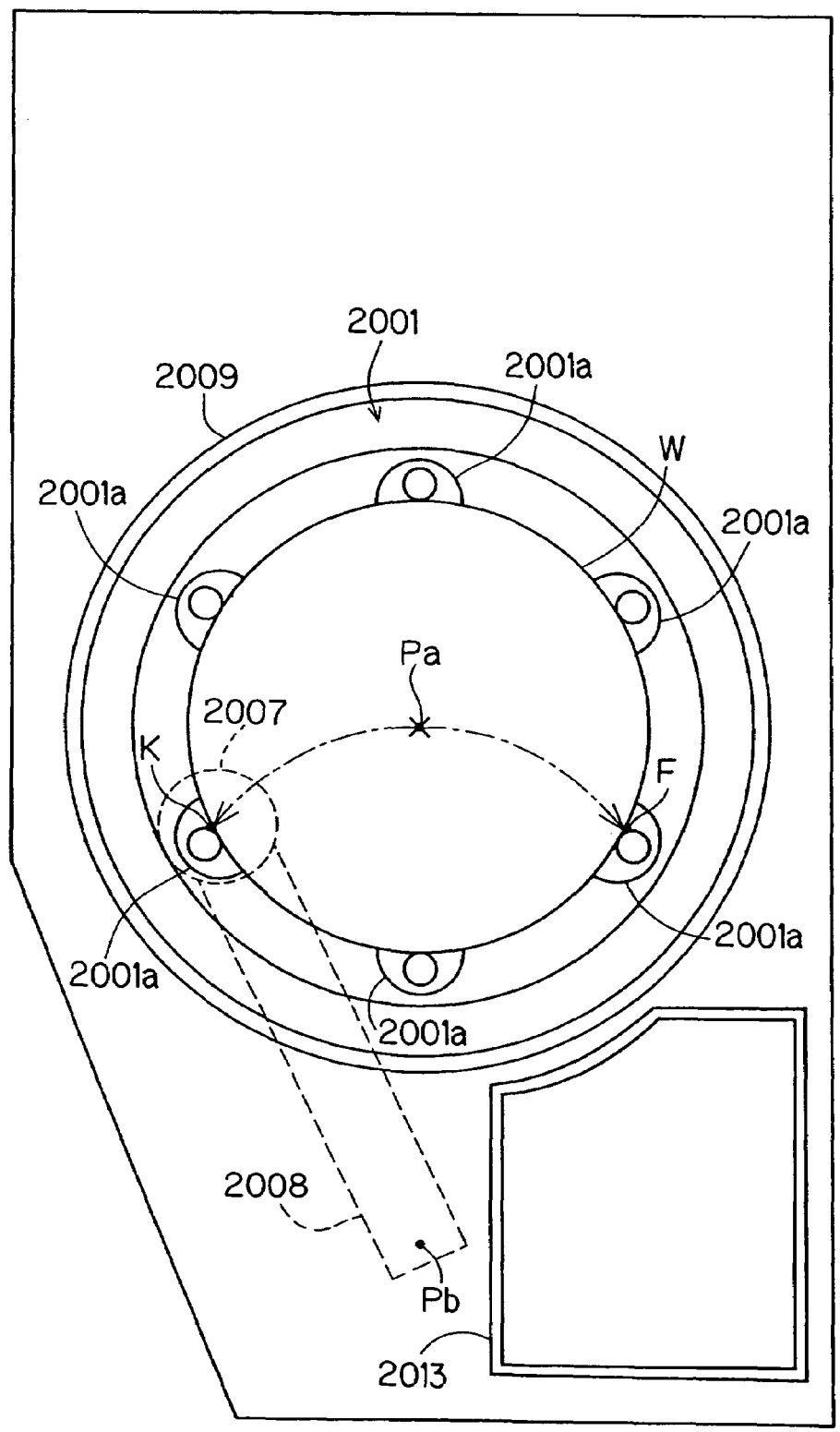
FIG. 14 is a plan view of the substrate cleaning device in accordance with the first preferred embodiment of the second aspect.

FIG. 13 is a block diagram that shows a schematic construction of a substrate cleaning device in accordance with the present preferred embodiment, and FIG. 14 is a plan view thereof.

In the Figures, reference numeral 2001 is a disc-shaped spin chuck, and six support pins 2001a are attached to the spin chuck 2001 in a protruding manner. As illustrated in FIG. 13, the spin chuck 2001 is allowed to rotate by an electric motor 2005 through a rotary shaft 2003 connected to the bottom surface thereof. A substrate W, which is supported by the support pins 2001a contacting the circumferential edge thereof, is rotated within a horizontal plane around the rotation center Pa by this rotative driving operation. A scattering preventive cup 2009 for preventing the scattering of a cleaning liquid M discharged from a double fluids cleaning nozzle 2007 is placed on the periphery of the spin chuck 2001. The cleaning liquid may be remover liquid for removing residual pollution from the surface of the substrate. This scattering preventive cup 2009 is designed to be raised and lowered with respect to the spin chuck 2001 as indicated by arrow shown in the Figure at the time when an uncleaned substrate W is placed on the spin chuck 2001 or when a transport means, not shown, receives a cleaned substrate W from the spin chuck 2001.

As illustrated in FIG. 13, the cleaning nozzle 2007 is supported with its trunk portion 2007b connected to the tip of a support arm 2008 so that its discharging surface 2007a is directed to the surface of the substrate W. The base portion of the support arm 2008 is, on the other hand, connected to a raising and shifting mechanism 11. As illustrated in FIG. 14, the cleaning nozzle 2007 is directed to a supply finish position F through the rotation center Pa from the supply start position K of the cleaning liquid within the in-plane of the substrate W.

Moreover, a rotary shaft 2011b of a rotary motor 2011a is connected to the support arm 2008. This is used for rocking the cleaning nozzle 2007 around the rotation center Pb of the rotary motor 2011a on the substrate W.

Moreover, the cleaning nozzle 2007 constitutes two fluids nozzle in which a pipe 20015a for introducing compressed air into its trunk portion 2007b as gas and a pipe 2015d for introducing deionized water as liquid are connected and allowed to communicate with each other. The pipe 2015a is connected to a compressed air supplying section 2021 corresponding to a gas supplying means of the present invention on the upstream side thereof. The pipe 2015a is provided with an electropneumatic regulator 2017a for adjusting the pressure of transmitted air to a pressure corresponding to a control signal inputted from a controller 2020, a pressure sensor 2018a for detecting the pressure of air and a flow-rate sensor 2019a for detecting the flow rate.

Moreover, the pipe 2015b is provided with an electropneumatic regulator 2017b for adjusting the pressure of transmitted deionized water to a pressure corresponding to a control signal inputted from the controller 2020, a pressure sensor 2018b for detecting the pressure of air and a flow-rate sensor 2019b for detecting the flow rate. The liquid to be used is not limited to deionized water, and, for example, extra-pure water (extra-deionized water) may be used. Moreover, any one of chemical liquids (for example, hydrofluoric acid, sulfuric acid, hydrochloric acid, nitric acid, phosphoric acid, acetic acid, ammonia or a hydrogen peroxide water liquid of these) may be used.

Control signals from the controller 2020 are respectively inputted to the electropneumatic regulators 2017a, 2017b, and in accordance with these control signals, the pressures of the gas and deionized water transmitted through the pipes 2015a, 2015b are adjusted. The results of detection, successively detected by the pressure sensors 2018a, 2018b and the flow-rate sensors 2019a, 2019b, are fed back to the controller 2020.

To the controller 2020 are respectively connected the electric motor 2005, the raising and shifting mechanism 2011, the electropneumatic regulators 2017a, 2017b, the pressure sensors 2018a, 2018b and the flow-rate sensors 2019a, 2019b. Cleaning conditions for each substrate W are preliminarily stored in the controller 2020 as a cleaning program (also referred to as "recipe"), and the above-mentioned respective sections are controlled in accordance with the cleaning program for each substrate W.

Moreover, an instructing section 2030, which is used for forming and altering the cleaning programs and for selecting a desired one of a plurality of cleaning programs, is connected to the controller 2020.

Figure 15:
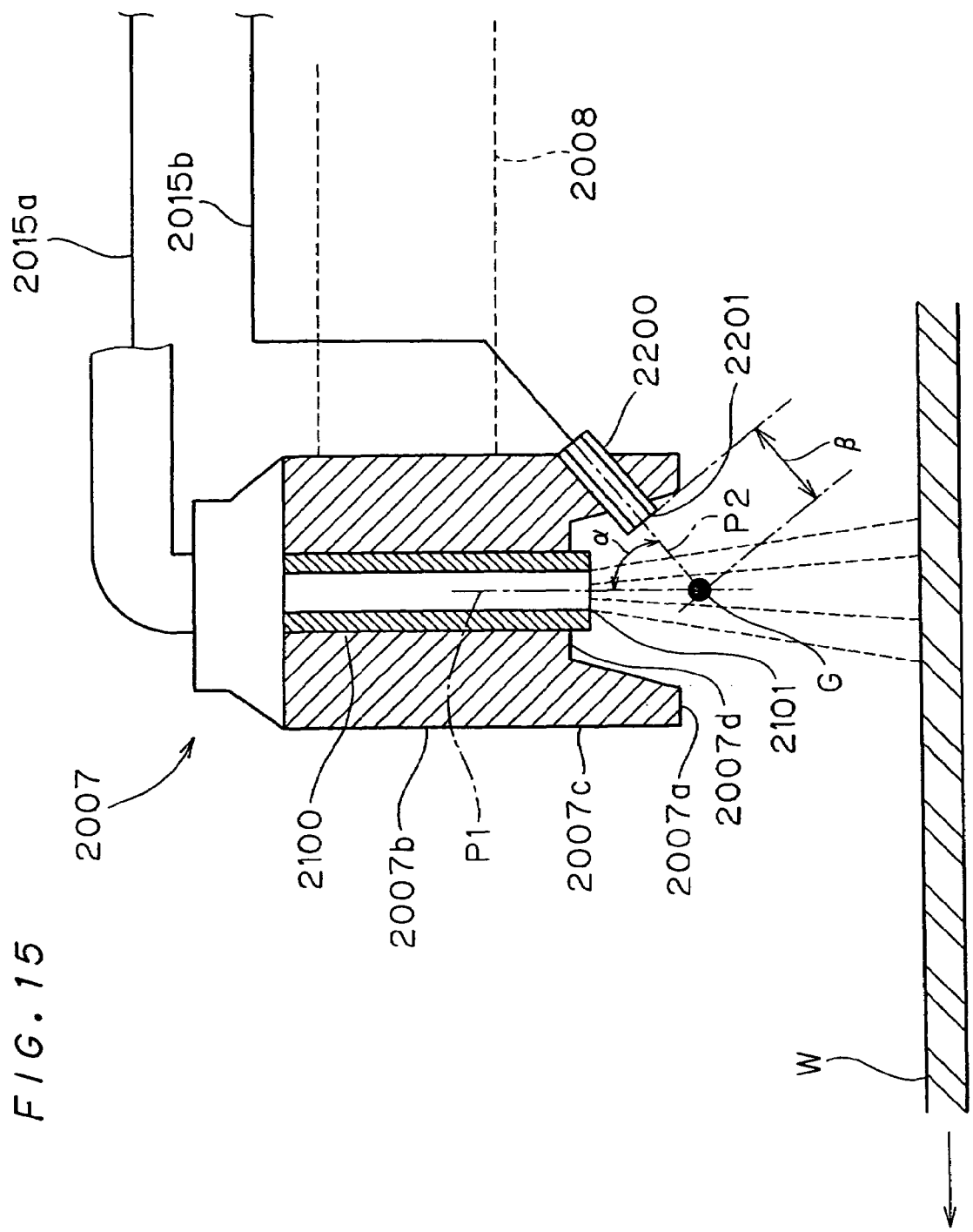
FIG. 15 is a longitudinal cross-sectional view that shows a structure of a cleaning nozzle in accordance with the first preferred embodiment of the second aspect.

Next, referring to Figures, a detailed explanation will be given of the inner structure of the cleaning nozzle 2007 that is the featured construction of the present preferred embodiment. FIG. 15 is a cross-sectional side view taken from the apparatus side, which schematically shows the structure of the cleaning nozzle 2007.

In this structure, the trunk portion 2007b is secured to one end of the support arm 2008 with bolts, etc., and placed with a gas discharging nozzle 2100 having a gas discharging outlet 2101 and a liquid discharging nozzle 2200 having a liquid discharging outlet 2201 being inserted through the inside of the trunk portion 2007b. The gas discharging nozzle 2100 and the liquid discharging nozzle 2200 are connected to the compressed air supplying section 2021 and the deionized water supplying section 2025 through the pipes 2015a, 2015b that pass through the inside of the support arm 2008.

The gas discharging nozzle 2100, which is placed in a manner so as to allow its gas discharging outlet 2101 to face the surface of the substrate W, is arranged so that its center axis line P1 passing through the gas discharging outlet 2101 is allowed to vertically cross the surface of the substrate W. The liquid discharging nozzle 2200 is, on the other hand, placed in a manner so as to diagonally tilt in the vicinity of the gas discharging nozzle 2100, and arranged so that its center axis line P2 passing through the liquid discharging outlet 2201 is allowed to diagonally cross the surface of the substrate W. The crossing point at which the center axis lines P1, P2 intersect each other is a collision portion G that is a mixing area between the liquid and gas. This mixing area between the liquid and the gas is within the open space.

The trunk portion 2007b of the cleaning nozzle 2007 has a column shape with its outer circumferential edge of the discharging surface 2007a forming a beveled portion 2007c sticking downward. The gas discharging nozzle 2100 is arranged so that the gas discharging outlet 2101 is placed on the upper surface portion 2007d of the beveled portion 2007c, and the liquid discharging nozzle 2200 is arranged so that the liquid discharging outlet 2201 is placed in the mid point of the beveled portion 2007c. Additionally, the trunk portion 2007b is integrally formed by a fluoro-resin such as Teflon.

Next, in an attempt to form atomized cleaning liquid by using the cleaning nozzle 2007, the incident angle $\alpha$ of each of the center axis lines P1, P2 in the collision portion G is preferably set in the range of not less than 0 degree to not more than 110 degrees, although it slightly changes depending on the flow rate and flow velocity of each fluid. In this case, when the respective incident angles $\alpha$ are set to 0 degree, the discharging directions of air and deionized water are in parallel with each other, however, by discharging one of the discharged flows into the jet flow of the other, it is possible to form droplets or mist. With respect to its aspect, a detailed explanation will be given later in a second preferred embodiment. However, in the case when the incident angle $\alpha$ is greater than 110 degrees, the collision between deionized water and air virtually becomes a frontal collision, and consequently, it is confirmed that the droplets are scattered not in one direction, but in all the directions. In other words, the droplets that are directed to the surface of the substrate so as to clean the surface of the substrate W come to decrease in number, failing to carry out a good cleaning operation. Therefore, the incident angle $\alpha$ is preferably set in the range of not less than 0 degree to not more than 110 degrees so that it becomes possible to direct the atomized cleaning liquid in one direction.

Moreover, with respect to the distance $\beta$ from the liquid discharging outlet 2201 to the collision portion G is preferably set in the range from greater than 0 mm to not more than 20 mm as a distance that does not allow the pressure of the liquid discharged flow to attenuate to cause the flow to collapse.

Moreover, the collision portion G is set at the same position as the discharging surface 2007a of the cleaning nozzle 2007 or at a position slightly closer to the surface side of the substrate W. With this arrangement, the beveled portion 2007c is allowed to prevent external influences at the collision portion G, thereby making it possible to properly mix deionized water and air. Since the collision portion G is not close to the upper surface portion 2007d, it is possible to prevent the atomized droplets from adhering to the inner surface of the beveled portion 2007c and dropping therefrom. The distance between the collision portion G and the surface of the substrate W is preferably set in accordance with a desired cleaning capability, and it is set to not more than 100 mm, preferably, approximately in the range of 3 to 30mm.

In the above-mentioned arrangement, when the electropneumatic regulators 2017a, 2017b are released by signals from the controller 2020 so that air and deionized water are supplied from the gas discharging outlet 2101 and the liquid discharging outlet 2201, the deionized water is mixed into the discharged flow or jet of air thus injected into the open space around the portion G so as to allow the discharged flow structure to collapse, thereby accelerating the formation of the droplets. This atomized cleaning liquid makes it possible to clean the surface of the substrate W.

Next, an explanation will be given of the cleaning operation carried out by the substrate cleaning device having the above-mentioned structure.

First, a predetermined cleaning program corresponding to the substrate W is selected by the instructing section 2030, and executed. Then, the scattering preventive cup 2009 is lowered with respect to the spin chuck 2001, and a substrate W is carried into the substrate cleaning device by a hand of a substrate transporting robot with the cleaning nozzle 2007 being located at a stand-by position. Thus, it is placed on the upper surface of the spin chuck 2001, and held thereon. Further, the scattering preventive cup 2009 is raised, while the cleaning nozzle 2007 is shifted to a cleaning start position. Next, the spin chuck 2001 holding the substrate W is rotated, thereby allowing the substrate W to rotate in the rotation direction, centered on the rotation center Pa (substrate rotating step).

Next, as illustrated in FIG. 14, with the substrate W being rotated at a fixed low speed, the cleaning nozzle 2007 is allowed to shift from the supply start position K of the cleaning liquid to the supply end position F passing through the rotation center Pa (cleaning liquid supplying step). Moreover, the rotation speed of the spin chuck 2001 is preferably set in the range of 10 rpm to 1000 rpm.

At this time, control signals are sent from the controller 2020 to the respective electropneumatic regulators 2017a, 2017b so that the pressures of air and deionized water are properly adjusted so as to form droplets at the collision portion G. Simultaneously, the results of the detections made by the pressure sensors 2018a, 2018b and the flow-rate sensors 2019a, 2019b, are successively fed back to the controller 2020. In other words, the air supplied by the compressed air supplying section 2021 is transported through the pipe 2015a, and the deionized water supplied by the deionized water supplying section 2025 is simultaneously transported to the pipe 2015b.

At this time, air is discharged from the gas discharging outlet 2101 of the cleaning nozzle 2007, and after a lapse of a predetermined time, deionized water is supplied from the liquid discharging outlet 2201. With this arrangement, the deionized water supplied to the collision portion G is allowed to form droplets, and simultaneously mixed with supplied air. Consequently, the deionized water collides with air to be atomized immediately after it has been discharged. Thus, it is possible to eliminate the wasteful use thereof in the case when it is discharged onto the surface of the substrate W as the liquid flow. These droplets or mist, as they are, are directly supplied onto the substrate W.

The discharging speed of the atomized cleaning liquid is properly set by adjusting the flow rates and flow velocities of the deionized water and the air that are maintained in a mutually independent state. In this controlling operation, the air and deionized water do not interfere with each other, and therefore, desired droplets or mist are obtained by desirably controlling the flow rate and flow velocity of the liquid or the gas. Thus, it becomes possible to remove fine particles on the substrate sufficiently.

Next, the rotation of the substrate W driven by the spin chuck 2001 is stopped. Lastly, when the cleaning nozzle 2007 has arrived at the supply end position F, control signals are sent from the controller 2020 to the electropneumatic regulators 2017a, 2017b so that the supplies of the respective objects are stopped, and the cleaning nozzle 2007 is shifted to the stand-by position 2013. At the time of the stoppage of the cleaning operation, with respect to the cleaning nozzle 2007, after the deionized water discharge has been stopped, the air discharge is stopped. Consequently, it is possible to eliminate the wasteful use of the cleaning liquid in which after the cleaning of the surface of the substrate W by using the atomized cleaning liquid, the cleaning flow is still discharged onto the surface of the substrate W.

Then, the substrate W is rotated at a high speed to scatter the cleaning liquid adhering to the surface of the substrate W so that the spinning-off process for drying the substrate W is carried out, thereby completing the sequence of operations (drying step). Lastly, the substrate W is carried out from the spin chuck 2001 by the hand of the substrate transporting robot, thereby completing the cleaning step by the substrate processing apparatus on the substrate W. Then, the substrate W is inserted in a cassette capable of housing a plurality of substrates W.

As described above, in accordance with the present invention, the surface of the substrate is cleaned by using the mist of the cleaning liquid formed by atomizing the liquid with gas in the air. At this time, the atomized cleaning liquid is generated after the gas and liquid have been discharged from the gas discharging means and the liquid discharging means. For this reason, the flow rates and flow velocities of the liquid and gas are maintained in a mutually independent state. Then, the discharged liquid and gas are mixed in the air, and allowed to form an atomized state. Consequently, a desired flow of droplets or mist current is obtained without making the respective flows interfere with each other upon forming the atomized cleaning liquid. Therefore, it is possible to sufficiently remove fine particles on the surface of the substrate, and consequently to improve the cleaning power exerted on the surface of the substrate.

In the above-mentioned embodiments, the center axis P1 passing through the gas discharging outlet 2101 of the cleaning nozzle 2007 is directed perpendicularly to the surface of the substrate W. However, this may be directed diagonally to the surface thereof.

The mixing operation of a liquid and gas can be attained with another structure described bellow:

2. Second Preferred Embodiment

Figure 16:
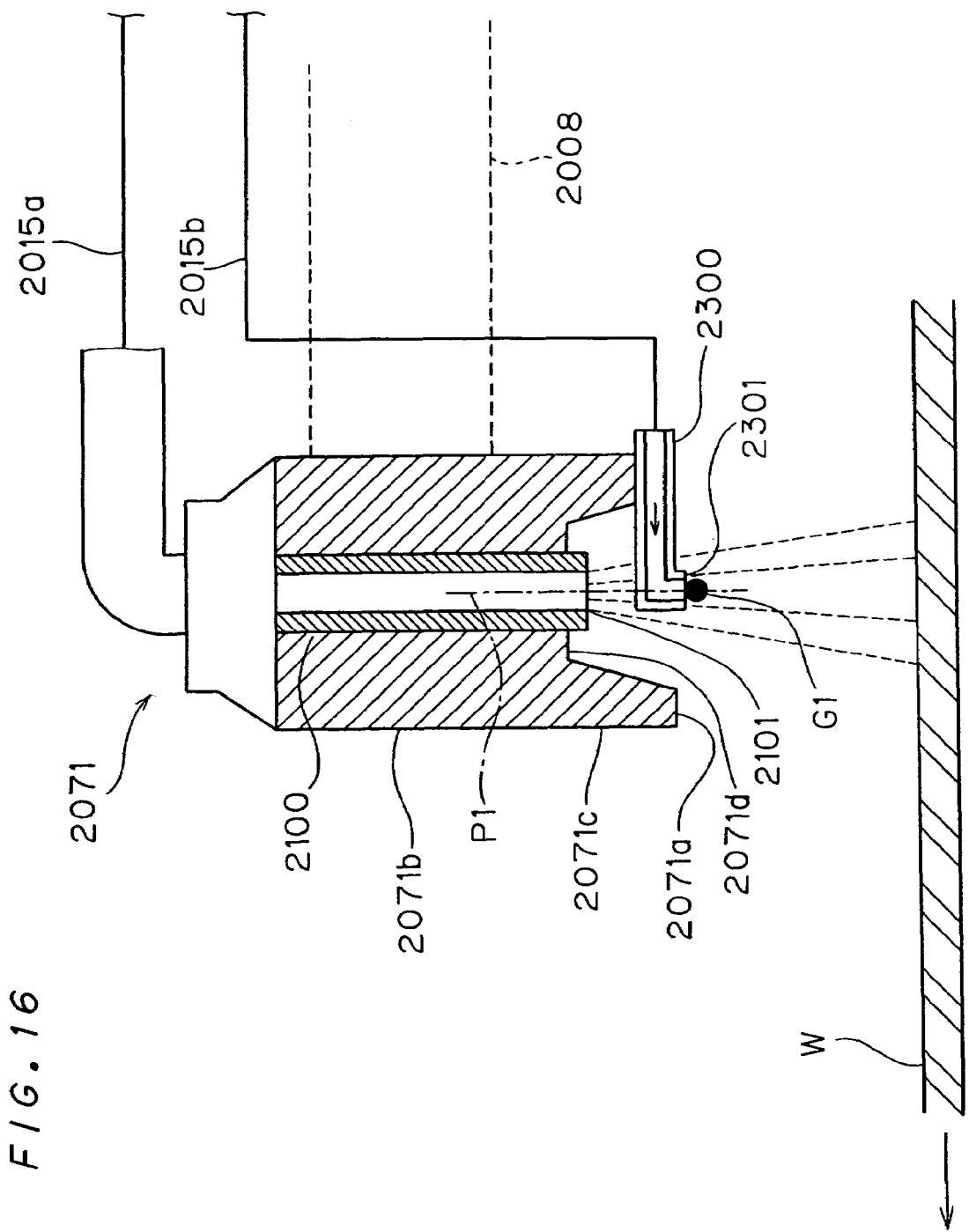
FIG. 16 is a longitudinal cross-sectional view that shows a structure of a cleaning nozzle in accordance with a second preferred embodiment of the second aspect.

FIG. 16 is a cross-sectional view taken from the apparatus side that shows another schematic construction of a cleaning nozzle in accordance with another preferred embodiment. Here, with respect to members that are the same as those of the first preferred embodiment, they are indicated by the same reference numerals, and the description thereof is omitted. A cleaning nozzle 2071 has a trunk portion 2071b through which a gas discharging nozzle 2100 having a gas discharging outlet 2101 is inserted. Then, a gas discharging outlet 2101 is formed in the upper surface portion 2071d of a beveled portion 2071c of the cleaning nozzle 2007. A liquid outlet nozzle 2300 is placed on the lower end of the bevel portion 2071c.

The liquid discharging nozzle 2300 is arranged in parallel with the discharging surface 2007a with its tip being extended in a discharged flow of air below the gas discharging outlet 2101. The tip portion is bent downward so as to allow the liquid discharging outlet 2301 to face the surface of the substrate W. Moreover, the center axis line P1 passing through the gas discharging outlet 2101 perpendicularly crosses the surface of the substrate W, and is also coincident with the center axis line passing through the liquid discharging outlet 2301. Thus, the discharged deionized water is smoothly formed into droplets by a discharged flow of air on the periphery thereof, in the proximity of the liquid discharging outlet 2301 in the discharging direction. Therefore, the position G1 in the FIG. 16 is a collision portion defined in a open space that is a mixing area between the liquid and the gas. In other words, in the second preferred embodiment, an arrangement is made so that the incident angles of the center axis line P1 and the center axis line passing through the liquid discharging outlet 2301 are set to 0 degree.

As described above, in the second preferred embodiment, droplets are smoothly generated by discharging deionized water into the discharged flow of air. Moreover, since the droplets or mist are formed in the discharged flow, the arrangement is less susceptible to scattering of the droplets, and consequently has a superior cleaning effect. Here, in the second preferred embodiment, any arrangement may be adopted as long as, into one of the discharged flows, the other is discharged, and the center axes of the liquid discharging outlet 2301 and the gas discharging outlet 2101 are not necessarily coincident with each other. In other words, the discharging outlet within the discharged flow may be slightly tilted as long as, into one of the discharged flows, the other is discharged.

<3. Modifications>

The present invention may be modified as described below.

(1) In the above-mentioned preferred embodiment, air is supplied from the pipe 2015a, and deionized water is supplied from the pipe 2015b. However, deionized water may be supplied from the pipe 2015a, and air may be supplied from the pipe 2015b.

(2) Moreover, in the above-mentioned one aspect, with respect to the gas supplied from the pipe 2015a, only air is use. Alternatively, a mixed gas of air and a gas that improves the cleaning degree when mixed with air may be used, or a gas that simply improves the cleaning degree, such as ozone gas, carbon dioxide or hydrogen, may be supplied therefrom.

(3) In addition to the soft-type substrate cleaning device, which supplies a cleaning liquid from the cleaning nozzle 2007, those of a hard type using the cleaning nozzle 2007 in combination with a brush may be adopted.

(4) The cleaning nozzle 2007 may be rocked only once in one direction within the plane of the substrate W on which the cleaning liquid is supplied, and alternatively, this may be rocked several times within the plane of the substrate W.

(5) With respect to the spin chuck 2001, a pin-holding type spin chuck in which the substrate W is rotated with its circumferential edge held by pins from below and on its end surface may be used, and alternatively, a suction-type spin chuck holding the substrate W by sucking the lower surface thereof may be used.

(6) Furthermore, the spin chuck 2001 may be prepared as at least three roller pins or the like that rotate centered on an axis in parallel with the rotation center Pa of the substrate W while contacting the circumferential end edge of the substrate W. The spin chuck using these roller pins is particularly effective in the case when both of the surfaces of the substrate W are cleaned, and in the case when the cleaning nozzles 2007 are placed at positions sandwiching the substrate W, it is possible to desirably clean the entire areas of both of the surfaces of the substrate.

The present invention is widely applied to the cleaning operation for various other substrates, such as a glass substrate for a liquid crystal display, a PDP (Plasma Display Panel) substrate or a glass substrate and a ceramic substrate used for a magnetic disk. With respect to the shape of the substrate, not limited to the round substrate of the above-mentioned one aspect, the present invention is also applied to square-shaped substrates having a square shape or a rectangular shape.

C. Preferred Embodiments According to Third Aspect of the Present Invention

1. First Preferred Embodiment of Substrate Processing Apparatus

In the following, a first preferred embodiment of the substrate processing apparatus according to the present aspect will be described.

Figure 17:
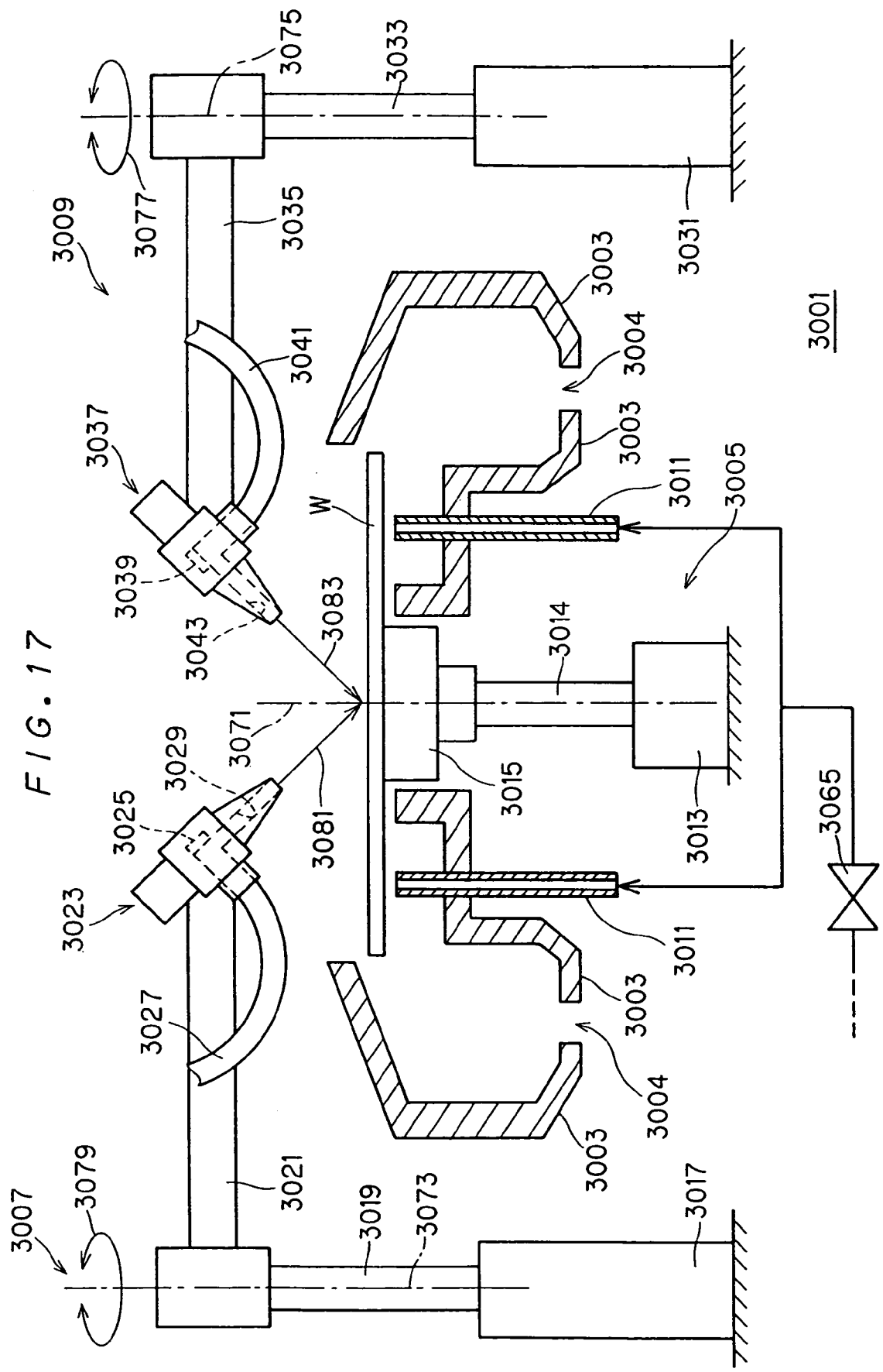
FIG. 17 is a side view of a substrate processing apparatus according to the first preferred embodiment of a third aspect.
Figure 18:
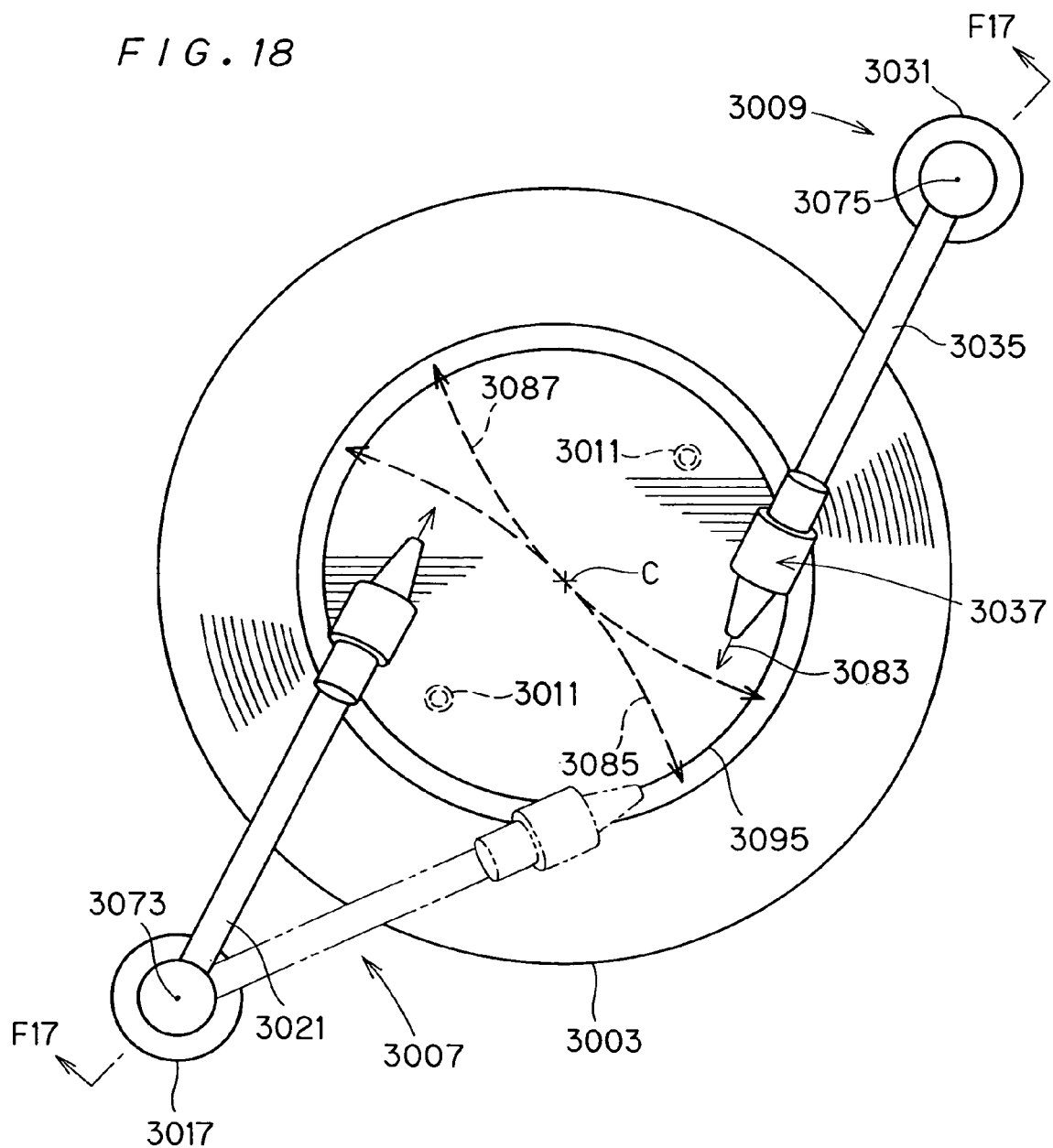
FIG. 18 is a top view of the substrate processing apparatus according to the first preferred embodiment of the third aspect.

FIGS. 17 and 18 show a configuration of a substrate processing apparatus 3001. FIG. 18 is a section view along the line F17-F17 of FIG. 17, in which hatching is partially omitted for convenience.

The substrate processing apparatus 3001 has a cup 3003 of roughly U shape in cross section as shown in FIG. 17, and roughly ring shape having an opening in its center part when viewed from the top surface as shown in FIG. 18; a holding and rotating portion 3005 provided in the vertical direction so as to stand via the opening of the cup 3003, for holding and rotating a substrate W; a remover liquid nozzle 3007 for supplying the substrate W held by the holding and rotating portion 3005 with a remover liquid; and a deionized water nozzle 3009 for similarly supplying the substrate W held by the holding and rotating portion 3005 with deionized water. Also the substrate processing apparatus 3001 has a back surface cleaning nozzle 3011 for supplying the back surface of the substrate W held by the holding and rotating portion 3005 with deionized water.

The remover liquid nozzle 3007 constitutes the remover liquid supplying portion, and the deionized water nozzle 3009 constitutes the deionized water supplying portion.

The cup 3003 has a plurality of discharge ports 3004 in its bottom part. The excess part of the liquid that has been supplied to the substrate W reaches to the discharge ports 3004 along the inner wall of the cup 3003, and is discharged outside the apparatus via the discharge ports 3004.

The holding and rotating portion 3005 has a spin motor 3013 having a driving shaft which is fixed to the apparatus frame and arranged in the vertical direction, a spin shaft 3014 fixed to the driving shaft of the spin motor and a vacuum chuck 3015 provided on the top of the spin shaft 3014 and functioning as a substrate holding member.

The vacuum chuck 3015 has an adsorptive surface for adsorbing the substrate on its top surface, the adsorptive surface being smaller in area than the substrate W when views from the top surface. In the present preferred embodiment, the vacuum chuck is a roughly cylindrical member and the adsorptive surface of the top surface is circular.

The vacuum chuck 3015 has an adsorptive holes in the adsorptive surface of the top surface, and adsorbs air through the adsorptive holes. Thus, the substrate W placed on the vacuum chuck 3015 is held by the air adsorption through the adsorptive holes. In this way, the vacuum chuck 3015 holds the substrate W while contacting only with the back surface of the substrate W.

In the holding and rotating portion 3005 as described above, the substrate W placed on the vacuum chuck 3015 is held by adsorption by the vacuum chuck 3015, and the substrate W held on the vacuum chuck 3014 is rotated about an axis 3071 as its center of rotation by driving the spin motor 3013.

The remover liquid nozzle 3007 has a first pivot motor 3017 having a driving shaft which is fixed to the apparatus frame and arranged in the vertical direction, a first pivot shaft 3019 fixed to the driving shaft of the first pivot motor 3017, and a first arm 3021 connected with the top of the first pivot shaft 3019.

At the distal end of the first arm 3021 is provided a remover liquid nozzle body 3023.

The remover liquid nozzle body 3023 constitutes the remover liquid discharge means. The remover liquid nozzle body 3023 is provide with a first through hole 3029, and a first tube 3027 is connected to the first through hole 3029.

The first through hole 3029 is a conduit run whose one end is connected to the first tube 3027 and other end has an opening toward the top surface of the substrate W. The longitudinal direction of the first through hole 3029 forms a predetermined angle of inclination with respect to the top surface of the substrate W. This angle of inclination determines an angle of incidence with respect to the top major surface of the substrate W of the remover liquid discharged from the first through hole 3029. That is, the angle of inclination of the first through hole 3029 is nearly equal to the angle of incidence with respect to the substrate W of the remover liquid discharged from the first through hole 3029.

In the present preferred embodiment, since the angle of inclination of the first through hole 3029 is set at 45 degrees, the remover liquid discharged from the first through hole 3029 reaches the substrate W at an angle of incident of 45 degrees.

On the other hand, the remover liquid nozzle body 3023 is adjusted so that when the first arm 3021 pivots or rotates about an axis 3073 in the manner indicated by the arrow 3079, the reach point of a remover liquid 81 discharged from the first through hole 3029 with respect to the substrate W (hereinafter, referred to as a remover liquid reach point) moves along the line that passes the center of rotation C of the substrate W and a rotation circle 3095 drawn by the end edge of the rotating substrate W.

In the present preferred embodiment, as shown by the arrow 3085 in FIG. 18, it is so adjusted that the remover liquid reach point moves reciprocally on the circular arc that passes the center of rotation C of the substrate W and crosses at two points on the circumference of the rotation circle 3095. Consequently, the major surface of the substrate W is scanned with the remover liquid reach point along the arc path.

The line passing the center of rotation C of the substrate W and the circumference of the rotation circle 3095 drawn by the end edge of the rotating substrate W may be a straight line or a curved line.

Furthermore, the remover liquid nozzle body 3023 may be moved so that the remover liquid reach point reciprocally moves on the circular arc whose chord is the radius of the rotation circle 3095 or reciprocally moves on the radius of the rotation circle 3095, or reciprocally moves on the diameter of the rotation circle 3095.

The line passing the center of rotation C of the substrate W and passing the circumference of the rotation circle 3095 drawn by the end edge of the rotating substrate W may be a straight line or a curved line.

Furthermore, in the first through hole 3029, a first vibrator 3025 is provided at the position where it will contact with the remover liquid passing through the first through hole 3029.

The first tube 3027 supplies the first through hole 3029 with the remover liquid. The first vibrator 3025 vibrates in response to an electric signal from an oscillator 3067 that will be described below, and applies an ultrasonic wave to the remover liquid passing through the first through hole 3029.

In the remover liquid nozzle 3007 as described above, the first pivot motor 3017 pivots the first pivot shaft 3019, whereby the first arm 3021 pivots or rotates about the axis 3073. As a result, as shown in FIG. 18, the remover liquid reach point reciprocally moves on the substrate W along the circular arc as shown by the arrow 3085 while passing the center of rotation C of the substrate W. Then, the substrate W is supplied with the remover liquid to which an ultrasonic wave has been applied.

The angle of inclination of the first through hole 3029 from the top major surface of the substrate may be any angles smaller than 90 degrees, with an angle of 30 degrees or more and 60 degrees or less being preferred, with an angle of 45 degrees being most preferred.

This enables the remover liquid to reach the interface between the reaction products and the surface of the substrate W in the condition that it is unlikely to be affected by projections and depressions such as patterns on the substrate W. In other words, the remover liquid can reach the interface between the reaction products and the surface of the substrate W in the condition that attenuation of ultrasonic wave energy of the remover liquid is small.

Since the ultrasonic wave oscillates along the discharge direction of the remover liquid, the remover liquid having reached the interface between the surface of the substrate W and the reaction products have plenty of energy that is effective to enter between the reaction products and the substrate W. Therefore, since the remover liquid strongly acts on the lower part of the reaction products, the reaction products are easily removed from the substrate W and the removing efficiency is improved.

In addition, since the remover liquid nozzle body 3023 having the first through hole 3029 as described above is adjusted to move so that the reach point of the remover liquid moves on the line passing the center of rotation C of the substrate W and the circumference of the rotation circle 3095 drawn by the end edge of the rotating substrate W, the remover liquid having an ultrasonic wave uniformly applied thereto is supplied on the substrate W. Consequently, it is possible to secure the uniformity in the surface of the substrate during process while improving the removing efficiency of the reaction products.

The deionized water nozzle 3009 has a second pivot motor 3031 having a driving shaft which is fixed to the apparatus frame and arranged in the vertical direction, a second pivot shaft 3033 fixed to the driving shaft of the second pivot motor 3031, and a second arm 3035 connected with the top of the second pivot shaft 3033.

The second pivot motor 3031, the second pivot shaft 3033 and the second arm 3035 constitute the second movement means.

At the distal end of the second arm 3035 is provided a deionized water nozzle body 3037. The deionized water nozzle body 3037 constitutes the deionized water discharge means.

The deionized water nozzle body 3037 is provided with a second through hole 3043 so that the axial direction of the deionized water discharged from the second through hole 3043 is directed to the top surface of the substrate W, and a second tube 3041 is connected to the second through hole 3043.

The second through hole 3043 is a conduit run whose one end is connected to the second tube 3041 and other end has an opening toward the top surface of the substrate W. The longitudinal direction of the second through hole 3043 forms a predetermined angle of inclination with respect to the top surface of the substrate W. This angle of inclination determines an angle of incidence with respect to the substrate W of the deionized water discharged from the second through hole 3043. That is, the angle of inclination of the second through hole 3043 is nearly equal to the angle of incidence with respect to the substrate W of the deionized water discharged from the second through hole 3043.

In the present preferred embodiment, since the angle of inclination of the second through hole 3043 from the top major surface of the substrate is set at 45 degrees, the deionized water discharged from the second through hole 3043 reaches the substrate W at an angle of incident of 45 degrees.

On the other hand, the deionized water nozzle body 3037 is adjusted so that when the second arm 3035 pivots about an axis 3075 in the manner indicated by the arrow 3077, the reach point of a deionized water 3083 discharged from the second through hole 3043 with respect to the substrate W (hereinafter, referred to as a deionized water reach point) moves on the line that passes the center of rotation C of the substrate W and a rotation circle 3095 drawn by the end edge of the rotating substrate W.

In the present preferred embodiment, as shown by the arrow 3087 in FIG. 18, it is so adjusted that the deionized water reach point moves reciprocally on the circular arc that passes the center of rotation C of the substrate W and crosses at two points on the circumference of the rotation circle 3095. Consequently, the major surface of the substrate W is scanned with the deionized water reach point along the arc path.

The line passing the center of rotation C of the substrate W and the circumference of the rotation circle 3095 drawn by the end edge of the rotating substrate W may be a straight line or a curved line.

The deionized water nozzle body 3037 may be moved so that the deionized water reach point reciprocally moves on the circular arc whose chord is the radius of the rotation circle 3095 or reciprocally moves on the radius of the rotation circle 3095, or reciprocally moves on the diameter of the rotation circle 3095.

Furthermore, in the second through hole 3043, a second vibrator 3039 is provided at the position where it will contact with the deionized water passing through the second through hole 3043.

The second tube 3041 supplies the second through hole 3043 with the deionized water. The second vibrator 3039 vibrates in response to an electric signal from an oscillator 3067 that will be described below, and applies an ultrasonic wave to the deionized water passing through the second through hole 3043.

In the deionized water nozzle 3009 as described above, the second pivot motor 3031 pivots the second pivot shaft 3033, whereby the second arm 3035 pivots about the axis 3075. As a result, as shown in FIG. 18, the deionized water reach point reciprocally moves on the substrate W along a circular arc as shown by the arrow 3087 while passing the center of rotation C of the substrate W. Then, the substrate W is supplied with the deionized water to which an ultrasonic wave has been applied.

The angle of inclination of the second through hole 3043 from the top major surface of the substrate may be any angles smaller than 90 degrees, with an angle of 30 degrees or more and 60 degrees or less being preferred, with an angle of 45 degrees being most preferred.

This enables the deionized water to reach the interface between the reaction products and the surface of the substrate W in the condition that it is unlikely to be affected by projections and depressions such as patterns on the substrate W. In other words, the deionized water can.reach the interface between the reaction products and the surface of the substrate W in the condition that attenuation of ultrasonic wave energy of the deionized water is small.

Since the ultrasonic wave oscillates along the discharge direction of the deionized water, the deionized water having reached the interface between the surface of the substrate W and the reaction products has plenty of energy that is effective to cut in between the reaction products and the substrate W. Therefore, since the deionized water strongly acts on the lower part of the reaction products, the reaction products are easily removed from the substrate W and the removing efficiency is improved.

In addition, since the deionized water nozzle body 3037 having the second through hole 3043 as described above is adjusted to move so that the reach point of the deionized water moves on the line passing the center of rotation C of the substrate W and the circumference of the rotation circle 3095 drawn by the end edge of the rotating substrate W, the deionized water having an ultrasonic wave uniformly applied thereto is supplied on the substrate W. Consequently, it is possible to secure the uniformity in the surface of the substrate during process while improving the removing efficiency of the reaction products.

The back surface cleaning nozzle 3011 is a tubular member which penetrates through the cup 3003 and extends in the roughly vertical direction toward the back surface of the substrate W, and supplied with deionized water via a back surface cleaning valve 3065 as will be described below. As a result, it is possible to discharge deionized water with respect to the back surface of the substrate W.

Figure 19:
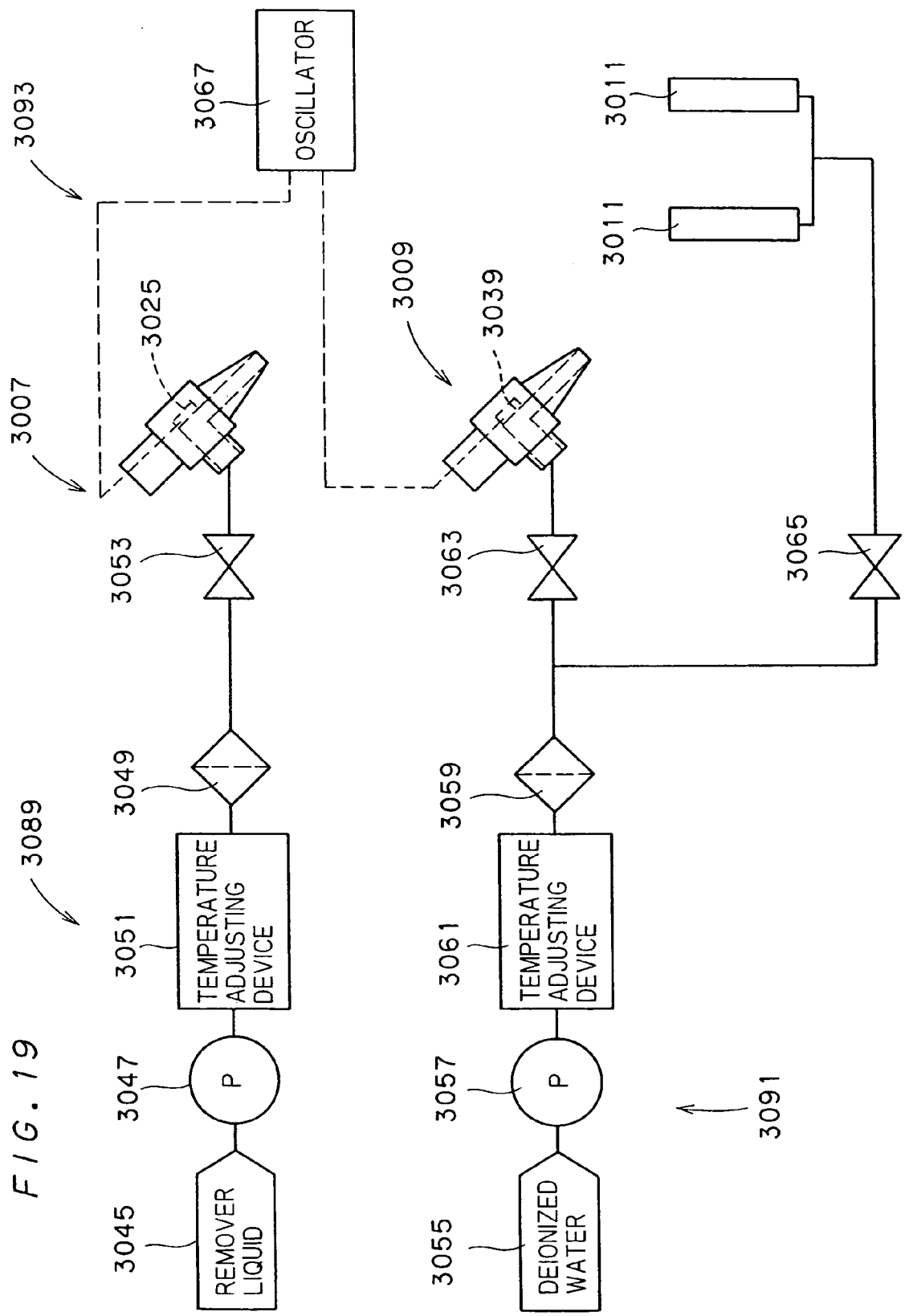
FIG. 19 is a piping drawing of the substrate processing apparatus according to the first preferred embodiment of the third aspect.

Next, a remover liquid supplying system for the remover liquid nozzle 3007 and a deionized water supplying system 3091 for the deionized water nozzle 3009 and the back surface nozzle 3011 will be explained with reference to FIG. 19.

A remover liquid supplying system 3089 has a remover liquid pump 3047 for pumping remover liquid from a remover liquid source 3045 provided outside the apparatus, a temperature controller 3051 for controlling the temperature of the remover liquid by heating or cooling the remover liquid pumped by the remover liquid pump 3047 to a predetermined temperature, a filter 3049 for filtering contaminants from the remover liquid whose temperature has been controlled by the temperature controller 3051, and a remover liquid nozzle valve 53 for opening/closing passage of the remover liquid after being subjected to the filtering toward the remover liquid nozzle 3007.

With the configuration as described above, the remover liquid supplying system 3089 can supply the remover liquid nozzle 3007 with the remover liquid whose temperature has been controlled to the predetermined temperature by means of the temperature controller 3051 and which has been cleaned by means of the filter 3049.

The deionized water supplying system 3091 has a deionized water pump 3057 for pumping deionized water from a deionized water source 3055 provided outside the apparatus, a temperature controller 3061 for controlling the temperature of the deionized water by heating or cooling the deionized water pumped by the deionized water pump 3057 to a predetermine temperature, a filter 3059 for filtering contaminants from the deionized water whose temperature has been controlled by the temperature controller 3061, a deionized water nozzle valve 3063 for opening/closing passage of the deionized water after being subjected to the filtering toward the deionized water nozzle 3009, and the back surface cleaning valve 3065 for opening/closing passage of the deionized water after being subjected to the filtering toward the back surface cleaning nozzle.

With the configuration as described above, the deionized water supplying system 3091 can supply the deionized water nozzle 3009 with the deionized water whose temperature has been controlled to the predetermined temperature by means of the temperature controller 3061 and which has been cleaned by means of the filter 3059.

Next, an ultrasonic wave applying portion 3093 will be explained with reference to FIG. 19 again.

The ultrasonic wave applying portion 3093 has the first vibrator 3025 provided within the remover liquid nozzle 3007 and the oscillator 3067 for transmitting an electric signal to the first vibrator 3025 to cause the first vibrator 3025 to vibrate.

With such a configuration, the ultrasonic wave applying portion 3093 applies an ultrasonic wave to the remover liquid that is to be supplied to the substrate W from the remover liquid nozzle 3007.

In addition, the ultrasonic wave applying portion 3093 has the second vibrator 3039 provided within the deionized water nozzle 3009 and the second vibrator 3039 vibrates in response to an electric signal transmitted from the oscillator 3067.

With such a configuration, the ultrasonic wave applying portion 3093 applies an ultrasonic wave to the deionized water that is to be supplied to the substrate W from the deionized water nozzle 3009.

As described above, since the substrate W can be supplied with the remover liquid or deionized water to which ultrasonic wave has been applies, it is possible to remove the reaction products more quickly and hence the throughput is improved. Though the throughput is improved by applying an ultrasonic wave to either one of the remover liquid or the deionized water, it is possible to remove the reaction products more quickly and improve the throughput by applying ultrasonic waves to both of the remover liquid and the deionized water.

Figure 20:
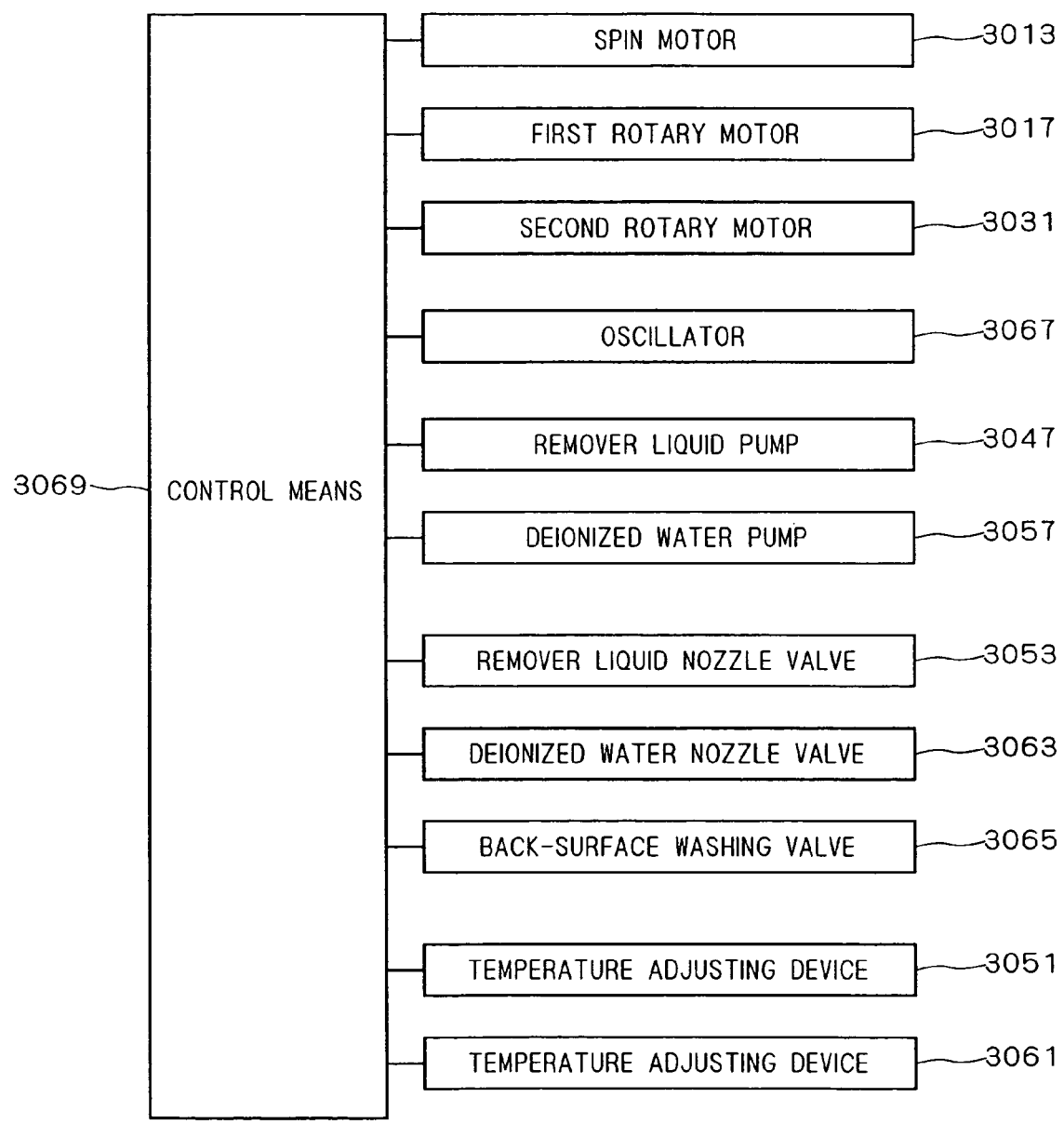
FIG. 20 is a hard configuration view of the substrate processing apparatus according to the first preferred embodiment of the third aspect.

Next, a hard configuration of the substrate processing apparatus 3001 will be explained with reference to FIG. 20.

To a control means 3069, connected are the spin motor 3013, the first pivot motor 3017, the second pivot motor 3031, the oscillator 3067, the remover liquid pump 3047, the deionized water pump 3057, the remover liquid nozzle valve 3053, the deionized water nozzle valve 3063, the back surface cleaning valve 3065, the temperature controller 3051 and the temperature controller 3061, and the control means 3069 controls these connected members in the manner as described in the first and second preferred embodiments of the substrate processing method that will be described below.

Though the substrate processing apparatus 3001 of the present preferred embodiment has both of the first vibrator 3025 for applying an ultrasonic wave to the remover liquid and the second vibrator 3039 for applying an ultrasonic wave to the deionized water, it is also possible to have either one of these vibrators.

2. First Preferred Embodiment of Substrate Processing Method

Figure 21:
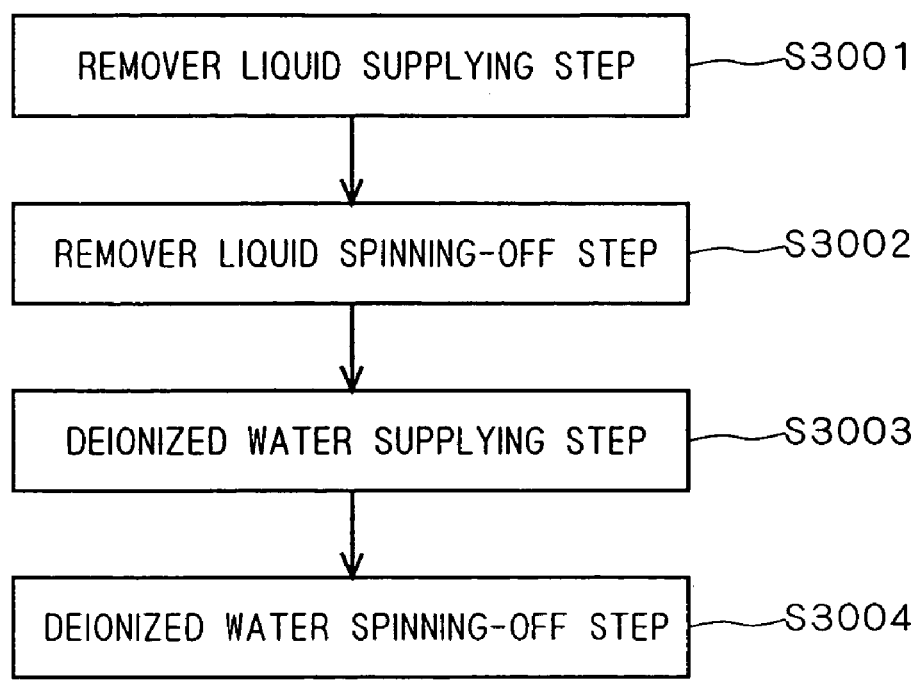
FIG. 21 is a flow chart of the a substrate processing method according to the first preferred embodiment of the third aspect.
Figure 22:
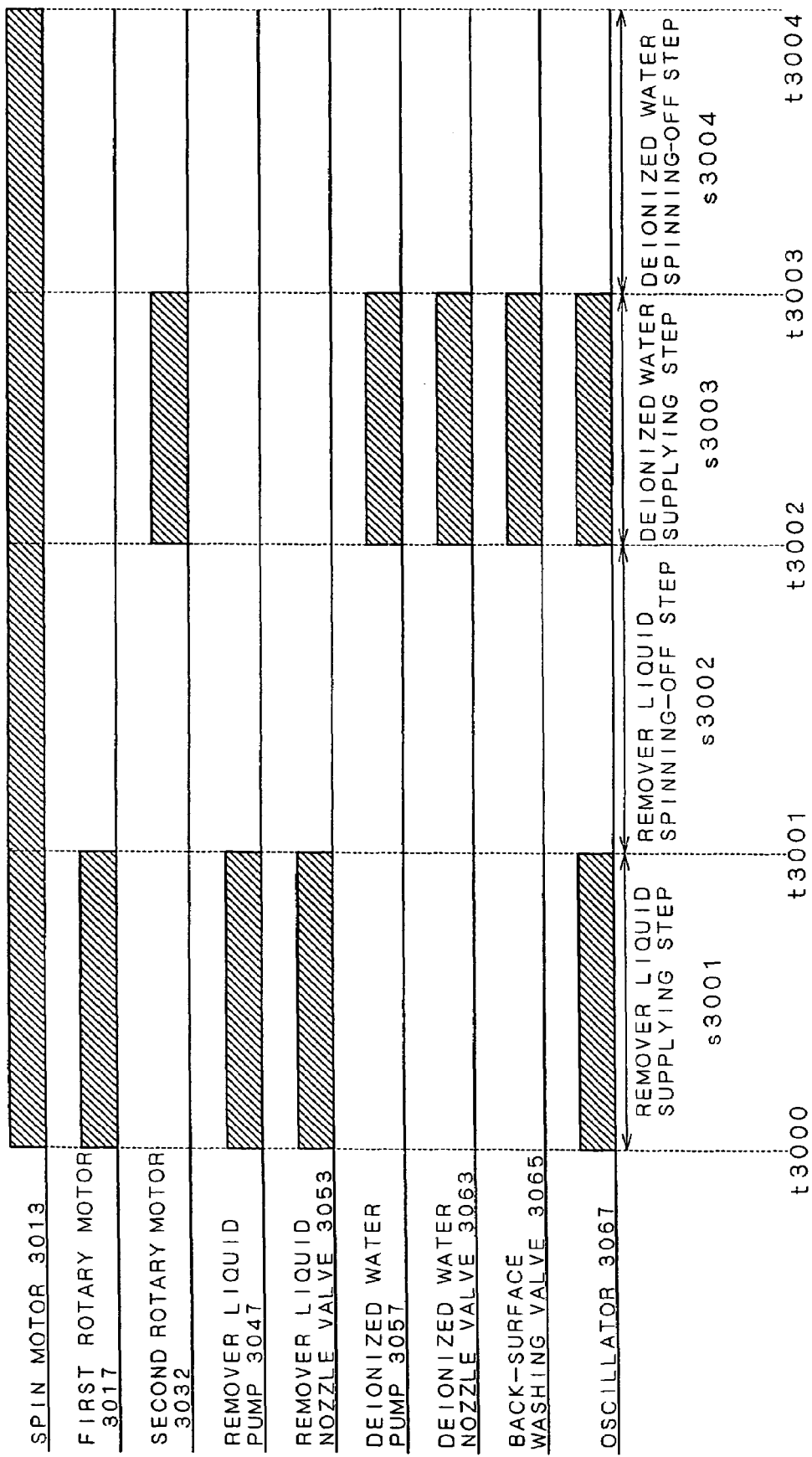
FIG. 22 is a detailed view of the flow of the substrate processing method according to the first preferred embodiment of the third aspect.

FIG. 21 is a view showing the first preferred embodiment of the substrate processing method using the above-described substrate processing apparatus 3001. As shown in FIG. 21, the substrate processing method of the present preferred embodiment comprises a remover liquid supplying step s3001, a remover liquid dispersing step s3002, a deionized water supplying step s3003 and a deionized water dispersing step s3004. In the following, each step will be explained with reference to FIG. 22.

(1. Remover Liquid Supplying Step s3001)

First, until the time t3000, the control means 3069 controls the temperature controllers 3051 and 3061 so that the remover liquid and the deionized water have predetermined temperatures.

On the other hand, until the time t3000, the control means 3069 drives the spin motor 3013 to rotate the substrate W, so that the substrate W rotates at a predetermined rotation speed at the time t3000.

Then, at the time t3000, the control means 3069 controls the first pivot motor 3017 to pivot, thereby controlling the remover liquid nozzle 3007 to swivel.

Furthermore, at the time t3000, the control means 3069 drives the remover liquid pump 3047, thereby allowing the remover liquid to be discharged toward the remover liquid nozzle 3007, while switching the remover liquid nozzle valve 3053 to an open state, thereby making the remover liquid nozzle 3007 supply the remover liquid to the substrate W. As a consequence, the remover liquid supplied from the remover liquid nozzle 3007 is supplied on the substrate W so that the reach point to the substrate W moves on the circular arc passing the center of rotation C of the substrate W in the horizontal surface including the surface of the substrate W as shown by the arrow 3085 in FIG. 18. In this way, the remover liquid supplying step s3001 is executed.

On the other hand, at the time t3000, the control means 3069 controls the oscillator 3067 to transmit an electric signal to the first vibrator 3025 within the remover liquid nozzle 3007, thereby making the first vibrator 3025 vibrate. As a consequence, an ultrasonic wave is applied to the remover liquid to be supplied from the remover liquid nozzle 3007. Therefore, ultrasonic vibration is applied to the reaction products adhered to the substrate W, so that the reaction products become easy to be removed from the substrate W.

At the time t3001 after a predetermined time period has elapsed, the control means 3069 stops driving of the first pivot motor 3017 in the condition that the remover liquid nozzle 3007 is retracted from above the cup 3003. Furthermore, the control means 3069 switches the remover liquid nozzle valve 3053 to a closed state, and stops driving of the remover liquid pump 3047, thereby stopping supply of the remover liquid from the remover liquid nozzle 3007. The control means 3069 causes the oscillator 3067 to stop transmission of an electric signal to the first vibrator 3025 at the time t3001.

By making the reach point of the remover liquid move on the circular arc passing the center of rotation C of the substrate W as described above, it is possible to supply the entire substrate W with a remover liquid which is small in temperature change and is not deteriorated and hence fresh, making it possible to easily remove the reaction products and secure the uniformity in the surface in the entire substrate W.

(2. Remover Liquid Dispersing Step s3002)

Next, at the time t3001, the control means 3069 stops supply of the remover liquid to the substrate W, while controlling the spin motor 3013 to continuously rotate, thereby maintaining the rotating state of the substrate W. As a consequence, the remover liquid dispersing step s3002 is executed.

In this remover liquid dispersing step s3002, the substrate W is rotated at a rotation speed of 500 rpm or more, preferably at a rotation speed in the range of 1000 rpm to 4000 rpm.

Furthermore, the time that the rotation is maintained is at least 1 second or more, preferably 2 to 5 seconds.

In this way, since the rotating state of the substrate is maintained in the condition that supply of the remover liquid to the substrate W is stopped, the remover liquid on the substrate W is dispersed from the substrate W owing to the centrifugal force.

Since the substrate is rotated while being held in the horizontal state, the remover liquid is dispersed uniformly from the substrate W. Therefore, the uniformity in the surface of the substrate W is maintained.

Furthermore, since the vacuum chuck 3015 contacts only with the back surface of the substrate W, there is no member that contacts with the end edge of the substrate W. Therefore, there is no object that prevents advance of the remover liquid dispersed from the top surface of the substrate W to outside of the substrate W in the horizontal direction, so that the time required for dispersing the remover liquid from the substrate W is reduced. Accordingly, it is possible to improve the throughput.

Since the holding and rotating portion 3005 merely holds one substrate W, the rotation speed of the substrate W can be easily increased. As a result, the time period required for dispersing the remover liquid from the substrate W is reduced. This is also effective to improve the throughput.

(3. Deionized Water Supplying Step s3003)

At the time t3002, the control means 3069 controls the second pivot motor 3032 to pivot, thereby controlling the deionized water nozzle 3009 to swivel.

At time t3002, the control means 3069 drives the deionized water pump 3057, thereby allowing the deionized water to be discharged toward the deionized water nozzle 3009, while switching the deionized water nozzle valve 3063 to an open state, thereby making the deionized water nozzle 3009 supply the deionized water to the substrate W. As a consequence, the deionized water supplied from the deionized water nozzle 3009 is supplied on the substrate W so that the reach point to the substrate W moves on the circular arc passing the center of rotation C of the substrate W in the horizontal surface including the surface of the substrate W as shown by the arrow 3087 in FIG. 18. In this way, the deionized water supplying step s3003 is executed.

On the other hand, at the time t3002, the control means 3069 controls the oscillator 3067 to transmit an electric signal to the second vibrator 3039 within the deionized water nozzle 3009, thereby making the second vibrator 3039 vibrate. As a consequence, an ultrasonic wave is applied to the deionized water to be supplied from the deionized water nozzle 3009. Therefore, ultrasonic vibration is applied to the reaction products adhered to the substrate W, so that the reaction products become easy to be removed from the substrate W.

Also, at the time t3002, the control means 3069 switches the back surface cleaning valve 3065 to an opened state to make the back surface cleaning nozzle 3011 supply deionized water to the back surface of the substrate W, thereby cleaning the back surface of the substrate W.

At the time t3003 after a predetermined time period has elapsed, the control means 3069 stops driving of the second pivot motor 3031 in the condition that the deionized water nozzle 3009 is retracted from above the cup 3003. The control means 3069 switches the deionized water nozzle valve 3063 to a closed state, and stops driving of the deionized water pump 3057, thereby stopping supply of the deionized water from the deionized water nozzle 3009. The control means 3069 causes the oscillator 3067 to stop transmission of the electric signal to the second vibrator 3039 at the time t3003.

By making the reach point of the deionized water move on the circular arc passing the center of rotation C of the substrate W as described above, it is possible to supply the entire substrate W with deionized water which is small in temperature change and is not deteriorated and hence fresh, making it possible to easily remove the reaction products and secure the uniformity in the surface in the entire substrate W.

(2. Deionized Water Dispersing Step s3004)

At the time t3003, the control means 3069 stops supply of the deionized water to the substrate W, while controlling the spin motor 3013 to continuously rotate, thereby maintaining the rotating state of the substrate W. As a consequence, the deionized water dispersing step s3004 is executed.

The reaction products are removed by the remover liquid and the deionized water supplied to the substrate W in the manner as described above.

According to the present preferred embodiment, in the remover liquid dispersing step s3002, the remover liquid on the substrate W is dispersed, so that no or very few remover liquid remains on the substrate W. Therefore, even if the substrate W is supplied with the deionized water in the deionized water supplying step s3003 under this condition, no or a small amount of remover liquid becomes contact with the deionized water, so that a pH shock, if it occurs, will hardly affect on the substrate W, or such a pH shock itself does not occur. Therefore, the necessity of the intermediate rinse step is eliminated, and hence the throughput is improved. Furthermore, by omitting the intermediate rinse step, it is possible to reduce the cost and eliminate the necessity of using an organic solvent used in the intermediate rinse step, resulting in improvement of the safety of the apparatus.

Furthermore, since the remover liquid and the deionized water to which an ultrasonic wave is supplied are supplied, it is possible to remove the reaction products more quickly.

While rotation of the substrate W is not stopped from start of the remover liquid supplying step s3001 until end of the deionized water dispersing step s3004 in the substrate processing method of the present preferred embodiment, rotation of the substrate W may be stopped either between the remover liquid supplying step s3001 and the remover liquid dispersing step s3002, between the remover liquid dispersing step s3002 and the deionized water supplying step s3003, or between the deionized water supplying step s3003 and the deionized water dispersing step s3004.

It is essential to provide a step of stopping rotation of the substrate W for reducing the remover liquid on the substrate W even in short time before staring the deionized water supplying step s3003.

Rotation speeds of the substrate W in the remover liquid supplying step s3001, the remover liquid dispersing step s3002, the deionized water supplying step s3003 and the deionized water dispersing step s3004 may be equal to each other or different from each other.

While an ultrasonic wave is applied to both the remover liquid and the deionized water in the substrate processing method of the present preferred embodiment, the ultrasonic wave may be applied to either one of the remover liquid or the deionized water.

3. Second Preferred Embodiment of Substrate Processing Method

Figure 23:
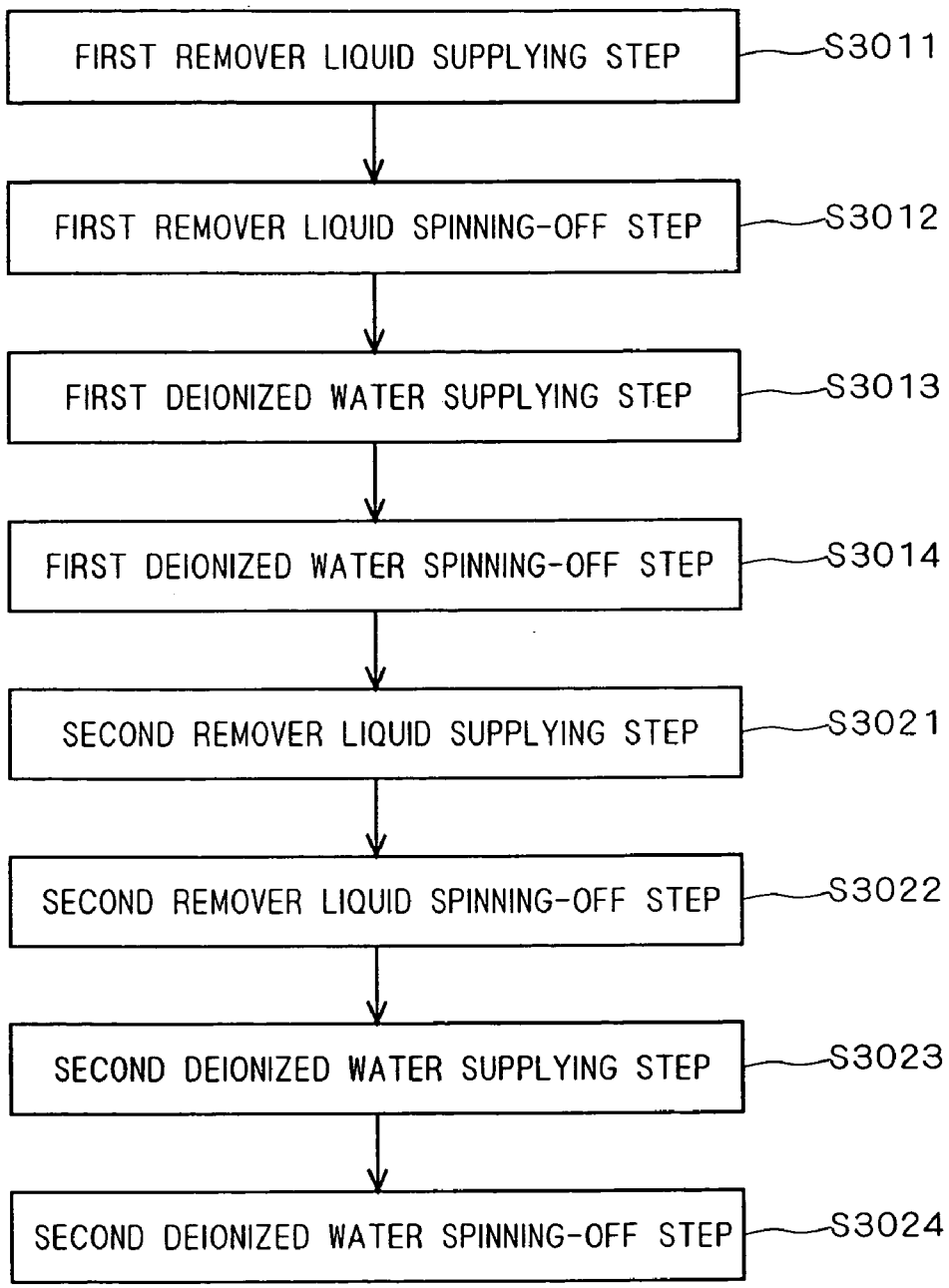
FIG. 23 is a flow chart of the substrate processing method according to the second preferred embodiment of the third aspect.

A substrate processing method of the second preferred embodiment will be described with reference to FIG. 23.

The substrate processing method of the second preferred embodiment repeats the substrate processing method of the first preferred embodiment twice.

That is, the substrate processing method of the present preferred embodiment comprises: a first remover liquid supplying step s3011; a first remover liquid dispersing step s3012; a first deionized water supplying step s3013; a first deionized water dispersing step s3014; a second remover liquid supplying step s3021; a second remover liquid dispersing step s3022; a second deionized water supplying step s3023; and a second deionized water dispersing step s3024.

In this context, the first remover liquid supplying step s3011 and the second remover liquid supplying step s3022 are as same as the remover liquid supplying step s3001 in the first preferred embodiment of the substrate processing method.

Furthermore, the first remover liquid dispersing step s3012 and the second remover liquid dispersing step s3022 are as same as the remover liquid dispersing step s3002 in the first preferred embodiment of the substrate processing method.

Furthermore, the first deionized water supplying step s3013 and the second deionized water supplying step s3023 are as same as the deionized water supplying step s3003 in the first preferred embodiment of the substrate processing method.

Furthermore, the first deionized water dispersing step s3014 and the second deionized water dispersing step s3024 are as same as the deionized water dispersing step s3004 in the first preferred embodiment of the substrate processing method.

In this substrate processing method of the second preferred embodiment, there is the first deionized water dispersing step s3014 between the first deionized water supplying step s3013 and the second remover liquid supplying step s3021. Therefore, the deionized water supplied on the substrate W in the first deionized water supplying step s3013 is dispersed in the first deionized water dispersing step s3014 so that little or no deionized water remains on the substrate W. If the substrate W is supplied with the remover liquid under this condition, a small amount of or no deionized water will come into contact with the remover liquid, so that a pH shock will hardly affect on the substrate W or a pH shock itself will not occur.

While the present preferred embodiment repeats the substrate processing method of the first preferred embodiment twice, the number of repetition may be repeated more than two.

4. Second Preferred Embodiment of Substrate Processing Apparatus

The second preferred embodiment of the substrate processing apparatus of the present invention will be explained with reference to FIGS. 24 and 25.

Figure 24:
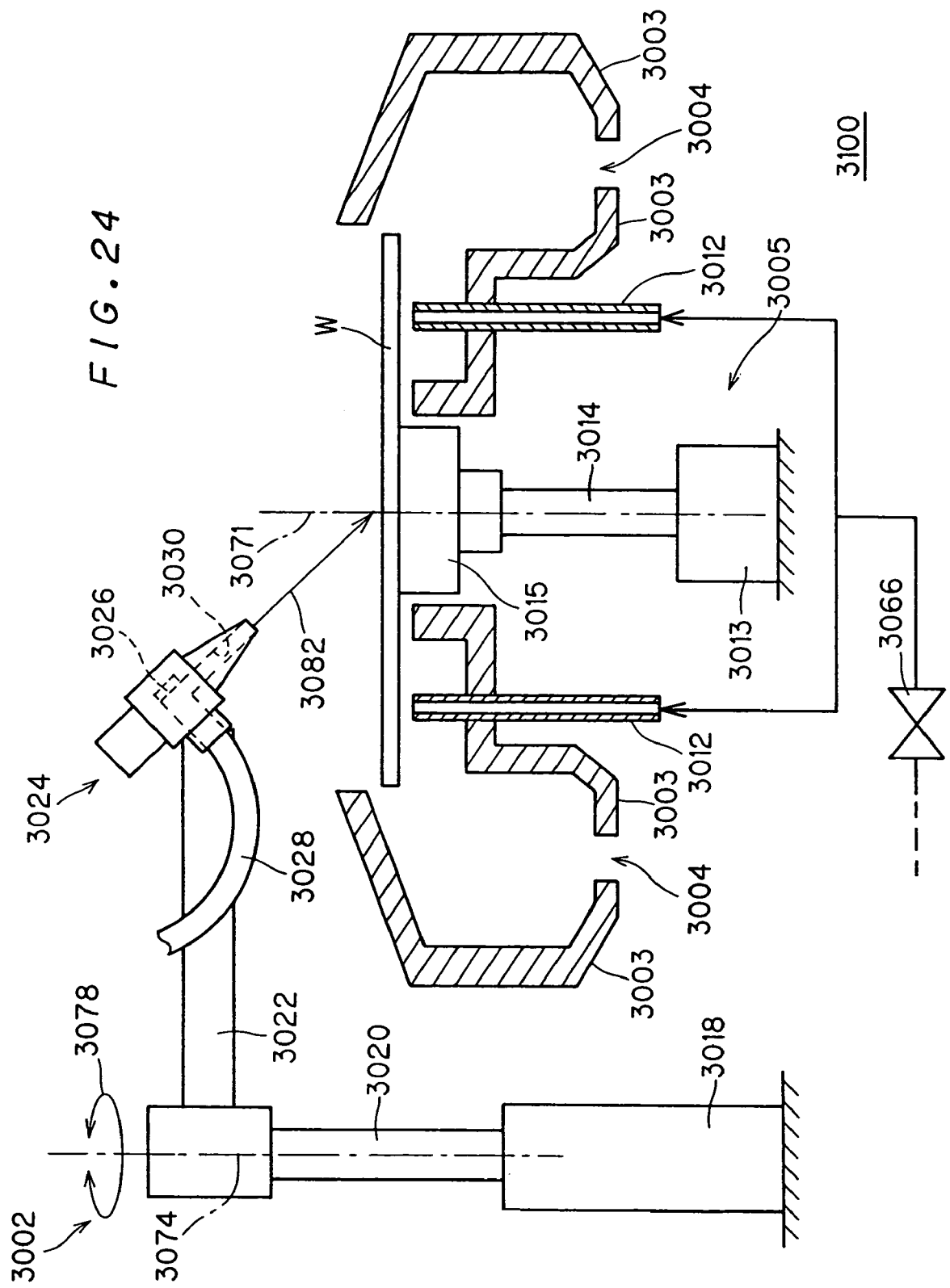
FIG. 24 is a side view of the substrate processing apparatus according to the second preferred embodiment of the third aspect.
Figure 25:
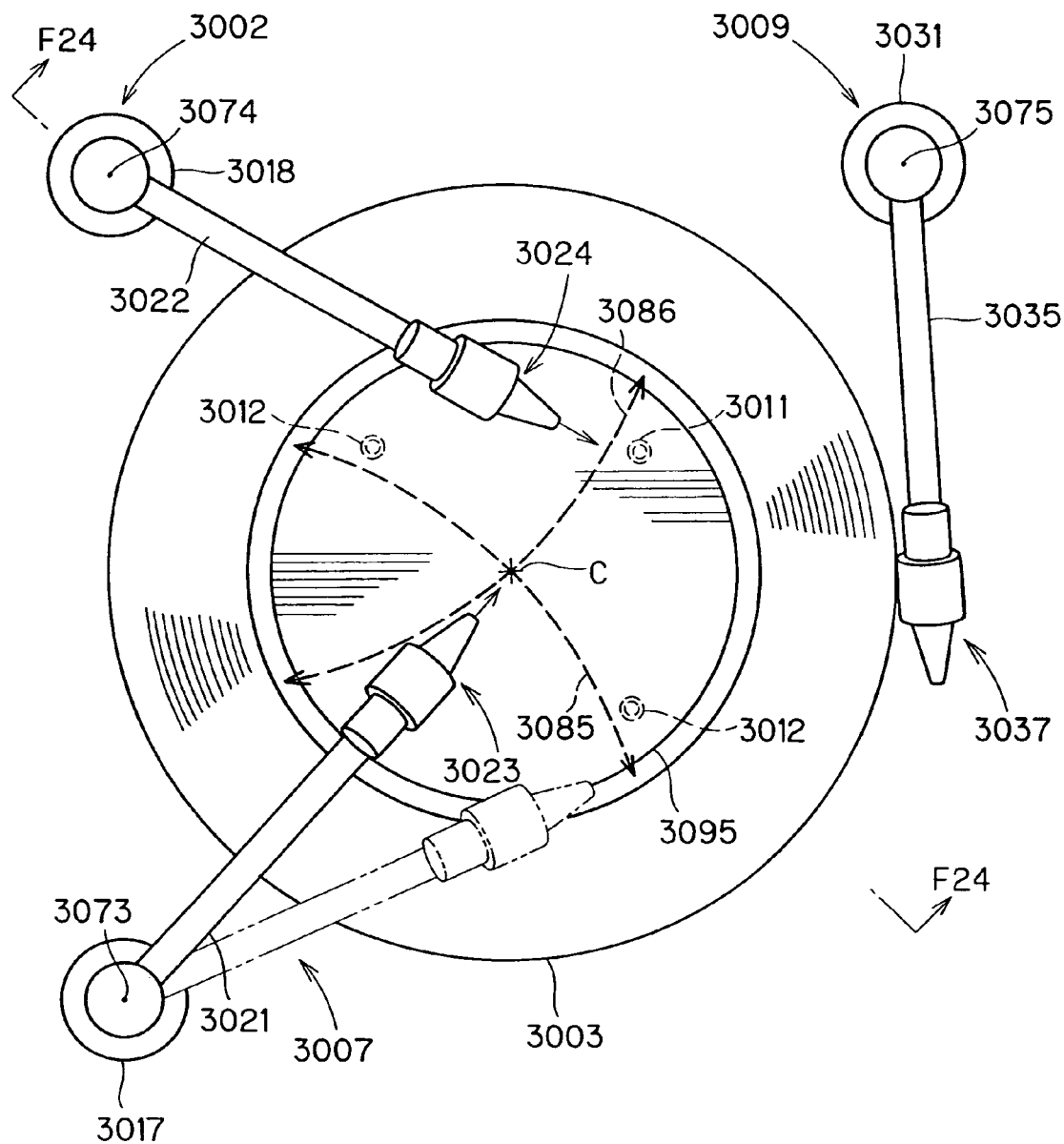
FIG. 25 is a top view of the substrate processing according to the second preferred embodiment of the third aspect.

FIG. 24 is a cross section viewed in the direction of F24-F24 of FIG. 25, in which hatching is partially omitted for convenience.

A substrate processing apparatus 3100 of the second preferred embodiment has a solvent nozzle 3002 serving as an intermediate rinse liquid supplying portion in addition to the substrate processing apparatus 3001 of the first preferred embodiment. The solvent nozzle 3002 constitutes the intermediate rinse liquid supplying portion.

Since the substrate processing apparatus 3100 of the second preferred embodiment has many equivalent parts with the substrate processing apparatus 3001 of the first preferred embodiment, the part equivalent to that of the substrate processing apparatus 3001 will be denoted by the same reference numeral in the drawing and explanation thereof will be omitted.

As shown in FIG. 24, the substrate processing apparatus 3100 has the solvent nozzle 3002.

The solvent nozzle 3002 has a third pivot motor 3018 having a driving shaft which is fixed to the apparatus frame and arranged in the vertical direction, a third pivot shaft 3020 fixed to the driving shaft of the third pivot motor 3018, and a third arm 3022 connected with the top of the third pivot shaft 3020.

The third pivot motor 3018, the third pivot shaft 3020 and the third arm 3022 constitute the third movement means.

At the distal end of the third arm 3022 is provided a solvent nozzle body 3024. The solvent nozzle body 3024 constitutes the intermediate rinse liquid discharge means.

The solvent nozzle body 3024 is provide with a third through hole 3030 so that the axial direction of the solvent to be discharged from the third through hole 3030 is directed to the top surface of the substrate W, and a third tube 28 is connected to the third through hole 3030.

The third through hole 3030 is a conduit run whose one end is connected to the third tube 3028 and other end has an opening toward the top surface of the substrate W. The longitudinal direction of the third through hole 3030 forms a predetermined angle of inclination with respect to the top surface of the substrate W. This angle of inclination determines an angle of incidence with respect to the substrate W of the organic solvent discharged from the third through hole 3030. That is, the angle of inclination of the third through hole 3030 is nearly equal to the angle of incidence with respect to the substrate W of the remover liquid discharged from the third through hole 3030.

In the present preferred embodiment, since the angle of inclination of the third through hole 3030 is set at 45 degrees, the organic solvent discharged from the third through hole 3030 reaches the substrate W at an angle of incident of 45 degrees.

On the other hand, the solvent nozzle body 3024 is adjusted so that when the third arm 3022 pivots about an axis 3074 in the manner indicated by the arrow 3078, the reach point of an organic solvent 3082 discharged from the third through hole 3030 with respect to the substrate W (hereinafter, referred to as a solvent reach point) moves on the line that passes the center of rotation C of the substrate W and a rotation circle 3095 drawn by the end edge of the rotating substrate W.

In the present preferred embodiment, as shown by the arrow 3086 in FIG. 25, it is so adjusted that the deionized water reach point moves reciprocally on the circular arc that passes the center of rotation C of the substrate W and crosses at two points on the circumference of the rotation circle 3095. Consequently, the major surface of the substrate W is scanned with the reach a solvent reach point along the arc path.

The line passing the center of rotation C of the substrate W and the circumference of the rotation circle 3095 drawn by the end edge of the rotating substrate W may be a straight line or a curved line.

Furthermore, the solvent nozzle body 3024 may be moved so that the deionized water reach point reciprocally moves on the circular arc whose chord is the radius of the rotation circle 3095 or reciprocally moves on the radius of the rotation circle 3095, or reciprocally moves on the diameter of the rotation circle 3095.

In the third through hole 3030, a third vibrator 3026 is formed at the position where it will contact with the organic solvent passing through the third through hole 3030.

The third tube 28 supplies the third through hole 3030 with the organic solvent. The third vibrator 3026 vibrates in response to an electric signal from an oscillator 3067, and applies an ultrasonic wave to the organic solvent passing through the third through hole 3030.

In the solvent nozzle 3002 as described above, the third pivot motor 3018 rotates the third pivot shaft 3020, whereby the third arm 3022 swivels about the axis 3074. As a result, as shown in FIG. 25, the reach point of the organic solvent 3081 reciprocally moves on the substrate W along a circular arc as shown by the arrow 3086 while passing the center of rotation C of the substrate W. Then, the substrate W is supplied with the organic solvent to which an ultrasonic wave has been applied.

The angle of inclination of the third through hole 3030 may be any angles smaller than 90 degrees, with an angle of 30 degrees or more and 60 degrees or less being preferred, with an angle of 45 degrees being most preferred.

This enables the organic solvent to reach the interface between the reaction products and the surface of the substrate W in the condition that it is unlikely to be affected by projections and depressions such as patterns on the substrate W. In other words, the organic solvent can reach the interface between the reaction products and the surface of the substrate W in the condition that attenuation of ultrasonic wave energy of the organic solvent is small.

Since the ultrasonic wave oscillates along the discharge direction of the organic solvent, the organic solvent having reached the interface between the surface of the substrate W and the reaction products have plenty of energy that is effective to cut in between the reaction products and the substrate W. Therefore, since the organic solvent strongly acts on the lower part of the reaction product, the reaction products are easily removed from the substrate W and the removing efficiency is improved.

In addition, since the solvent nozzle body 3024 having the third through hole 3030 as described above is adjusted to move so that the reach point of the solvent moves on the line passing the center of rotation C of the substrate W and the circumference of the rotation circle 3095 drawn by the end edge of the rotating substrate W, the organic solvent having an ultrasonic wave uniformly applied thereto is supplied on the substrate W. Consequently, it is possible to secure the uniformity in the surface of the substrate during process while improving the removing efficiency of the reaction product.

In addition, since the remover liquid remaining in the vicinity of the interface between the reaction products and the substrate W can also be cleaned, it is possible to desirably remove the remover liquid from the substrate W. Therefore, even if the deionized water is supplied to the substrate in the deionized water supplying step that will be described below, a pH shock is unlikely to occur.

The back surface solvent nozzle 3012 is a tubular member which penetrates through the cup 3003 and extends in the roughly vertical direction toward the back surface of the substrate W, and supplied with an organic solvent via a back surface solvent valve 3066 as will be described below. As a result, it is possible to discharge an organic solvent with respect to the back surface of the substrate W.

Figure 26:
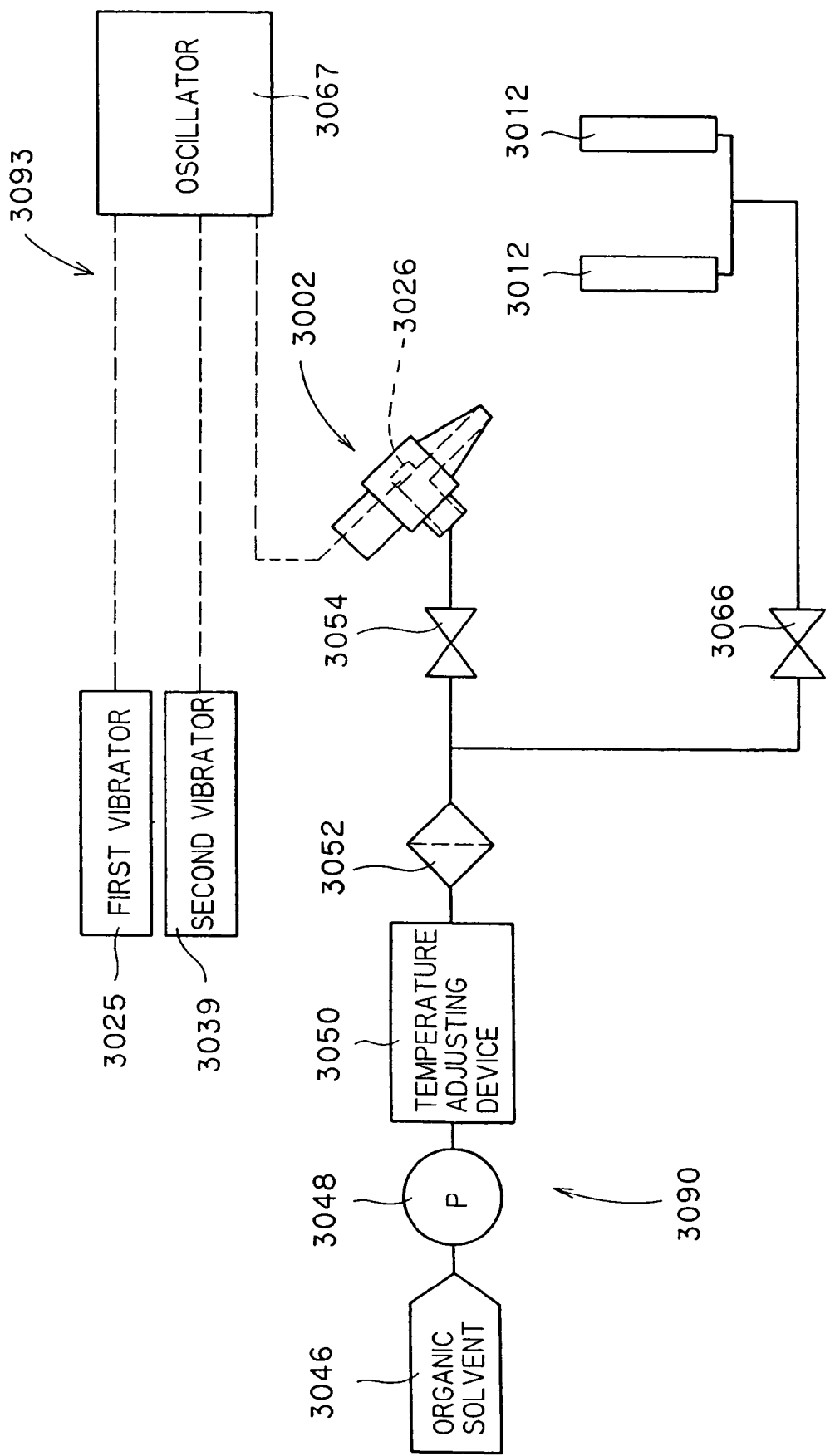
FIG. 26 is a piping drawing of the substrate processing apparatus according to the second preferred embodiment of the third aspect.

FIG. 26 shows a solvent supplying system 3090 for supplying the solvent nozzle 3002 with an organic solvent.

The solvent supplying system 3080 has a solvent pump 3048 for pumping an organic solvent from a solvent source 3046 provided outside the apparatus, a temperature controller 3050 for controlling the temperature of the organic solvent by heating or cooling the organic solvent pumped by the solvent pump 3048 to a predetermine temperature, a filter 3052 for filtering contaminants from the organic solvent whose temperature has been controlled by the temperature controller 3050, a solvent nozzle valve 3054 for opening/closing passage of the organic solvent after being subjected to the filtering toward the solvent nozzle 3002, and the back surface solvent valve 3066 for opening/closing passage of the organic solvent after being subjected to the filtering toward the back surface solvent nozzle 3012.

With the configuration as described above, the solvent supplying system 3090 can supply the solvent nozzle 3002 with the organic solvent whose temperature has been controlled to the predetermined temperature by means of the temperature controller 3052 and which has been cleaned by means of the filter 50.

In addition, the ultrasonic wave applying portion 3093 has the third vibrator 3026 provided within the solvent nozzle 3002 and the third vibrator 3026 vibrates in response to an electric signal transmitted from the oscillator 3067.

With such a configuration, the ultrasonic wave applying portion 3093 applies an ultrasonic wave to the organic solvent that is to be supplied to the substrate W from the solvent nozzle 3002.

As described above, since the substrate W can be supplied with the organic solvent to which ultrasonic wave has been applied, it is possible to remove the reaction products more quickly and hence the throughput is improved. Though the throughput is improved by applying an ultrasonic wave to either one of the organic solvent or the deionized water, it is possible to remove the reaction products more quickly and improve the throughput by applying an ultrasonic wave to two or all of the remover liquid, the organic solvent and the deionized water.

Figure 27:
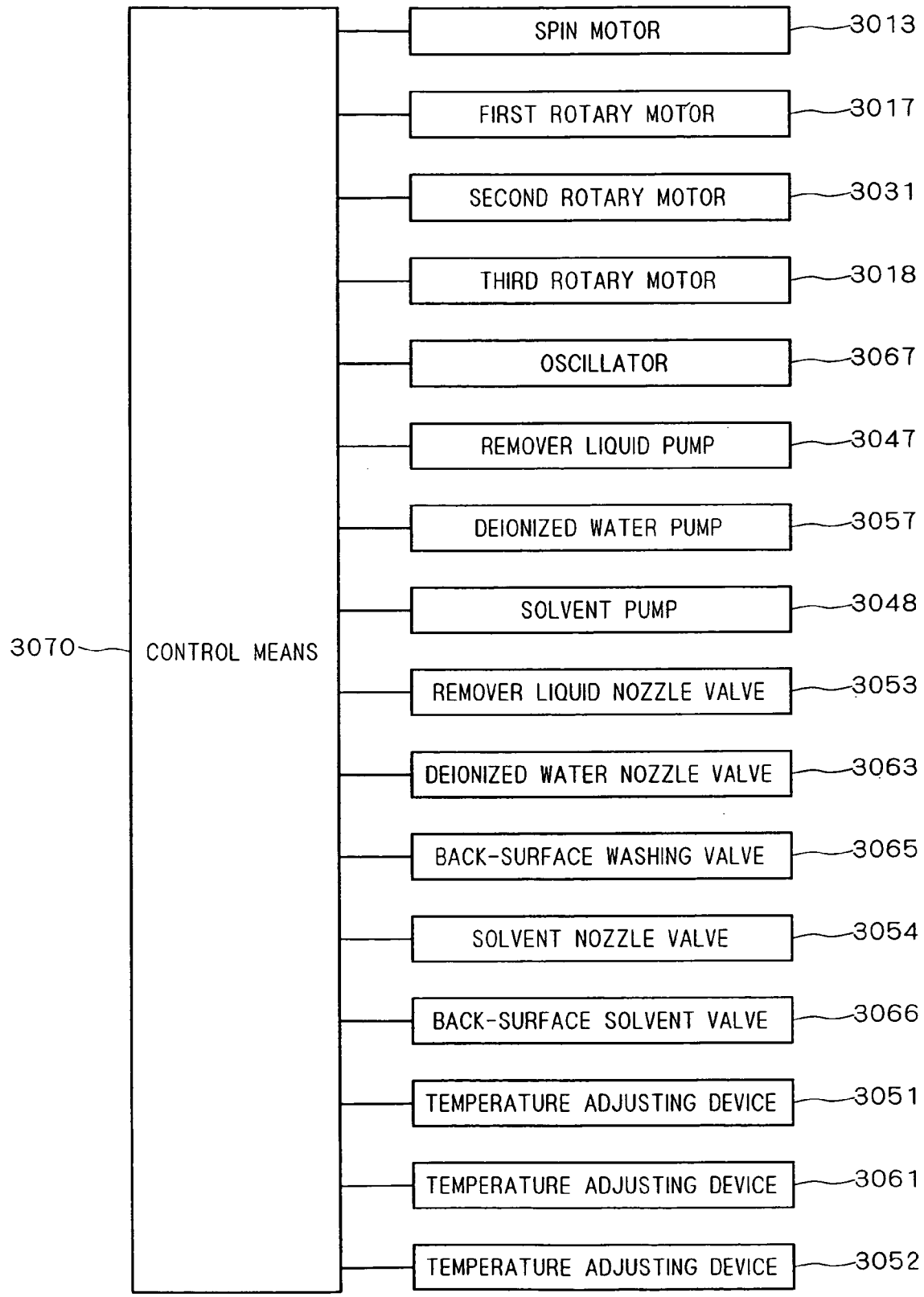
FIG. 27 is a hard configuration view of the substrate processing apparatus according to the second preferred embodiment of the third aspect.

Next, a hardware configuration of the substrate processing apparatus 3100 will be explained with reference to FIG. 27.

Similarly to the control means 3069 in the first preferred embodiment of the substrate processing apparatus, to a control means 3070, the spin motor 3013, the first pivot motor 3017, the second pivot motor 3031, the oscillator 3067, the remover liquid pump 3047, the deionized water pump 3057, the remover liquid nozzle valve 3053, the deionized water nozzle valve 3063, the back surface cleaning valve 3065, the temperature controller 3051 and the temperature controller 3061 are connected.

Furthermore, to the control means 3070, the third pivot motor 3018, the solvent pump 3048, the solvent nozzle valve 3054, the back surface solvent valve 3066 and the temperature controller 3052 are connected.

The control means 3070 controls these connected members in the manner as described in the third preferred embodiment of the substrate processing method that will be described below.

Though the substrate processing apparatus 3100 of the present preferred embodiment has three vibrators, the first vibrator 3025 for applying an ultrasonic wave to the remover liquid, the second vibrator 3039 for applying an ultrasonic wave to the deionized water and the third vibrator 3026 for applying an ultrasonic wave to the organic solvent, it is also possible to have either one or two of these vibrators.

5. Third Preferred Embodiment of Substrate Processing Method

Referring to FIG. 28, the third preferred embodiment of the substrate processing method using the above-described substrate processing apparatus 3100 will be explained.

The substrate processing method of the present preferred embodiment comprises a remover liquid supplying step s3031, a remover liquid dispersing step s3032, a solvent supplying step s3033 as an intermediate rinse step, a deionized water supplying step s3034 and a deionized water dispersing step s3035.

Substantially, the substrate processing method of the present preferred embodiment is such that a solvent supplying step is applied between the remover liquid dispersing step s3002 and the deionized water supplying step s3003 in the substrate processing method of the first preferred embodiment which comprises the remover liquid supplying step s3001, the remover liquid dispersing step s3002, the deionized water supplying step s3003 and the deionized water dispersing step s3004.

Therefore, the remover liquid supplying step s3031, the remover liquid dispersing step s3032, the deionized water supplying step s3034 and the deionized water dispersing step s3035 correspond to the remover liquid supplying step s3001, the remover liquid dispersing step s3002, the deionized water supplying step s3003 and the deionized water dispersing step s3004 in the substrate processing method of the first preferred embodiment, respectively, so that the explanations thereof will be omitted.

Figure 29:
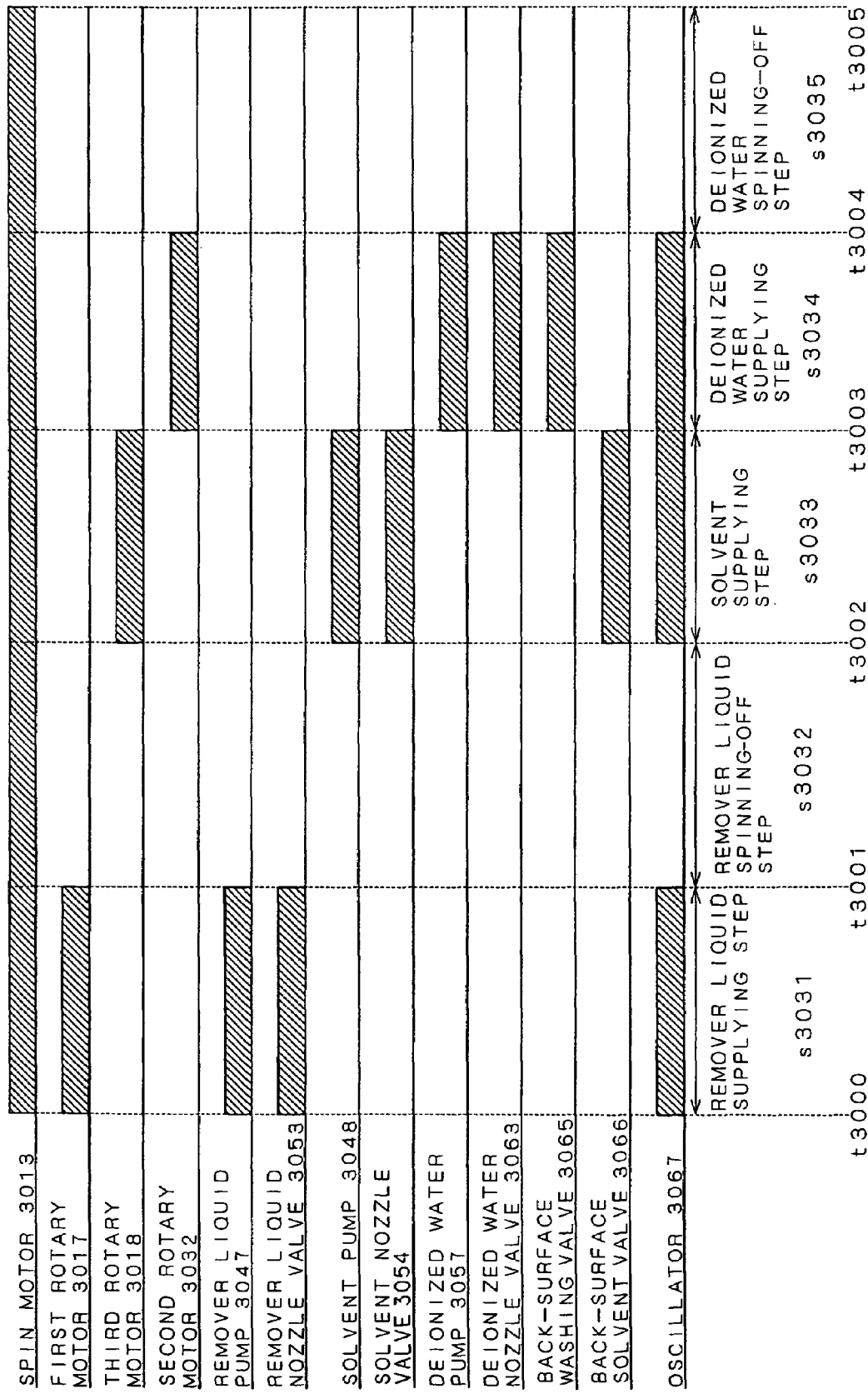
FIG. 29 is a detailed view of the flow the substrate processing method according to the third preferred embodiment of the third aspect.

Next, the solvent supplying step s3033 of the present preferred embodiment will be explained. As shown in FIG. 29, after the remover liquid supplying step s3031 and the remover liquid dispersing step s3032, the solvent supplying step s3033 is executed. In the remover liquid dispersing step s3032, since the substrate is kept rotating in the condition that supplying of the remover liquid to the substrate W is stopped, the remover liquid on the substrate W is dispersed from on the substrate W by the centrifugal force, so that the remover liquid remaining on the substrate W becomes as small as possible.

Next, at time t3002, the control means 3070 controls the third pivot motor 3018 to pivot, thereby rotating the solvent nozzle 3002.

Furthermore, at the time t3002, the control means 3070 drives the solvent pump 3048, thereby allowing the organic solvent to be discharged toward the solvent nozzle 3002, and drives temperature controller 3052 to control the organic solvent to a predetermined temperature, while switching the solvent nozzle valve 3054 to an open state, thereby making the solvent nozzle 3002 supply the organic solvent to the substrate W. As a consequence, the organic solvent supplied from the solvent nozzle 3002 is supplied on the substrate W so that the reach point to the substrate W moves on the circular arc passing the center of rotation C of the substrate W in the horizontal surface including the surface of the substrate W as shown by the arrow 3086 in FIG. 25. In this way, the solvent supplying step s3033 is executed.

On the other hand, at the time t3002, the control means 3070 controls the oscillator 3067 to transmit an electric signal to the third vibrator 3026 within the solvent nozzle 3002, thereby making the third vibrator 3026 vibrate. As a consequence, an ultrasonic wave is applied to the organic solvent to be supplied from the solvent nozzle 3002.

For this reason, ultrasonic vibration is applied to the reaction products adhered to the substrate W, so that the reaction products become easy to be removed from the substrate W.

Furthermore, at the time t3002, the control means 3070 switches the back surface solvent valve 3066 to the open state to allow the back surface solvent nozzle 3012 to supply the back surface of the substrate W with the organic solvent, thereby cleaning out the remover liquid on the back surface of the substrate W.

As described above, in the solvent supplying step s3033, by supplying the substrate W with the organic solvent, the remover liquid is completely removed from the substrate W. Consequently, when the substrate W is supplied with the deionized water in the subsequent deionized water supplying step s3034, there is no remover liquid that will come into contact with the deionized water, so that it is possible to prevent a pH shock from occurring. Therefore, it is possible to prevent occurrence of damage to the thin film on the substrate W.

Moreover, since the remover liquid is dispersed from the substrate W in the remover liquid dispersing step s3032 in the present preferred embodiment, the remover liquid remaining on the substrate W is slight at this point of time. Therefore, it is possible to reduce the time required for cleaning out the remover liquid by the organic solvent in the solvent supplying step s3033. As a result, the throughput is improved. Similarly, since the remover liquid remaining on the substrate is slight, it is possible to reduce the amount of organic solvent required in the solvent supplying step s3033 and reduce the cost.

In the present preferred embodiment, while the deionized water supplying step s3034 is executed directly after the solvent supplying step s3033, a solvent dispersing step for dispersing the solvent on the substrate W may be provided between the solvent supplying step s3033 and the deionized water supplying step s3034.

While rotation of the substrate W is not stopped from start of the remover liquid supplying step s3031 until end of the deionized water dispersing step s3035 in the substrate processing method of the present preferred embodiment, rotation of the substrate W may be stopped either between the remover liquid supplying step s3031 and the remover liquid dispersing step s3032, between the remover liquid dispersing step s3032 and the solvent supplying step s3033, between the solvent supplying step s3033 and the deionized water supplying step s3034, or between the deionized water supplying step s3034 and the deionized water dispersing step s3035.

It is essential to provide a step of stopping rotation of the substrate W and reducing the remover liquid on the substrate W even in short time before staring the solvent supplying step s3033. This reduces the time required for the solvent supplying step s3035, improves the throughput and reduces the cost.

Furthermore, since the remover liquid, the organic solvent and the deionized water to which an ultrasonic wave is applied are supplied, it is possible to remove the reaction products more quickly.

In the present preferred embodiment, a series of process of the remover liquid supplying step s3031, the remover liquid dispersing step s3032, the solvent supplying step s3033, the deionized water supplying step s3034 and the deionized water dispersing step s3035 is executed once, however, this series of process may be repeated for plural times.

6. Third Preferred Embodiment of Substrate Processing Apparatus

Figure 30:
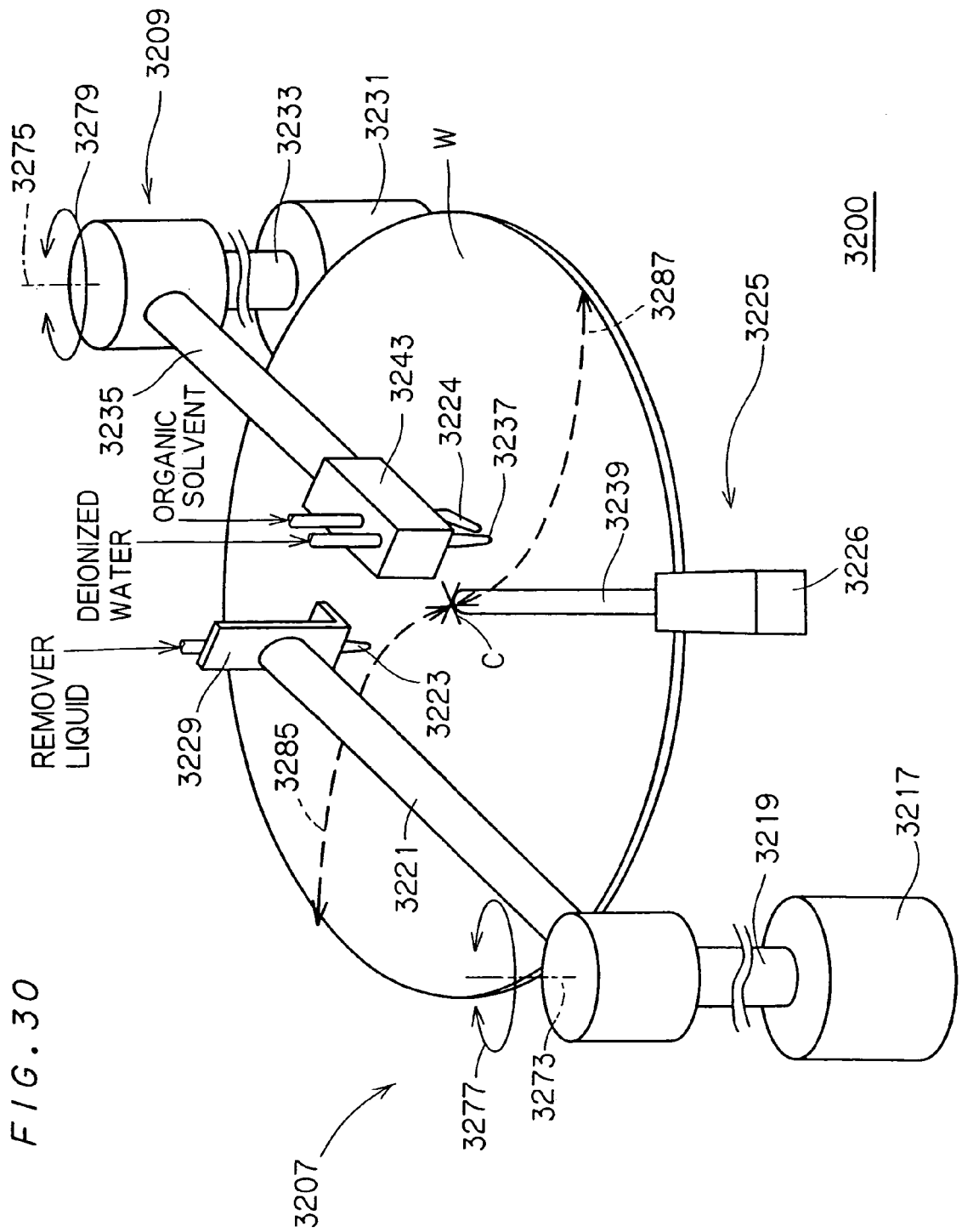
FIG. 30 is a perspective view of the substrate processing apparatus according to the third preferred embodiment of the third aspect.
Figure 31:
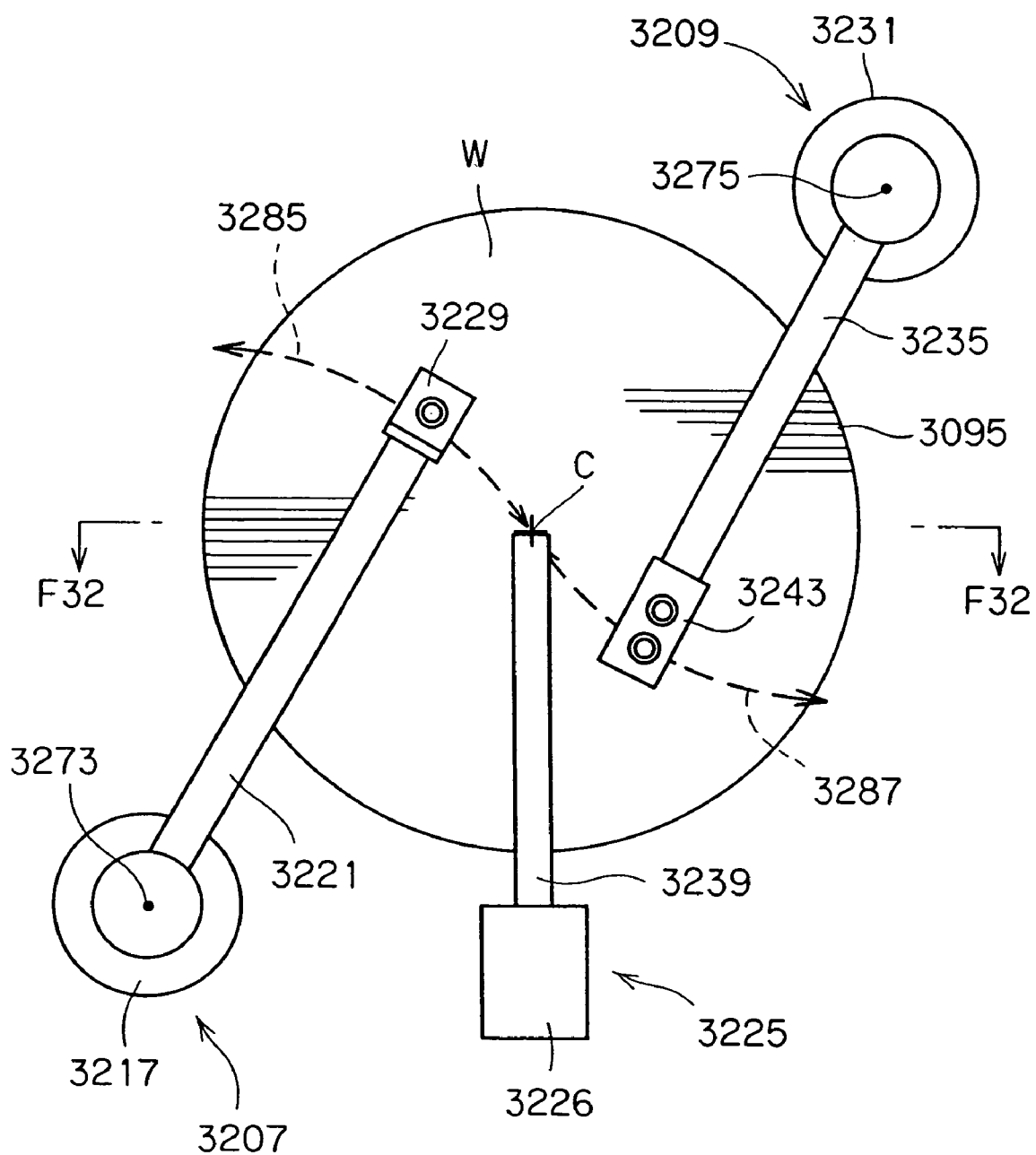
FIG. 31 is a top view of the substrate processing according to the third preferred embodiment of the third aspect.

Referring to FIGS. 30 and 31, the third preferred embodiment of the substrate processing apparatus of the present aspect will be explained. FIG. 31 is a top view of FIG. 30.

A major difference of a substrate processing apparatus 200 of the third preferred embodiment from the substrate processing apparatus 3001 of the first preferred embodiment and the substrate processing apparatus 3100 of the second preferred embodiment is that no vibrator for applying an ultrasonic wave to a process liquid is provided in nozzles which discharge such process liquids as a remover liquid, intermediate rinse liquid and deionized water, whereas direct vibration applying means for directly applying an ultrasonic wave while being in contact with the process liquid discharged onto the substrate and existing on the substrate.

Furthermore, the substrate processing apparatus 200 is different from the substrate processing apparatus 3100 of the second preferred embodiment in that the solvent nozzle body and the deionized water nozzle body are mounted on a single arm, however, other configuration including the holding and rotating portion, the remover liquid supplying system, the solvent supplying system and the deionized water supplying system is approximately equal to that of the substrate processing apparatus 3100. Therefore, the following explanation will be made on only different parts.

As shown in FIG. 30, the substrate processing apparatus 3200 comprises a remover liquid nozzle portion 3207 for supplying the substrate W with a remover liquid, a rinse system nozzle portion 3209 for supplying the substrate W with an organic solvent and deionized water and a direct vibration applying means 3225. Though omitted in the drawing, the substrate W is held by the holding and rotating portion in the manner similar to the substrate processing apparatus 3100.

The remover liquid nozzle portion 3207 has a first pivot motor 3217 having a driving shaft fixed to the apparatus frame and arranged in the vertical direction, a first pivot shaft 3219 fixed to the driving shaft of the first pivot motor 3217 and a first arm 3221 connected to the top portion of the first pivot shaft 3219.

At the distal end of the first arm 3221 is provided a first fixing block 3229, and the first fixing block 3229 is provided with a remover liquid nozzle body 3223.

The remover liquid nozzle body 3223 is a tubular member arranged in the vertical direction, of which one end has an opening toward the substrate W and other end is supplied with the remover liquid from the remover liquid supplying system. In this way, the remover liquid nozzle body 3223 discharges the remover liquid to the substrate W.

In the present preferred embodiment, as shown by the arrow 3285 of FIG. 31, the remover liquid nozzle body 3223 is moved so that the reach point of the remover liquid with respect to the substrate W moves on the circular arc whose chord is the radius of the rotation circle 3095 drawn by the rotating end edge of the substrate W.

The rinse system nozzle portion 3209 has a second pivot motor 3231 having a driving shaft fixed to the apparatus frame and arranged in the vertical direction, a second pivot shaft 3233 fixed to the driving shaft of the second pivot motor 3231 and a second arm 3235 connected to the top portion of the second pivot shaft 3233.

At the distal end of the second arm 3235 is provided a second fixing block 3243, and the second fixing block 3243 is provided with a deionized water nozzle body 3237 and a solvent nozzle body 3224.

The deionized water nozzle body 3237 is a tubular member arranged in the vertical direction, of which one end has an opening toward the substrate W and other end is supplied with deionized water from the deionized water supplying system. In this way, the deionized water nozzle body 3237 discharges deionized water to the substrate W.

On the other hand, the solvent nozzle body 3224 is a tubular member, of which one end has an opening toward the substrate W and other end is supplied with an organic solvent from the solvent supplying system. In this way, the solvent nozzle body 3224 discharges the organic solvent to the substrate W. Incidentally, the distal end of the solvent nozzle body 3224 is bent in the direction that the deionized water nozzle body 3237 exist. More specifically, the tip end of the solvent nozzle body 3224 is bent so that the reach point with respect to the W of the organic solvent that has been discharged from the solvent nozzle body 3224 is equal to the reach point with respect to the substrate W of the deionized water that has been discharged from the deionized water nozzle body 3237. With such configuration, both the organic solvent and the deionized water supplied from the rinse system nozzle 3207 reach to the same position on the substrate W.

In the present preferred embodiment, a shown by the arrow 3287 of FIG. 31, the solvent nozzle body 3224 and the pure nozzle body 3237 are moved so that both of the reach points with respect to the substrate W of the deionized water and the organic solvent reciprocally move on the circular arc whose chord is the radius of the rotation circle 3095 drawn by rotation of the end edge of the substrate W.

In this configuration, the remover liquid nozzle body 3223, the solvent nozzle body 3224 and the deionized water nozzle body 3237 constitute the remover liquid discharging means, the solvent discharging means and the deionized water discharging means, respectively.

The direct vibration applying means 3225 is connected to the oscillator, and has a vibrator 3226 which is caused to vibrate by an electric signal issued from the oscillator, and a vibration bar 3239 which vibrates in response to the vibration of the vibrator 3226 transmitted thereto.

Figure 32:
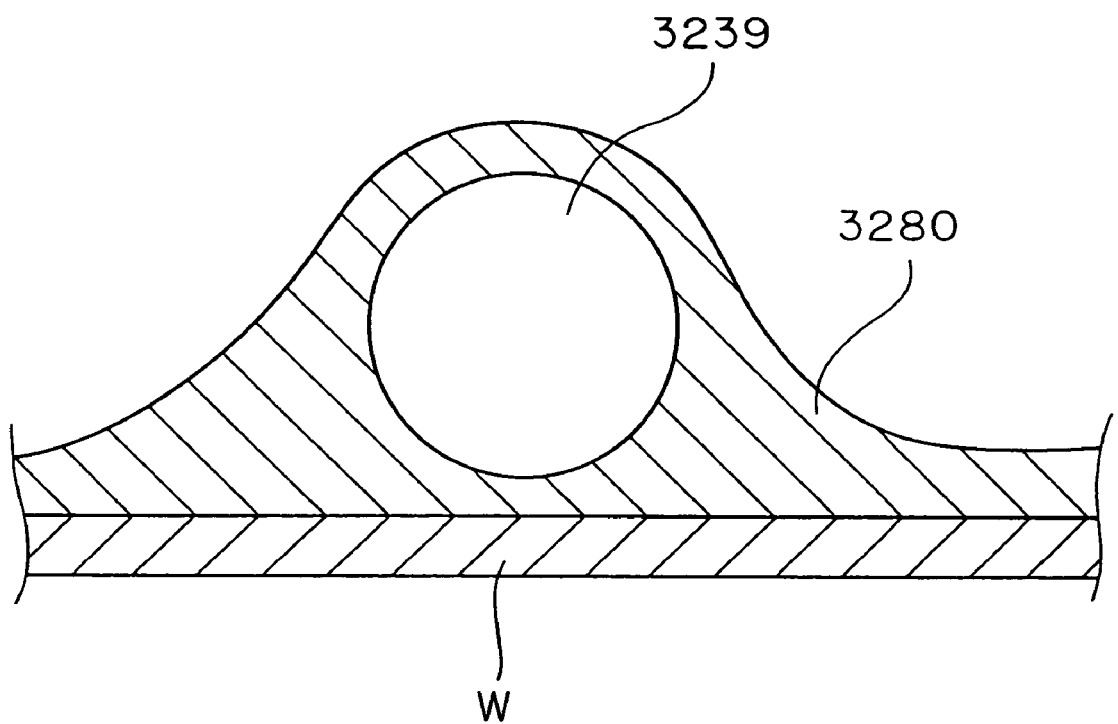
FIG. 32 is a cross section view with respect to F32-F32 of FIG. 31.

The vibration bar 3239 is a bar member crossed in the radial direction of the rotation circle 3095 and having a length approximately equal to the radius of the rotation circle 3095. Furthermore, the vibration bar 3239 is provided above the substrate W at a distance therefrom as shown in FIG. 32. This distance is such that when a process liquid 3280 is supplied to the substrate W, the vibration bar 3239 comes into contact with the process liquid 280 thus supplied on the substrate W. FIG. 32 is a cross section view with respect to the F32-F32 of FIG. 31.

In such direct vibration applying means 3225, the vibration bar 3239 vibrates while contacting with the process liquid existing on the substrate W that has been supplied to the substrate W. Therefore, an ultrasonic wave is directly applied to the process liquid existing on the substrate W.

In the substrate processing apparatus 3200 as described above, it is possible to perform the substrate processing method which comprises: a remover liquid supplying step in which the substrate W is rotated to reciprocally move the remover liquid nozzle body 3223, the rotating substrate W is supplied with the remover liquid, and the vibration bar 3239 contacting with the remover liquid on the substrate W is vibrated to add an ultrasonic wave to the remover liquid existing on the rotating substrate W; a solvent supplying step serving as an intermediate rinse step in which after the remover liquid supplying step, the rotating substrate W is supplied with the organic solvent while the solvent nozzle body 3224 is reciprocally moved, and the vibration bar 3239 contacting with the organic solvent supplied on the substrate W is vibrated to add an ultrasonic wave to the organic solvent existing on the substrate W; a deionized water supplying step in which the rotating substrate W is supplied with the deionized water while the deionized water nozzle body 3237 is reciprocally moved, and the vibration bar 3239 contacting with the deionized water supplied on the substrate W is vibrated to apply an ultrasonic wave to the deionized water existing on the substrate W; and a deionized water dispersing step in which the substrate W is rotated to disperse the deionized water on the substrate W.

In this configuration, since an ultrasonic wave is directly applied to the process liquid such as remover liquid, organic solvent and deionized water existing on the substrate W, the ultrasonic energy possessed by the process liquid in the vicinity of the reaction products is large compared to the case where the process liquid to which an ultrasonic wave has been applied in advance is discharged to the substrate W. Therefore, it is possible to desirably remove the reaction product.

While an ultrasonic wave from the vibration bar 3239 is applied to all of the remover liquid, organic solvent and deionized water on the substrate W, it is also possible to add an ultrasonic wave from the vibration bare 3239 to either one or two of the remover liquid, organic solvent and deionized water on the substrate W.

The holding and rotating portion of each preferred embodiment as described above rotates the substrate while holding the same in the horizontal state. Alternatively, the holding and rotating portion may be designed to hold and rotate the substrate in the condition that the principal surface of the substrate is inclined with respect to the horizontal surface or the principal surface of the substrate runs along the vertical direction.

While the holding and rotating portion of the each preferred embodiment as described above holds only one substrate, the holding and rotating portion may be designed to hold a plurality of substrates.

An objective of the substrate process in each preferred embodiment as described above is a substrate having a polymer generated on it surface as a result of dry-etching. However, the substrate process is especially effective in the case where the objective is a substrate having experienced ashing after the dry-etching.

Since the liquids such as remover liquid and deionized water are supplied at least to the center of rotation C of the substrate W and the substrate W rotates, the liquids supplied to the substrate are supplied uniformly in the vicinity of the substrate W. In particular, in the case where the substrate W is rotated while being held in the horizontal position, the liquid is uniformly supplied on the entire surface of the substrate W, with the result that it is possible to achieve uniform process.

The vacuum chuck 3015 holds the substrate W while contacting only with the back surface of the substrate W, and therefore, the liquid is uniformly supplied on the entire surface of the substrate W, particularly in the peripheral part of the surface of the substrate W, so that the quality of process is not deteriorated.

Furthermore, since the vacuum chuck 3015 holds the substrate W while contacting only with the back surface of the substrate W, no member contact will contact with the peripheral part of the substrate W. Therefore, when the liquid is dispersed from the substrate W, the liquid can be discharged from the substrate W smoothly.

In the above preferred embodiment, it was disclosed that a polymer generated during dry-etching is removed from a substrate that has experienced the dry-etching, however, the present invention is not limited to remove a polymer from a substrate on which the polymer generated during dry-etching.

For example, as is described before, the present invention also includes the case of removing a polymer generated during plasma ashing from the substrate. Therefore, the present invention also includes the case of removing a polymer generated from a resist in various processes not limited to dry-etching.

Furthermore, the present invention is not limited to the case of removing the polymer generated in the processes by dry-etching or plasma ashing, but includes the case of removing various reaction products resulting from a resist from the substrate.

The present invention is not limited to the case of removing reaction products originating from a resist from the substrate, but includes the case of removing a resist itself.

For example, the present invention also includes the case of removing a resist film that is no longer required after completion of the under layer treatment from a substrate on which a resist is applied, a pattern such as wiring pattern is exposed to the resist, the resist is developed, and an under layer treatment (such as etching to the thin film serving as an under layer) is effected on the under layer of the resist.

In such a case, in addition to removing the resist film which is no longer required, it is possible to remove the reaction products that have generated as a result of quality change of the resist film if exists, so that it is possible to improve the throughput and reduce the cost. For example, in the above-mentioned under layer treatment, in the case where dry-etching is effected on the thin film serving as the under layer, also the reaction products are generated. Therefore, it is possible to remove the resist film itself provided for masking the under layer at the time of dry-etching and the reaction products generated as a result of quality change of the resist film at once.

Furthermore, the present invention is not limited to the case of removing reaction products originating from a resist or a resist itself from the substrate, but includes the case of removing micro contaminants and the like coming, for example, from a human body from a substrate.

While the deionized water supplying portion is provided in the above substrate processing apparatus of the preferred embodiment, the deionized water supplying portion may be replaced by a rinse liquid supplying portion. In such a case, a rinse liquid source is provided in place of the deionized water source, and a rinse liquid in the rinse liquid source is supplied to the substrate. In this context, the rinse liquid is a liquid that will turn to water when kept at the atmospheric temperature (about 20° C. to 28° C.) and at the atmospheric pressure (about 1 atmospheric pressure), for example, ozone water in which ozone is dissolved in deionized water, hydrogen water in which hydrogen is dissolved in deionized water and aerated water in which carbon dioxide is dissolved in deionized water. In particular, by using ozone water as the rinse liquid in place of the deionized water, it is possible to remove an organic substance, reaction products generated as a result of quality change of resist and a polymer more completely. Therefore, in this case, it is possible to solve the problem of improving the quality of process of removing the an organic substance, reaction products generated as a result of quality change of resist and a polymer.

In substrate processing method of the above preferred embodiment, the substrate is supplied with the deionized water in the deionized water supplying step and the deionized water is dispersed from the substrate in the deionized water dispersing step, however, the deionized water supplying step may be replaced by the rinse liquid supplying step and the deionized water dispersing step may be replaced by the rinse liquid dispersing step.

In such a case, the rinse liquid is supplied to the substrate in the rinse liquid supplying step and the rinse liquid is dispersed from the substrate in the rinse liquid dispersing step.

Therefore, in the above preferred embodiment, the rinse liquid supplying step and the rinse liquid dispersing step may be executed subsequent to the remover liquid dispersing step or the intermediate rinse step.

In the case where the rinse liquid used in the rinse liquid supplying step is ozone water, it is possible to remove an organic substance, reaction products generated as a result of quality change of resist and a polymer more completely. Therefore, in the above preferred embodiment, the rinse liquid supplying step and the rinse liquid dispersing step may be executed subsequent to the remover liquid dispersing step or the intermediate rinse step.

D. Preferred Embodiments According to Fourth Aspect of the Present Invention

1. First Preferred Embodiment of the Substrate Processing Apparatus

The following description will discuss a first preferred embodiment of the substrate processing apparatus of the present aspect.

Figure 33:
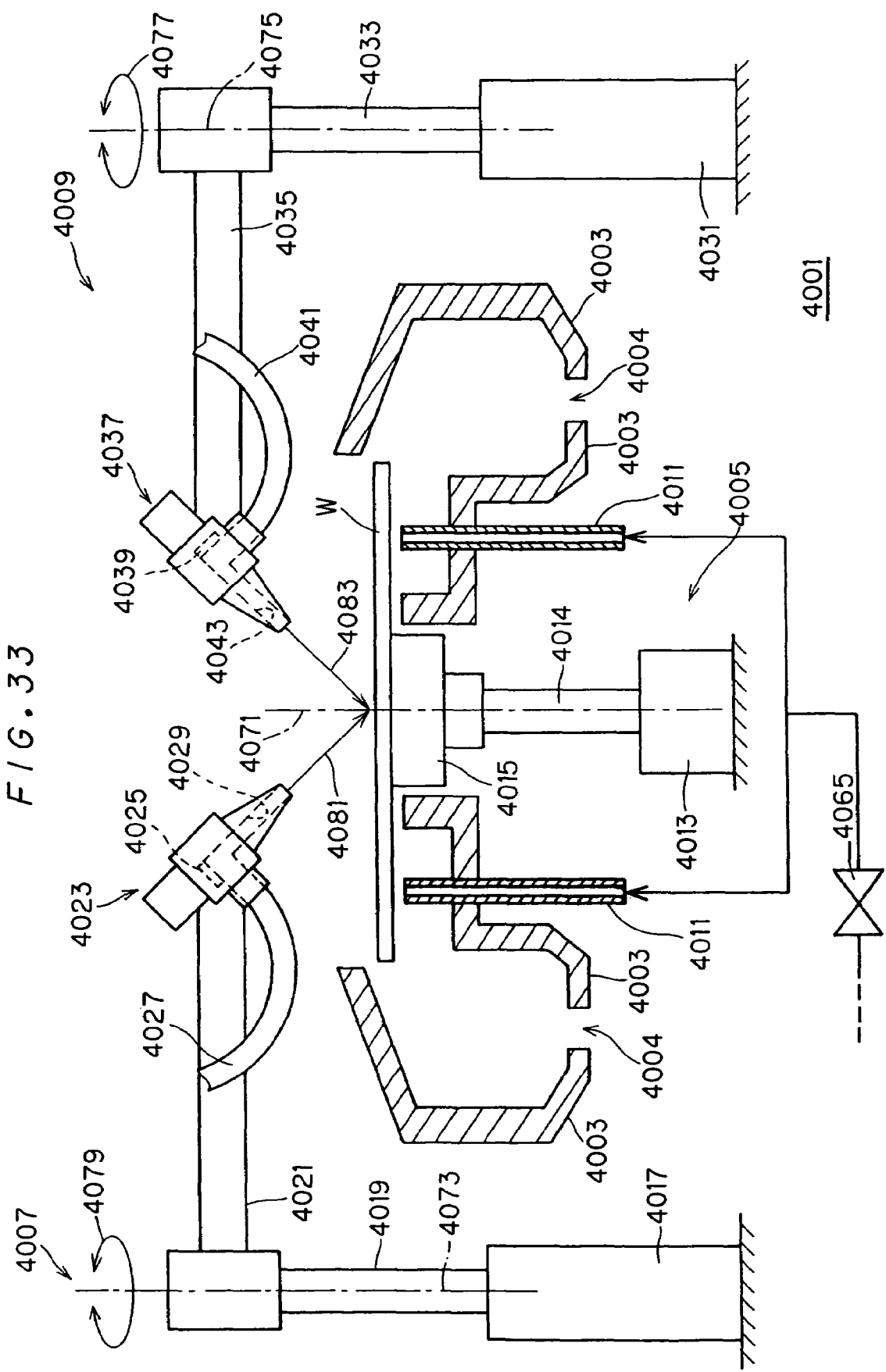
FIG. 33 is a side view a substrate processing apparatus in accordance with a first preferred embodiment of a fourth aspect.
Figure 34:
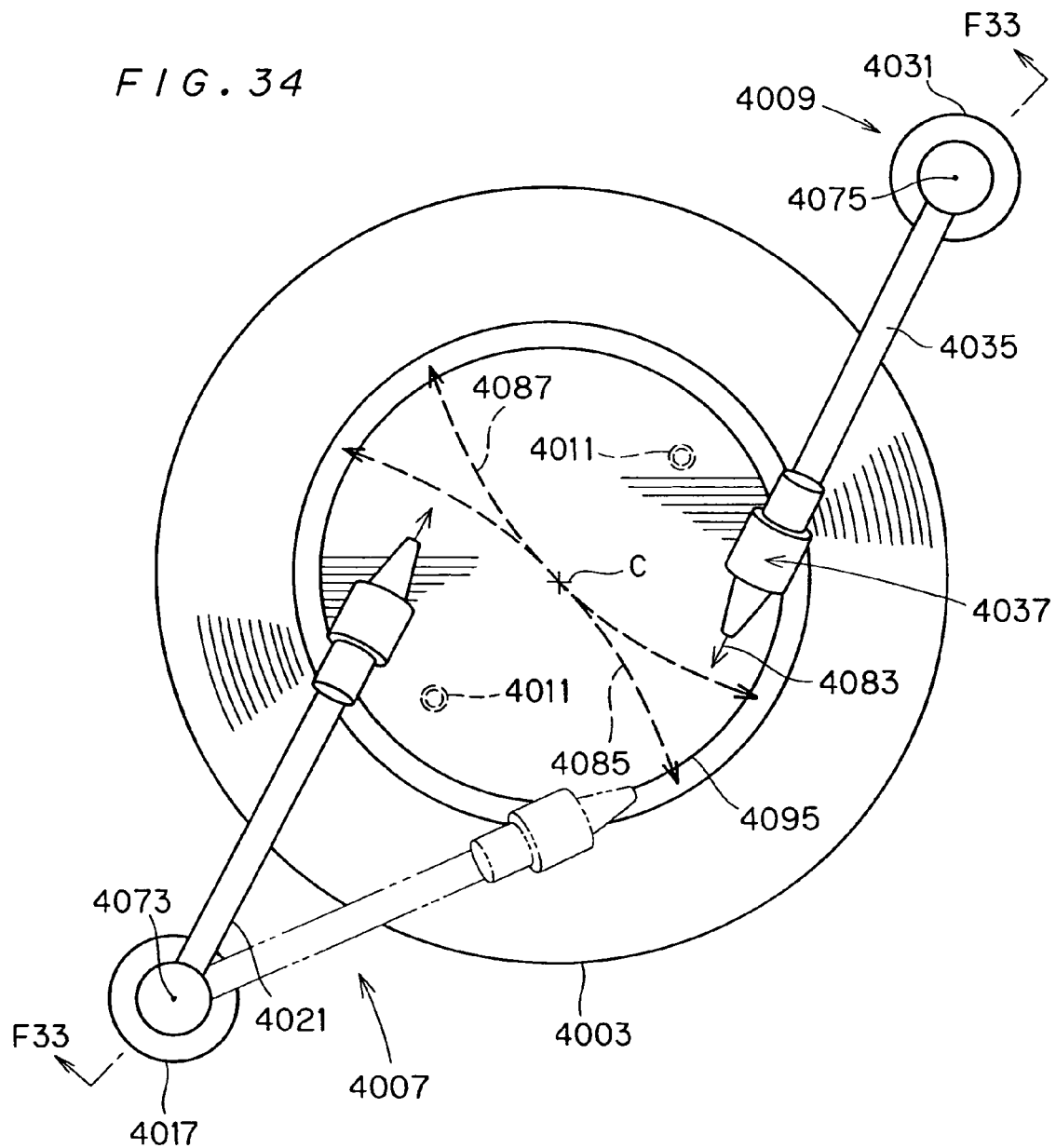
FIG. 34 is a top view of the substrate processing apparatus in accordance with the first preferred embodiment of the fourth aspect.

FIGS. 33 and 34 are drawings that show the construction of a substrate processing apparatus 4001. FIG. 33 is a cross-sectional view taken along line F33-F33 of FIG. 34, and for convenience of explanation, hatching is partially omitted from some portions.

As illustrated in FIG. 33, the substrate processing apparatus 4001 is provided with a cup 4003 which has a virtually U-letter shape in its cross-section, and also has a virtually ring shape with an opening in the center portion thereof as shown in FIG. 34, when viewed from above, a holding rotary section 4005 that is formed in a manner so as to stick out through the opening of the cup 4003 in the vertical direction as shown in FIG. 33 and that rotates while holding a substrate W, a remover liquid supplying section 4007 for supplying a remover liquid to the substrate W held by the holding rotary section 4005 and a deionized water supplying section 4009 for also supplying deionized water to the substrate W held by the holding rotary section 4005. Moreover, the substrate processing apparatus 4001 also has a back surface cleaning nozzle 4011 for supplying deionized water to the back surface of the substrate W held by the holding rotary section 4005.

The cup 4003 has a plurality of discharging outlets 4004 on the bottom thereof. Thus, an excessive portion of the liquid supplied to the substrate W drops along the inner wall of the cup 4003 to reach the discharging outlets 4004, and is discharged out of the apparatus through the discharging outlets 4004.

The holding rotary section 4005, which is secured to an apparatus frame is provided with a spin motor 4013 having a driving shaft placed in the vertical direction and a spin shaft 4014 that is secured to the driving shaft of the spin motor and a vacuum chuck 4015 serving as a substrate holding member placed on the top of the spin shaft 4014.

The vacuum chuck 4015 has a suction surface for applying suction to the top major surface of the substrate, and the suction surface has an area smaller than the area of the substrate W when viewed from above. In the present preferred embodiment, the vacuum chuck 4015 is a virtually column-shaped member with the suction surface on the upper portion having a round shape.

The vacuum chuck 4015 has suction holes in the suction surface on its upper surface, and air is sucked through the suction holes. Thus, the substrate W, placed on the vacuum chuck 4015, is held by air suction applied through the suction holes. In this manner, the vacuum chuck 4015 holds the substrate W by contacting only the back surface of the substrate W.

In this arrangement, the holding rotary section 4005 holds the substrate W placed on the vacuum chuck 4015 through suction applied by the vacuum chuck 4015, and rotates the substrate W held on the vacuum chuck 4015 around a shaft 4071 serving as the rotation center by driving the spin motor 4013.

The remover liquid supplying section 4007 is provided with a first rotary motor 4017 which is secured to the apparatus frame and has a driving shaft placed in the vertical direction, a first rotary shaft 4019 secured to the rotary shaft of the first rotary motor 4017 and a first arm 4021 connected to the top of the first rotary shaft 4019.

These first rotary motor 4017, first rotary shaft 4019 and first arm 4021 constitute a first shifting means. The first shifting means forms a shifting means for shifting a remover liquid discharging means in the present invention.

A remover liquid nozzle main body 4023 is installed on the tip of the first arm 4021. The remover liquid nozzle main body 4023 constitutes the remover liquid discharging means.

The remover liquid nozzle main body 4023 is provided with a first passage hole 4029, and a first tube 4027 is connected to the first passage hole 4029. The first tube 4027 supplies a remover liquid to the first passage hole 4029.

One end of the first passage hole 4029 is connected to the first tube 4027 with the other end forming a tube path having an opening to the top major surface of the substrate W. The extending direction of the first passage hole 4029 makes a predetermined angle of inclination with respect to the top major surface of the substrate W. This angle of inclination determines an incident angle of the remover liquid to be discharged from the first passage hole 4029 with respect to the top major surface of the substrate W. In other words, the angle of inclination of the first passage hole 4029 and the incident angle of the remover liquid to be discharged from the first passage hole 4029 with respect to the substrate W are virtually equal to each other.

In the present preferred embodiment, the angle of inclination of the first passage hole 4029 is set to 45 degrees so that the remover liquid discharged from the first passage hole 4029 reaches the substrate W with an incident angle of 45 degrees.

Moreover, the remover liquid nozzle main body 4023 is arranged so that when the first arm 4021 is allowed to pivot centered on the shaft 4073 as indicated by arrow 4079, the arrival point of a remover liquid 4081 discharged from the first passage hole 4029 (hereinafter, referred to as remover liquid arrival point) with respect to the substrate W is allowed to shift on a line passing through the rotation center C of the substrate W and the circumference of a rotation circle 4095 that the end edge of the substrate W forms when the substrate W rotates.

In the present preferred embodiment, as indicated by arrow 4085 of FIG. 34, the remover liquid arrival point is allowed to pass through the rotation center C of the substrate W and also to reciprocally shift on a circular arc intersecting the circumference of the rotation circle 4095 at two points.

The line passing through the rotation center C of the substrate W and the circumference of the rotation circle 4095 that the end edge of the substrate W forms when the substrate W rotates may be either a straight line or a curve.

Moreover, the remover liquid nozzle main body 4023 may be moved so that the remover liquid arrival point is allowed to reciprocally shift on a circular arc with its chord corresponding to the radius of the rotation circle 4095, so that it reciprocally shifts on the radius of the rotation circle 4095, or so that it reciprocally shifts on the diameter of the rotation circle 4095.

A first vibrator 4025 is installed inside the first passage hole 4029 at a position contacting the remover liquid that passes through the first passage hole 4029.

The first vibrator 4025 is allowed to vibrate by an electric signal from an oscillator 4067, which will be described later, so as to apply ultrasonic waves to the remover liquid passing through the first passage hole 4029.

The first vibrator 4025 forms a remover liquid vibrator. In the remover liquid supplying section 4017 arranged as described above, the first rotary motor 4017 rotates the first rotary shaft 4019 so that the first arm 4021 is allowed to reciprocally pivot centered on a shaft 4073. Thus, as illustrated in FIG. 34, the remover liquid arrival point is allowed to reciprocally shift on the substrate W passing through the rotation center C of the substrate W in the form of a circular arc as indicated by arrow 4085. Thus, the remover liquid to which ultrasonic waves are applied is supplied to the substrate W.

The angle of inclination of the first passage hole 4029 is set to any degrees as long as it is greater than 0 degree, and also smaller than 90 degrees. However, it is preferably set in the range of not less than 30 degrees to not more than 60 degrees, in particular, at 45 degrees.

This arrangement allows the remover liquid to reach the interface or border between the reaction products and the surface of the substrate W without having adverse effects from irregularities such as patterns on the substrate W. In other words, the remover liquid is allowed to reach the border between the reaction products and the surface of the substrate W with less attenuation in the ultrasonic energy.

Since the ultrasonic wave oscillates along the discharging direction of the remover liquid, the remover liquid, which has arrived at the border between the surface of the substrate W and the reaction products, is abundant in energy to try to invade between the reaction products and the substrate W. Therefore, the remover liquid is allowed to exert its function below the reaction products strongly so that the reaction products are easily removed from the substrate W, thereby making it possible to improve the removing efficiency.

The remover liquid nozzle main body 4023 having the first passage hole 4029 is shifted so that the remover liquid arrival point is allowed to shift on the line passing through the rotation center C of the substrate W and the circumference of a rotation circle 4095 that the end edge of the substrate W forms when the substrate W rotates. Therefore, the remover liquid to which the ultrasonic wave is uniformly applied is supplied onto the substrate W. Thus, it is possible to ensure the in-plane uniformity of the substrate in the process while improving the removing efficiency of the reaction products.

The deionized water supplying section 4009, which is secured to the apparatus frame, not shown, is provided with a second rotary motor 4031 having a driving shaft placed in the vertical direction, a second rotary shaft 4033 secured to the driving shaft of the second rotary motor 4031 and a second arm 4035 that is connected to the top of the second rotary shaft 4033.

These second rotary motor 4031, second rotary shaft 4033 and second arm 4035 constitute a second shifting means.

A deionized water nozzle main body 4037 is installed on the tip of the second arm 4035. The pure nozzle main body 4037 forms a deionized water discharging means.

A second passage hole 4043 that directs the axis line direction of deionized water to be discharged toward the top major surface of the substrate W is formed in the pure nozzle main body 4037, and a second tube 4041 is connected to the second passage hole 4043. The second tube 4041 supplies deionized water to the second passage hole 4043.

One end of the second passage hole 4043 is connected to the second tube 4041 with the other end forming a tube path having an opening to the top major surface of the substrate W. Here, the extending direction of the second passage hole 4043 makes a predetermined angle of inclination with respect to the top major surface of the substrate W. This angle of inclination determines an incident angle of the deionized water to be discharged from the second passage hole 4043 with respect to the substrate W. In other words, the angle of inclination of the second passage hole 4043 and the incident angle of the deionized water to be discharged from the second passage hole 4043 with respect to the substrate W are virtually equal to each other.

In the present preferred embodiment, the angle of inclination of the second passage hole 4043 is set to 45 degrees so that deionized water discharged from the first passage hole 4043 reaches the substrate W with an incident angle of 45 degrees.

Moreover, the remover liquid nozzle main body 4037 is arranged so that when the second arm 4035 is allowed to pivot centered on the shaft 4075 as indicated by arrow 4077, the arrival point of deionized water 4083 discharged from the second passage hole 4043 (hereinafter, referred to as deionized water arrival point) with respect to the substrate W is allowed to shift on a line passing through the rotation center C of the substrate W and the circumference of a rotation circle 4095 that the end edge of the substrate W forms when the substrate W rotates.

In the present preferred embodiment, as indicated by arrow 4087 of FIG. 34, the deionized water arrival point is allowed to pass through the rotation center C of the substrate W and also to reciprocally shift on a circular arc that intersects the circumference of the rotation circle 4095 at two points.

The line passing through the rotation center C of the substrate W and the circumference of the rotation circle 4095 that the end edge of the substrate W forms when the substrate W rotates may be either a straight line or a curve.

The deionized water nozzle main body 4037 may be moved so that the deionized water arrival point is allowed to reciprocally shift on a circular arc with its chord corresponding to the radius of the rotation circle 4095, so that it reciprocally shifts on the radius of the rotation circle 4095, or so that it reciprocally shifts on the diameter of the rotation circle 4095.

A second vibrator 4039 is installed inside the second passage hole 4043 at a position contacting the deionized water that passes through the second passage hole 4043.

The second vibrator 4039 is allowed to vibrate by an electric signal from the oscillator 4067, which will be described later, so as to apply ultrasonic waves to the deionized water passing through the second passage hole 4043.

The second vibrator 4039 forms a deionized water vibrator.

In the deionized water supplying section 4009 arranged as described above, the second rotary motor 4031 rotates the second rotary shaft 4033 so that the second arm 4035 is allowed to reciprocally pivot centered on a shaft 4075. Thus, as illustrated in FIG. 34, the deionized water arrival point is allowed to reciprocally shift on the substrate W passing through the rotation center C of the substrate W in the form of a circular arc as indicated by arrow 4087. Thus, the deionized water to which ultrasonic waves are applied is supplied to the substrate W.

The angle of inclination of the second passage hole 4043 is set to any degrees as long as it is greater than 0 degree, and also smaller than 90 degrees. However, it is preferably set in the range of not less than 30 degrees to not more than 60 degrees, in particular, at 45 degrees.

This arrangement allows the deionized water to reach the border between the reaction products and the surface of the substrate W without having adverse effects from irregularities such as patterns on the substrate W. In other words, the deionized water is allowed to reach the border between the reaction products and the surface of the substrate W with less attenuation in the ultrasonic energy.

Since the ultrasonic wave oscillates along the discharging direction of the deionized water, the deionized water, which has arrived at the border between the surface of the substrate W and the reaction products, is abundant in energy to try to invade between the reaction products and the substrate W. Therefore, the reaction products are further subjected to ultrasonic energy with the result that the reaction products are easily removed from the substrate W, thereby making it possible to improve the removing efficiency.

The deionized water nozzle body 4037 having the second passage hole 4029 is shifted so that the deionized water arrival point is allowed to shift on the line passing through the rotation center C of the substrate W and the circumference of a rotation circle 4095 that the end edge of the substrate W forms when the substrate W rotates; therefore, the deionized water to which the ultrasonic wave is uniformly applied is supplied onto the substrate W. Thus, it is possible to ensure the in-plane uniformity of the substrate in the process while improving the removing efficiency of the reaction products.

A back surface cleaning nozzle 4011 is a tube-shaped member that penetrates the cup 4003 and extends virtually in the vertical direction toward the back major surface of the substrate W, and used for supplying deionized water via a back surface cleaning valve 4065, which will be described later. Thus, it is possible to discharge deionized water onto the back surface of the substrate W.

Figure 35:
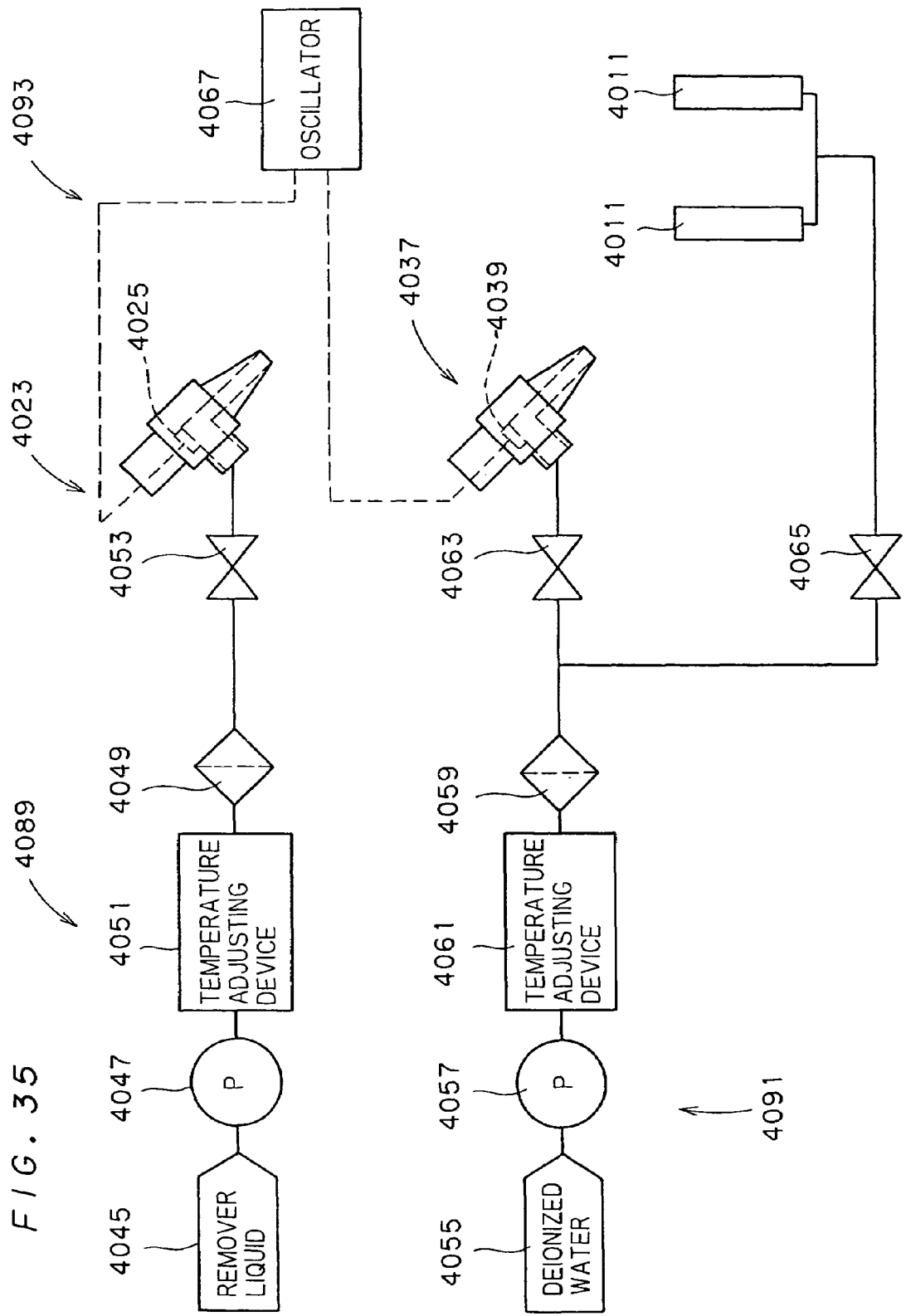
FIG. 35 is a drawing that shows piping of the substrate processing apparatus in accordance with the first preferred embodiment of the fourth aspect.
Figure 36:
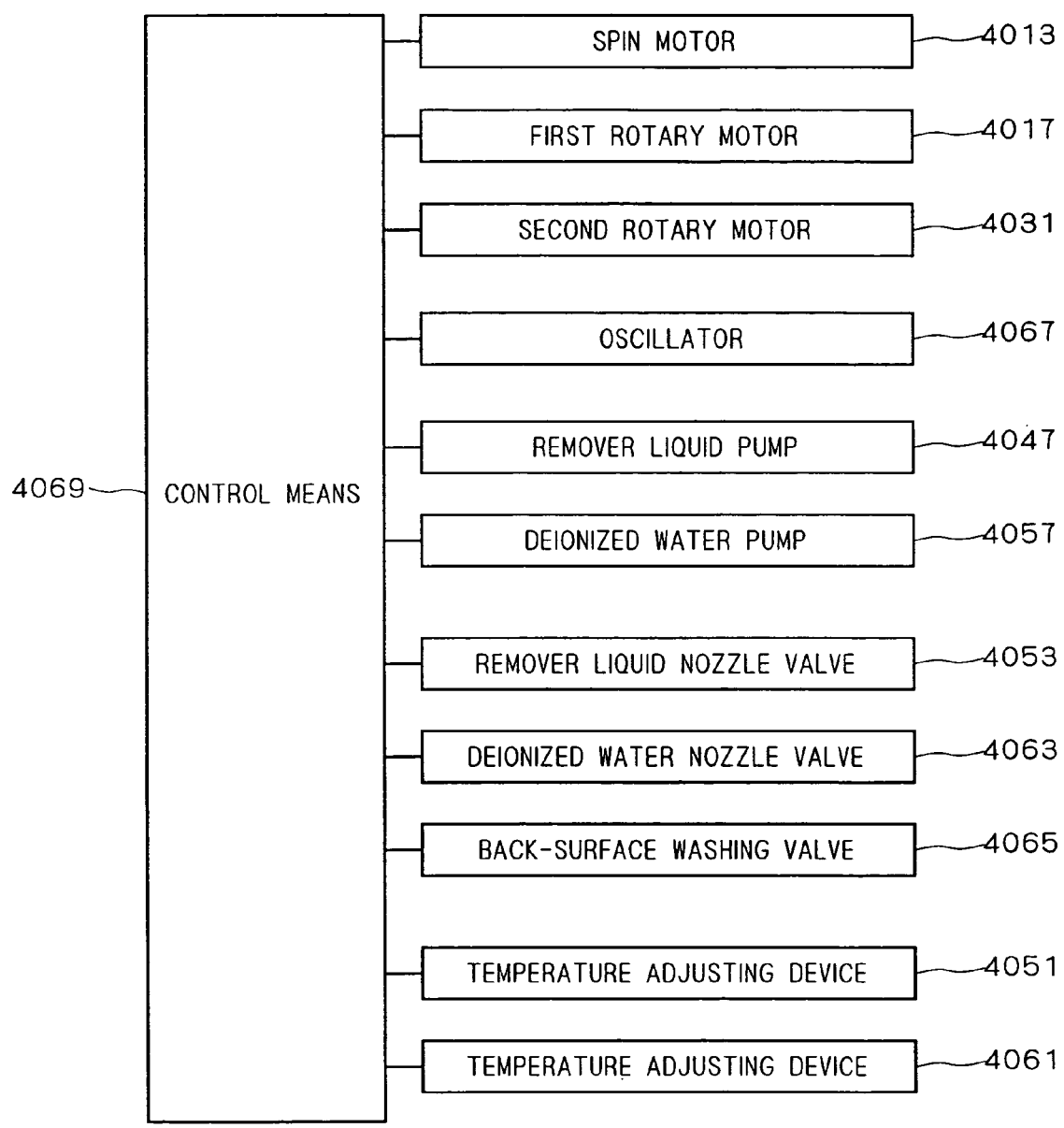
FIG. 36 is a drawing that shows a hardware construction of the substrate processing apparatus in accordance with the first preferred embodiment of the fourth aspect.

Referring to FIG. 35, the following description will discuss a remover liquid supplying system to the remover liquid supplying section 4007 as well as a deionized water supplying system 4091 to the deionized water supplying section 4009 and the back surface cleaning nozzle 4011.

The remover liquid supplying system 4089 is provided with a remover liquid pump 4047 for pumping the remover liquid from a remover liquid source 4045 outside the apparatus, a temperature-adjusting device 4051 for adjusting the temperature of the remover liquid by heating or cooling the remover liquid pumped out by the remover liquid pump 4047 to a predetermined temperature, a filter 4049 for filtering contaminants from the remover liquid that has been temperature-adjusted by the temperature-adjusting device 4051, and a remover liquid nozzle valve 4053 for opening and closing the flowing path of the filtered remover liquid to the remover liquid supplying section 4007.

The temperature-adjusting device 4051 forms a remover liquid temperature-adjusting means, and the remover liquid pump 4047 forms a remover liquid sending means.

This arrangement allows the remover liquid supplying system 4089 to supply the remover liquid that has been temperature-adjusted to a predetermined temperature by the temperature-adjusting device 4051 and purified by the filter 4049 to the remover liquid supplying section 4007.

The deionized water supplying system 4091 is provided with a deionized water pump 4057 for pumping deionized water from a deionized water source 4055 outside the apparatus, a temperature-adjusting device 4061 for adjusting the temperature of the deionized water by heating or cooling the deionized water pumped out by the deionized water pump 4057 to a predetermined temperature, a filter 4059 for filtering contaminants from the deionized water that has been temperature-adjusted by the temperature-adjusting device 4061, and a deionized water nozzle 4063 for opening and closing the flowing path of the filtered deionized water liquid to the deionized water supplying section 4009 as well as a back surface cleaning valve 4065 for opening and closing the flowing path of the deionized water filtered by the filter 4059 to the back surface cleaning nozzle.

The temperature-adjusting device 4061 forms a deionized water temperature-adjusting means, and the deionized water pump 4057 forms a deionized water sending means.

This arrangement allows the deionized water supplying system 4091 to supply the deionized water that has been temperature-adjusted to a predetermined temperature by the temperature-adjusting device 4061 and purified by the filter 4059 to the deionized water supplying section 4009.

Next, referring to FIG. 35, an explanation will be given of a ultrasonic wave applying section 4093.

The ultrasonic wave applying section 4093 is provided with a first vibrator 4025 placed inside the removing liquid nozzle main body 4023 and an oscillator 4067 for vibrating the first vibrator 4025 by transmitting an electric signal to the first vibrator 4025.

With this arrangement, the ultrasonic wave applying section 4093 applies ultrasonic waves to the remover liquid to be supplied to the substrate W from the remover liquid supplying section 4007.

Moreover, the ultrasonic wave applying section 4093 is also provided with a second vibrator 4039 placed inside the deionized water nozzle main body 4037, and the second vibrator 4039 is vibrated by an electric signal transmitted from the oscillator 4067.

With this arrangement, the ultrasonic wave applying section 4093 applies ultrasonic waves to the deionized water to be supplied to the substrate W from the deionized water supplying section 4009.

In this manner, the remover liquid with the ultrasonic waves applied thereto or the deionized water with the ultrasonic waves applied thereto is supplied to the substrate W. Therefore, it is possible to carry out the removing process of the reaction products more quickly, and consequently to improve the throughput. Here, the throughput can be improved by only applying ultrasonic waves to either the remover liquid or deionized water. However, by applying ultrasonic waves to both of the remover liquid and deionized water, it is possible to remove the reaction products more quickly and to improve the throughput more effectively.

Next, referring to FIG. 4, an explanation will be given of the hardware construction of the substrate processing apparatus 4001.

To the control means 4069 are connected the spin motor 4013, the first rotary motor 4017, the second rotary motor 4031, the oscillator 4067, the remover liquid pump 4047, the deionized water pump 4057, the remover liquid nozzle valve 4007, the deionized water nozzle valve 4063, the back surface cleaning valve 4065, the temperature-adjusting device 4051 and the temperature-adjusting device 4061. Thus, as will be described in first preferred embodiment and second preferred embodiment of a substrate processing method, the control means 4069 controls these devices connected thereto.

In the substrate processing apparatus 4001 of the present preferred embodiment, both of the first vibrator 4025 for applying ultrasonic waves to the remover liquid and the second vibrator 4039 for applying ultrasonic waves to deionized water are installed. However, either one of them may be installed.

2. Second Preferred Embodiment of a Substrate Processing Method

Figure 38:
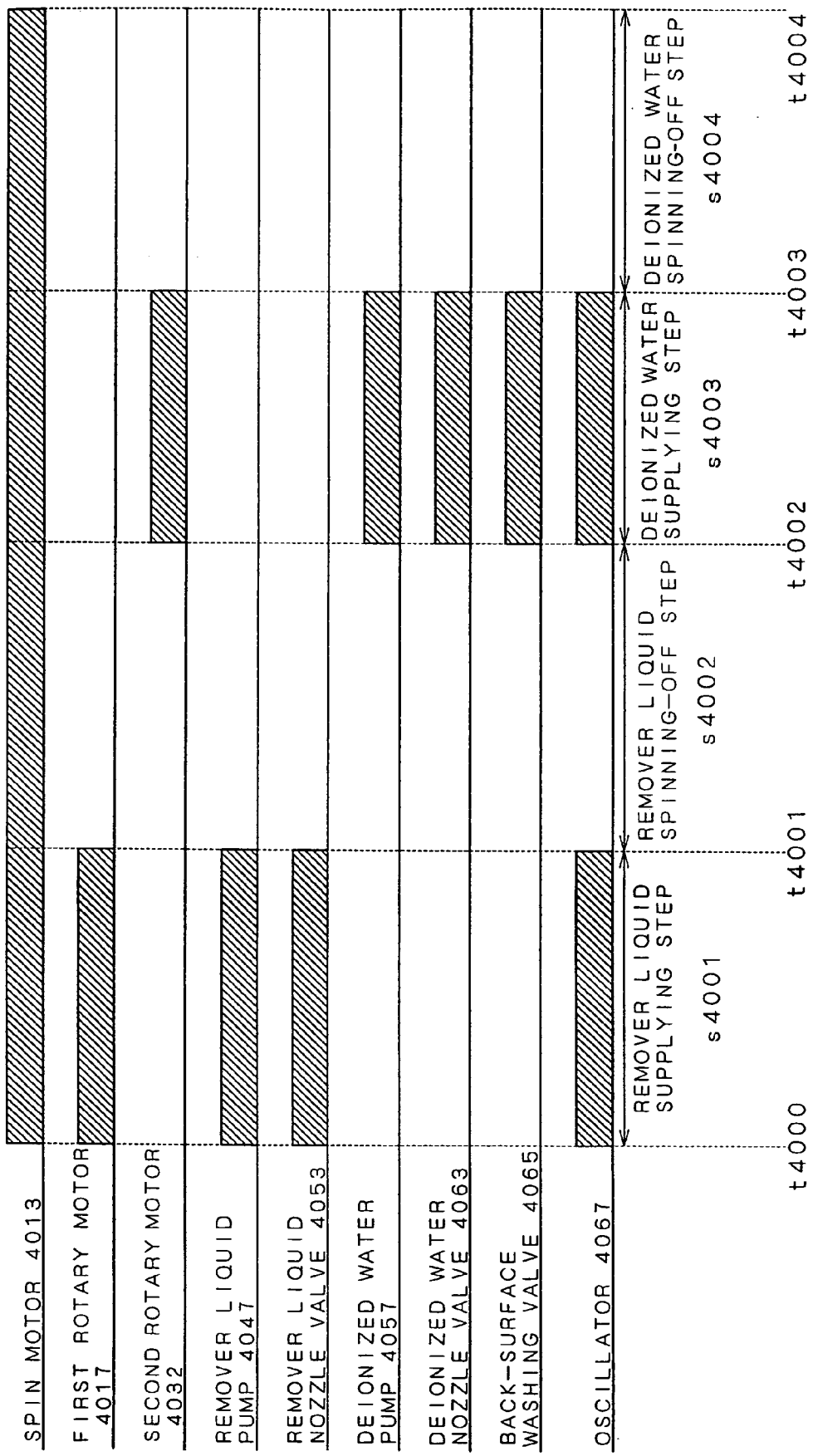
FIG. 38 is a detailed flow chart that shows a substrate processing method in accordance with the first preferred embodiment of the fourth aspect.

FIG. 37 is a drawing that shows a first preferred embodiment of a substrate processing method in which the above-mentioned substrate processing apparatus 4001 is used. As illustrated in FIG. 37, the substrate processing method of the present preferred embodiment includes a remover liquid supplying step s4001, a remover liquid spinning-off step s4002, a deionized water supplying step s4003, and a deionized water spinning-off step s4004. Referring to FIG. 38, the following description will discuss the respective steps.

(1. Remover Liquid Supplying Step s4001)

First, the control means 4069 has controlled the temperature-adjusting devices 4051 and 4061 so that the temperatures of the remover liquid and deionized water are set to predetermined temperatures before the sequence has reached the time t4000.

Moreover, before the sequence has reached the time t4000, the control means 4069 drives the spin motor 4013 to rotate the substrate W so that at time t4000, the substrate W is being rotated at a predetermined number of revolutions.

Then at time t4000, the control means 4069 rotates the first rotary motor 4017 so as to allow the remover liquid supplying section 4007 to pivot.

Furthermore, at the time t4000, the control means 4069 drives the remover liquid pump 4047 so as to send the remover liquid to the remover liquid supplying section 4007, and also allows the remover liquid nozzle valve 4053 to open so as to supply the remover liquid from the remover liquid supplying section 4007 to the substrate W. With these steps, the remover liquid, supplied from the remover liquid supplying section 4007, is supplied onto the substrate W in such a manner that the arrival point thereof onto the substrate W is shifted on a circular arc passing through the rotation center C of the substrate W in the horizontal surface including the surface of the substrate W as indicated by arrow 4085 in FIG. 34. In this manner, the remover liquid supplying step s4001 is executed.

Here, at time t4000, the control means 4069 allows the oscillator 4067 to transmit an electric signal to the first vibrator 4025 within the remover liquid supplying section 4007 so as to oscillate the first vibrator 4025. Thus, ultrasonic waves are applied to the remover liquid supplied from the remover liquid supplying section 4007. Consequently, the reaction products adhering to the substrate W are subjected to ultrasonic vibration, and thus easily separated from the substrate W.

At the time t4001 after a lapse of a predetermined time, the control means 4069 stops the driving operation of the first rotary motor 4017 in a state where the remover liquid supplying section 4007 has retreated from a position above the cup 4003. Moreover, the control means 4069 closes the remover liquid nozzle valve 4053, and also stops the driving operation of the remover liquid pump 4047 so as to stop the supply of the remover liquid from the remover liquid supplying section 4007. Moreover, at time t4001, the control means 4069 stops the transmission of the electric signal from the oscillator 4067 to the first vibrator 4025.

In this manner, the remover liquid arrival point is shifted on the circular arc passing through the rotation center C of the substrate W so that the remover liquid that is less susceptible to temperature changes and that is fresh without being exhausted can be supplied to the entire portion of the substrate W; thus, it is possible to easily remove the reaction products and also to ensure the in-plane uniformity in the entire surface of the substrate W.

(2. Remover Liquid Spinning-Off Step s4002)

Next, at the time t4001, the control means 4069 stops the supply of the remover liquid to the substrate W, while it successively rotates the spin motor 4013 so as to maintain the rotating state of the substrate W. Thus, a remover liquid spinning-off step s4002 is executed.

In this remover liquid spinning-off step s4002, the substrate W is rotated at not less than 500 rpm, more preferably, in the range from 1000 rpm to 4000 rpm.

Moreover, the time during which the rotation is maintained is set to not less than 1 second, preferably, in the range of 2 to 5 seconds.

In this manner, the rotating state of the substrate is maintained with the supply of the remover liquid being stopped with respect to the substrate W, the remover liquid on the substrate W is spun off from the substrate W by a centrifugal force.

Furthermore, since the substrate is rotated while being maintained in the horizontal state, the remover liquid is spun off from the substrate W uniformly. Thus, it is possible to maintain the in-plane uniformity of the substrate W.

Here, since the vacuum chuck 4015 is kept in contact with only the back surface of the substrate W, there are no parts contacting the edge of the substrate W. Consequently, since there are no parts that intervene with the progress the remover liquid that is spun off in the horizontal direction toward the outside of the substrate W from the top major surface of the substrate W, the time required for the remover liquid to be spun off from the substrate is shortened. Thus, it is possible to improve the throughput.

Moreover, since the holding rotary section 4005 only needs to hold a single sheet of the substrate W, it is possible to easily increase the number of revolutions of the substrate W. For this reason, the time required for the remover liquid to be spun off from the substrate is shortened. Thus, it is possible to improve the throughput.

(3. Deionized Water Supplying Step s4003)

Next, at the time t4002, the control means 4069 rotates the second rotary motor 4032 so as to allow the deionized water supplying section 4009 to pivot.

At the time t4002 also, the control means 4069 drives the deionized water pump 4057 so as to send deionized water to the deionized water supplying section 4009, and also allows the deionized water nozzle valve 4063 to open so as to supply the deionized water from the deionized water supplying section 4009 to the substrate W. With these steps, the deionized water, supplied from the deionized water supplying section 4009, is supplied onto the substrate W in such a manner that the arrival point thereof onto the substrate W is shifted on a circular arc passing through the rotation center C of the substrate W in the horizontal surface including the surface of the substrate W as indicated by arrow 4087 in FIG. 34. In this manner, the deionized water supplying step s4003 is executed.

At the time t4002, the control means 4069 allows the oscillator 4067 to transmit an electric signal to the second vibrator 4039 within the deionized water supplying section 4009 so as to oscillate the second vibrator 4039. Thus, ultrasonic waves are applied to the deionized water supplied from the deionized water supplying section 4009. Consequently, the reaction products adhering to the substrate W are subjected to ultrasonic vibration, and thus easily separated from the substrate W.

Moreover, at the time t4002, the control means 4069 allows the back surface cleaning valve 4065 to open so as to supply deionized water to the back surface of the substrate W from the back surface cleaning nozzle 4011, thereby also cleaning the back surface of the substrate W.

At the time t4003 after a lapse of a predetermined time period, the control means 4069 stops the driving operation of the second rotary motor 4031 in a state where the deionized water supplying section 4009 has retreated from a position above the cup 4003. Moreover, the control means 4069 closes the deionized water nozzle valve 4063, and also stops the driving operation of the deionized water pump 4057 so as to stop the supply of the deionized water from the deionized water supplying section 4009. Moreover, at the time t4003, the control means 4069 stops the transmission of the electric signal from the oscillator 4067 to the second vibrator 4039.

In this manner, the deionized water arrival point is shifted on the circular arc passing through the rotation center C of the substrate W so that the deionized water that is less susceptible to temperature changes and that is fresh without being exhausted can be supplied to the entire portion of the substrate W. Thus, it is possible to easily remove the reaction products and also to ensure the in-plane uniformity in the entire surface of the substrate W.

(4. Remover Liquid Spinning-Off Step s4004)

At the time t4003, the control means 4069 stops the supply of the deionized water to the substrate W, while it successively rotates the spin motor 4013 so as to maintain the rotating state of the substrate W. Thus, a deionized water spinning-off step s4004 is executed.

In this manner, the remover liquid and deionized water are supplied to the substrate W so that the reaction products are removed.

In accordance with the present preferred embodiment, at the remover liquid spinning-off step s4002, the remover liquid on the substrate W is spun off so that the remover liquid remaining on the substrate W becomes very little, or no longer exists. Therefore, in the case when, in this state, the deionized water is supplied to the substrate W at the deionized water supplying step s4003, the amount of the remover liquid that comes to contact the deionized water becomes very little or none. Therefore, even in the event of a pH shock, hardly any adverse effect is given to the substrate W, or no pH shock occurs. Therefore, no intermediate rinse process is required, and the throughput is consequently improved. Moreover, by omitting the intermediate rinse process, the costs can be reduced, and since an organic solvent, used for the intermediate rinse process, is no longer required, it is possible to improve the safety of the apparatus.

Since the remover liquid and deionized water to which ultrasonic waves have been applied are supplied, it is possible to remove the reaction products more quickly.

In the substrate processing method of the present preferred embodiment, the rotation of the substrate W has not been stopped from the start of the remover liquid supplying step s4001 to the completion of the deionized water spinning-off step s4004. However, the rotation of the substrate W may be temporarily stopped at any one of the intervals between the remover liquid supplying step s4001 and the remover liquid spinning-off step s4002, between the remover liquid spinning-off step s4002 and the deionized water supplying step s4003 and between the deionized water supplying step s4003 and the deionized water spinning-off step s4004.

The essential thing is to provide at least a step for reducing the remover liquid on the substrate W by rotating the substrate W even in a short time, prior to the start of the deionized water supplying step s4003.

Moreover, with respect to the number of revolutions of the substrate W, it may be the same or respectively different in the remover liquid supplying step s4001, the remover liquid spinning-off step s4002, the deionized water supplying step s4003 and the deionized water spinning-off step s4004.

In the substrate processing method of the present preferred embodiment, ultrasonic waves are applied to both of the remover liquid and deionized water. However, ultrasonic waves may be applied to only either of the remover liquid and deionized water.

3. Second Preferred Embodiment of the Substrate Processing Method

Figure 39:
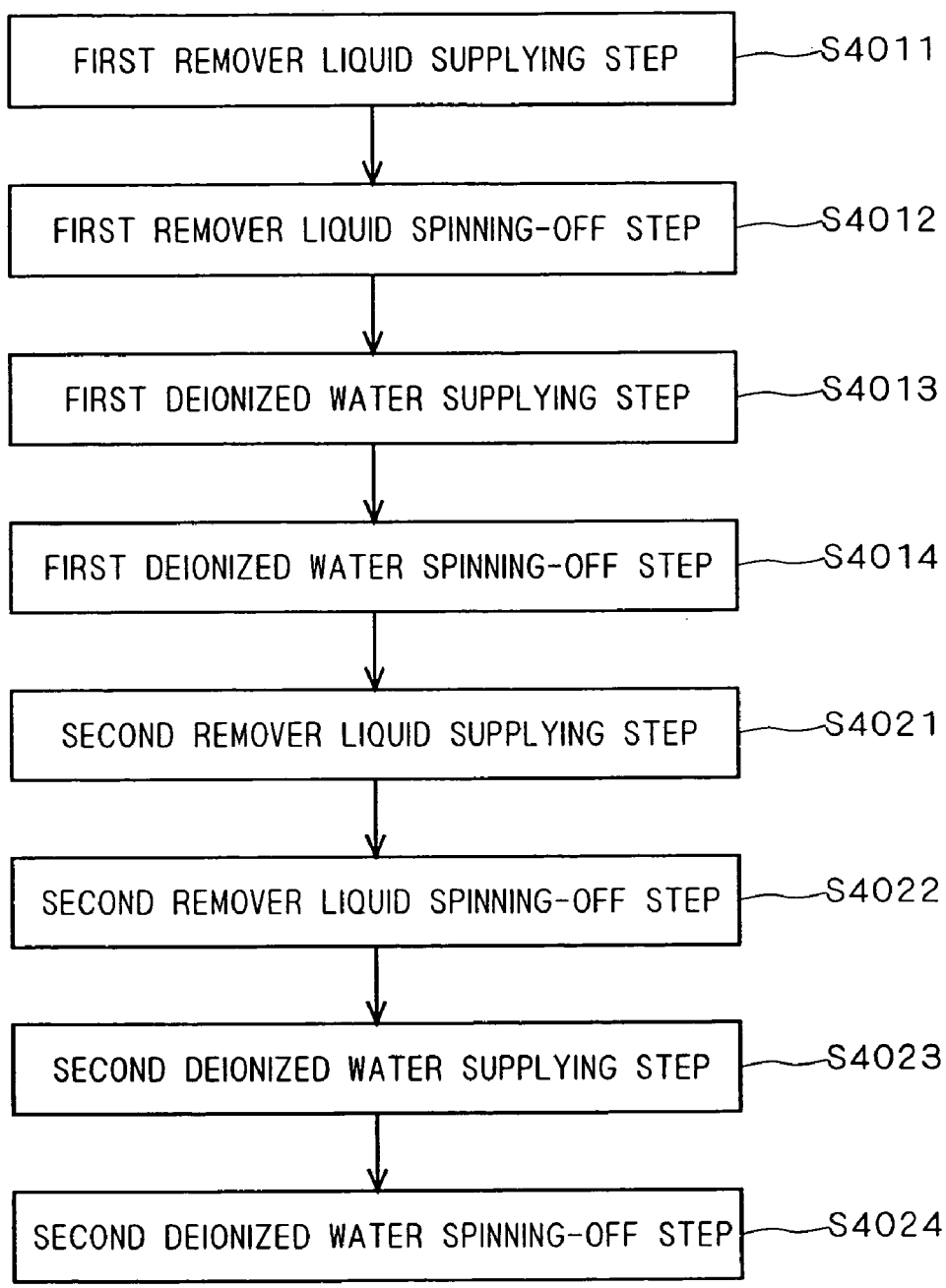
FIG. 39 is a flow chart that shows a substrate processing method in accordance with a second preferred embodiment of the fourth aspect.

Referring to FIG. 39, an explanation will be given of the substrate processing method in accordance with a second preferred embodiment.

The substrate processing method of the second preferred embodiment repeats the substrate processing method of the first preferred embodiment twice.

In other words, the substrate processing method of the present invention includes a first remover liquid supplying step s4011, a first remover liquid spinning-off step s4012, a first deionized water supplying step s4013, a first deionized water spinning-off process s4014, a second remover liquid supplying step s4021, a second remover liquid spinning-off step s4022, a second deionized water supplying step s4023 and a second deionized water spinning-off step s4024.

The first remover liquid supplying step s4011 and the second remover liquid supplying step s4021 are the same as the remover liquid supplying step s4001 of the first preferred embodiment.

Moreover, the first remover liquid spinning-off step s4012 and the second remover liquid spinning-off step s4022 are the same as the remover liquid spinning-off step s4002 of the first preferred embodiment.

The first deionized water supplying step s4013 and the second deionized water supplying step s4023 are the same as the deionized water supplying step s4003 of the first preferred embodiment.

The first deionized water spinning-off step s4014 and the second deionized water spinning-off step s4024 are the same as the deionized water spinning-off step s4004 of the first preferred embodiment.

In the substrate processing method of the second preferred embodiment, the first deionized water spinning-off step s4014 is placed between the first deionized water supplying step s4013 and the second remover liquid supplying step s4021. For this reason, the deionized water, which has been supplied on the substrate W at the first deionized water supplying step s4013, is spun off by the first deionized water spinning-off process s4014 so that the remaining deionized water on the substrate W becomes very little or none. Therefore, in the case when, in this state, the remover liquid is supplied to the substrate W, the amount of the deionized water that comes to contact the remover liquid becomes very little or none; consequently, even in the event of a pH shock, hardly any adverse effect is given to the substrate W, or no pH shock occurs.

In the present preferred embodiment, the substrate processing method of the first preferred embodiment is repeated twice. However, this method may be repeated not less than twice.

4. Second Preferred Embodiment of the Substrate Processing Apparatus

Figure 40:
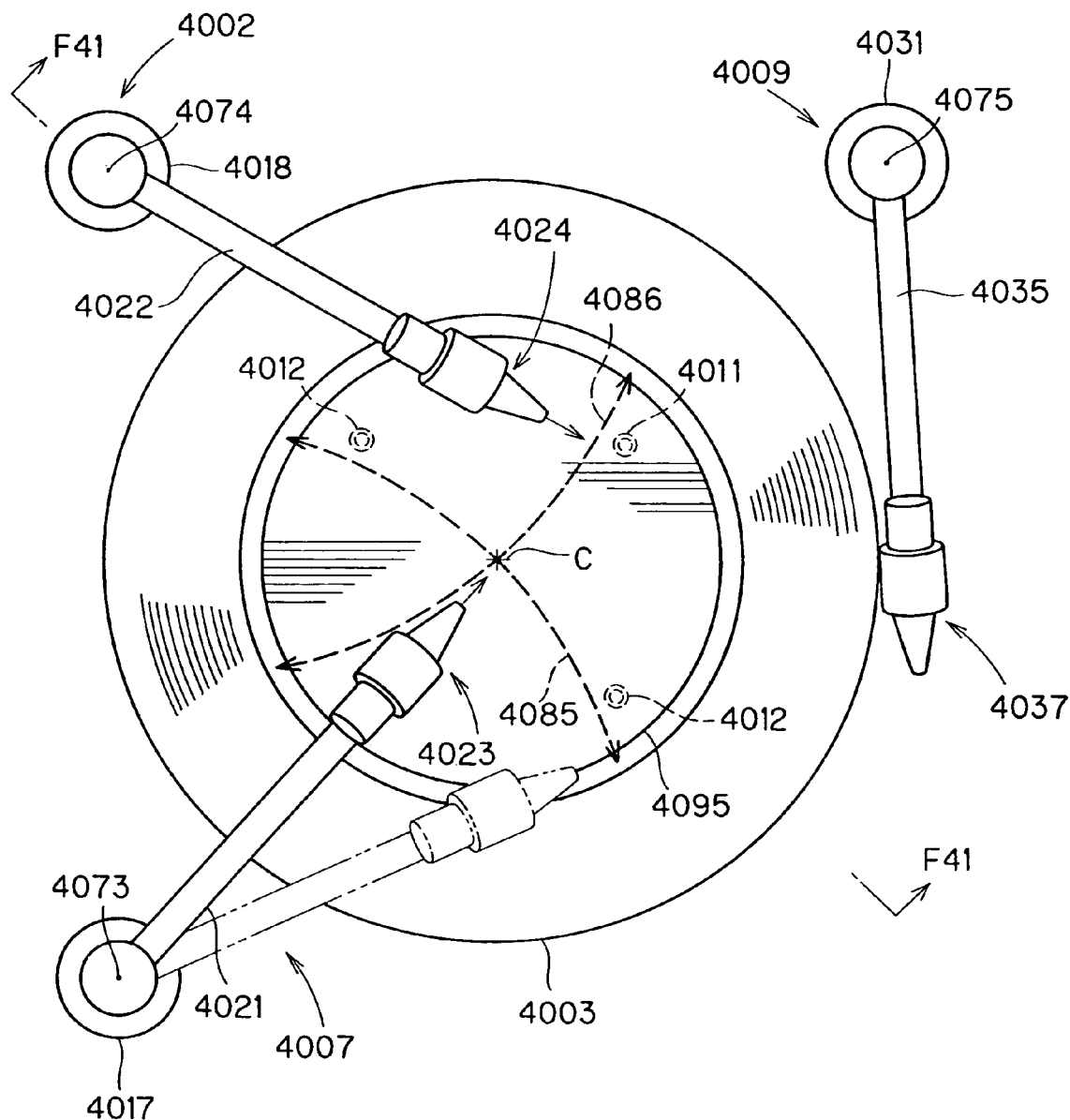
FIG. 40 is a top view of the substrate processing apparatus in accordance with the second preferred embodiment of the fourth aspect.
Figure 41:
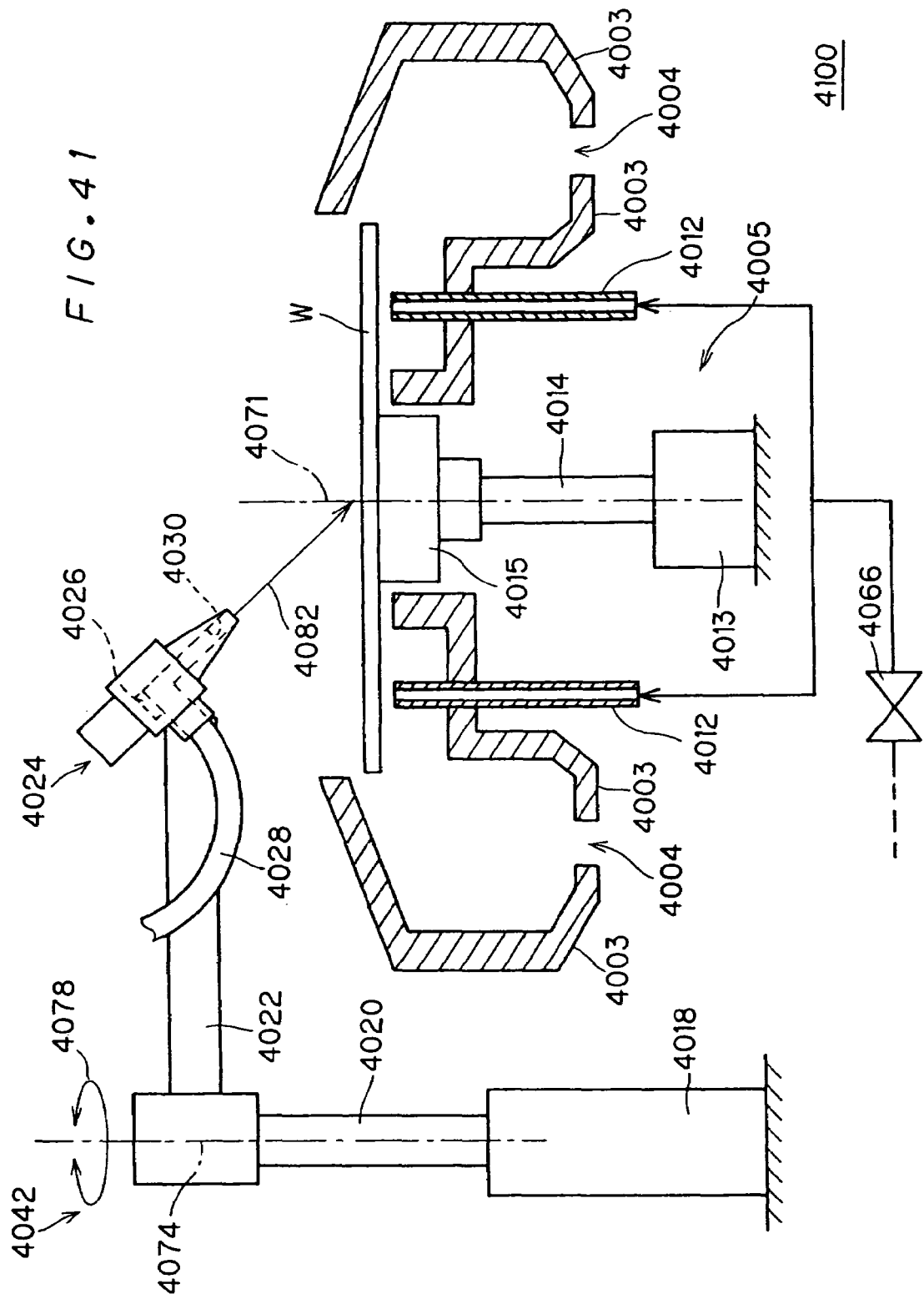
FIG. 41 is a side view a substrate processing apparatus in accordance with the second preferred embodiment of the fourth aspect.

Referring to FIGS. 40 and 41, an explanation will be given of a second preferred embodiment of the substrate processing apparatus of the present invention. Here, FIG. 41 is a cross-sectional view taken along line F41-F41 of FIG. 40; and, for convenience of explanation, hatching is omitted from some portions.

A substrate processing apparatus 4100 of the second preferred embodiment is provided with a solvent supplying section 4002 serving as an intermediate rinse supplying section, in addition to the substrate processing apparatus 4001 of the first preferred embodiment.

The substrate processing apparatus 4100 of the second preferred embodiment has many parts that are in common with the substrate processing apparatus 4001 of the first preferred embodiment, and therefore, the corresponding parts are indicated by the same reference numerals, and description thereof is omitted.

As illustrated in FIG. 40, the substrate processing apparatus 4100 has the solvent supplying section 4002.

The solvent supplying section 4002, which is secured to the apparatus frame, not shown, is provided with a third rotary motor 4018 having a driving shaft placed in the vertical direction, a third rotary shaft 4020 secured to the rotary shaft of the third rotary motor 4018 and a third arm 4022 connected to the top of the third rotary shaft 4020.

These third rotary motor 4018, third rotary shaft 4020 and third arm 4022 constitute a third shifting means.

A solvent nozzle main body 4024 is installed on the tip of the third arm 4022.

The solvent nozzle main body 2024 constitutes an intermediate rinse liquid discharging means.

The solvent nozzle main body 4024 is provided with a third passage hole 4030 that directs the axis line direction of an organic solvent to be discharged toward the top surface of the substrate W, and a third tube 4028 is connected to the third passage hole 4030. The third tube 4028 supplies the organic solvent to the third passage hole 4030.

One end of the third passage hole 4030 is connected to the third tube 4028 with the other end forming a tube path having an opening to the top major surface of the substrate W. Here, the extending direction of the third passage hole 4030 makes a predetermined angle of inclination with respect to the top major surface of the substrate W. This angle of inclination determines an incident angle of the organic solvent to be discharged from the third passage hole 4030 with respect to the top major surface of the substrate W. In other words, the angle of inclination of the third passage hole 4030 and the incident angle of the organic solvent to be discharged from the third passage hole 4030 with respect to the substrate W are virtually equal to each other.

In the present preferred embodiment, the angle of inclination of the third passage hole 4030 is set to 45 degrees so that the organic solvent discharged from the third passage hole 4030 reaches the substrate W with an incident angle of 45 degrees.

The solvent nozzle main body 4024 is arranged so that when the third arm 4022 is allowed to pivot centered on the shaft 4074 as indicated by arrow 4078, the arrival point of an organic solvent 4082 discharged from the third passage hole 4030 (hereinafter, referred to as solvent arrival point) with respect to the substrate W is allowed to shift on a line passing through the rotation center C of the substrate W and the circumference of a rotation circle 4095 that the end edge of the substrate W forms when the substrate W rotates.

In the present preferred embodiment, as indicated by arrow 4086 of FIG. 40, the solvent arrival point is allowed to shift on a circular arc passing through the rotation center C of the substrate W.

The line passing through the rotation center C of the substrate W and the circumference of the rotation circle 4095 that the end edge of the substrate W forms when the substrate W rotates may be either a straight line or a curve.

The solvent nozzle main body 4024 may be moved so that the solvent arrival point is allowed to shift on a circular arc with its chord corresponding to the radius of the rotation circle 4095, so that it shifts on the radius of the rotation circle 4095, or so that it shifts on the diameter of the rotation circle 4095.

A third vibrator 4026 is installed inside the third passage hole 4030 at a position contacting the organic solvent that passes through the third passage hole 4030.

The third vibrator 4026 is allowed to vibrate by an electric signal from an oscillator 4067 so as to apply ultrasonic waves to the organic solvent passing through the third passage hole 4030.

The third vibrator 4026 forms a solvent vibrator.

In the solvent supplying section 4002 arranged as described above, the third rotary motor 4018 rotates the third rotary shaft 4020 so that the third arm 4022 is allowed to reciprocally pivot centered on a shaft 4074 as indicated by arrow 4078. Thus, as illustrated in FIG. 40, the solvent arrival point of the solvent discharged from the solvent supplying section 4002 is allowed to reciprocally shift on the substrate W passing through the rotation center C of the substrate W in the form of a circular arc as indicated by arrow 4086. Thus, the organic solvent to which ultrasonic waves are applied is supplied to the substrate W.

The angle of inclination of the third passage hole 4030 is set to any degrees as long as it is greater than 0 degree, and also smaller than 90 degrees. However, it is preferably set in the range of not less than 30 degrees to not more than 60 degrees, in particular, at 45 degrees.

This arrangement allows the organic solvent to reach the border between the reaction products and the surface of the substrate W without having much adverse effects from irregularities such as patterns on the substrate W. In other words, the organic solvent is allowed to reach the border between the reaction products and the surface of the substrate W with less attenuation in the ultrasonic energy.

Since the ultrasonic wave oscillates along the discharging direction of the organic solvent, the organic solvent, which has arrived at the border between the surface of the substrate W and the reaction products, is abundant in energy to try to invade between the reaction products and the substrate W. Therefore, the organic solvent is allowed to exert its function below the reaction products strongly so that the remover liquid located below the reaction products is desirably removed from the substrate W. Moreover, since the reaction products on the substrate W is further subjected to ultrasonic energy so that the reaction products are easily removed from the substrate W, thereby making it possible to improve the removing efficiency.

The organic solvent nozzle main body 4024 having the third passage hole 4030 is shifted so that the organic solvent arrival point is allowed to shift on the line passing through the rotation center C of the substrate W and the circumference of a rotation circle 4095 that the end edge of the substrate W forms when the substrate W rotates; therefore, the organic solvent to which the ultrasonic wave is uniformly applied is supplied onto the substrate W. Thus, it is possible to ensure the in-plane uniformity of the substrate in the process while improving the removing efficiency of the reaction products.

Since the remover liquid remaining in the vicinity of the border between the reaction products and the substrate W is desirably cleaned, it is possible to desirably remove the remover liquid from the substrate W. For this reason, even when deionized water is supplied to the substrate W in the deionized water supplying process, which will be described later, the apparatus is less susceptible to the occurrence of a pH shock.

A back surface solvent nozzle 4012 is a tube-shaped member that penetrates the cup 4003 and extends virtually in the vertical direction toward the back surface of the substrate W, and used for supplying the organic solvent via a back surface solvent valve 4066, which will be described later. Thus, it is possible to discharge the organic solvent onto the back surface of the substrate W.

Figure 42:
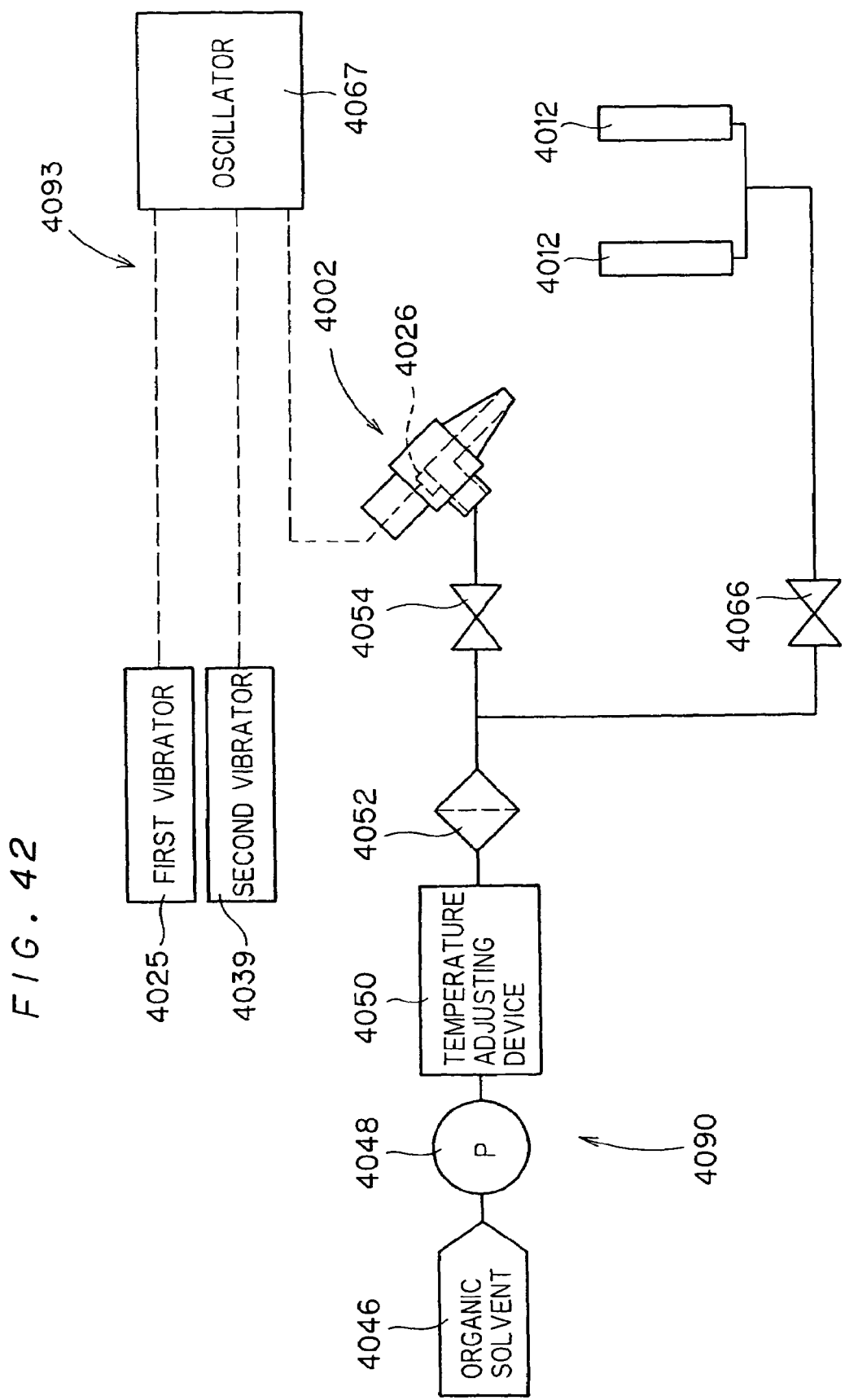
FIG. 42 is a drawing that shows piping of the substrate processing apparatus in accordance with the second preferred embodiment of the fourth aspect.

FIG. 42 shows an organic solvent supplying system for supplying the organic solvent to the organic solvent supplying section 4002.

The organic solvent supplying system is provided with a solvent pump 4048 for pumping the organic solvent from an organic solvent source 4046 outside the apparatus, a temperature-adjusting device 4052 for adjusting the temperature of the organic solvent by heating or cooling the organic solvent pumped out by the solvent pump 4048 to a predetermined temperature, a filter 4050 for filtering contaminants from the organic solvent that has been temperature-adjusted by the temperature-adjusting device 4052, a solvent nozzle valve 4054 for opening and closing the flowing path of the filtered organic solvent to the solvent supplying section 4002, and a back surface solvent valve 4066 for opening and closing the flowing path of the organic solvent filtered by the filter 4050 to the back surface solvent nozzle 4012.

The temperature-adjusting device 4052 forms a solvent temperature-adjusting means, and the solvent pump 4048 forms a solvent sending means.

This arrangement allows the solvent supplying system to supply the organic solvent that has been temperature-adjusted to a predetermined temperature by the temperature-adjusting device 4052 and purified by the filter 4050 to the solvent nozzle main body 4024.

Moreover, the ultrasonic wave applying section 4093 is provided with a third vibrator 4026 placed inside the solvent supplying section 4002, and the third vibrator 4026 is allowed to vibrate by an electric signal transmitted from the oscillator 4067.

With this arrangement, the ultrasonic wave applying section 4093 applies ultrasonic waves to the organic solvent to be supplied from the solvent supplying section 4002.

In this manner, the organic solvent with the ultrasonic waves applied thereto is supplied to the substrate W. Therefore, it is possible to carry out the removing process of the reaction products more quickly, and consequently to improve the throughput. The throughput can be improved by only applying ultrasonic waves to any one of the remover liquid, the organic solvent and deionized water. However, by applying ultrasonic waves to any two or all of the remover liquid, the organic solvent and deionized water, it becomes possible to remove the reaction products more quickly and to improve the throughput more effectively.

Figure 43:
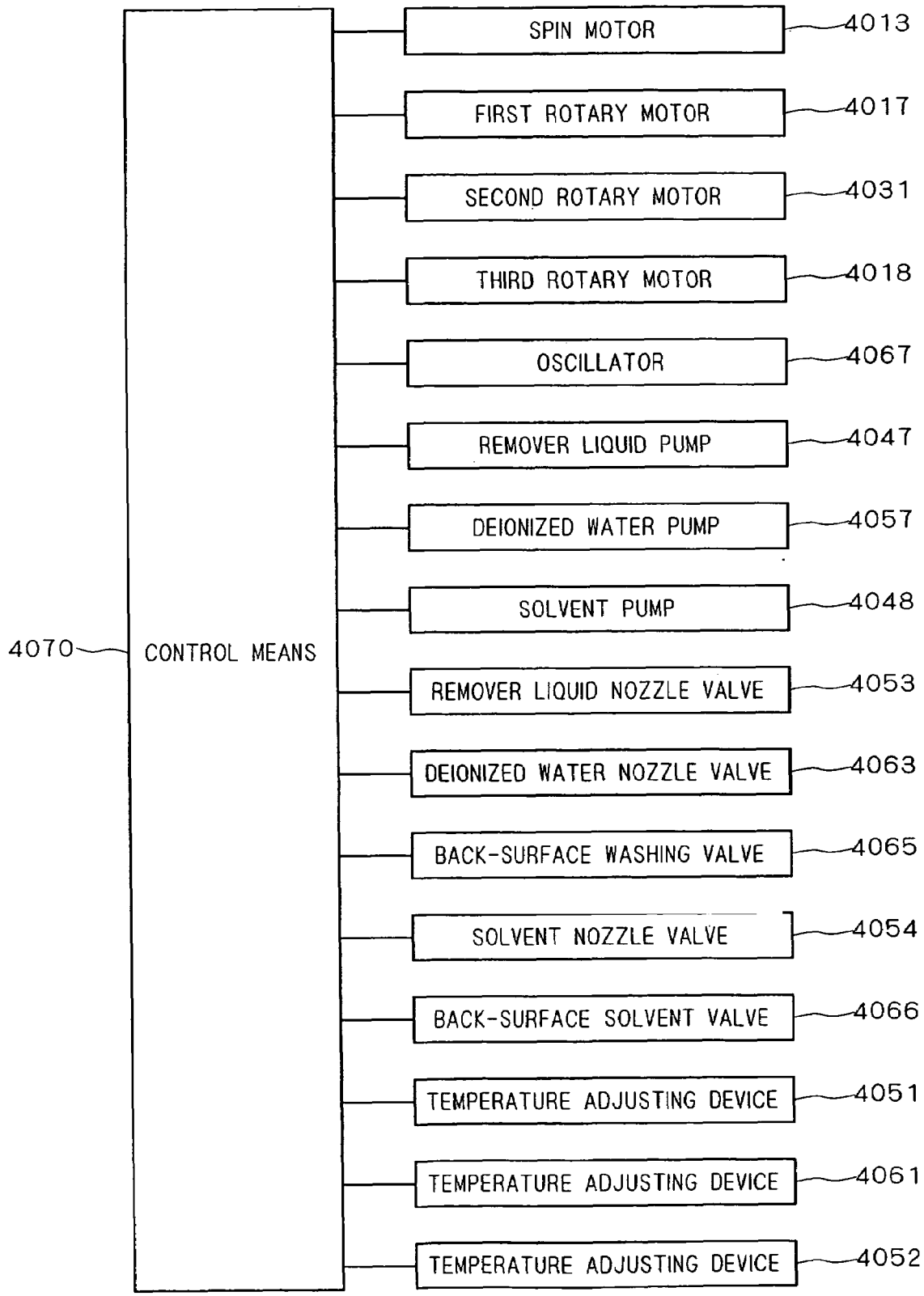
FIG. 43 is a drawing that shows a hardware construction of the substrate processing apparatus in accordance with the second preferred embodiment of the fourth aspect.

Next, referring to FIG. 43, an explanation will be given of the hardware construction of the substrate processing apparatus 4100.

In the same manner as the control means 4069 in the first preferred embodiment, to the control means 4070 are connected the spin motor 4013, the first rotary motor 4017, the second rotary motor 4031, the oscillator 4067, the remover liquid pump 4047, the deionized water pump 4057, the remover liquid nozzle valve 4007, the deionized water nozzle valve 4063, the back surface cleaning valve 4065, the temperature-adjusting device 4051 and the temperature-adjusting device 4061.

Moreover, to the control means 4070 are further connected the third rotary motor 4018, the solvent pump 4048, the solvent nozzle 4054, the back surface solvent valve 4066 and the temperature-adjusting device 4052.

Thus, as will be described in a third preferred embodiment of a substrate processing method, the control means 4070 controls these devices connected thereto.

In the substrate processing apparatus 4100 of the present preferred embodiment, three vibrators, that is, the first vibrator 4025 for applying ultrasonic waves to the remover liquid, the second vibrator 4039 for applying ultrasonic waves to deionized water and the third vibrator 4026 for applying ultrasonic waves to the organic solvent are installed. However, any one of these, or any two of these may be installed.

5. Third Preferred Embodiment of the Substrate Processing Method

Figure 44:
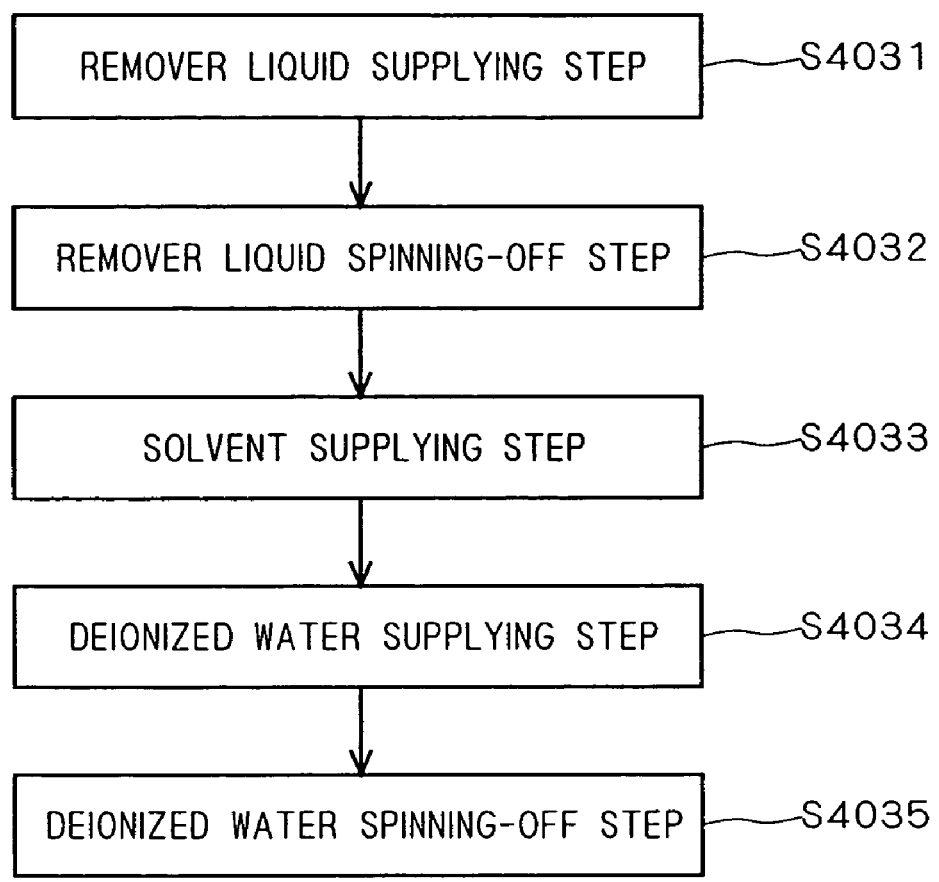
FIG. 44 is a flow chart that shows a substrate processing method in accordance with a third preferred embodiment of the fourth aspect.

Referring to FIG. 44, an explanation will be given of the substrate processing method in accordance with a third preferred embodiment in which the above-mentioned substrate processing apparatus 4100 is used.

The substrate processing method of the present preferred embodiment is provided with: a remover liquid supplying step s4031, a remover liquid spinning-off step s4032, a solvent supplying step s4033 serving as an intermediate rinse step, a deionized water supplying step s4034 and a deionized water spinning-off process s4035.

The substrate processing method of the present preferred embodiment is virtually designed by interpolating the solvent supplying step between the remover liquid spinning-off step s4002 and the deionized water supplying step s4003 in the substrate processing method of the first preferred embodiment including the remover liquid supplying step s4001, the remover liquid spinning-off step s4002, the deionized water supplying step s4003 and the deionized water spinning-off process s4004.

Therefore, the above-mentioned remover liquid supplying step s4031, the remover liquid spinning-off step s4032, the deionized water supplying step s4034 and the deionized water spinning-off step s4035 are respectively the same as the remover liquid supplying step s4001, the remover liquid spinning-off step s4002, the deionized water supplying step s4003 and the deionized water spinning-off step s4004 in the substrate processing method of the first preferred embodiment; therefore, the description thereof is omitted.

Figure 45:
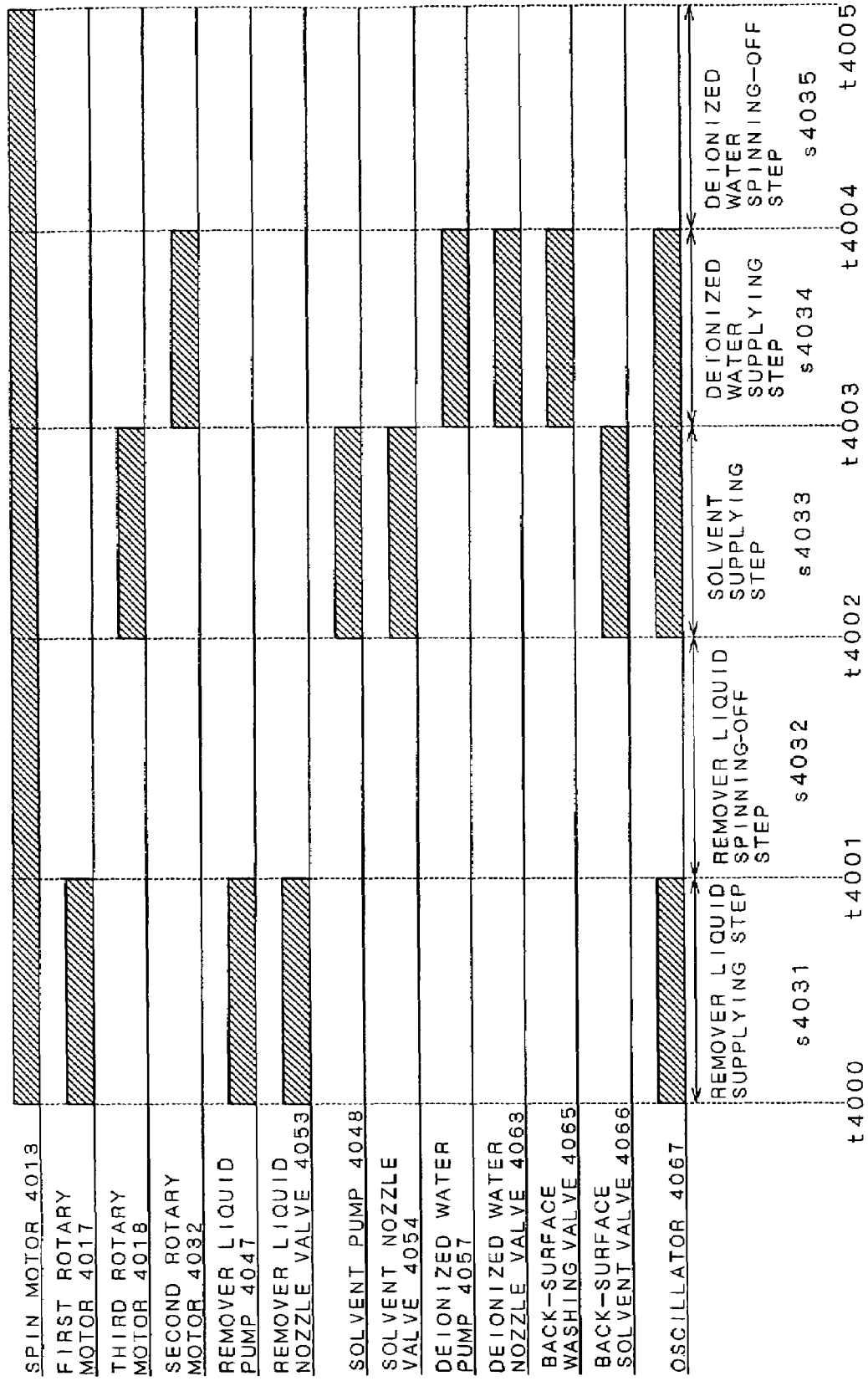
FIG. 45 is a detailed flow chart that shows a substrate processing method in accordance with the third preferred embodiment of the fourth aspect.

Next, an explanation will be given of the solvent supplying step s4033 of the present preferred embodiment. As illustrated in FIG. 45, the solvent supplying step s4033 is carried out after the remover liquid supplying step s4031 and the remover liquid spinning-off step s4032 have been finished. In the remover liquid spinning-off process s4032, the substrate is kept rotating with the supply of the remover liquid to the substrate W being stopped so that the remover liquid on the substrate W is spun off from the substrate W by a centrifugal force; thus, the remover liquid remaining on the substrate W is reduced to a minimum.

Next, at time t4002, the control means 4070 rotates the third rotary motor 4018, thereby allowing the solvent supplying section 4002 to pivot.

At time t4002 also, the control means 4070 drives the solvent pump 4048 so as to send the organic solvent to the solvent supplying section 4002, also drives the temperature-adjusting device 4052 to set the organic solvent to a predetermined temperature, and then opens the solvent nozzle valve 4054 so as to supply the organic solvent from the solvent supplying section 4002. With these steps, the organic solvent, supplied from the solvent supplying section 4002, is supplied onto the substrate W in such a manner that the arrival point thereof onto the substrate W is shifted on a circular arc passing through the rotation center C of the substrate W in the horizontal surface including the surface of the substrate W as indicated by arrow 4086 in FIG. 40. In this manner, the solvent supplying step s4033 is executed.

Here, at time t4002, the control means 4070 allows the oscillator 4067 to transmit an electric signal to the third vibrator 4026 within the solvent supplying section 4002 so as to vibrate the third vibrator 4026. Thus, ultrasonic waves are applied to the organic solvent supplied from the solvent supplying section 4002.

Consequently, the reaction products adhering to the substrate W are subjected to ultrasonic vibration, and thus easily separated from the substrate W.

Moreover, at time t4002, the control means 4070 allows the back surface solvent valve 4066 to open so as to supply the organic solvent to the back surface of the substrate W from the back surface solvent nozzle 4012, thereby also cleaning the remover liquid away from the back surface of the substrate W.

As described above, in the solvent supplying step s4033, the remover liquid is completely washed away from the substrate W by supplying the organic solvent to the substrate W. For this reason, even when deionized water is supplied to the substrate W in the succeeding deionized water supplying step s4034, the remover liquid contacting deionized water no longer exists, thereby making it possible to prevent the occurrence of a pH shock. Consequently, it becomes possible to prevent damages to thin films on the substrate W.

Moreover, the solvent arrival point is shifted on the circular arc passing through the rotation center C of the substrate W so that the organic solvent that is less susceptible to temperature changes and that is fresh without being exhausted can be supplied to the entire portion of the substrate W; thus, it is possible to positively remove the remover liquid from the entire surface of the substrate W and also to ensure the in-plane uniformity in the entire surface of the substrate W.

In the present preferred embodiment, since the remover liquid has been spun off from the substrate W in the remover liquid spinning-off step s4032, the remover liquid remaining on the substrate W at this point of time is very little. For this reason, it is possible to shorten the time required for the organic solvent to remove the remover liquid in the solvent supplying process s4033. Thus, it becomes possible to improve the throughput. In the same manner, since the remover liquid remaining on the substrate W is very little, it is possible to reduce the amount of the organic solvent to be required for the solvent supplying step s4033, and consequently to reduce the costs.

Here, in the present preferred embodiment, the deionized water supplying step s4034 is executed immediately after the solvent supplying step s4033. However, a solvent spinning-off process for spinning the solvent on the substrate W off may be placed between the solvent supplying step s4033 and the deionized water supplying step s4034.

Moreover, in the present preferred embodiment, the rotation of the substrate W has not been stopped from the start of the remover liquid supplying step s4031 to the completion of the deionized water spinning-off step s4035. However, the rotation of the substrate W may be temporarily stopped at any one of the intervals between the remover liquid supplying process s4031 and the remover liquid spinning-off step s4032, between the remover liquid spinning-off step s4032 and the solvent supplying step s4033, between the solvent supplying step s4033 and the deionized water supplying step s4034, and between the deionized water supplying step s4034 and the deionized water spinning-off step s4035.

The essential thing is to provide at least a step for reducing the remover liquid on the substrate W by rotating the substrate W even in a short time, prior to the start of the solvent supplying step s4033. Consequently, it is possible to shorten the time required for the solvent supplying step s4035, to improve the throughput, and also to reduce the costs.

Moreover, in the present preferred embodiment, the remover liquid, the organic solvent and deionized water to which ultrasonic waves are applied are supplied so that it is possible to remove the reaction products more quickly.

Furthermore, in the present preferred embodiment, a sequence of steps including the remover liquid supplying step s4031, the remover liquid spinning-off step s4032, the solvent supplying step s4033, the deionized water supplying step s4034 and the deionized water spinning-off step s4035 are carried out once. However, this sequence of steps may be repeated several times.

6. Third Preferred Embodiment of the Substrate Processing Apparatus

Figure 46:
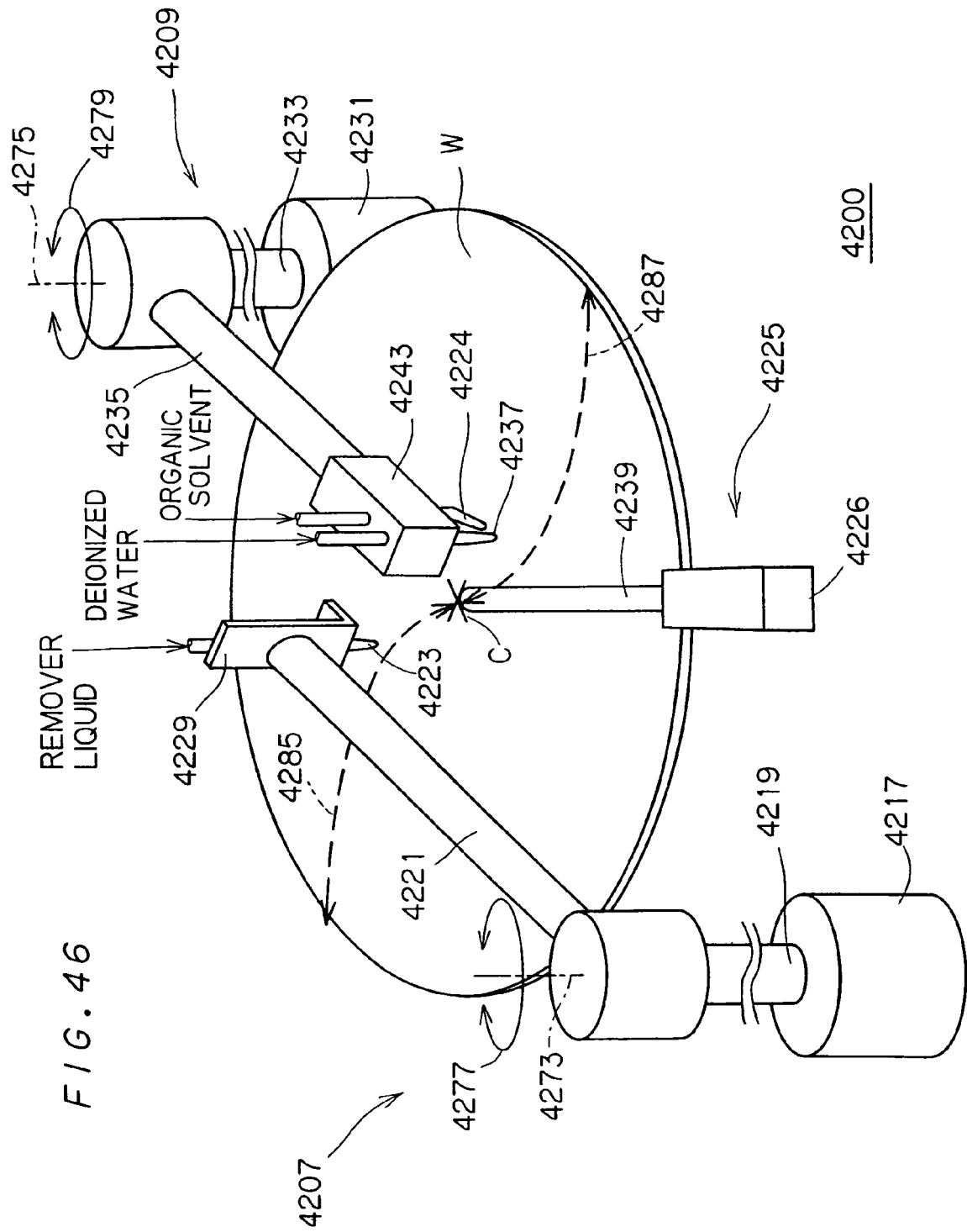
FIG. 46 is a perspective view that shows a substrate processing apparatus in accordance with the third preferred embodiment of the fourth aspect.
Figure 47:
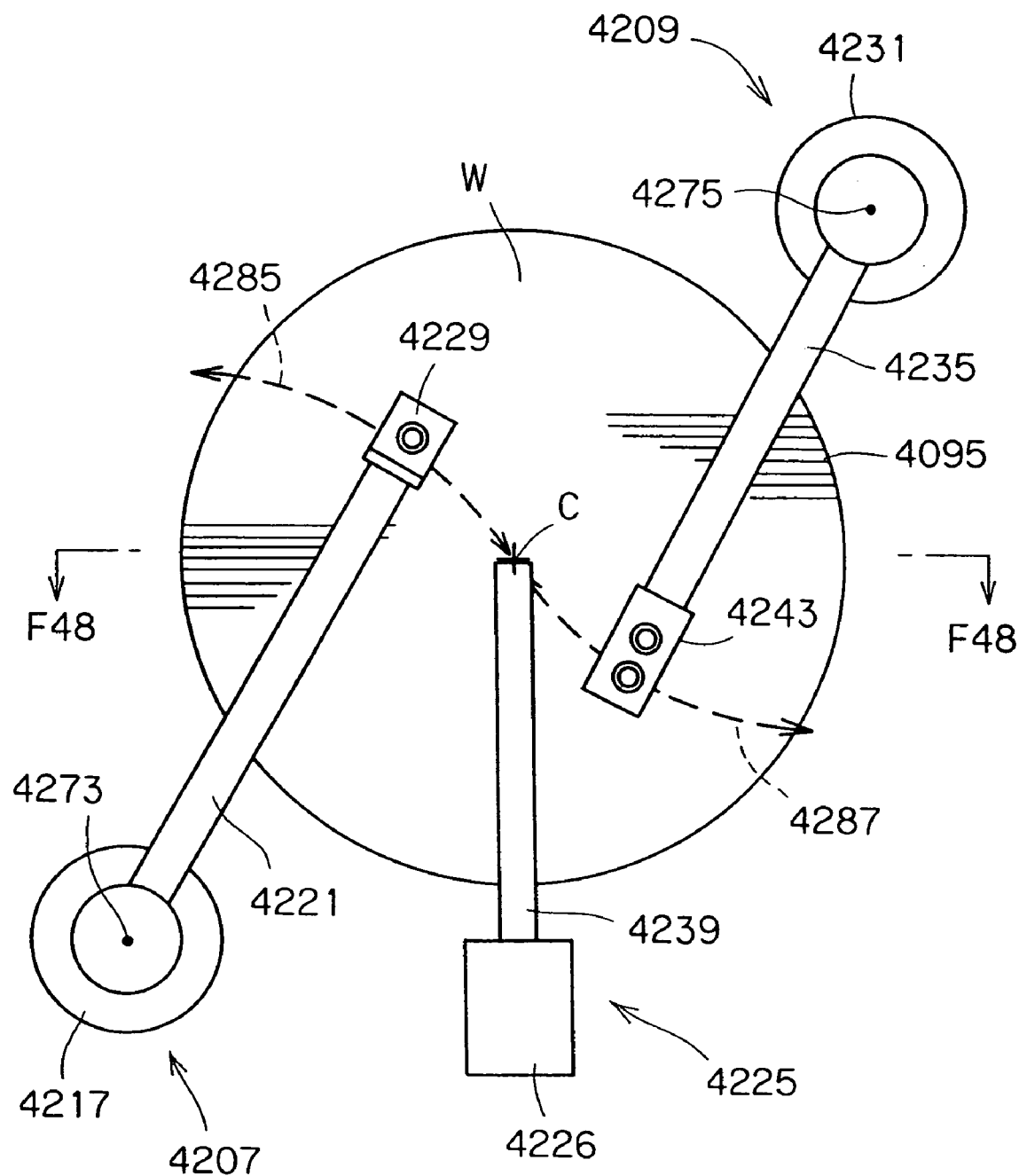
FIG. 47 is a top view that shows the substrate processing apparatus in accordance with the third preferred embodiment of the fourth aspect.

Referring to FIGS. 46 and 47, an explanation will be given of a substrate processing apparatus in accordance with a third preferred embodiment of the present invention. Here, FIG. 47 is a top view of FIG. 46.

A substrate processing apparatus 4200 in accordance with the third preferred embodiment is greatly distinct from the substrate processing apparatus 4001 of the first preferred embodiment and the substrate processing apparatus 4100 of the second preferred embodiment in that no vibrators for applying ultrasonic waves to the process liquids are placed inside the nozzles for discharging the process liquids such as the remover liquid, the intermediate rinse liquid and deionized water, and in that, instead of these, a direct vibration-applying means, which contacts the process liquids discharged onto a substrate and located on the substrate to directly apply ultrasonic waves thereto, is provided.

Moreover, the substrate processing apparatus 4200 is distinct from the substrate processing apparatus 4100 of the second preferred embodiment in that the solvent nozzle main body and the deionized water nozzle main body are installed on one arm. However, the other constructions including the holding rotary section, the remover liquid supplying system, the solvent supplying system and the deionized water supplying system are virtually the same as those of the second preferred embodiment; therefore, explanations will be given of only the different parts.

As illustrated in FIG. 46, the substrate processing apparatus 4200 is provided with a remover liquid supplying section 4207 for supplying a remover liquid to a substrate W, a solvent and deionized water supplying section 4209 for supplying an organic solvent and deionized water to the substrate W and a direct vibration-applying means 4225. Here, not shown in the Figure, the substrate W is held on the holding rotary section in the same manner as the substrate processing apparatus 4100.

The remover liquid supplying section 4207, which is secured to an apparatus frame, not shown, is provided with a first rotary motor 4217 having a driving shaft directed in the vertical direction, a first rotary shaft 4219 secured to the driving shaft of the first rotary motor 4217, and a first arm 4221 connected to the top of the first rotary shaft 4219.

A first fixing block 4229 is installed on the tip of the first arm 4221, and a remover liquid nozzle main body 4223 is attached to the first fixing block 4229.

The remover liquid nozzle main body 4223 is a tube-shaped member placed in the vertical direction, and one end thereof has an opening directed to the substrate W and the remover liquid is supplied to the other end thereof from the remover liquid supplying system. Thus, the remover liquid nozzle main body 4223 is allowed to discharge the remover liquid to the substrate W.

Here, as indicated by arrow 4285 in FIG. 47, in the present preferred embodiment, the remover liquid nozzle main body 4223 is shifted so that the arrival point of the remover liquid with respect to the substrate W is allowed to shift on a circular arc with its chord corresponding to the radius of a rotation circle 4095 that the end edge of the substrate W forms when it rotates.

The solvent and deionized water supplying section 4209, which is secured to an apparatus frame, not shown, is provided with a second rotary motor 4231 having a driving shaft directed in the vertical direction, a second rotary shaft 4233 secured to the driving shaft of the second rotary motor 4231, and a second arm 4235 connected to the top of the second rotary shaft 4233.

A second fixing block 4243 is installed on the tip of the second arm 4235, and a deionized water nozzle main body 4237 and a solvent nozzle main body 4224 are attached to the second fixing block 4243.

The deionized water nozzle main body 4237 is a tube-shaped member placed in the vertical direction, and one end thereof has an opening directed to the substrate W and deionized water is supplied to the other end thereof from the deionized water supplying system. Thus, the deionized water nozzle main body 4237 is allowed to discharge the deionized water to the substrate W.

The solvent nozzle main body 4224 is a tube-shaped member placed in the vertical direction, and one end thereof has an opening directed to the substrate W and the organic solvent is supplied to the other end thereof from the solvent supplying system. Thus, the solvent nozzle main body 4224 is allowed to discharge the organic solvent to the substrate W. Here, the tip of the solvent nozzle main body 4224 is bent toward the location of the pure nozzle main body 4237. More specifically, the tip of the solvent nozzle main body 4224 is bent in such a manner that the arrival point to the substrate W of the organic solvent discharged from the solvent nozzle main body 4224 and the arrival point to the substrate W of the deionized water discharged from the deionized water nozzle main body 4237 are made coincident with each other. With this arrangement, both of the organic solvent and deionized water supplied from a rinse-related nozzle 4207 are allowed to arrive at the same position on the substrate W.

As indicated by arrow 4287 in FIG. 47, in the present preferred embodiment, the solvent nozzle main body 4224 and the deionized water nozzle main body 4237 are shifted so that both of the arrival points of the deionized water and the organic solvent with respect to the substrate W are allowed to shift on a circular arc with its chord corresponding to the radius of a rotation circle 4095 that the end edge of the substrate W forms when it rotates.

In this case, the remover liquid nozzle main body 4223, the solvent nozzle main body 4224 and the deionized water nozzle main body 4237 respectively constitute a remover liquid discharging means, a solvent discharging means and a deionized water discharging means.

The direct vibration applying means 4225 is connected to an oscillator, not shown, and is provided with a vibrator 4226 for generating vibration by an electric signal transmitted from the oscillator and a vibration rod 4239 that is allowed to vibrate by vibration transmitted from the vibrator 4226.

Figure 48:
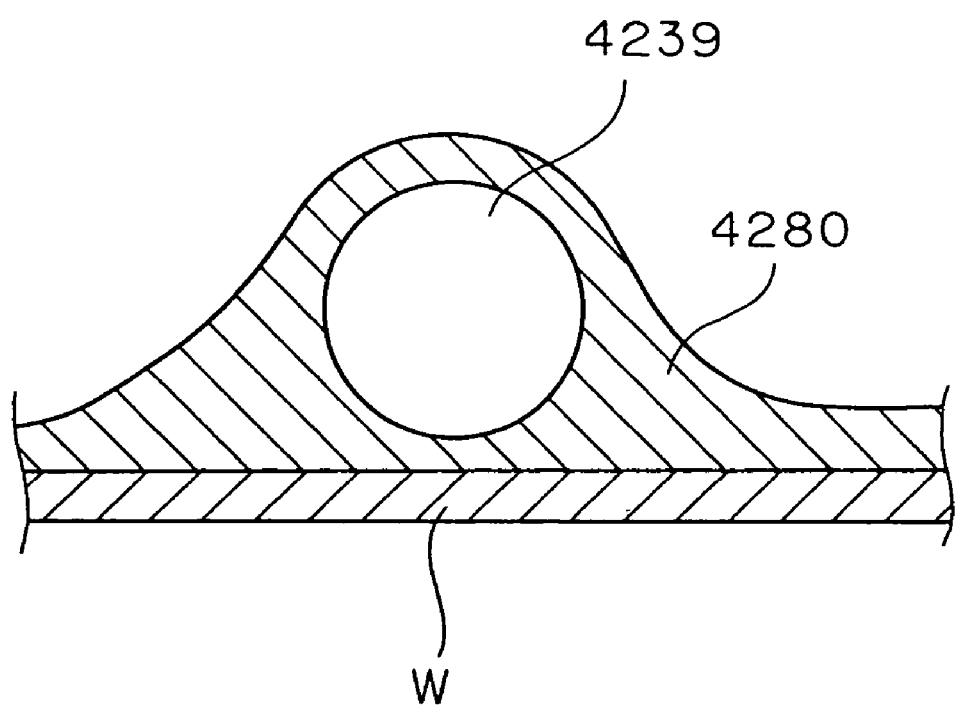
FIG. 48 is a cross-sectional view taken along line F48-F48 of FIG. 47.

The vibration rod 4239, which is a rod-shaped member having a length virtually covers the radius of the rotation circle 4095, is passed over the rotation circle 4095 in the radial direction. Moreover, as illustrated in FIG. 48, the vibration rod 4239 is placed above the substrate W with a gap. This gap is determined in such a manner that when a process liquid 4280 is supplied to the substrate W, the vibration rod 4239 is allowed to contact the process liquid 4280 thus supplied onto the substrate W. Here, FIG. 48 is a cross-sectional view taken along line F48-F48 of FIG. 47.

In this manner, the direct vibration applying means 4225 is allowed to vibrate with the vibration rod 4239 contacting the process liquid supplied to the substrate W and located on the substrate W. Thus, the process liquid on the substrate W is directly subjected to ultrasonic vibration.

In the substrate processing apparatus 4200 as described above, it is possible to carry out a substrate processing method including the remover liquid supplying step in which: the substrate W is rotated so that the remover liquid nozzle main body 4223 is reciprocally shifted, the remover liquid is supplied to the rotating substrate W, and the vibration rod 4239 contacting the remover liquid on the substrate W is vibrated so that ultrasonic waves are applied to the remover liquid located on the rotating substrate W; the solvent supplying step serving as an intermediate rinse step in which: after the remover liquid supplying step, the organic solvent is supplied to the rotating substrate W while reciprocally shifting the solvent nozzle main body 4224, and the vibration rod 4239 contacting the organic solvent supplied onto the substrate W is vibrated so that ultrasonic waves are applied to the organic solvent located on the substrate W; the deionized water supplying step in which: the deionized water is supplied to the rotating substrate W while reciprocally shifting the deionized water nozzle main body 4237, and the vibration rod 4239 contacting the deionized water supplied onto the substrate W is vibrated so that ultrasonic waves are applied to the deionized water located on the rotating substrate W; and the deionized water spinning-off step for spinning the deionized water off from the substrate W by rotating the substrate W.

In this case, since ultrasonic waves are directly applied to the process liquids such as the remover liquid, the organic solvent and the deionized water located on the substrate W so that, in comparison with a case in which process liquids to which ultrasonic waves have been preliminarily applied are discharged onto the substrate, the process liquids in the vicinity of the reaction products have greater ultrasonic energy. Therefore, it is possible to desirably remove the reaction products.

In this case, ultrasonic waves are applied from the vibration rod 4239 to all the three process liquids, that is, the remover liquid, the organic solvent and deionized water, on the substrate W. However, any one or any two of the remover liquid, the organic solvent and the deionized water on the substrate W may be subjected to ultrasonic waves from the vibration rod 4239.

In each of the above-mentioned preferred embodiments, the holding rotary section rotates the substrate while maintaining it horizontally. However, the holding rotary section may rotate the substrate with its major surface being tilted with respect the horizontal surface, or may rotate the substrate with its major surface being maintained in the vertical direction.

Moreover, in each of the above-mentioned preferred embodiments, the holding rotary section holds only one substrate. However, the holding rotary section may be designed to hold a plurality of substrates.

In each of the above-mentioned preferred embodiments, the substrate treatment deals with a substrate having a surface on which polymers are formed through dry-etching. However, the present substrate treatment is more effectively applied to a substrate that has been further subjected to ashing after the dry-etching.

Moreover, in each of the substrate processing apparatuses in the respective preferred embodiments, when the temperature-adjusting device for adjusting the temperature of the remover liquid sets the temperature of the remover liquid to a temperature higher than room temperature (approximately, 25° C.), in particular, to not less than 60° C., it is possible to obtain greater effects.

In other words, in the case when a remover liquid having a temperature higher than room temperature is supplied to the substrate, the remover liquid is easily cooled off. In the case when the remover liquid arrival point is fixed to a specific position on the substrate, although, at the specific position, the remover liquid having a proper temperature is supplied thereto to remove the reaction products with a maximum efficiency, the remover liquid is cooled off at the portions other than the specific portion, failing to remove the reaction products with a high efficiency.

However, in the substrate processing apparatuses in the respective preferred embodiments, since the arrival point of the remover liquid at the substrate W is shifted so that it becomes possible to supply the remover liquid having a predetermined temperature to each of the portions on the substrate.

In particular, in the substrate processing apparatuses in the respective preferred embodiments, the substrate W is rotated, and the arrival point of the remover liquid with respect to the substrate W is allowed to shift on a line passing through the rotation center of the substrate and the circumference of a rotation circle that the end edge of the substrate W forms when the substrate W rotates. This arrangement makes it possible to supply the remover liquid having a predetermined temperature to all the portions of the substrate W, and consequently to optimize the removing efficiency of the reaction products on the entire portions of the substrate W. Thus, it becomes possible to ensure the in-plane uniformity of the substrate W in the process.

E. Preferred Embodiments According to Fifth Aspect of the Present Invention

<1. Substrate Processing Apparatus 5001>

Figure 49:
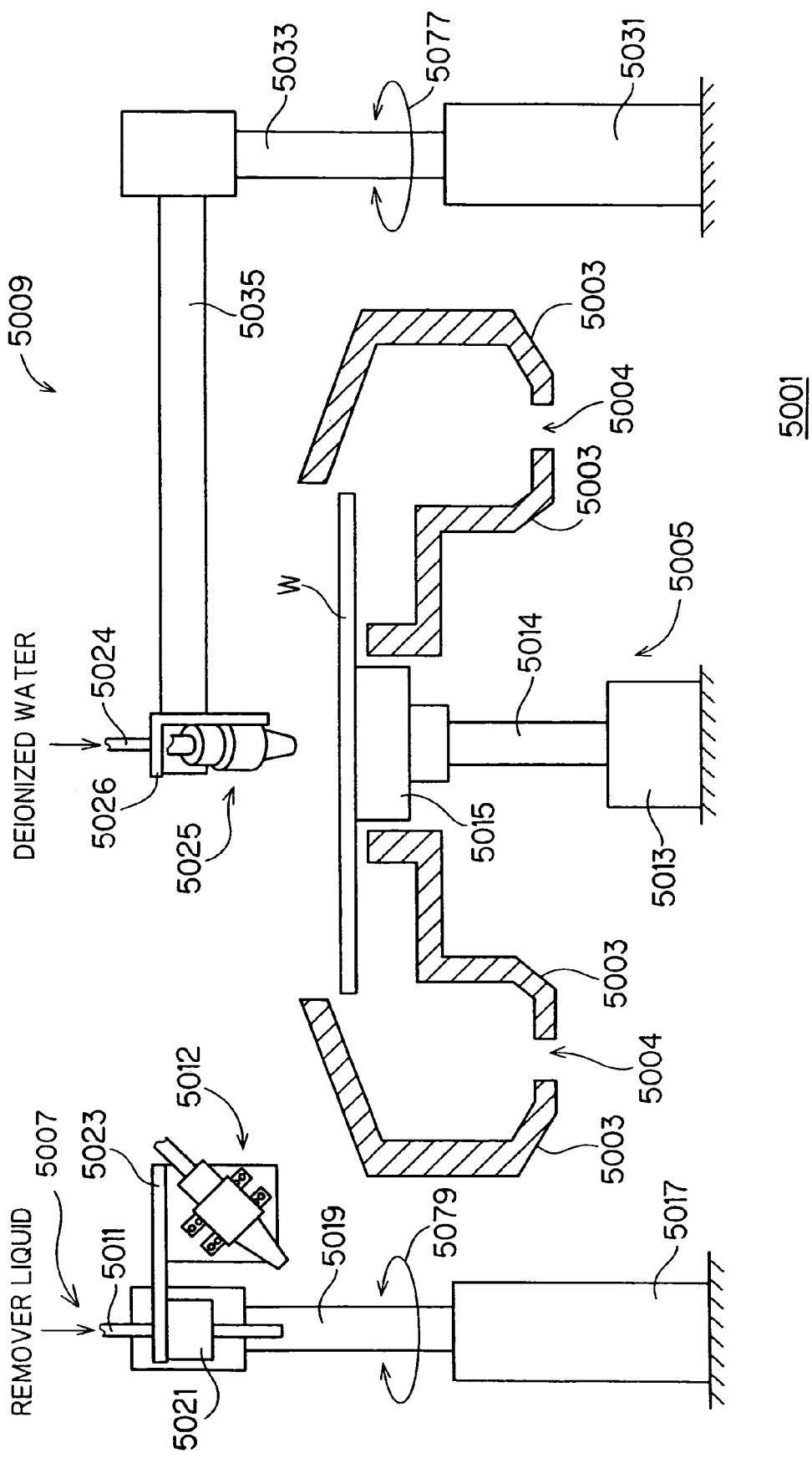
FIG. 49 is a side view of a substrate processing apparatus 5001.
Figure 50:
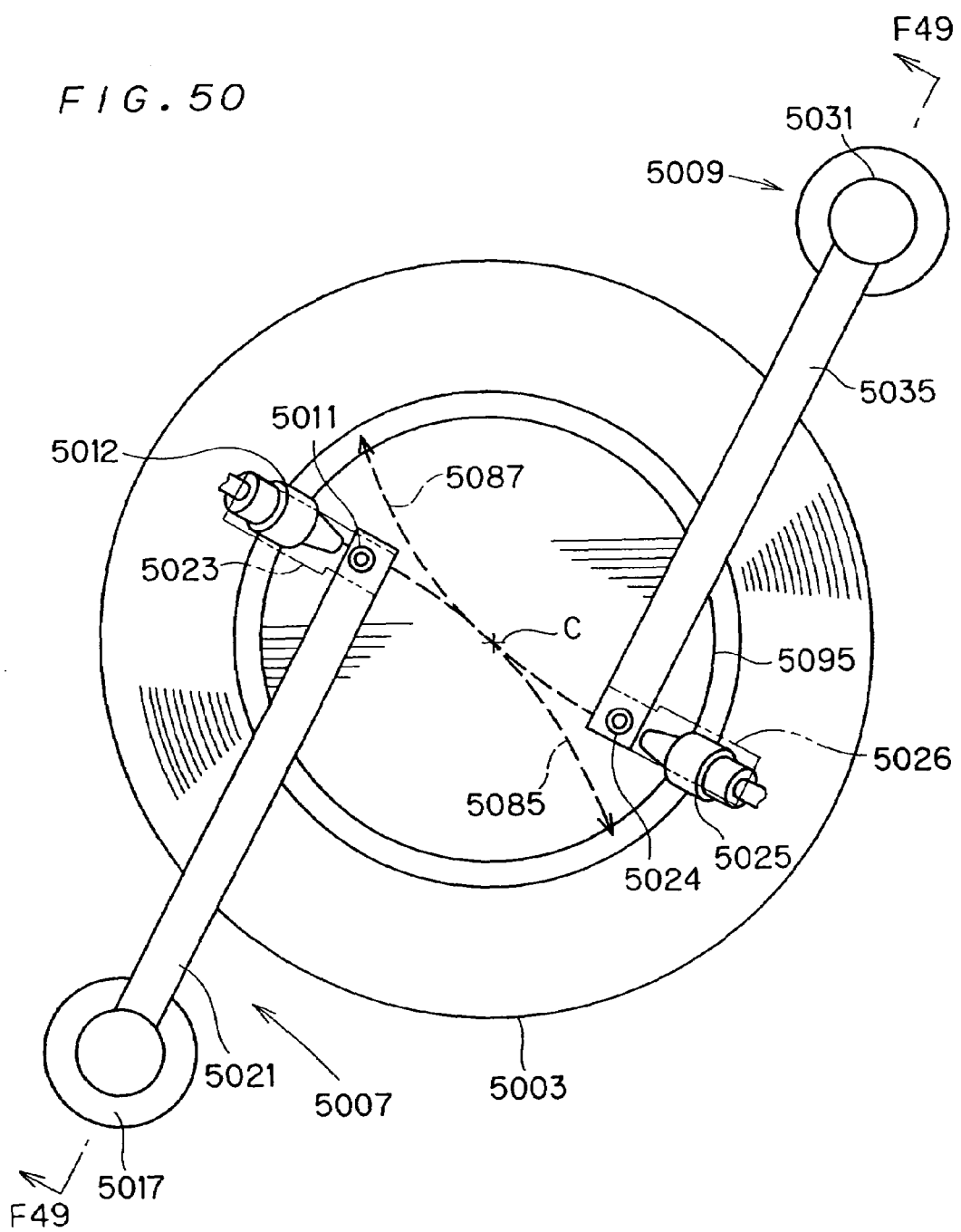
FIG. 50 is a top view of the substrate processing apparatus 5001.

FIGS. 49 and 50 are drawings that show the construction of a substrate processing apparatus 5001. Here, FIG. 49 is a cross-sectional view taken along line F49-F49 of FIG. 50, and for convenience of explanation, hatching is partially omitted from some portions.

As illustrated in FIG. 49, the substrate processing apparatus 5001 is provided with a cup 5003 which has a virtually U-letter shape in its cross-section, and also has a virtually ring shape with an opening in the center portion thereof as shown in FIG. 50, when viewed from above, a holding rotary section 5005 that is formed in a manner so as to stick out through the opening of the cup 5003 in the vertical direction as shown in FIG. 49 and that rotates while holding a substrate W, a remover liquid supplying section 5007 for supplying a remover liquid to the substrate W held by the holding rotary section 5005 and a deionized water supplying section 5009 for also supplying deionized water to the substrate W held by the holding rotary section 5005.

The cup 5003 has a plurality of discharging outlets 5004 on the bottom thereof. Thus, an excessive portion of the liquid supplied to the substrate W drops along the inner wall of the cup 5003 to reach the discharging outlets 5004, and is discharged out of the apparatus through the discharging outlets 5004.

The holding rotary section 5005 is provided with a spin motor 5013 which is secured to an apparatus frame, not shown, and has a driving shaft placed in the vertical direction, a spin shaft 5014 that is secured to the driving shaft of the spin motor 5013 and a vacuum chuck 5015 serving as a substrate holding member placed on the top of the spin shaft 5014.

The vacuum chuck 5015 has a suction hole, not shown, formed in a suction surface that is a top major surface thereof, and air is sucked through the suction hole. Thus, the substrate W, placed on the vacuum chuck 5015, is held by air suction applied through the suction hole.

In this arrangement, the holding rotary section 5005 holds the substrate W placed on the vacuum chuck 5015 through suction applied by the vacuum chuck 5015, and rotates the substrate W held on the vacuum chuck 5015 by driving the spin motor 5013.

The remover liquid supplying section 5007 is provided with a first rotary motor 5017 which is secured to the apparatus frame, not shown, and has a driving shaft placed in the vertical direction, a first rotary shaft 5019 secured to the driving shaft of the first rotary motor 5017 and a first arm 5021 connected to the top of the first rotary shaft 5019.

A remover liquid discharging nozzle 5011 is attached to the tip of the first arm 5021. The remover liquid discharging nozzle 5011 is a tube-shaped member with its length direction set virtually in the vertical direction, and a remover liquid is supplied from one end thereof, with the other end supplying the remover liquid to the substrate W.

Moreover, a remover liquid injection nozzle 5012 is attached to the same tip of the first arm 5021 through a bracket 5023 (indicated by an alternate long and two short dashes line in FIG. 50).

The remover liquid injection nozzle 5012, which sprays a remover liquid that is pressurized (hereinafter, also referred to as pressurized remover liquid), as will be described later, is arranged so as to spray the remover liquid with an inclination of 45 degrees with respect to the surface of the substrate W.

Here, the above-mentioned remover liquid discharging nozzle 5011 and remover liquid injection nozzle 5012 are arranged so that the remover liquid discharged from the remover liquid discharging nozzle 5011 and the pressurized remover liquid sprayed from the remover liquid injection nozzle 5012 are allowed to intersect each other on the surface of the substrate W, and so that, when the remover liquid discharging nozzle 5011 and the remover liquid injection nozzle 5012 are allowed to pivot by the first rotary motor 5017, the remover liquid discharged from the remover liquid discharging nozzle 5011 and the pressurized remover liquid sprayed from the remover liquid injection nozzle 5012 are reciprocally shifted, as illustrated in FIG. 50, on a circular arc 5085 that passes through the rotation center C of the substrate W and also intersects a rotation circle 5095 that the end edge of the rotating substrate W forms at two points on the circumference thereof.

The deionized water supplying section 5009, which is secured to the apparatus frame, not shown, is provided with a second rotary motor 5031 having a driving shaft directed in the vertical direction, a second rotary shaft 5033 secured to the driving shaft of the second rotary motor 5031 and a second arm 5035 connected to the top of the second rotary shaft 5033.

A deionized water discharging nozzle 5024 is attached to the tip of the second arm 5035. The deionized water discharging nozzle 5024 is a tube-shaped member with its length direction set virtually in the vertical direction, and deionized water is supplied from one end thereof, with the other end supplying the deionized water to the substrate W.

Moreover, a deionized water injection nozzle 5025 is attached to the same tip of the second arm 5035 through a bracket 5026 (indicated by an alternate two dots dash line in FIG. 50). The deionized water injection nozzle 5025, which sprays a deionized water mist that is pressurized (hereinafter, also referred to as pressurized deionized water), as will be described later, is arranged so as to spray the pressurized deionized water with an inclination of 45 degrees with respect to the surface of the substrate W.

The above-mentioned deionized water discharging nozzle 5024 and deionized water injection nozzle 5025 are arranged so that the deionized water discharged from the deionized water discharging nozzle 5024 and the pressurized deionized water sprayed from the deionized water injection nozzle 5025 are allowed to intersect each other on the surface of the substrate W, and so that, when the deionized water discharging nozzle 5024 and the deionized water injection nozzle 5025 are allowed to pivot by the second rotary motor 5031, the deionized water discharged from the deionized water discharging nozzle 5024 and the pressurized deionized water sprayed from the deionized water injection nozzle 5025 are reciprocally shifted, as illustrated in FIG. 50, on a circular arc 5087 that passes through the rotation center C of the substrate W and also intersects a rotation circle 5095 that the end edge of the rotating substrate W forms, at two points on the circumference thereof.

<2. Remover Liquid Supplying System, Deionized Water Supplying System, Nitrogen Supplying System>

Figure 51:
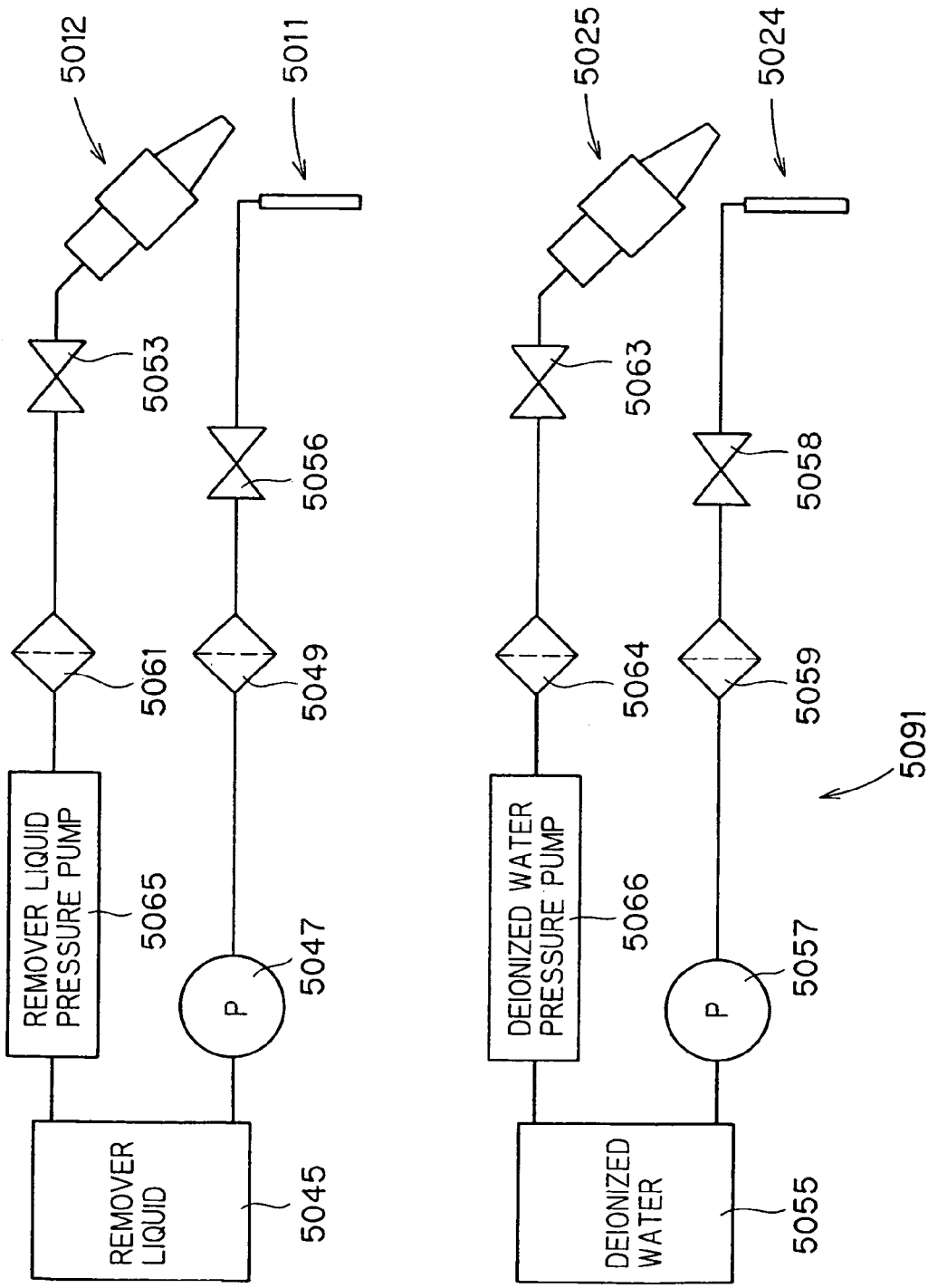
FIG. 51 is a drawing that shows a remover liquid supplying system 5089 and a deionized water supplying system 5091.

FIG. 51 shows a remover liquid supplying system 5089, a deionized water supplying system 5091 and a nitrogen supplying system 5093.

The remover liquid supplying system 5089 is provided with a pressure pump 5065 for pumping the remover liquid from a remover liquid source 5045 outside the apparatus, a filter 5061 for filtering contaminants from the remover liquid pumped by the pressure pump 5065, and a remover liquid injection valve 5053 for opening and closing the flowing path of the filtered remover liquid to the remover liquid injection nozzle 5012. Moreover, the remover liquid supplying system 5089 is provided with a remover liquid pump 5047 for pumping the remover liquid from the remover liquid source 5045, a filter 5049 for filtering contaminants from the remover liquid pumped by the remover liquid pump 5047, and a remover liquid discharging valve 5056 for opening and closing the flowing path of the filtered remover liquid to the remover liquid discharging nozzle 5011.

With this arrangement, the remover liquid supplying system 5089 is allowed to supply the purified remover liquid to the remover liquid injection nozzle 5012 and the remover liquid discharging nozzle 5011.

A remover liquid injection hole having a bore diameter of not more than 0.5 mm, preferably, not more than 0.1 mm, is formed in the tip of the remover liquid injection nozzle 5012 so that the remover liquid pressure pump 5065 is allowed to discharge a high-pressure remover liquid from the remover liquid injection hole. In this case, the high pressure corresponds to a pressure that measures not less than $2.94 \times 106$ Pa (30 kgf/cm$^2$) upon arrival on the substrate W.

The deionized water supplying system 5091 is provided with a deionized water pressure pump 5066 for pumping deionized water from a deionized water source 5055 outside the apparatus, a filter 5064 for filtering contaminants from the deionized water pumped by the deionized water pressure pump 5066, and a deionized water injection valve 5063 for opening and closing the flowing path of the filtered deionized water to the deionized water injection nozzle 5025. Moreover, the deionized water supplying system 5091 is provided with a deionized water pump 5057 for pumping deionized water from the deionized water source 5055, a filter 5059 for filtering contaminants from the deionized water pumped by the deionized water pump 5057, and a deionized water discharging valve 5056 for opening and closing the flowing path of the filtered deionized water to the deionized water injection nozzle 5024.

With this arrangement, the deionized water supplying system 5091 is allowed to supply the purified deionized water to the deionized water injection nozzle 5025 and the deionized water discharging nozzle 5024.

A deionized water injection nozzle hole having a bore diameter of not more than 0.5 mm, preferably, not more than 0.1 mm, is formed in the tip of the deionized water injection nozzle 5025 so that the deionized water pressure pump 5066 is allowed to discharge a high-pressure deionized water from the deionized water injection hole. In this case, the high pressure corresponds to a pressure that measures not less than $2.94 \times 106$ Pa (30 kgf/cm$^2$) upon arrival on the substrate W.

<3. Liquid Pressurizing Section>

Figure 52:
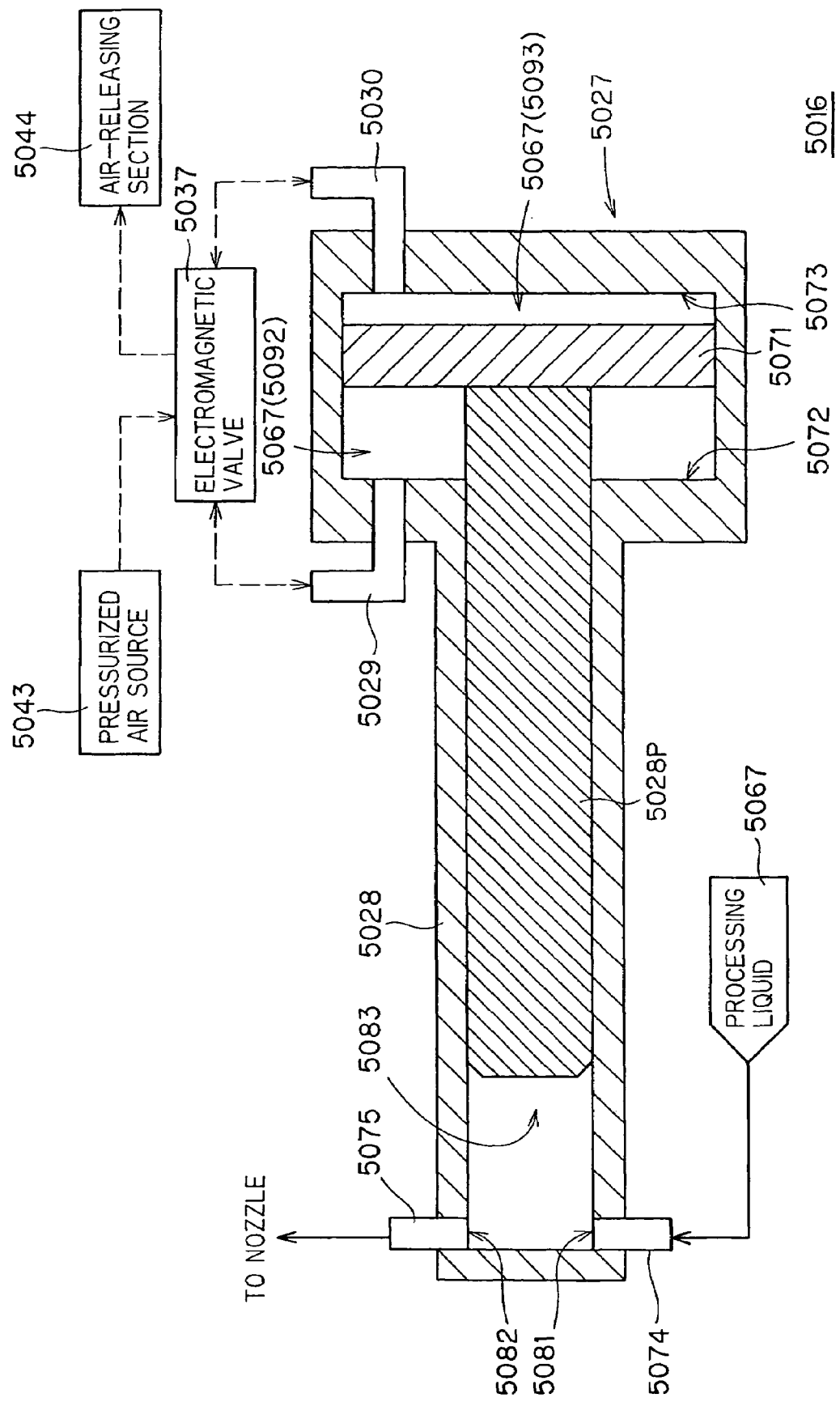
FIG. 52 is a drawing that shows a liquid pressurizing section 5016.

The above-mentioned remover liquid pressure pump 5065 and the deionized water pressure pump 5066 have the same structure in which a pressure pump 5027, shown in FIG. 52, is used. The following description will discuss a liquid pressurizing section 5016 containing the pressure pump 5027. The liquid pressurizing section 5016 is provided with the pressure pump 5027, and an electromagnetic valve 5037 which switches the supply end of air from a pressurized air source 5043 to a front port 5029 or a rear port 5030, which will be described later, and which, when the supply end is the front port 5029, allows the rear port 5030 to communicate with an air-releasing section 5044 outside the apparatus so as to release air from the rear port 5030, and when the supply end is the rear port 5030, allows the front port 5029 to communicate with the air-releasing section 5044 so as to release air from the front port 5029.

The pressure pump 5027 is provided with a tube-shaped cylinder 5028 with its front end closed and its rear end opened, a sliding chamber 5052 the front end of which is connected to the rear end of the cylinder 5028 in a sealed state with the rear end thereof being closed, and which has a column-shaped sliding space 5067 having a diameter larger than the inner diameter of the cylinder 5028 inside thereof, a piston 5028P inserted into the cylinder 5028 so as to freely slide therein, a sliding member 5071 that is connected to the piston 5028P and slides inside the sliding chamber 5052 so that the piston 5028P is allowed to slide on the cylinder 5028, the front port 5029 that communicates with a space (front chamber 5092) on the side in which the piston 5028P is placed of the sliding chambers 5067 divided by the sliding member 5071 and the rear port 5030 that communicates with a space (rear chamber 5093) formed on the side opposite to the front chamber of the sliding chambers 5067 divided by the sliding member 5071. Moreover, the cylinder 5028 and the front end of the piston 5028P form a space (referred to as a liquid chamber 5083). Moreover, a flow inlet 5074, which communicates with the liquid chamber 5083, is formed in the tip of the cylinder 5028 on the closed side so that a process liquid released from a process liquid source 5067 is allowed to flow from the flow inlet 5074 to the liquid chamber 5083 through a flow-in side reverse stopping valve 5074. Moreover, a flow outlet 5082, which communicates with the liquid chamber 5083, is formed in the tip of the cylinder 5028 on the closed side so that the process liquid inside the liquid chamber 5083 is allowed to flow out through a flow-out side reverse stopping valve 5075.

In the liquid pressurizing section 5016 of this type, air is supplied from the pressurized air source 5043 to the front port 5029 by operating the electromagnetic valve 5037. Then, since the air is supplied into the front chamber 5092, the sliding member 5071 is shifted toward a rear wall 5073. Thus, the piston 5028P is allowed to retreat so that the process liquid is allowed to flow into the liquid chamber 5083. At this time, since the flow-out side reverse stopping valve 5075 is placed in the flow outlet 5082, no liquid is flow in the liquid chamber 5083 from the flow outlet 5082.

After a predetermined amount of the process liquid has been stored in the liquid chamber, the electromagnetic valve 5037 is operated so as to switch the supply end of air to the rear port 5030. Then, since air is supplied to the rear chamber 5093, the sliding member 5071 is shifted toward a rear wall 5072. Thus, the piston 5028P is allowed to advance so that the process liquid inside the liquid chamber 5083 is allowed to flow out of the flow outlet 5082. At this time, since the flow-in side reverse stopping valve 5074 is placed in the flow inlet 5081, no liquid is allowed to flow reversely from the liquid chamber 5083 to the flow inlet 5081.

Thus, the liquid pressurizing section 5016 is allowed to flow the pressurized process liquid.

In the case when, the above-mentioned pressure pump 5027 is adopted as the remover liquid pressure pump 5065, the process liquid source 5067 corresponds to the remover liquid source 5045. Here, the pressurized remover liquid flowing from the flow-out side reverse stopping valve 5075 is sent toward the filter 5061.

Moreover, in the case when the pressure pump 5027 is adopted as the deionized water pressure pump 5066, the process liquid source 5067 corresponds to the deionized water source 5055. Here, the pressurized deionized water flowing from the flow-out side reverse stopping valve 5075 is sent toward the filter 5064.

<4. Control Means>

Figure 53:
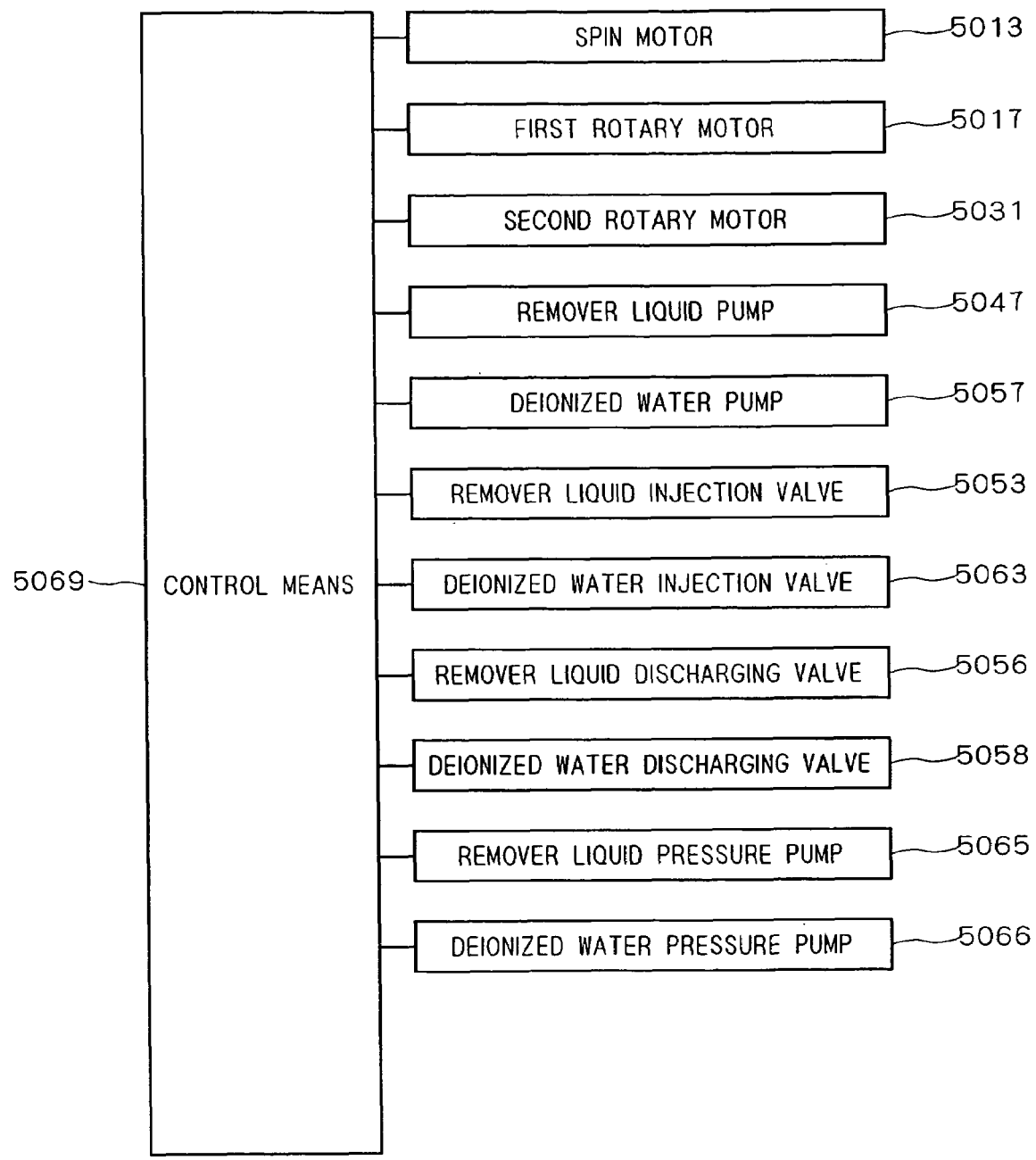
FIG. 53 is a drawing that shows a hardware construction of the substrate processing apparatus 5001.

FIG. 53 shows a control means 5069 of the substrate processing apparatus 5001.

The control means 5069 are connected to the spin motor 5013, the first rotary motor 5017, the second rotary motor 5031, the remover liquid pump 5047, the deionized water pump 5057, the remover liquid injection valve 5053, the deionized water injection valve 5063, the remover liquid discharging valve 5056, the deionized water discharging valve 5058, the remover liquid side nitrogen valve 5066, the deionized water side nitrogen valve 5065, the temperature-adjusting device 5051 and the temperature-adjusting device 5061. Thus, as will be described in a substrate processing method, the control means 5069 controls these devices connected thereto.

In the present substrate processing apparatus 5001, the gas-liquid mixing nozzle 5027 is adopted as the remover liquid injection nozzle 5012 and the deionized water injection nozzle 5025. Since the gas-liquid mixing nozzle 5027 has a straight flow section 5037, it is possible to regulate the remover liquid mist and the deionized water mist from dispersing. For this reason, the remover liquid mist and the deionized water mist are accelerated to a predetermined velocity, and the remover liquid mist and the deionized water mist are allowed to reach the substrate W with their velocity less attenuated.

In the present substrate processing apparatus 5001, the remover liquid mist and the deionized water mist from the remover liquid injection nozzle 5012 and the deionized water injection nozzle 5025 are sprayed with an angle of 45 degrees with respect to the surface of the substrate W, and in general, they can be sprayed in a direction tilted from the normal to the substrate W. In order to properly remove the reaction products of the side walls, the angle between the discharging direction of the remover liquid mist and the deionized water mist and the surface of the substrate W is preferably set in the range of not less than 30 degrees to not more than 60 degrees, in particular, at 45 degrees.

<5. Substrate Processing Method Using the Substrate Processing Apparatus 5001>

As illustrated in FIG. 53, the present substrate processing method using the substrate processing apparatus 5001 includes a remover liquid supplying step s5001, a remover liquid spinning-off step s5002, a deionized water supplying step s5003, and a deionized water spinning-off step s5004.

(1. Remover Liquid Supplying Step s5001)

First, the control means 5069 drives the spin motor 5013 so that the substrate W is being rotated at a predetermined number of revolutions.

Moreover, the control means 5069 drives to rotate the first rotary motor 5017, and also rotates the remover liquid pump 5047 with the remover liquid discharging valve 5058 being opened so that the remover liquid is supplied to the substrate W from the remover liquid discharging nozzle 5011. Thus, the substrate W is supplied with a comparatively large amount of the remover liquid, with the result that the reaction products on the substrate W start to swell.

Next, after a lapse of a first predetermined time from the start of the remover liquid supply from the remover liquid discharging nozzle 5011, the remover liquid discharging valve 5058 is closed to stop the supply of the remover liquid from the remover liquid discharging nozzle 5011, and the remover liquid pump 5047 is also stopped. Then, the remover liquid pressure pump 5065 is driven with the remover liquid injection valve 5053 is opened so that the pressurized remover liquid is discharged to the substrate W from the remover liquid injection nozzle 5012. Thus, the pressurized remover liquid is blasted onto the reaction products that are swelling and softening. Thus, the pressurized remover liquid is firmly driven into the reaction products, thereby allowing the reaction products to further swell, and the swelled reaction products come off the substrate W.

Moreover, since the remover liquid injection nozzle 5012 discharges the pressurized remover liquid with an angle of 45 degrees with respect to the substrate W, the pressurized remover liquid is allowed to reach the reaction products adhering to the irregular side walls of the substrate W without being weakened in its force against the reaction products. Consequently, it is possible to further accelerate the swelling and coming off of the reaction products from the substrate W.

The first predetermined time is a period of time from the start of the supply of the remover liquid from the remover liquid discharging nozzle 5011 to the time at which the reaction products on the substrate W start to swell by the remover liquid supplied from the remover liquid discharging nozzle 5011, and this has been preliminarily found through experiments.

Then, the control means 5069 stops the driving operation of the first rotary motor 5017 with the remover liquid injection nozzle 5012 having retreated from a position above the cup 5003. Moreover, the control means 5069 closes the remover liquid injection valve 5053, and also stops the driving operation of the remover liquid pressure pump 5065 so as to stop the supply of the remover liquid from the remover liquid supplying section 5007.

(2. Remover Liquid Spinning-Off Step s5002)

Next, the control means 5069 stops the supply of the remover liquid to the substrate W, while it successively rotates the spin motor 5013 so as to maintain the rotating state of the substrate W. Thus, a remover liquid spinning-off step s5002 is executed.

In this remover liquid spinning-off step s5002, the substrate W is rotated at not less than 500 rpm, more preferably, in the range from 1000 rpm to 4000 rpm.

Moreover, the time during which the rotation is maintained is set to not less than 1 second, preferably, in the range of 2 to 5 seconds.

In this manner, the rotating state of the substrate is maintained with the supply of the remover liquid being stopped with respect to the substrate W, the remover liquid on the substrate W is spun off from the substrate W by a centrifugal force.

(3. Deionized Water Supplying Step s5003)

After the remover liquid spinning-off process s5002, the control means 5069 rotates the second rotary motor 5031, and also drives the deionized water pump 5057 so as to supply deionized water from the deionized water discharging nozzle 5024 with the deionized water discharging valve 5058 being open. Thus, the substrate W is supplied with a comparatively large amount of deionized water so that the reaction products that have swelled on the substrate W start to be washed away.

Next, after a lapse of a second predetermined time from the start of the deionized water supply from the deionized water discharging nozzle 5024, the deionized water discharging valve 5058 is closed to stop the supply of the deionized water from the deionized water discharging nozzle 5024, and the deionized water pump 5057 is also closed. Then, the deionized water pressure pump 5066 is driven with the deionized water injection valve 5063 being open so that the pressurized deionized water is discharged to the substrate W from the deionized water injection nozzle 5025. Thus, the accelerated deionized water is blasted onto the reaction products that are swelling and softening, with the result that the reaction products come off the substrate W.

Moreover, since the deionized water injection nozzle 5025 sprays the pressurized deionized water with an angle of 45 degrees with respect to the substrate W, the pressurized deionized water is allowed to reach the reaction products adhering to the irregular side walls of the substrate W without being weakened in its force against the reaction products. Consequently, it is possible to further accelerate the coming off of the reaction products from the substrate W.

Here, the second predetermined time is a period of time from the start of the deionized water supply from the deionized water discharging nozzle 5024 to the time at which the reaction products on the substrate W have come off to a certain degree by the deionized water, and this has been preliminarily found through experiments.

Next, the control means 5069 stops the driving operation of the second rotary motor 5031 with the deionized water injection nozzle 5025 having retreated from a position above the cup 5003. Moreover, the control means 5069 closes the deionized water injection valve 5063, and also stops the driving operation of the deionized water pressure pump 5066 so as to stop the supply of the deionized water from the deionized water supplying section 5009.

(4. Deionized Water Spinning-Off Step s5004)

After the deionized water supplying step s5003, the control means 5069 stops the supply of the deionized water to the substrate W, while it successively rotates the spin motor 5013 so as to maintain the rotating state of the substrate W. Thus, a deionized water spinning-off step s5004 is executed.

In this manner, by supplying the remover liquid and deionized water to the substrate W, the reaction products are removed therefrom.

In accordance with the present substrate processing method, until the first predetermined time has elapsed since the start of the remover liquid supplying step s5001, the liquid-state remover liquid is continuously supplied from the remover liquid discharging nozzle 5011. However, after the lapse of the first predetermined time, the pressurized remover liquid is supplied from the remover liquid injection nozzle 5012. Thus, in comparison with a case in which the liquid-state remover liquid is continuously supplied from the remover liquid discharging nozzle 5011 for the entire remover liquid supplying process s5001, it is possible to reduce the amount of consumption of the remover liquid. Moreover, since the high-speed pressurized remover liquid is discharged from the remover liquid injection nozzle 5012, the time required for the swelling of the reaction products on the substrate W and coming-off thereof from the substrate W is shortened, thereby making it possible to improve the throughput.

Furthermore, until the second predetermined time has elapsed since the start of the deionized water supplying step s5003, the liquid-state deionized water is continuously supplied from the deionized water discharging nozzle 5024. However, after the lapse of the second predetermined time, the pressurized deionized water is supplied from the deionized water injection nozzle 5025. Thus, in comparison with a case in which the liquid-state deionized water is continuously supplied from the deionized water discharging nozzle 5024 for the entire deionized water supplying process s5003, it is possible to reduce the amount of consumption of the deionized water. Moreover, since the high-speed pressurized deionized water is discharged from the deionized water injection nozzle 5025, the time required for the coming-off of the reaction products from the substrate W is shortened, thereby making it possible to improve the throughput.

In accordance with the present substrate processing method, at the remover liquid spinning-off step s5002, the remover liquid on the substrate W is spun off so that the remover liquid remaining on the substrate W becomes very little, or no longer exists. Therefore, in the case when, in this state, the deionized water is supplied to the substrate W at the deionized water supplying step s5003, the amount of the remover liquid that comes to contact the deionized water becomes very little or none, and therefore, even in the event of a pH shock, hardly any adverse effect is given to the substrate W, or no pH shock occurs.

Moreover, in the present substrate processing method, until the first predetermined time has elapsed since the start of the remover liquid supplying process s5001, the liquid-state remover liquid is supplied from the remover liquid discharging nozzle 5011, and up to the time immediately before the start of the remover liquid spinning-off process s5002 after the lapse of the first predetermined time, the pressurized remover liquid is sprayed onto the substrate W from the remover liquid injection nozzle 5012. However, instead of this arrangement, the following method may be adopted.

In other words, the pressurized remover liquid may be supplied from the remover liquid injection nozzle 5012 for the entire process of the remover liquid supplying process s5001. In this case, it is not necessary to install the remover liquid discharging nozzle 5011 in the substrate processing apparatus 5001.

Moreover, until a predetermined time has elapsed after the start of the remover liquid supplying step s5001, the pressurized remover liquid may be supplied from the remover liquid injection nozzle 5012, and after the lapse of the predetermined time, the liquid-state remover liquid may be supplied from the remover liquid discharging nozzle 5011.

In the present substrate processing method, until the second predetermined time has elapsed since the start of the deionized water supplying process s5003, the liquid-state deionized water is supplied from the deionized water discharging nozzle 5024, and up to the time immediately after the deionized water spinning-off step s5004, the pressurized deionized water is sprayed onto the substrate W from the deionized water injection nozzle 5025. However, instead of this arrangement, the following method may be adopted.

In other words, the pressurized deionized water may be supplied from the deionized water injection nozzle 5025 during the entire deionized water supplying step s5003. In this case, it is not necessary to install the deionized water discharging nozzle 5024 in the substrate processing apparatus 5001.

Moreover, until a predetermined time has elapsed from the start of the deionized water supplying step s5003, the pressurized deionized water may be supplied from the deionized water injection nozzle 5025, and after the lapse of the predetermined time, the liquid-state deionized water may be supplied from the deionized water discharging nozzle 5024.

<6. Substrate Processing Apparatus 5100>

Figure 55:
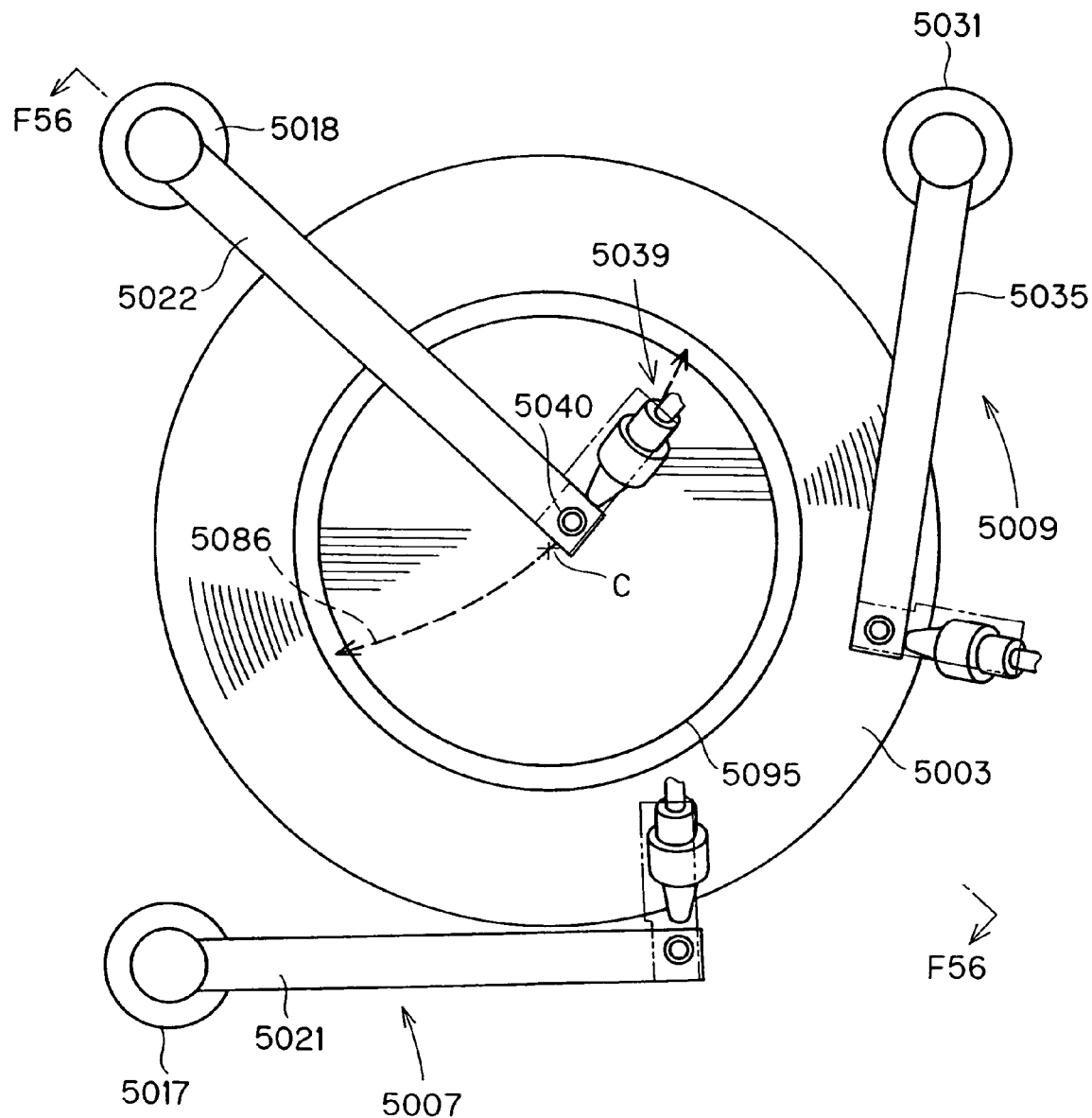
FIG. 55 is a top view of the substrate processing apparatus 5100.
Figure 56:
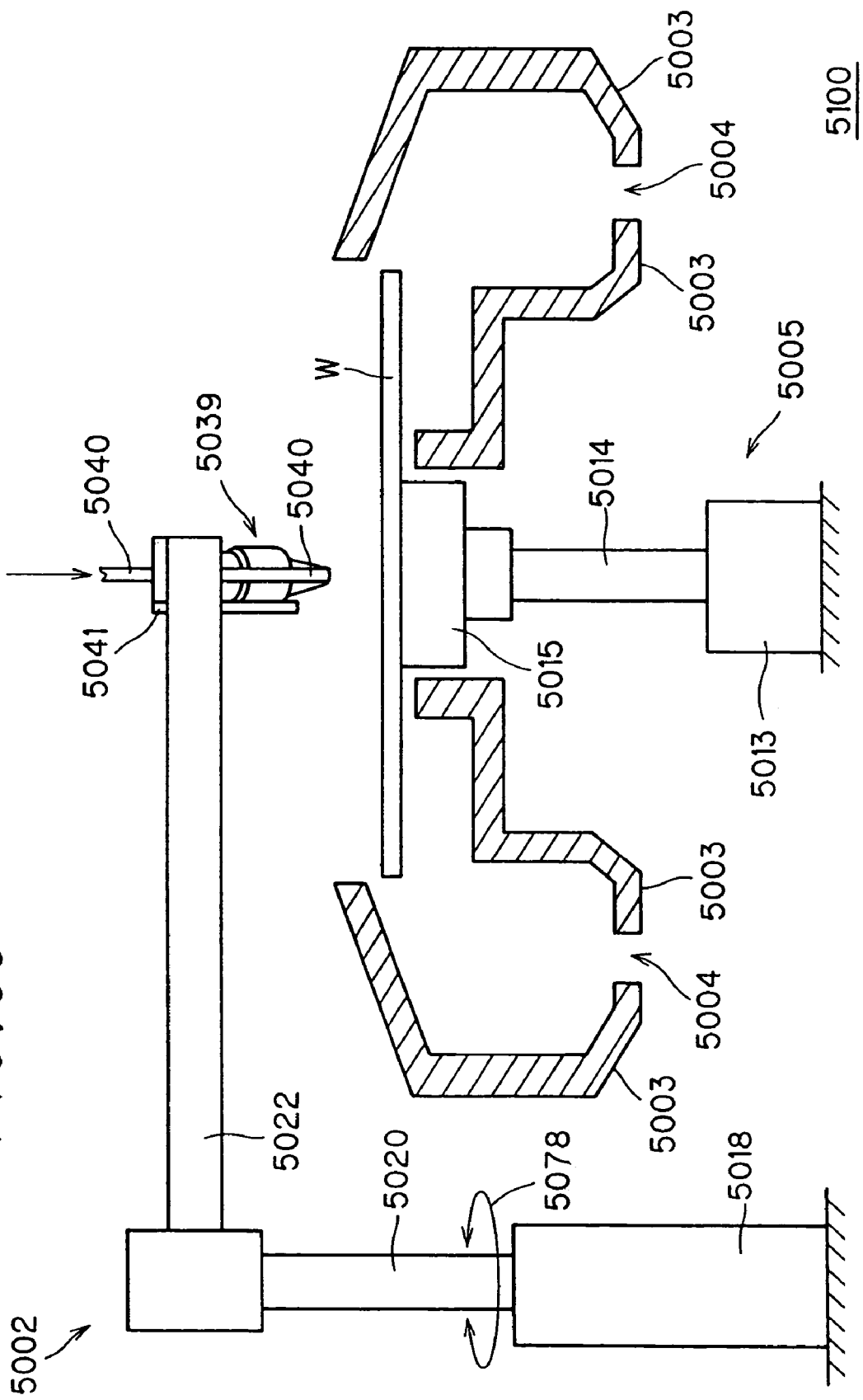
FIG. 56 is a side view of a substrate processing apparatus 5100.

Referring to FIGS. 55 and 56, an explanation will be given of a substrate processing apparatus 5100. Here, FIG. 56 is a cross-sectional view taken along line F56-F56 of FIG. 55 and, for convenience of explanation, hatching is omitted from some portions.

The substrate processing apparatus 5100 is provided with a solvent supplying section 5002 serving as an intermediate rinse supplying section, in addition to the aforementioned substrate processing apparatus 5001. The substrate processing apparatus 5100 has many parts that are in common with the substrate processing section 5001. Therefore, the same parts as the substrate processing apparatus 5001 are indicated by the same reference numerals, and the description thereof is omitted.

The substrate processing apparatus 5100 has the solvent supplying section 5002, and the solvent supplying section 5002, which is secured to the apparatus frame, not shown, is provided with a third rotary motor 5018 having a driving shaft placed in the vertical direction, a third rotary shaft 5020 secured to the rotary shaft of the third rotary motor 5018 and a third arm 5022 connected to the top of the third rotary shaft 5020.

A solvent discharging nozzle 5040 is installed on the tip of the third arm 5022. The solvent discharging nozzle 5040 is a tube-shaped member with its length direction set virtually in the vertical direction, and an organic solvent is supplied to one end thereof with the other end supplying the organic solvent to the substrate W.

Moreover, a solvent injection nozzle 5039 is attached to the same tip of the third arm 5022 through a bracket 5041 (indicated by an alternate long and two short dashes line in FIG. 56). The solvent injection nozzle 5039, which discharges an organic solvent that is pressurized (hereinafter, also referred to as pressurized solvent) as will be described later, is arranged so as to spray the pressurized solvent with an inclination of 45 degrees with respect to the surface of the substrate W.

The above-mentioned solvent discharging nozzle 5040 and solvent injection nozzle 5039 are arranged so that the organic solvent discharged from the organic solvent discharging nozzle 5040 and the pressurized solvent discharged from the solvent injection nozzle 5039 are allowed to intersect each other on the surface of the substrate W, and so that, when the solvent discharging nozzle 5040 and the solvent injection nozzle 5039 are allowed to pivot by the third rotary motor 5018, the organic solvent discharged from the solvent discharging nozzle 5040 and the pressurized solvent sprayed from the solvent injection nozzle 5039 are reciprocally shifted, as illustrated in FIG. 56, on a circular arc 5086 that passes through the rotation center C of the substrate W and also intersects a rotation circle 5095 that the end edge of the rotating substrate W forms at two points on the circumference thereof.

<7. Solvent Supplying System>

Figure 57:
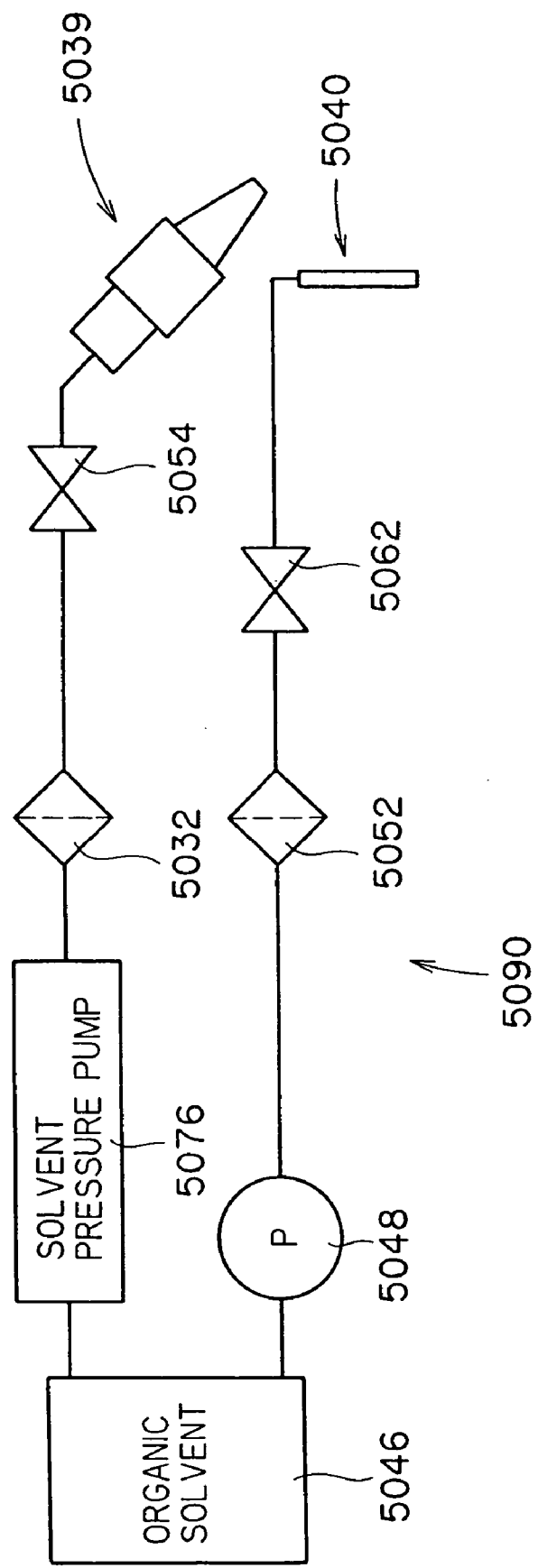
FIG. 57 is a drawing that shows a solvent supplying system 5090.

FIG. 57 shows the solvent supplying system 5090.

The solvent supplying system 5090 is provided with a solvent pressure pump 5076 for pumping the organic solvent from an organic solvent source 5045 outside the apparatus, a filter 5032 for filtering contaminants from the organic solvent that has been pumped by the solvent pressure pump 5076, and a solvent injection valve 5054 for opening and closing the flowing path of the filtered organic solvent to the solvent injection nozzle 5039. Moreover, the solvent supplying system 5090 is also provided with a solvent pump 5048 for pumping the organic solvent from the organic solvent source 5045, a filter 5052 for filtering contaminants from the organic solvent pumped by the solvent pump 5048, and a solvent discharging valve 5062 for opening and closing the flowing path of the filtered organic solvent to the solvent discharging nozzle 5040.

With this arrangement, the solvent supplying system 5090 is allowed to supply the purified organic solvent to the solvent injection nozzle 5039 and the solvent discharging nozzle 5040.

A solvent injection hole having a bore diameter of not more than 0.5 mm, preferably, not more than 0.1 mm, is formed in the tip of the solvent injection nozzle 5039 so that the solvent pressure pump 5076 is allowed to discharge a high-pressure solvent from the solvent injection hole. In this case, the high pressure corresponds to a pressure that measures not less than $2.94 \times 10^6$ Pa (30 kgf/cm$^2$) upon arrival on the substrate W.

Moreover, in this case, the aforementioned pressure pump 5027 is adopted as the solvent pressure pump 5076. In this case, the process liquid source 5067 of FIG. 52 corresponds to the organic solvent source 5046. Further, the pressurized solvent flowing from the flow-out side reverse stopping valve 5075 is sent toward the filter 5032.

The substrate processing apparatus 5100 has a control means, not shown, and in the same manner as the control means 5069 of the substrate processing apparatus 5001, to the control means 5069 are connected the spin motor 5013, the first rotary motor 5017, the second rotary motor 5031, the remover liquid pump 5047, the deionized water pump 5057, the remover liquid injection valve 5053, the deionized water injection valve 5063, the remover liquid discharging valve 5056, the deionized water discharging valve 5058, the remover liquid pressure pump 5065 and the deionized water pressure pump 5066, and to this are further connected the third rotary motor 5018, the solvent pump 5048, the solvent injection valve 5054, the solvent discharging valve 5062 and the solvent pressure pump 5076.

In the present substrate processing apparatus 5100, the solvent injection nozzle 5039 discharges the pressurized solvent with an angle of 45 degrees with respect to the surface of the substrate W, and, in order to properly remove the reaction products on side walls, the angle between the discharging direction of the pressurized solvent and the surface of the substrate W is preferably set in the range of 30 degrees to 60 degrees, more preferably, at 45 degrees.

<8. Substrate Processing Method Using the Substrate Processing Apparatus 5100>

Referring to FIG. 58, an explanation will be given of a substrate processing method in which the above-mentioned substrate processing apparatus 5100 is used.

The present substrate processing method using the substrate processing apparatus 5100 includes a remover liquid supplying step s5031, a remover liquid spinning-off step s5032, a solvent supplying step s5033 serving as an intermediate rinse process, a deionized water supplying step s5034, and a deionized water spinning-off step s5035.

The present substrate processing method is virtually the same as the substrate processing method using the substrate processing apparatus 5001 having the remover liquid supplying step s5001, the remover liquid spinning-off step s5002, the deionized water supplying step s5003 and the deionized water spinning-off step s5004, except that the solvent supplying step is interpolated between the remover liquid spinning-off step s5002 and the deionized water supplying step s5003.

Therefore, the above-mentioned remover liquid supplying step s5031, the remover liquid spinning-off step s5032, the deionized water supplying step s5034 and the deionized water spinning-off step s5035 are respectively the same as the remover liquid supplying step s5001, the remover liquid spinning-off step s5002, the deionized water supplying step s5003 and the deionized water spinning-off step s5004 in the substrate processing method using the substrate processing apparatus 5001, and therefore, the description thereof is omitted.

The following description will discuss the solvent supplying process s5033.

The solvent supplying step s5033 is carried out after the remover liquid supplying step s5031 and the remover liquid spinning-off step s5032 have been finished. In the remover liquid spinning-off step s5032, the substrate is kept rotating with the supply of the remover liquid to the substrate W being stopped so that the remover liquid on the substrate W is spun off from the substrate W by a centrifugal force. Thus, the remover liquid remaining on the substrate W is reduced to a minimum.

At the time of the start of the solvent supplying process s5033, the control means, not shown, rotates the third rotary motor 5018, and also drives the solvent pump 5048 so as to supply the organic solvent from the solvent discharging nozzle 5040, with the solvent discharging valve 5062 being opened. Thus, the substrate W is supplied with a comparatively large amount of the organic solvent so that the remover liquid on the substrate W starts to be washed away.

Next, after a lapse of a third predetermined time from the start of the solvent supplying step s5033, the solvent discharging valve 5062 is closed so that the supply of the organic solvent from the solvent discharging nozzle 5040 is stopped, and the solvent pump 5048 that has been driven is also stopped. Then, after the lapse of the third predetermined time, the solvent pressure pump 5076 is driven with the solvent injection valve 5054 being opened so that the pressurized solvent from the solvent injection nozzle 5039 is sprayed on the substrate W. Thus, the highly pressurized solvent is sprayed onto the reaction products that have swelled and softened, with the result that the reaction products come off from the substrate W.

Moreover, since the solvent injection nozzle 5039 sprays the pressurized solvent with an angle of 45 degrees with respect to the substrate W, the pressurized solvent is allowed to reach the reaction products adhering to the irregular side walls of the substrate W without being weakened in its force against the reaction products. Consequently, it is possible to further accelerate the swelling and coming-off of the reaction products from the substrate W. Thus, it becomes possible to shorten the time required for the process.

The third predetermined time is a period of time from the start of the solvent supplying step s5033 to the time at which the remover liquid on the substrate W has been washed away to a certain degree by the organic solvent supplied from the solvent discharging nozzle 5040, and this has been preliminarily found through experiments.

Then, immediately before the deionized water supplying process s5034, the control means, not shown, stops the driving operation of the third rotary motor 5018 with the solvent injection nozzle 5039 having retreated from a position above the cup 5003. Moreover, the control means, not shown, closes the solvent injection valve 5054 and also stops the solvent pressure pump 5076 so as to stop the supply of the organic solvent from the solvent supplying section 5002.

In this manner, in the solvent supplying step s5033, the organic solvent is supplied to the substrate W so that the remover liquid is washed away from the substrate W. For this reason, even when deionized water is supplied to the substrate W in the succeeding deionized water supplying step s5034, no remover liquid contacting the deionized water exists, thereby making it possible to prevent the occurrence of a pH shock. Consequently, it is possible to prevent the resulting damages to the thin films on the substrate W.

In accordance with the present substrate processing method, at the remover liquid spinning-off step s5032, the remover liquid on the substrate W is spun off so that the remover liquid remaining on the substrate W at this point of time is very little. For this reason, it is possible to shorten the time required for the organic solvent to remove the remover liquid at the solvent supplying step s5033. Thus, it is possible to improve the throughput. In the same manner, since the remover liquid remaining on the substrate W is very little, it is possible to reduce the amount of the organic solvent required for the solvent supplying process s5033, and consequently to reduce the costs.

In the present substrate processing method, immediately after the solvent supplying step s5033, the deionized water supplying process s5034 is executed. However, a solvent spinning-off step for spinning the solvent off from the substrate W may be interpolated between the solvent supplying step s5033 and the deionized water supplying step s5034.

Moreover, in the present substrate processing method, the rotation of the substrate W has not been stopped from the start of the remover liquid supplying step s5031 to the completion of the deionized water spinning-off step s5035. However, the rotation of the substrate W may be stopped in any one of the intervals between the remover liquid supplying step s5031 and the remover liquid spinning-off step s5032, between the remover liquid spinning-off step s5032 and the solvent supplying step s5033, between the solvent supplying step s5033 and the deionized water supplying step s5034, and between the deionized water supplying step s5034 and the deionized water spinning-off process s5035.

In the present substrate processing method, until the first predetermined time has elapsed since the start of the remover liquid supplying step s5031, the liquid-state remover liquid is supplied from the remover liquid discharging nozzle 5011, and up to the time immediately before the start of the remover liquid spinning-off step s5032 after the lapse of the first predetermined time, the pressurized remover liquid is sprayed onto the substrate W from the remover liquid injection nozzle 5012. However, instead of this arrangement, the following method may be adopted.

In other words, the pressurized remover liquid may be supplied from the remover liquid injection nozzle 5012 during the entire remover liquid supplying process s5031. In this case, it is not necessary to install the remover liquid discharging nozzle 5011 in the substrate processing apparatus 5001.

Until a predetermined time has elapsed from the start of the remover liquid supplying step s5031, the pressurized remover liquid may be supplied from the remover liquid injection nozzle 5012, and after the lapse of the predetermined time, the liquid-state remover liquid may be supplied from the remover liquid discharging nozzle 5011.

Moreover, in the present substrate processing method, until the third predetermined time has elapsed since the start of the solvent supplying step s5033, the liquid-state organic solvent is supplied from the solvent discharging nozzle 5040, and up to the time immediately before the start of the deionized water supplying process s5034 after the lapse of the third predetermined time, the pressurized solvent is sprayed onto the substrate W from the solvent injection nozzle 5039. However, instead of this arrangement, the following method may be adopted.

In other words, the pressurized solvent may be supplied from the solvent injection nozzle 5039 during the entire solvent supplying step s5033. In this case, it is not necessary to install the solvent discharging nozzle 5040 in the substrate processing apparatus 5100.

Further, until a predetermined time has elapsed since the start of the solvent supplying step s5033, the pressurized solvent may be supplied from the solvent injection nozzle 5039, and up to the time immediately before the deionized water supplying process s5034 after the lapse of the predetermined time, the liquid-state organic solvent may be supplied from the solvent discharging nozzle 5040.

In the present substrate processing method, until the second predetermined time has elapsed since the start of the deionized water supplying process s5033, the liquid-state deionized water is supplied from the deionized water discharging nozzle 5024, and up to the time immediately before the deionized water spinning-off step s5004 after the lapse of the second predetermined time, the pressurized deionized water is sprayed onto the substrate W from the deionized water injection nozzle 5025. However, instead of this arrangement, the following method may be adopted.

In other words, the pressurized deionized water may be supplied from the deionized water injection nozzle 5025 during the entire deionized water supplying process s5033. In this case, it is not necessary to install the deionized water discharging nozzle 5024 in the substrate processing apparatus 5001.

Moreover, until a predetermined time has elapsed from the start of the deionized water supplying process s5033, the pressurized deionized water may be supplied from the deionized water injection nozzle 5025, and after the lapse of the predetermined time, the liquid-state deionized water may be supplied from the deionized water discharging nozzle 5024.

<9. Supplementary>

In the above-mentioned substrate processing apparatuses 5001, 5100, the holding rotary section rotates the substrate while maintaining it horizontally. However, the holding rotary section may rotate the substrate with its major surface being tilted with respect the horizontal surface, or may rotate the substrate with its major surface being maintained in the vertical direction.

Moreover, in the above-mentioned substrate processing apparatuses 5001, 5100, the holding rotary section holds only one substrate. However, the holding rotary section may be designed to hold a plurality of substrates.

In the substrate processing apparatus 5001, the remover liquid supplying section 5007 is provided with the remover liquid injection nozzle 5012 and the deionized water supplying section 5009 is provided with the deionized water injection nozzle 5025 respectively. However, either the remover liquid injection nozzle 5012 or the deionized water injection nozzle 5025 may be omitted.

In the substrate processing apparatus 5100, the remover liquid supplying section 5007 is provided with the remover liquid injection nozzle 5012, the deionized water supplying section 5009 is provided with the deionized water injection nozzle 5025 and the solvent supplying section 5002 is provided with the solvent injection nozzle 5039 respectively. However, any one or any two of the remover liquid injection nozzle 5012, the deionized water injection nozzle 5025 and the solvent injection nozzle 5039 may be omitted.

Furthermore, in the present aspect, the substrate treatment deals with a substrate having a surface on which polymers are formed through dry-etching. However, the present substrate treatment is more effectively applied to a substrate that has been further subjected to ashing after the dry-etching.

In the above-mentioned substrate processing apparatuses 5001, 5100, even in the case when the reaction products are accumulated on the substrate W in a protruding form, the process liquid mist is discharged onto the substrate W in a direction tilted with respect to the substrate W so that the reaction products, accumulated in the protruding form, is broken by the process liquid mist. For this reason, it is possible to finish the removing process of the reaction products more quickly.

Moreover, in the above-mentioned substrate processing apparatuses 5001, 5100, the pressure pump 5027 is used in the liquid pressurizing section for discharging a high-pressure process liquid from the remover liquid injection nozzle 5012, the deionized water injection nozzle 5025 and the solvent injection nozzle 5039. However, instead of this, the following arrangement may be used.

In other words, a sealed container storing the process liquid, a pressurized gas supplying means for supplying pressurized gas into a space within the sealed container, and a process liquid supplying tube with its one end contacting the process liquid inside the sealed container and the other end directed to the outside of the sealed container are installed, and the process liquid may be supplied to the remover liquid injection nozzle 5012, the deionized water injection nozzle 5025 or the solvent injection nozzle 5039 from the processing liquid supplying tube. With respect to gas used in this case, an inert gas is preferably used in order to prevent denature of the process liquid, and examples of the inert gas include nitrogen and argon.

F. Preferred Embodiments According to Sixth Aspect of the Present Invention

<1. Substrate Processing Apparatus 5001>

Figure 59:
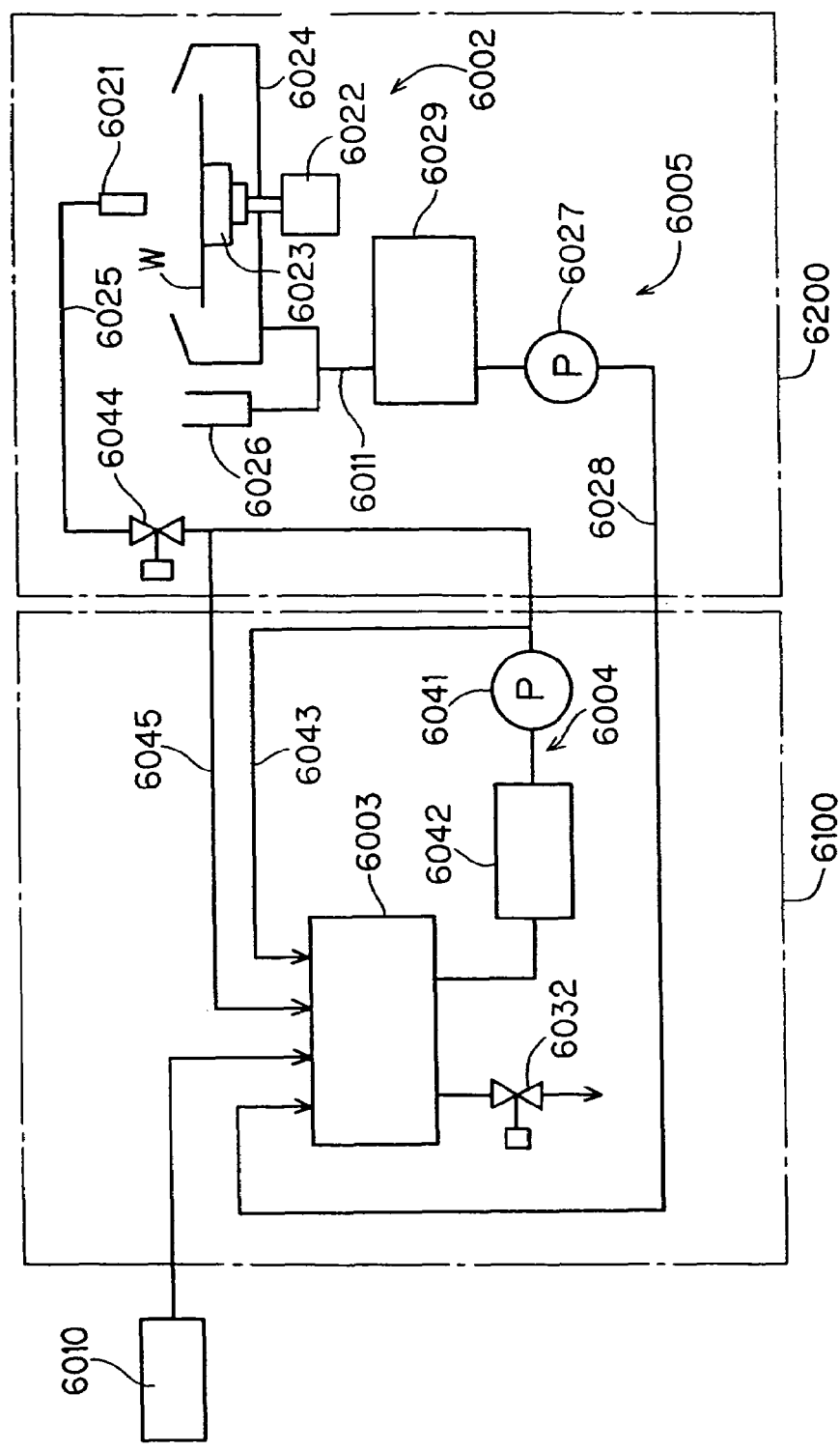
FIG. 59 is a schematic drawing that shows a substrate processing apparatus in accordance with a sixth aspect of the present invention.

FIG. 59 is a schematic drawing that shows a substrate processing apparatus in accordance with a preferred embodiment in the sixth aspect of the present invention.

This substrate processing apparatus is provided with a substrate processing section 6002, a temperature adjusting vessel 6003, a temperature adjusting mechanism 6004 and a remover liquid collecting system 6005. The temperature adjusting vessel 6003 is placed inside a chemical cabinet 6100. Moreover, the substrate processing section is placed inside a processing cabinet 6200. The temperature adjusting mechanism 6004 and the remover liquid collecting mechanism 6005 are arranged in association with the chemical cabinet 6100 and the processing cabinet 6200.

The substrate processing section 6002, which is used for supplying a remover liquid for removing the reaction products to a surface of a substrate W so as to process the surface thereof, is provided with a spin chuck 6023 that is allowed to rotate with the substrate W held thereon by the driving operation of the motor 6022, a remover liquid supplying nozzle 6021 for discharging the remover liquid onto the surface of the rotating substrate W, a remover liquid supplying tube 6025 for connecting an electromagnetic valve 6044 to the remover liquid nozzle 6021, a scattering preventive cup 6024 for the remover liquid and a remover liquid collecting pot 6026.

In this substrate processing section 6002, the remover liquid, which has been temperature-controlled in the temperature adjusting vessel 6003, is supplied from the remover liquid supplying nozzle 6021 onto the surface of the substrate W that is held on the spin chuck 6023 and rotated, by opening the electromagnetic valve 6044. The reaction products, such as polymers accumulated on side walls of metal films on the surface of the substrate W, are removed by the remover liquid supplied from the remover liquid supplying nozzle 6021.

The temperature adjusting vessel 6003 stores the remover liquid to be supplied to the substrate W in the substrate processing section 6002. The remover liquid is supplied to the temperature adjusting vessel 6003 from a supplying section 6010 for the remover liquid.

The temperature adjusting mechanism 6004, which is used for heating the remover liquid inside the temperature adjusting vessel 6003, is provided with a heater 6042, a circulating pump 6041, a circulation path 6043 for circulating the remover liquid inside the chemical cabinet 6100 and a circulation path 6045 for circulating the remover liquid from the chemical cabinet 6100 to the processing cabinet 6200. The remover liquid inside the temperature adjusting vessel 6003 is heated to a predetermined temperature by the function of the heater 6042 while it is circulated through the circulation paths 6043 and 6045 by the driving operation of the circulating pump 6004.

The remover liquid collecting mechanism 6005 is provided with a remover liquid collecting path 6011 for collecting the remover liquid that has been used in the process for the substrate W and captured by the scattering preventive cup 6024 and the remover liquid that has been discharged from the remover liquid supplying nozzle 6021 toward the remover liquid collecting pot 6026, a remover liquid storing vessel 6029 for temporarily storing the remover liquid collected through the remover liquid collecting path 6011 and a pump 6027 used for collecting the remover liquid temporarily stored inside the remover liquid storing vessel 6029 through a tube path 6028.

Figure 60:
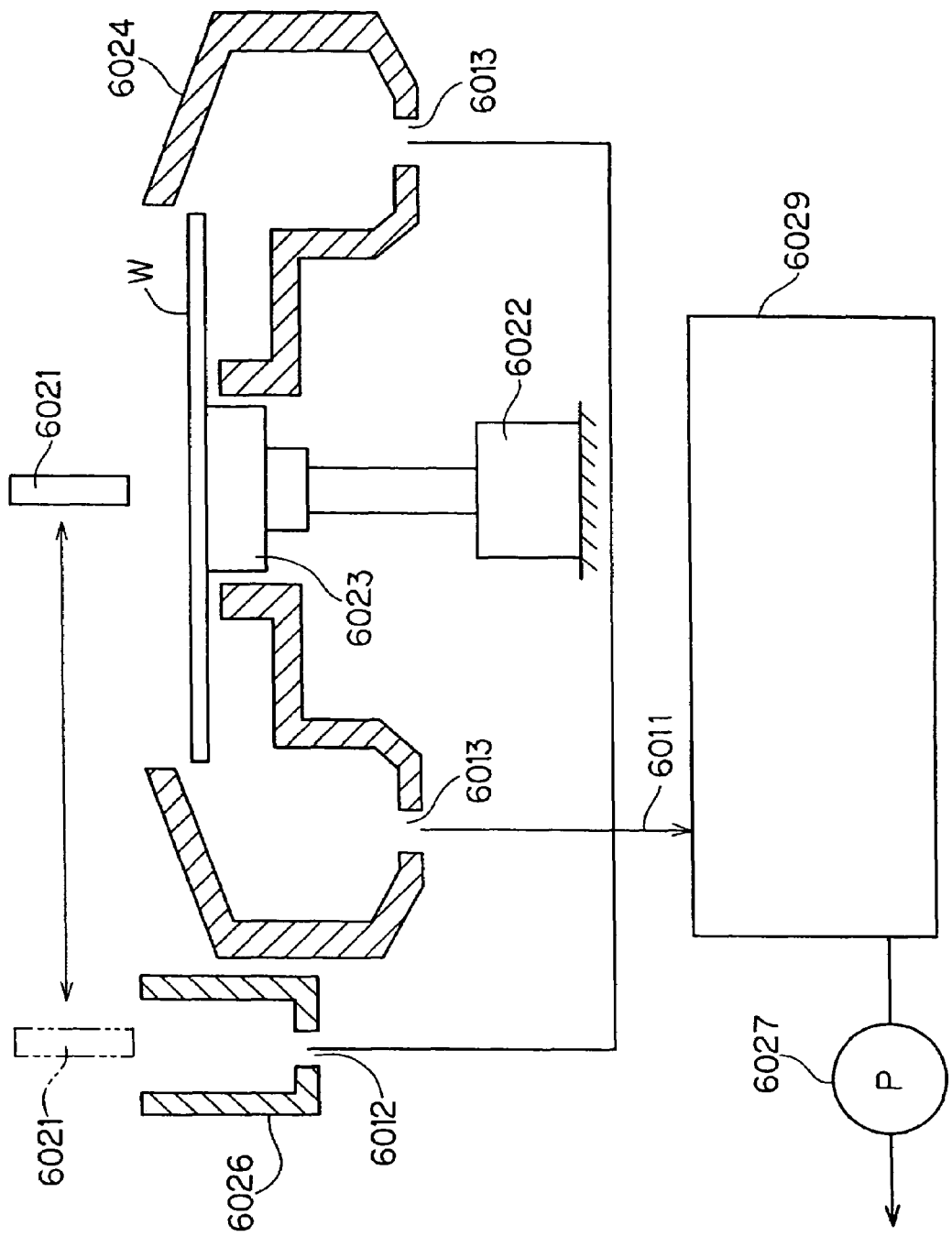
FIG. 60 is a schematic side view that shows a construction of a substrate processing section 6002 including a remover liquid storing vessel 6029, etc.
Figure 61:
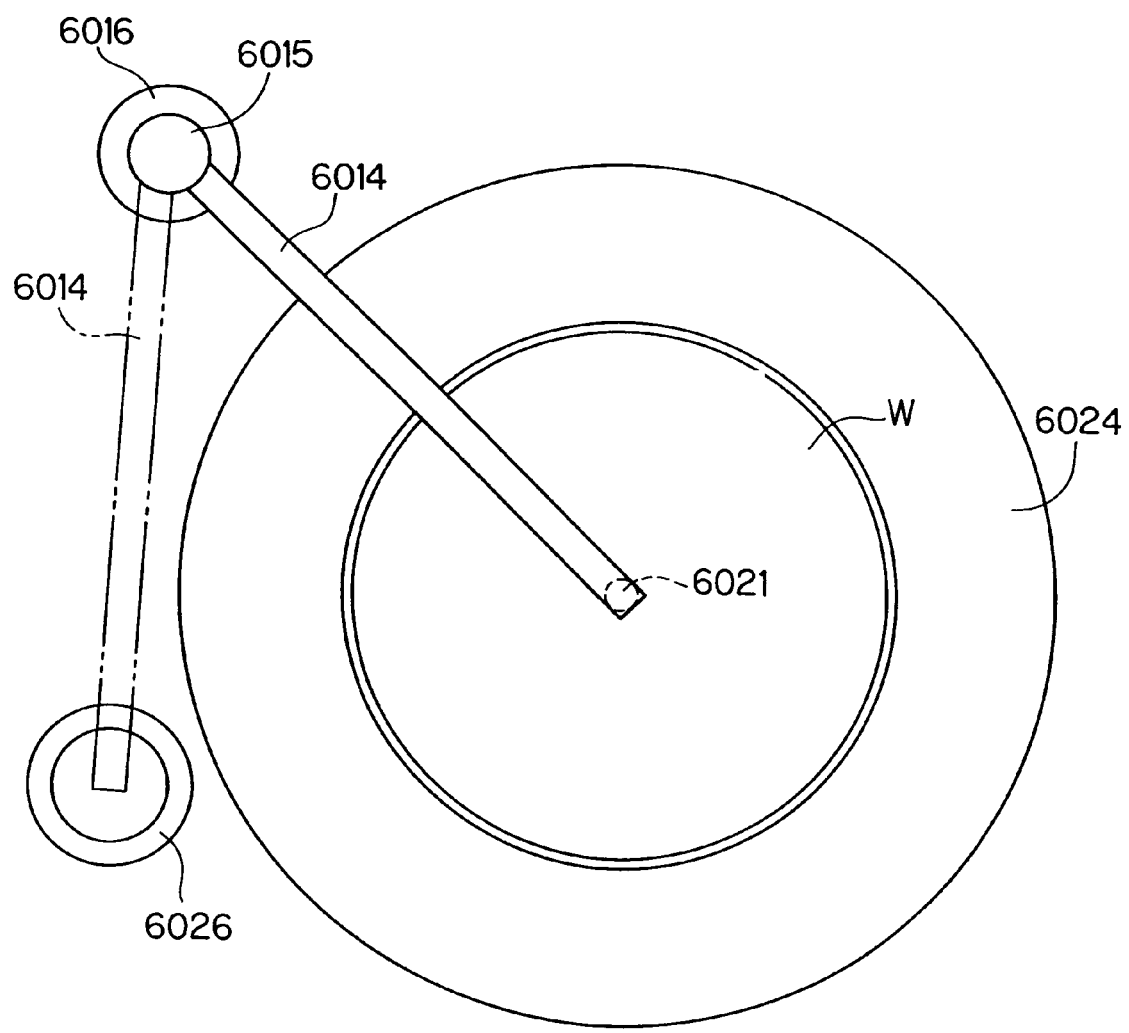
FIG. 61 is a plan view that shows the construction of the substrate processing section 6002.

FIG. 60 is a schematic side view that shows the construction of the above-mentioned substrate processing section 6002 including the remover liquid storing vessel 6029, etc., and FIG. 61 is a plan view that shows the construction of the substrate processing section 6002. Here, in FIG. 61, some portions of the substrate processing section 6002 are indicated by cross-sectional views.

The scattering preventive cup 6024 for the remover liquid has a virtually U-letter shape in its cross-section, and also has a virtually ring shape having an opening in its center portion, when viewed from above. An opening 6013, connected to the remover liquid collecting path 6011, is formed in the bottom surface of the scattering preventive cup 6024. The remover liquid collecting pot 6026 has a cylinder shape with its upper portion being open. Further, an opening 6012, connected to the remover liquid collecting path 6011, is formed in the bottom surface of the remover liquid collecting pot 6026.

The remover liquid supplying nozzle 6021, which serves as a remover liquid discharging section for discharging the remover liquid onto the surface of the substrate W, is attached to the tip of an arm 6014 that is allowed to freely pivot centered on a shaft 6015 by the driving operation of a motor 6016 shown in FIG. 61. Thus, the remover liquid supplying nozzle 6021 is allowed to reciprocally shift between a supplying position indicated by a solid line, shown in FIGS. 60 and 61, and a stand-by position indicated by an alternate long and two short dashes line shown in FIGS. 60 and 61, by the driving operation of the motor 6016.

In this case, the supplying position is a position at which the remover liquid supplying nozzle 6021 is allowed to face the rotation center of the rotating substrate W that is held by the spin chuck 6023 so that the remover liquid, discharged from the remover liquid supplying nozzle 6023, is discharged onto the surface of the substrate W. Moreover, the above-mentioned stand-by position is a position at which the remover liquid supplying nozzle 6021 is allowed to face the remover liquid collecting pot 6026 so that the remover liquid, discharged from the remover liquid supplying nozzle 6021, is injected into the remover liquid collecting pot 6026.

FIG. 62 is a block diagram that shows an essential electrical construction of the substrate processing apparatus.

The substrate processing apparatus is provided with a control section 6050 having a CPU 6051 for executing logical operations, a ROM 6052 in which operation programs required for the control of the apparatus are stored and a RAM 6053 in which data, etc., are temporarily stored at the time of the controlling operation. This control section 6050 is connected to the motor 6016 used for reciprocally moving the remover liquid supplying nozzle 6021 between the supplying position and the stand-by position, a motor 6022 for rotating, the spin chuck 6023 that is holding the substrate W, and the electromagnetic valve 6044 for discharging the remover liquid from the remover liquid supplying nozzle 6021, through an interface 6054.

Next, an explanation will be given of a processing operation in which the removing process for the reaction products is carried out by the above-mentioned substrate processing apparatus.

In the above-mentioned substrate processing apparatus, the remover liquid inside the remover liquid supplying tube 6025, which reaches the remover liquid supplying nozzle 6021 from the electromagnetic valve 6044, is not circulated. For this reason, during a non-processing period of time from the finish of the process for substrates in the first lot to the start of the process for substrates W in the next lot, the temperature of the remover liquid inside the remover liquid supplying tube 6025 becomes lower than the predetermined temperature. For this reason, in the substrate processing apparatus in accordance with the present preferred embodiment, the following two processes are carried out: a pre-dispensing process in which, prior to the discharge of the remover liquid to the substrate W, the remover liquid is discharged from the remover liquid supplying nozzle 6021 to the remover liquid collecting pot 6026 at the stand-by position and an auto-dispensing process in which, during the non-processing period of the substrate W, the remover liquid is intermittently discharged from the remover liquid supplying nozzle 6021 to the remover liquid collecting pot 6026 at the stand-by position.

FIG. 63 is a flow chart that shows the processing operation in the substrate processing apparatus at the time of the pre-dispensing operation. Moreover, FIG. 64 is a flow chart showing the processing operation in the substrate processing apparatus at the time of the auto-dispensing operation, which forms a sub-routine of the flow chart shown in FIG. 63.

As shown in the flow chart of FIG. 63, at the time when the removing process of the reaction products is executed by using the substrate processing apparatus, first, the execution flow for the auto-dispensing process shown in FIG. 64 is started as a sub-routine (step S6011). Here, the operation of the auto-dispensing process will be described later.

Next, a determination is made as to whether or not the substrates W in the first lot have been carried in (step S6012).

When the substrates W in the first lot have been carried in, the pre-dispensing process is carried out (step S6013). At the time when the pre-dispensing process is executed, the electromagnetic valve 6044 is opened with the remover liquid supplying nozzle 6021 having been moved to the stand-by position indicated by the alternate long and two short dashes line in FIGS. 60 and 61. Thus, the pressurized remover liquid, which is circulated inside the circulating path 6045, is discharged from the remover liquid discharging nozzle 6021. The remover liquid, discharged from the remover liquid discharging nozzle 6021, is temporarily stored in the remover liquid storing vessel 6029 through the remover liquid collecting pot 6026 and the remover liquid collecting path 6011, and then collected by the temperature adjusting vessel 6003 by the function of the pump 6027.

By executing the pre-dispensing process, the remover liquid inside the remover liquid supplying tube 6025 from the electromagnetic valve 6044 to the remover liquid supplying nozzle 6021, which is not circulated in the normal state and is lower than the set temperature, is discharged so that the remover liquid, which is always circulated and heated to the set temperature, is newly introduced into the remover liquid supplying tube 6025. In this case, during the pre-dispensing process, for example, the remover liquid may be continuously discharged for approximately 15 seconds, although it depends on the length of the remover liquid supplying tube 6025, etc.

In this state, the substrates W in the first lot are subjected to the process (step S6014). At the time of carrying out the process on the substrates W, the substrate W is rotated at a high-speed by the spin chuck 6023, and the electromagnetic valve 6044 is opened with the remover liquid supplying nozzle 6021 being set at the supplying position indicated by the solid line shown in FIGS. 60 and 61. Thus, the pressurized remover liquid, which is being circulated in the circulation path 6045, is discharged from the remover liquid discharging nozzle 6021. At the time of this process of the substrate W, the substrate W is treated by the remover liquid that has been initially heated to the set temperature. For this reason, it is possible to execute the removing process of the reaction products with high precision.

Upon completion of the process of the substrates W in the first lot, the sequence is set to a stand-by state until substrates W in a lot to be processed next have been carried in (step S6015). In this stand-by state, the auto-dispensing process, shown in FIG. 64 as the sub-routine, is carried out.

In other words, a determination is made as to whether or not a predetermined period of time has elapsed since the completion of the processing step (step S6014) of the substrate W (step S6021).

Then, after the predetermined time has elapsed, the auto-dispensing process is carried out (step S6022). At the time when the auto-dispensing process is executed, in the same manner as the above-mentioned pre-dispensing process, the electromagnetic valve 6044 is opened with the remover liquid supplying nozzle 6021 being set at the stand-by position indicated by the alternate long and two short dashes line in FIGS. 60 and 61. Thus, the pressurized remover liquid, which is being circulated through the circulation path 6045, is discharged from the remover liquid discharging nozzle 6021. The remover liquid, discharged from the remover liquid discharging nozzle 6021, is temporarily stored in the remover liquid storing vessel 6029 through the remover liquid collecting pot 6026 and the remover liquid collecting path 6011, and then collected in the temperature adjusting vessel 6003 by the function of the pump 6027.

The auto-dispensing process is carried out every fixed time, that is, in an intermittent manner. Thus, the remover liquid inside the remover liquid supplying tube 6025 from the electromagnetic valve 6044 to the remover liquid supplying nozzle 6021, which is not circulated in the normal state and is lower than the set temperature, is discharged so that the remover liquid, which is always circulated and heated to the set temperature, is newly introduced into the remover liquid supplying tube 6025.

In the case when the remover liquid is held inside the remover liquid supplying tube 6025 for a long time, not only the remover liquid inside the remover liquid supplying tube 6025, but also the remover liquid supplying tube 6025 has a low temperature. Therefore, even when the above-mentioned pre-dispensing process is carried out, the temperature of the remover liquid to be first supplied to the substrate W might become lower than the set temperature. However, the above-mentioned auto-dispensing process is carried out so that it becomes possible to prevent the occurrence of this phenomenon beforehand. Here, during the pre-dispensing process, for example, the remover liquid may be continuously discharged for approximately 15 seconds once every hour.

As also shown in FIG. 63, in the case when all the processes on the substrate W have been completed (step S6015), after completion of the execution flow of the auto-dispensing process shown in FIG. 64 as the sub-routine (step S6016), the entire processes are completed.

In the substrate processing apparatus in accordance with the present aspect, the pre-dispensing process is executed every time substrates W in a new lot have been carried in. However, the pre-dispensing process may be carried out every time a single substrate W is processed.

Moreover, in the substrate processing apparatus in accordance with the present aspect, the auto-dispensing process is carried out every fixed time, that is, in an intermittent manner. However, the auto-dispensing process may be carried out continuously. In other words, in the state where the substrate W has not been processed, the remover liquid supplying nozzle 6021 is set in the stand-by position indicated by the alternate long and two short dashes line in FIGS. 60 and 61, and the remover liquid may be continuously discharged toward the remover liquid collecting pot 6026 from the remover liquid nozzle 6021. In this case, it is preferable to set the flow of the remover liquid to be discharged from the remover liquid discharging nozzle smaller.

Moreover, in the substrate processing apparatus in accordance with the above-mentioned preferred embodiment, both of the auto-dispensing process and the pre-dispensing process are executed in parallel with each other. However, either one of these may be executed.

In the substrate processing apparatus in accordance with the above-mentioned preferred embodiment, the supplying position of the remover liquid supplying nozzle 6021 is determined as a position at which the remover liquid supplying nozzle 6021 is allowed to face the rotation center of the substrate W. However, any position may be set as the supplying position, as long as the remover liquid supplying nozzle 6021 can supply the remover liquid to the substrate W. In the case of the substrate processing apparatus of the present aspect, for example, any position may be set as long as it allows the remover liquid supplying nozzle 6021 to face the substrate W.

Further, in the substrate processing apparatus in accordance with the present aspect, the stand-by position of the remover liquid supplying nozzle 6021 is determined as a position at which the remover liquid supplying nozzle 6021 is allowed to face the remover liquid collecting pot 6026. However, any position may be set as the stand-by position, as long as the remover liquid supplying nozzle 6021 can discharge the remover liquid to the remover liquid collecting pot 6026.

Moreover, in the substrate processing apparatus in accordance with the present aspect, the remover liquid supplying nozzle 6021 discharges the remover liquid while it is stationed at a position at which the remover liquid supplying nozzle 6021 is allowed to face the rotation center of the rotating substrate W. However, the arm 6014 is reciprocally rotated by the motor 6016 so that the remover liquid may be discharged while the remover liquid nozzle 6021 is being shifted on a circular arc that passes through the rotation center of the substrate W and the circumferential edge of the substrate W.

G. Preferred Embodiments According to Seventh Aspect of the Present Invention

The following description will discuss the construction of a substrate processing apparatus in accordance with a seventh aspect of the present invention. Here, this substrate processing apparatus is used for removing polymers from a surface of a silicon semiconductor wafer serving as a substrate having a thin film formed thereon, the polymers having been generated on the surface as reaction products.

Figure 66:
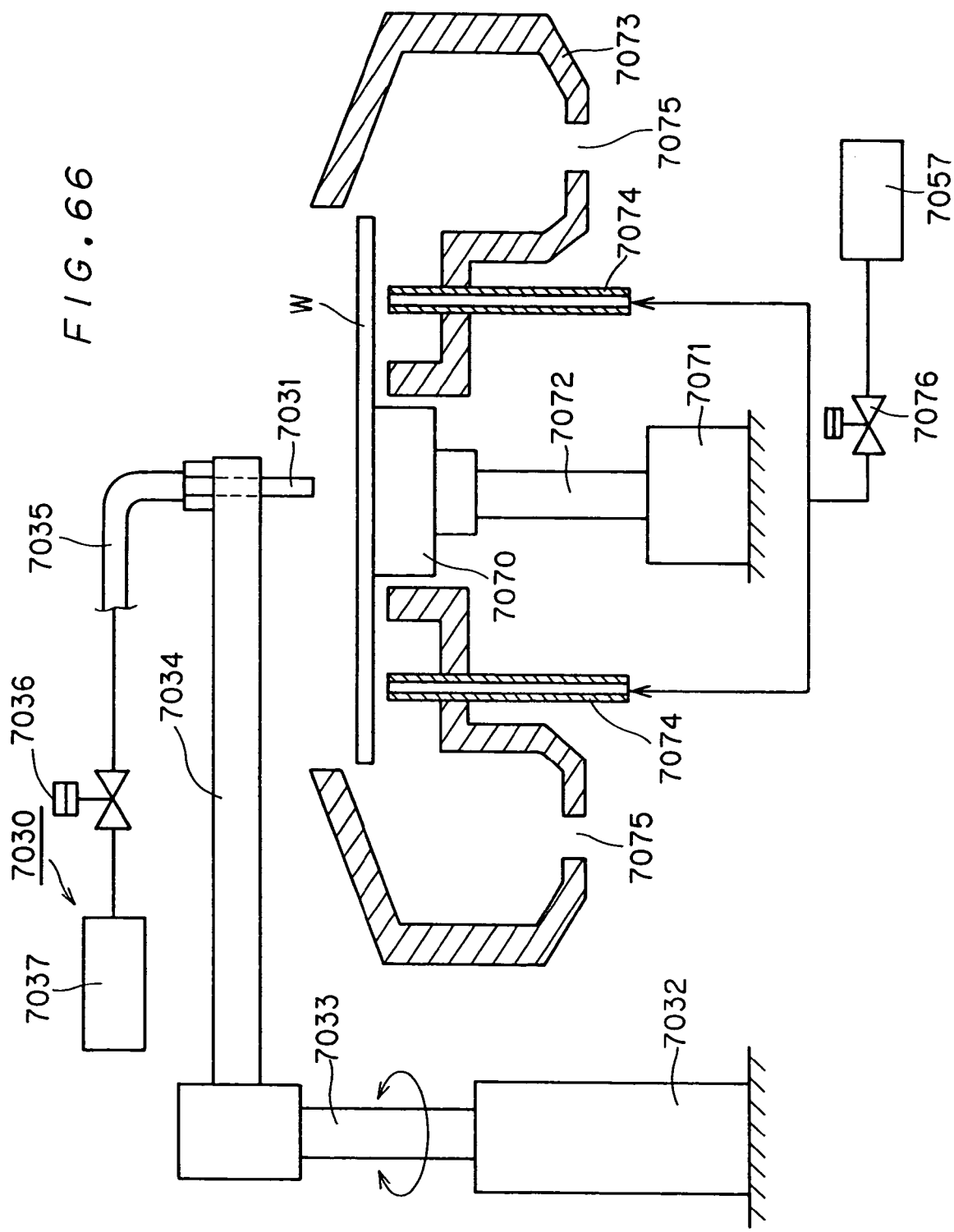
FIG. 66 is a schematic side view that shows the substrate processing apparatus in accordance with the first preferred embodiment of the seventh aspect.
Figure 67:
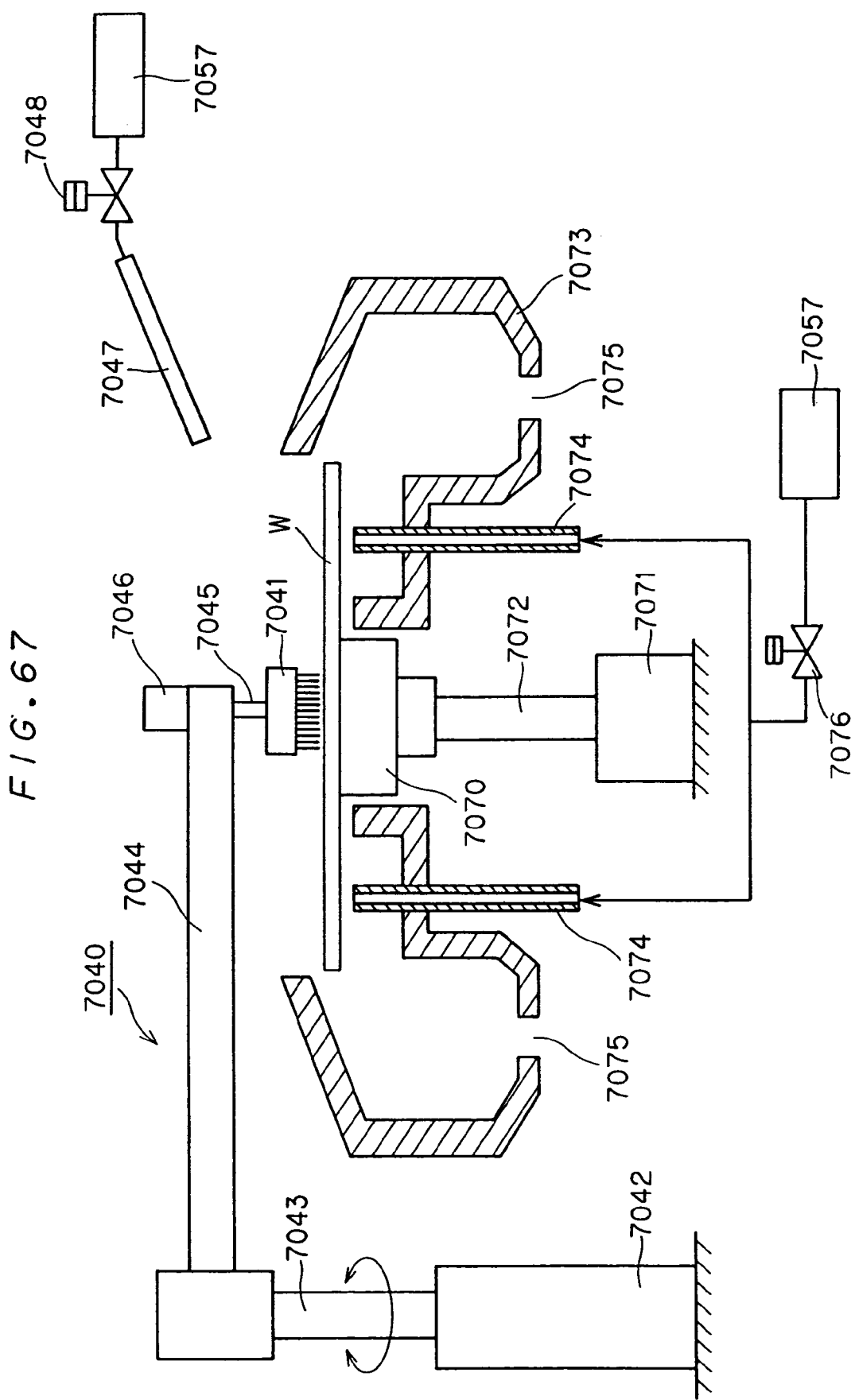
FIG. 67 is a schematic side view that shows the substrate processing apparatus in accordance with the first preferred embodiment of the seventh aspect.
Figure 68:
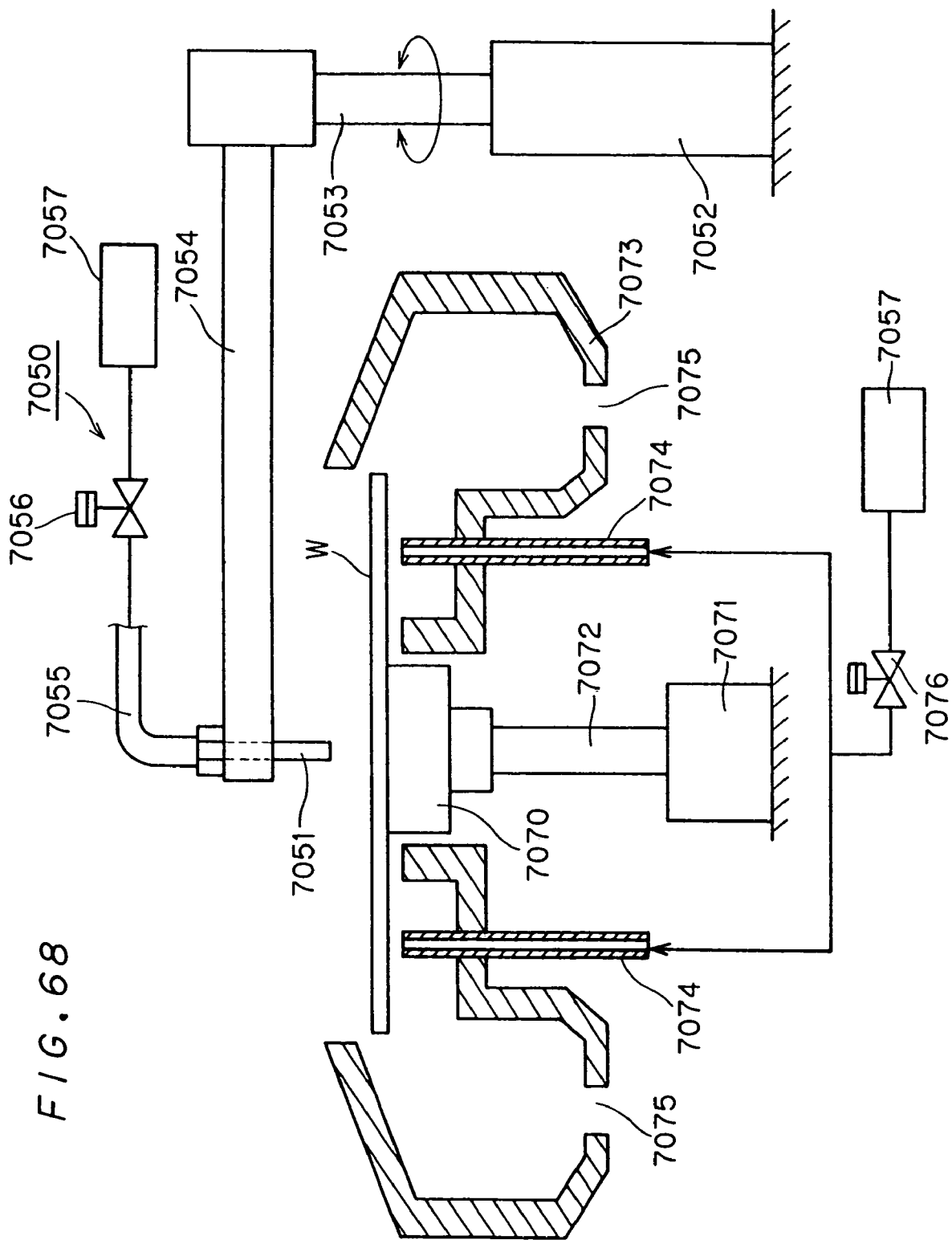
FIG. 68 is a schematic side view that shows the substrate processing apparatus in accordance with the first preferred embodiment of the seventh aspect.

FIG. 65 is a schematic plan view that shows a substrate processing apparatus in accordance with a first preferred embodiment of the seventh aspect. Moreover, FIGS. 66 to 68 are schematic side views that show the substrate processing apparatus in accordance with the first preferred embodiment of the seventh aspect. Here, FIG. 66 shows the relationship among a remover liquid supplying mechanism 7030, a spin chuck 7070 and a scattering preventive cup 7073, FIG. 67 shows the relationship among a brush cleaning mechanism 7040, the spin chuck 7070 and the scattering preventive cup 7073, and FIG. 68 shows the relationship among a deionized water supplying mechanism 7050, the spin chuck 7070 and the scattering preventive cup 7073, and in these drawings, the scattering preventive cup 7073 and a back surface cleaning nozzle 7074 are shown in their cross-sectional views.

This substrate processing apparatus is provided with the spin chuck 7070 serving as a rotation holding means for holding the substrate W so as to freely rotate thereon, a remover liquid supplying mechanism 7030 for supplying a remover liquid toward the surface of the substrate W held on the spin chuck 7070. a brush cleaning mechanism 7040 for cleaning the surface of the substrate W held on the spin chuck 7070 with a rotary brush 7041, and a deionized water supplying mechanism 7050 for supplying deionized water to the surface of the substrate W held on the spin chuck 7070.

As illustrated in FIGS. 66 to 68, the spin chuck 7070 is allowed to rotate centered on a support shaft 7072 directed in the vertical direction by the driving operation of the motor 7071, with the substrate W being sucked thereon. Thus, the substrate W is allowed to rotate together with the spin chuck 7070 within a plane in parallel with its major surface.

The scattering preventive cup 7073 is placed on the periphery of the spin chuck 7070. The scattering preventive cup 7073 has a virtually U-letter shape in its cross-section, and also has a virtually ring shape having an opening in its center portion, when viewed from above. An opening 7075, connected to a drain not shown, is formed in the bottom surface of the scattering preventive cup 7073.

Here, a back surface cleaning nozzle 7074 for cleaning the back surface of the substrate W by supplying deionized water to the back surface of the substrate W is placed at a position facing the back surface of the substrate W in the scattering preventive cup 7073. This back surface cleaning nozzle 7074 is connected to a supply section 7057 of deionized water through an electromagnetic valve 7076. Thus, this supply section 7057 of deionized water is capable of sending pressurized deionized water.

As illustrated in FIG. 66, the remover liquid supplying mechanism 7030 is provided with a remover liquid discharging nozzle 7031 for discharging a remover liquid toward the substrate W. This remover liquid discharging nozzle 7031 is attached to the tip of an arm 7034 that is allowed to freely pivot centered on a shaft 7033 directed in the vertical direction by the driving operation of a nozzle shifting mechanism 7032. Thus, the remover liquid discharging nozzle 7031 is allowed to reciprocally shift between a position facing the rotation center of the rotating substrate W held on the spin chuck 7070 and a position facing the end edge of the substrate W. Here, the nozzle shifting mechanism 7032 also has an arrangement for shifting the arm 7034 in the vertical directions.

Moreover, the remover liquid discharging nozzle 7031 is connected to a remover liquid supplying section 7037 through an electromagnetic valve 7036. The remover liquid supplying section 7037 has an arrangement capable of sending a pressurized remover liquid that has been heated to a predetermined temperature. Here, reference numeral 7035 represents a tube for supplying the remover liquid.

As illustrated in FIG. 67, the brush cleaning mechanism 7040 has a rotary brush 7041 for cleaning the surface of the substrate W. This rotary brush 7041 is attached to the tip of an arm 7044 that is allowed to rock centered on a shaft 7043 directed in the vertical direction by the driving operation of a rotary brush shifting mechanism 7042. Thus, the rotary brush 7041 is allowed to reciprocally shift between a position facing the rotation center of the rotating substrate W held on the spin chuck 7070 and a position facing the end edge of the substrate W. Here, the rotary brush shifting mechanism 7042 also has an arrangement for shifting the arm 7044 in the vertical direction.

The rotary brush 7041 is allowed to rotate, centered on a rotary shaft 7045 directed in the vertical direction by the driving operation of the motor 7046 placed at the tip of the arm 7044. Moreover, as illustrated in FIG. 67, the lower end of the rotary brush 7041 can be shifted to a position for allowing it to contact the surface of the substrate W held on the spin chuck 7070 or a position that is apart from the surface of the substrate W held on the spin chuck 7070 with a fine gap. In this arrangement, the arm 7044 is moved so as to reciprocally shift the rotary brush 7041 between the position facing the rotation center of the rotating substrate W held on the spin chuck 7070 and the position facing the end edge of the substrate W, with the rotary brush 7041 being rotated at such a position. Thus, it is possible to clean the entire surface of the substrate W with the rotary brush 7041.

As illustrated in FIGS. 65 and 67, a deionized water injection nozzle 7047, which supplies deionized water on the surface of the substrate W at the time of cleaning the substrate W using the rotary brush 7041, is placed at a position facing the brush cleaning mechanism 7041. This deionized water injection nozzle 7047 is connected to the deionized water supplying section 7057 through an electromagnetic valve 7048.

As illustrated in FIG. 68, the deionized water supplying mechanism 7050 is provided with a deionized water discharging nozzle 7051 for discharging deionized water toward the substrate W. This deionized water discharging nozzle 7051 is attached to the tip of an arm 7054 that is allowed to rock centered on a shaft 7053 directed in the vertical direction, by the driving operation of a nozzle shifting mechanism 7052. Thus, the deionized water discharging nozzle 7051 is allowed to reciprocally shift between a position facing the rotation center of the rotating substrate W held on the spin chuck 7070 and a position facing the end edge of the substrate W. Here, the nozzle shifting mechanism 7052 also has an arrangement for shifting the arm 7044 in the vertical direction.

Moreover, the deionized water discharging nozzle 7051 is connected to the deionized water supplying section 7057 through an electromagnetic valve 7056. Here, reference numeral 7055 represents a tube for supplying deionized water.

Figure 69:
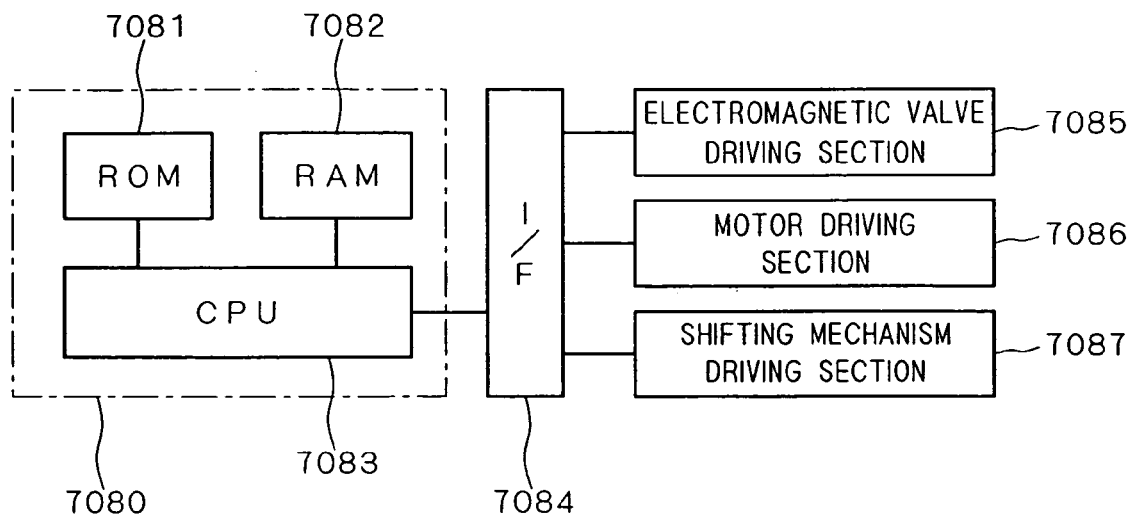
FIG. 69 is a block diagram that shows an essential electrical construction of the substrate processing apparatus.

FIG. 69 is a block diagram that shows an essential electrical construction of the substrate processing apparatus.

The substrate processing apparatus is provided with a control section 7080 having a ROM 7081 in which operation programs required for the control of the apparatus are stored, a RAM 7082 in which data, etc., are temporarily stored at the time of the controlling operation and a CPU 7083 for executing logical operations. This control section 7080 is connected to an electromagnetic valve driving section 7085 for driving the above-mentioned electromagnetic valves 7036, 7048, 7056 and 7076, a motor driving section 7086 for driving the above-mentioned motors 7046, 7070, and a shifting mechanism driving section 7087 for driving the above-mentioned nozzle shifting mechanism 7032, brush shifting mechanism 7042 and nozzle shifting mechanism 7052, through an interface 7084.

Figure 70:
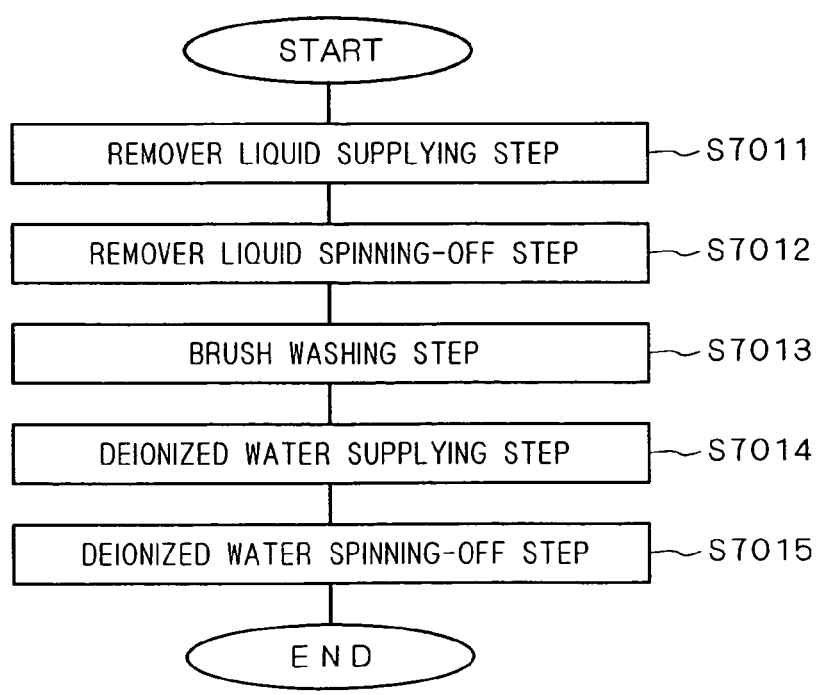
FIG. 70 is a flow chart that shows a processing operation carried out on a substrate W by the substrate processing apparatus in accordance with the first preferred embodiment.

Next, an explanation will be given of a processing operation for removing the reaction products from the substrate W by using the above-mentioned substrate processing apparatus in accordance with the first preferred embodiment. FIG. 70 is a flow chart that shows a processing operation on the substrate W carried out by the substrate processing apparatus in accordance with the first preferred embodiment.

In the case when, with respect to a substrate W on which a thin film formed on its surface has been patterned by dry-etching using a resist film as a mask, resulting reaction products generated on its surface are removed by using the substrate processing apparatus, a remover liquid supplying step is first executed (step S7011).

In this remover liquid supplying step (step S7011), the substrate W held by the spin chuck 7070 is rotated at a low speed. Then, the nozzle shifting mechanism 7032 in the remover liquid supplying mechanism 7030 is driven so that the remover liquid discharging nozzle 7031 is reciprocally shifted between a position facing the rotation center of the rotating substrate W held by the spin chuck 7070 and a position facing the end edge of the substrate W, while the electromagnetic valve 7036 is opened so as to allow the remover liquid discharging nozzle 7031 to discharge the remover liquid. Thus, the remover liquid, heated to a predetermined temperature, is supplied from the remover liquid supplying section 7037 to the entire surface of the substrate W that rotates while being held on the spin chuck 7070. Most of the reaction products generated on the surface of the substrate W are removed through this remover liquid supplying step.

Next, a remover liquid spinning-off step for spinning off or dispersing the remover liquid adhering to the substrate W is executed by rotating the substrate W at a high speed (step S7012). In this remover liquid spinning-off step, the substrate W is rotated by the spin chuck 7070 at a rotation speed of not more than 500 rpm, preferably, at a rotation speed of 1000 rpm to 4000 rpm.

In this case, the reason why the remover liquid spinning-off step is executed continuously after the remover liquid supplying step is explained as follows: In the case when an organic alkali liquid, etc., is used as the remover liquid, upon mixture of deionized water with the residual remover liquid on the substrate W, a phenomenon, referred to as "pH shock", occurs in which a strong alkali is generated, causing damages to the metal wiring. Therefore, it is impossible to continuously execute the remover liquid supplying step and the brush cleaning step using deionized water, which will be described later, and after completion of the remover liquid supplying step, it is necessary to use a large amount of an intermediate rinse liquid so as to remove the remover liquid from the substrate W beforehand, and then to carry out the brush cleaning step by supplying deionized water onto the substrate W. For this reason, the intermediate rinse liquid supplying step takes a long time, and the application of a large amount of the intermediate rinse liquid causes high costs.

In the present preferred embodiment, however, since the remover liquid spinning-off step is carried out continuously after the remover liquid supplying step, it is possible to omit the above-mentioned intermediate rinse supplying step. Moreover, even in the case when the intermediate rinse supplying step is carried out, it is possible to complete the intermediate rinse supplying step in a short time by using only a small amount of the intermediate rinse liquid.

Upon completion of the remover liquid spinning-off step, the brush cleaning step is carried out (step S7013). In the brush cleaning step, the substrate W, held by the spin chuck 7070, is rotated at a low speed. Moreover, the electromagnetic valve 7048 is opened so that deionized water is discharged from the deionized water discharging nozzle 7047 to the surface of the rotating substrate W that is held on the spin chuck 7070. Then, the rotary brush 7041 is allowed to rotate by the motor 7046 in the brush cleaning mechanism 7040, and the rotary brush 7041 is reciprocally shifted between a position that allows it to contact the rotation center of the rotating substrate W held on the spin chuck 7070 and a position that allows it to contact the end edge of the substrate W, by the driving operation of the brush shifting mechanism 7042. Thus, the rotary brush 7041 washes the entire surface of the rotating substrate W held by the spin chuck 7070. The above-mentioned brush cleaning step makes it possible to quickly remove the reaction products remaining on the surface of the substrate W.

Here, instead of the arrangement in which the lower end of the rotary brush 7041 is made in contact with the rotating substrate W held on the spin chuck 7070, the rotary brush 7041 may be placed at a position that makes the lower end slightly apart from the surface of the substrate W with a fine gap so as to clean the surface of the substrate. With this arrangement, it is possible to clean the surface of the substrate W by using deionized water existing between the lower end of the rotary brush 7041 and the surface of the substrate W without giving any impact to the surface of the substrate W.

After the completion of the brush cleaning step, a deionized water supplying step is executed (step S7014). In this deionized water supplying step, the substrate W, held on the spin chuck 7070, is rotated at a low speed. Then, the deionized water discharging nozzle 7051 is allowed to reciprocally shift between the position facing the rotation center of the rotating substrate W held on the spin chuck 7070 and the position facing the end edge of the substrate W by the driving operation of the nozzle shifting mechanism 7052 in the deionized water supplying mechanism 7050, while deionized water is discharged from the deionized water discharging nozzle 7051 by opening the electromagnetic valve 7056. Thus, deionized water is supplied from the deionized water supplying section 7057 to the entire surface of the rotating substrate W held on the spin chuck 7070. The surface of the substrate W is washed by this deionized water supplying step.

Here, in the above-mentioned remover liquid supplying step (step S7011), the brush cleaning step (step S7013) and the deionized water supplying step (step S7014), the electromagnetic valve 7076 is opened so that deionized water is supplied to the back surface of the rotating substrate held on the spin chuck 7070 by the back surface cleaning nozzle 7074, and therefore, it is possible to prevent the reaction products, etc., removed from the surface of the substrate from further reaching the back surface side of the substrate W.

Lastly, a deionized water spinning-off step for spinning off the deionized water adhering to the substrate W is executed by rotating the substrate W at a high speed (step S7015). In this deionized water spinning-off step, the substrate W is rotated by the spin chuck 7070 at a rotation speed of not less than 500 rpm, preferably, at a rotation speed of 1000 rpm to 4000 rpm.

The removing process of the reaction products is completed by finishing the above-mentioned steps.

Additionally, in the above-mentioned preferred embodiment, deionized water is supplied to the surface of the substrate W from the deionized water injection nozzle 7047 in the brush cleaning step, and deionized water is supplied to the surface of the substrate W from the deionized water discharging nozzle 7051 in the deionized water supplying step. However, another arrangement may be used, in which either the deionized water injection nozzle 7047 or the deionized water discharging nozzle 7048 is omitted and deionized water is supplied to the surface of the substrate W through the single nozzle.

Next, an explanation will be given of another preferred embodiment of the processing operation for removing the reaction products from the substrate W by using the substrate processing apparatus in accordance with the above-mentioned first preferred embodiment. FIG. 71 is a flow chart that shows another preferred embodiment of the processing operation of the substrate W carried out by using the substrate processing apparatus in accordance with the first preferred embodiment.

This preferred embodiment is distinct from the preferred embodiment shown in FIG. 70 in that the deionized water supplying step (step S7023) and the deionized water spinning-off step (step S7024) are executed between the remover liquid spinning-off step (step S7022) and the brush cleaning step (step S7025).

In other words, in this aspect, upon completion of the remover liquid spinning-off step, a deionized water supplying step is executed (step S7023). In this deionized water supplying step, the substrate W, held on the spin chuck 7070, is rotated at a low speed. Then, by the driving operation of the nozzle shifting mechanism 7052 in the deionized water supplying mechanism 7050, the deionized water discharging nozzle 7051 is allowed to reciprocally shift between the position facing the rotation center of the rotating substrate W held on the spin chuck 7070 and the position facing the end edge of the substrate W, while the electromagnetic valve 7056 is opened to discharge deionized water from the deionized water discharging nozzle 7051. Thus, deionized water is supplied from the deionized water supplying section 7057 to the entire surface of the rotating substrate W held on the spin chuck 7070. The surface of the substrate W is washed by this deionized water supplying step.

Then, a deionized water spinning-off process for spinning off the deionized water adhering to the substrate W is executed (step S7024). In this deionized water spinning-off step, the substrate W is rotated by the spin chuck 7070 at a speed of not less than 500 rpm, preferably, at a rotation speed of 1000 rpm to 4000 rpm.

This step makes it possible to process the substrate W more cleanly by cleaning the reaction products with deionized water.

Next, an explanation will be given of a construction of a substrate processing apparatus in accordance with another preferred embodiment of the present aspect.

Figure 72:
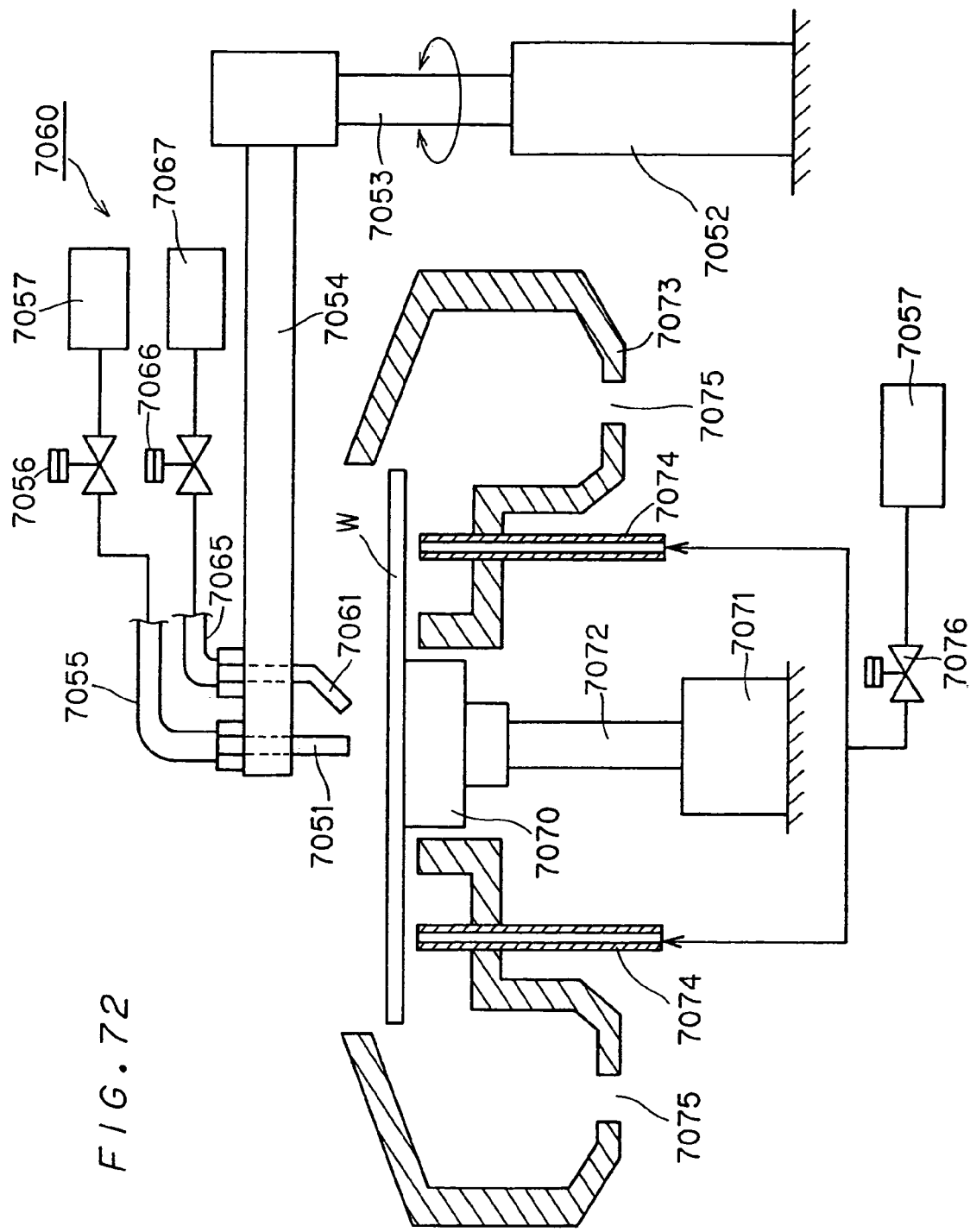
FIG. 72 is a schematic side view that shows a substrate processing apparatus in accordance with a second preferred embodiment of the seventh aspect.

FIG. 72 is a schematic side view of the substrate processing apparatus in accordance with a second preferred embodiment of the present invention. Here, FIG. 72, which corresponds to FIG. 68 in accordance with the first preferred embodiment, is a drawing that shows the relationship between a deionized water/intermediate rinse liquid supplying mechanism 7060 and the scattering preventive cup of the spin chuck 7070.

The substrate processing apparatus related to the first preferred embodiment has the same construction as the first preferred embodiment except that, in place of the deionized water supplying mechanism 7050 in the substrate processing apparatus of the first preferred embodiment, it is provided with the deionized water/intermediate rinse liquid supplying mechanism 7060 that supplies both deionized water and an intermediate rinse liquid to the substrate W held on the spin chuck 7070. In the following explanation, those members that are the same as the first preferred embodiment are indicated by the same reference numerals, and the description thereof is omitted.

As illustrated in FIG. 72, the deionized water/intermediate rinse liquid supplying mechanism 7060 is provided with a deionized water discharging nozzle 7051 for discharging deionized water to the substrate W and an intermediate rinse liquid discharging nozzle 7061 for discharging an intermediate rinse liquid to the substrate W. In the same manner as the first preferred embodiment, these deionized water discharging nozzle 7051 and intermediate rinse liquid discharging nozzle 7061 are attached to the tip of an arm 7054 that is allowed to rock centered on a shaft 7053 directed to the vertical direction by the driving operation of the nozzle shifting mechanism 7052. For this reason, the deionized water discharging nozzle 7051 is allowed to reciprocally shift between a position facing the rotation center of the rotating substrate W held on the spin chuck 7070 and a position facing the end edge of the substrate W, and the intermediate rinse liquid discharging nozzle 7061 is allowed to reciprocally shift between a position facing the vicinity of the rotation center of the rotating substrate W held on the spin chuck 7070 and a position facing the end edge of the substrate W. Here, the nozzle shifting mechanism 7052 also has an arrangement for shifting the arm 7054 in the vertical direction.

Moreover, the deionized water discharging nozzle 7051 is connected to the deionized water supplying section 7057 through an electromagnetic valve 7056, and the intermediate rinse liquid discharging nozzle 7061 is connected to a supplying section 7067 of the intermediate rinse liquid through an electromagnetic valve 7066. Here, reference numerals 7055, 7065 are tubes for supplying deionized water and the intermediate rinse liquid respectively.

Here, the intermediate rinse liquid is a liquid for cleaning the remover liquid away from the substrate W, and examples thereof include an organic solvent such as isopropyl alcohol (IPA) or a functional water such as ozone water prepared by dissolving ozone in deionized water and hydrogen water prepared by dissolving hydrogen in deionized water.

An explanation will be given of a processing operation for removing the reaction products from the substrate W by using the substrate processing apparatus of the second preferred embodiment. FIG. 73 is a flow chart that shows the processing operation of the substrate W carried out by the substrate processing apparatus of the second preferred embodiment.

In the case when, with respect to a substrate W on which a thin film formed on its surface has been patterned by dry-etching using a resist film as a mask, resulting reaction products generated on its surface are removed by using the substrate processing apparatus of the second preferred embodiment, a remover liquid supplying step is first executed (step S7031) in the same manner as the substrate processing apparatus of the first preferred embodiment.

In this remover liquid supplying step (step S7031), the substrate W held by the spin chuck 7070 is rotated at a low speed. Then, the nozzle shifting mechanism 7032 in the remover liquid supplying mechanism 7030 is driven so that the remover liquid discharging nozzle 7031 is reciprocally shifted between a position facing the rotation center of the rotating substrate W held by the spin chuck 7070 and a position facing the end edge of the substrate W, while the electromagnetic valve 7036 is opened so as to allow the remover liquid discharging nozzle 7031 to discharge the remover liquid. Thus, the remover liquid, heated to a predetermined temperature, is supplied from the remover liquid supplying section 7037 to the entire surface of the substrate W that rotates while being held on the spin chuck 7070. Most of the reaction products generated on the surface of the substrate W are removed through this remover liquid supplying step.

Next, a remover liquid spinning-off step for spinning off the remover liquid adhering to the substrate W is executed by rotating the substrate W at a high speed (step S7032). In this remover liquid spinning-off step, the substrate W is rotated by the spin chuck 7070 at a rotation speed of not more than 500 rpm, preferably, at a rotation speed of 1000 rpm to 4000 rpm.

Upon completion of the remover liquid spinning-off step, an intermediate rinse liquid supplying step is carried out (step S7033). In this intermediate rinse supplying step, the substrate W, held by the spin chuck 7070, is rotated at a low speed. Then, the intermediate rinse liquid discharging nozzle 7061 is allowed to reciprocally shift between a position facing the vicinity of the rotation center of the rotating substrate W held on the spin chuck 7070 and a position facing the end edge of the substrate W by the driving operation of the nozzle shifting mechanism 7052 in the deionized water/intermediate rinse liquid supplying mechanism 7060, while the electromagnetic valve 7066 is opened to allow the intermediate rinse liquid discharging nozzle 7061 to discharge the intermediate rinse liquid. Thus, deionized water is supplied from the supplying section 7067 of the intermediate rinse liquid to the entire surface of the rotating substrate W held on the spin chuck 7070. This intermediate rinse liquid supplying process allows the residual deionized water on the surface of the substrate W to be replaced by the intermediate rinse liquid.

Here, in the second preferred embodiment also, since the remover liquid spinning-off step is carried out succeeding to the remover liquid supplying step, it is possible to finish the intermediate rinse liquid supplying step in a short time by using only a small amount of the intermediate rinse liquid.

After the completion of the intermediate rinse liquid supplying process, a brush cleaning step is executed (step S7034). In this brush cleaning step, the substrate W, held on the spin chuck 7070, is rotated at a low speed. Further, the electromagnetic valve 7048 is opened to discharge deionized water from the deionized water injection nozzle 7047 onto the surface of the rotating substrate held on the spin chuck 7070. Then, the rotary brush 7041 is allowed to rotate by the motor 7046 in the brush cleaning mechanism 7040, and the rotary brush is reciprocally shifted between a position that allows it to contact the rotation center of the rotating substrate W held on the spin chuck 7070 and a position that allows it to contact the end edge of the substrate W, by the driving operation of the brush shifting mechanism 7042. Thus, the rotary brush 7041 washes the entire surface of the rotating substrate W held on the spin chuck 7070. The above-mentioned brush cleaning step makes it possible to quickly remove the reaction products remaining on the surface of the substrate W.

After the completion of the brush cleaning step, a deionized water supplying step is executed (step S7035). In this deionized water supplying step, the substrate W, held on the spin chuck 7070, is rotated at a low speed. Then, the deionized water discharging nozzle 7051 is allowed to reciprocally shift between a position facing the rotation center of the rotating substrate W held on the spin chuck 7070 and a position facing the end edge of the substrate W by the driving operation of the nozzle shifting mechanism 7052 in the deionized water/intermediate rinse liquid supplying mechanism 7060, while deionized water is discharged from the deionized water discharging nozzle 7051 by opening the electromagnetic valve 7056. Thus, deionized water is supplied from the deionized water supplying section 7057 to the entire surface of the rotating substrate W held on the spin chuck 7070. Consequently, this deionized water supplying step makes it possible to clean the substrate W.

Lastly, a deionized water spinning-off step for spinning off the deionized water adhering to the substrate W is executed by rotating the substrate W at a high speed (step S7036). In this deionized water spinning-off step, the substrate W is rotated by the spin chuck 7070 at a rotation speed of not less than 500 rpm, preferably, at a rotation speed of 1000 rpm to 4000 rpm.

The removing process of the reaction products is completed by finishing the above-mentioned steps.

Additionally, in the above-mentioned second preferred embodiment also, deionized water is supplied to the surface of the substrate W from the deionized water injection nozzle 7047 in the brush cleaning step, and deionized water is supplied to the surface of the substrate W from the deionized water discharging nozzle 7051 in the deionized water supplying step. However, another arrangement may be used, in which either the deionized water injection nozzle 7047 or the deionized water discharging nozzle 7048 is omitted and deionized water is supplied to the surface of the substrate W through the single nozzle.

Next, an explanation will be given of another preferred embodiment of the processing operation for removing the reaction products from the substrate W by using the substrate processing apparatus in accordance with the above-mentioned second preferred embodiment. FIG. 74 is a flow chart that shows another preferred embodiment of the processing operation of the substrate W carried out by using the substrate processing apparatus in accordance with the second preferred embodiment.

This aspect is distinct from the aspect shown in FIG. 73 in that the deionized water supplying step (step S7044) and the deionized water spinning-off step (step S7045) are executed between the remover liquid supplying step (step S7043) and the brush cleaning step (step S7046).

In other words, in this aspect, upon completion of the remover liquid supplying step, a deionized water supplying step is executed (step S7044). In this deionized water supplying step, the substrate W, held on the spin chuck 7070, is rotated at a low speed. Then, by the driving operation of the nozzle shifting mechanism 7052 in the deionized water/intermediate rinse liquid supplying mechanism 7060, the deionized water discharging nozzle 7051 is allowed to reciprocally shift between the position facing the rotation center of the rotating substrate W held on the spin chuck 7070 and the position facing the end edge of the substrate W, while the electromagnetic valve 7056 is opened to discharge deionized water from the deionized water discharging nozzle 7051. Thus, deionized water is supplied from the deionized water supplying section 7057 to the entire surface of the rotating substrate W held on the spin chuck 7070. The surface of the substrate W is washed by this deionized water supplying step.

Then, a deionized water spinning-off process for spinning off the deionized water adhering to the substrate W is executed (step S7045). In this deionized water spinning-off step, the substrate W is rotated by the spin chuck 7070 at a speed of not less than 500 rpm, preferably, at a rotation speed of 1000 rpm to 4000 rpm.

This step makes it possible to process the substrate W more cleanly by cleaning the reaction products with deionized water.

Additionally, in both of the above-mentioned preferred embodiments, the remover liquid spinning-off step for removing the residual remover liquid on the substrate W is executed succeeding to the remover liquid supplying process. However, in the case when a remover liquid that does not cause any pH shock is used, the remover liquid spinning-off process may be omitted.

H. Preferred Embodiments According to Eighth Aspect of the Present Invention

1. Preferred Embodiment of Substrate Processing Apparatus

Figure 75:
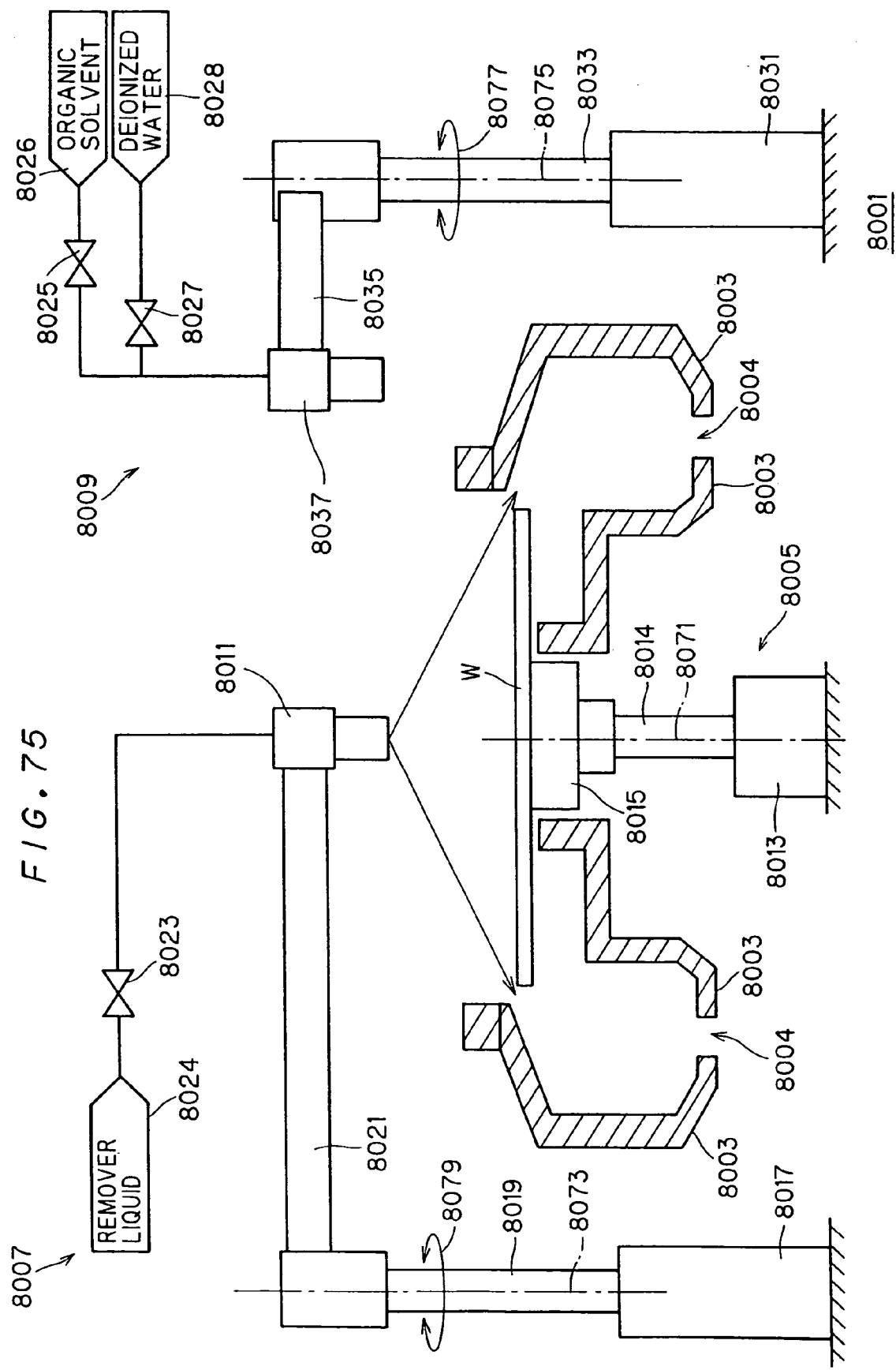
FIG. 75 is a side view of a substrate processing apparatus 8001.

FIG. 75 shows a substrate processing apparatus 8001.

As illustrated in FIG. 75, the substrate processing apparatus 8001 is provided with a doughnut-shaped cup 8003 which has a continuous ring shaped wall surface having a virtually U-letter shape in its cross-section, and also has an opening in the center portion thereof, when viewed from above, a holding rotary means 8005 that is formed in a manner so as to stick out through the opening of the cup 8003 in the vertical direction as shown in FIG. 75 and that rotates while holding a substrate W, a remover liquid supplying means 8007 for supplying a remover liquid to the substrate W held by the holding rotary means 8005 and a rinse liquid supplying means 8009 for also supplying a rinse liquid to the substrate W held by the holding rotary means 8005.

The cup 8003 has a plurality of discharging outlets 8004 on the bottom thereof. Thus, an excessive portion of the liquid supplied to the substrate W drops along the inner wall of the cup 8003 to reach the discharging outlets 8004, and is discharged out of the apparatus through the discharging outlets 8004.

The holding rotary means 8005 is provided with a spin motor 8013 which is secured to an apparatus frame, not shown, and has a driving axis placed in the vertical direction, a spin shaft 8014 that is secured to the driving shaft of the spin motor 8013 and a vacuum chuck 8015 serving as a substrate holding member placed on the top of the spin shaft 8014.

The vacuum chuck 8015 has a suction surface for sucking the substrate on its upper surface and a suction hole, not shown, formed in the suction surface. Thus, it holds the substrate W virtually in the horizontal direction by applying air suction trough the suction hole.

In this arrangement, the holding rotary means 8005 holds the substrate W placed on the vacuum chuck 8015 through suction applied by the vacuum chuck 8015, and rotates the substrate W, centered on a shaft 8071, by driving the spin motor 8013.

The remover liquid supplying means 8007 is provided with a first rotary motor 8017 which is secured to the apparatus frame, not shown, and has a driving shaft placed in the vertical direction, a first rotary shaft 8019 secured to the driving shaft of the first rotary motor 8017, a first arm 8021 connected to the top of the first rotary shaft 8019 and a remover liquid nozzle 8011 that is attached to the tip of the first arm 8021.

This first arm 8021 is allowed to pivot centered on a shaft 8073 as indicated by arrow 8079 so that the remover liquid nozzle 8011 is shifted between a discharging position above the rotation center of the substrate W and a stand-by position that is located outside the cup 8003 when viewed from above.

Moreover, a remover liquid source 8024 is connected to the remover liquid nozzle 8011 through a remover liquid valve 8023. The remover liquid source 8024 sends a pressurized remover liquid that has been temperature-adjusted toward the remover liquid nozzle 8011. Thus, the opening and closing operations of the removing valve 8023 make it possible to execute and stop the discharging of the remover liquid from the remover liquid nozzle 8011.

Here, a dispersing nozzle 8016 which will be described later is applied to the remover liquid nozzle 8011.

The rinse liquid supplying means 8009 is provided with a second rotary motor 8031 which is secured to the apparatus frame, not shown, and has a driving shaft placed in the vertical direction, a second rotary shaft 8033 secured to the driving shaft of the second rotary motor 8031, a second arm 8035 connected to the top of the second rotary shaft 8033 and a rinse liquid nozzle 8037 that is attached to the tip of the second arm 8035.

This second arm 8035 is allowed to pivot centered on a shaft 8075 as indicated by arrow 8077 so that the rinse liquid nozzle 8037 is shifted between a discharging position above the rotation center of the substrate W and a stand-by position that is located outside the cup 8003 when viewed from above.

Moreover, a solvent source 8026 is connected to the rinse liquid nozzle 8037 through a solvent valve 8025, and a deionized water source 8028 is also connected thereto through a deionized water valve 8027. The solvent source 8026 sends a pressurized organic solvent (in this case, isopropyl alcohol) as the intermediate rinse liquid toward the rinse liquid nozzle 8037. Thus, the opening and closing operations of the solvent nozzle 8025 make it possible to execute and stop the discharging of the organic solvent from the rinse liquid nozzle 8037.

Moreover, the deionized water source 8028 sends pressurized deionized water toward the rinse liquid nozzle 8037 as the final rinse liquid. The opening and closing operations of the deionized water nozzle 8028 makes it possible to execute and stop the discharging of the deionized water from the rinse liquid nozzle 8037. This arrangement makes it possible to selectively discharge the organic solvent and deionized water from the rinse liquid nozzle 8037.

Here, the dispersing nozzle 8016 which will be described later is applied to the rinse liquid nozzle 8037.

<2. Dispersing Nozzle>

The dispersing nozzle 8016, which will be described below, is applied to the remover liquid nozzle 8011 and the rinse liquid nozzle 8037.

Figure 76A:
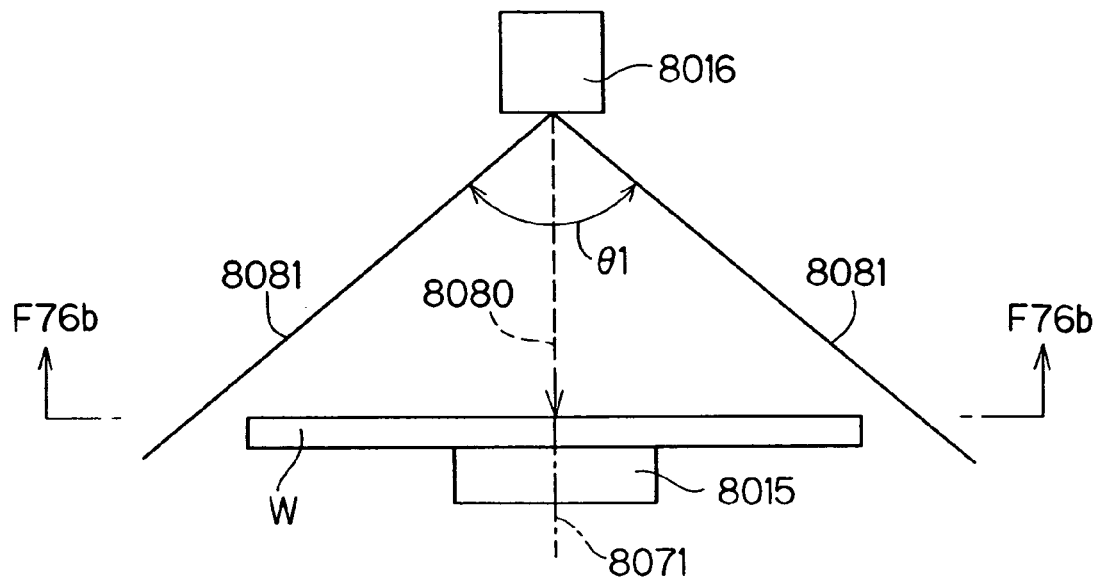
FIGS. 76A and 76B are drawings explaining dispersing nozzle 8016.
Figure 76B:
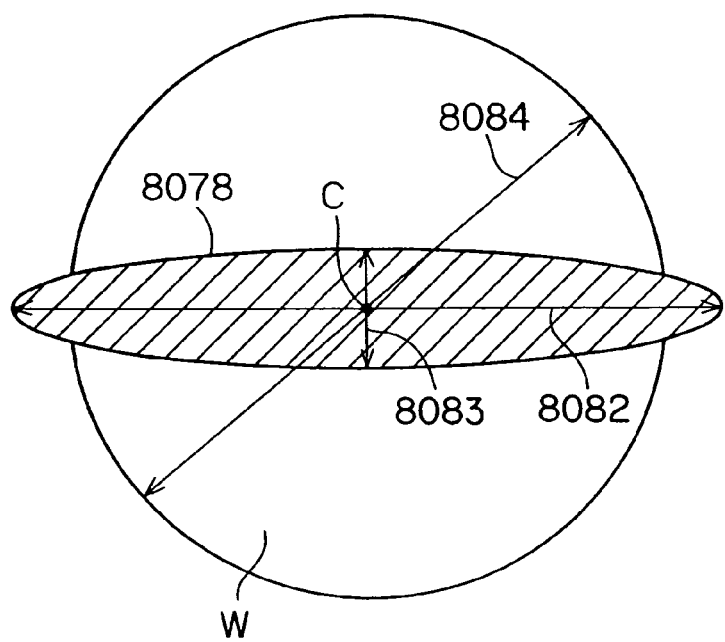

FIGS. 76A and 76B are a side view and a top view that respectively explain the dispersing nozzle 8016. Here, FIG. 76B is a cross-sectional view taken along line F76*b*-F76*b* of FIG. 76A (a cross-sectional view on a plane including the surface of the substrate W).

As indicated by arrow 8080 in FIG. 76A, the dispersing nozzle 8016 discharges the process liquid 8081 with its progressing direction directed downward (in this case, downward in the vertical direction toward the rotation center C of the substrate). Moreover, the liquid discharging operation is executed in such a manner that the process liquid is dispersed downward with an angle θ1 on its side view as shown in FIG. 76A. Here, the dispersing nozzle 8016 discharges a spreading current of the process liquid 8081 in a manner so as to form a cone shape with an elliptical bottom surface (referred to as elliptical cone shape). In this case, the process liquid 8081 is also present inside the elliptical cone shape in such a manner that the process liquid 8081 is also supplied into a portion surrounded by an outline 8078 as shown in FIG. 76B.

In the case when the process liquid is supplied to the substrate by using the dispersing nozzle 8016 of this type, the discharging positions of the remover liquid nozzle 8011 and the rinse liquid nozzle 8037 are adjusted and the distance between the substrate and the dispersing nozzle 8016 is adjusted by taking the angle θ1 into consideration. Thus, the process liquid is supplied to the substrate as described below:

In other words, in the cross-section (F76*b*-F76*b* cross-section) on the plane including the surface of the substrate W, the process liquid 8081 is allowed to spread in a manner indicated by an elliptical outline 8078, as shown in FIG. 76B. The major axis 8082 of the outline 8078 is set to be longer than the diameter 8084 of the substrate W and the minor axis 8083 is set to be shorter than the diameter 8084, with the center of the outline 8078 being virtually coincident with the rotation center of the substrate W.

3. Preferred Embodiment of Substrate Processing Method

An explanation will be given of one preferred embodiment of a substrate processing method using the substrate processing apparatus 8001.

In FIG. 75, the remover liquid nozzle 8011 and the rinse liquid nozzle 8037 are initially positioned respectively at the stand-by positions outside the cup 8003. Then, a substrate W is placed on the vacuum chuck 8015 and held thereon by a transporting device located outside of the drawing. Next, the discharging nozzle 8011 is shifted to the discharging position, and the substrate is rotated by the spin motor. When the number of revolutions of the substrate has reached a predetermined number of revolutions (150 rpm to 1000 rpm, preferably, 150 rpm to 500 rpm), the remover liquid valve 8023 is opened so as to execute a remover liquid supplying step. In this remover liquid supplying step, a remover liquid is supplied from the remover liquid nozzle 11 to the substrate W that is rotating at the predetermined number of revolutions for a predetermined time. Thus, the function of the remover liquid sets the reaction products to a state in which they are allowed to easily come off.

After a lapse of a predetermined time, the remover liquid valve 8023 is closed, while the remover liquid nozzle 8011 is returned to the stand-by position, and the rinse liquid nozzle 8037 is next shifted from the stand-by position to the discharging position. Thus, an intermediate rinse step is started.

In the intermediate rinse step, the solvent valve 8025 is opened so that an organic solvent is supplied as the intermediate rinse liquid from the rinse liquid nozzle 8037 to the substrate W that is rotating at a predetermined number of revolutions.

Consequently, the remover liquid and contaminants are washed away from the substrate W.

After a lapse of a predetermined time, the solvent valve 8025 is closed, and the sequence proceeds to a final rinse step.

In the final rinse step, the deionized water valve 8027 is opened so that deionized water is supplied as the final rinse liquid from the rinse liquid nozzle 8037 to the substrate W that is rotating at a predetermined number of revolutions.

Thus, the organic solvent and contaminants are washed away from the substrate W.

After a lapse of a predetermined time, the deionized water valve 8027 is closed.

Thereafter, the substrate W is rotated at a high speed so that a drying step for drying the substrate W is executed, thereby completing the sequence of processes.

As described above, since the dispersing nozzle 8016 is applied to the removing nozzle 8011, the remover liquid is supplied to the portion surrounded by the outline 8078 of FIG. 76B on the substrate W. In this manner, the remover liquid is allowed to hit a comparatively wide range on the surface of the substrate W. Moreover, since the substrate W is rotating at the predetermined number of revolutions, a fresh remover liquid is allowed to uniformly hit the substrate W. Since this liquid arrival portion being hit by the remover liquid is supplied with the remover liquid that has always been adjusted to a predetermined temperature and less susceptible to variations in the component composition, it is possible to ensure the in-plane uniformity in the process.

Moreover, both of the intermediate rinse liquid and the final rinse liquid are supplied through the dispersing nozzle in the same manner as the remover liquid. For this reason, since a fresh rinse liquid is uniformly supplied to the substrate W, it becomes possible to more positively ensure the in-plane uniformity in the process.

Here, in the above-mentioned aspect, the minor axis 8083 of the outline 8078 is set to be shorter than the diameter 8084 of the substrate W. However, the minor axis 8083 may be set to be longer than the diameter 8084 of the substrate W. Moreover, the lengths of the major axis 8082 and the minor axis 8083 may be made coincident with each other. In other words, the outline 8078 may include a circle.

4. Another Preferred Embodiment of Substrate Processing Apparatus

In the substrate processing apparatus 1, the dispersing nozzle 8016 is placed as shown in FIGS. 76A and 76B. However, this may be placed as shown in FIGS. 77A and 77B.

As indicated by arrow 8080a in FIG. 77A, a dispersing nozzle 8016a discharges a process liquid 8081a with its progressing direction directed downward (in this case, downward in the vertical direction). Moreover, the liquid discharging operation is executed in such a manner that the process liquid 8081a is dispersed downward with an angle θ2 on its side view. Here, the dispersing nozzle 8016a discharges the process liquid 8081a in a manner so as to form a cone shape with an elliptical bottom surface (referred to as elliptical cone shape), and in this case, the process liquid 8081a is also present inside the elliptical cone shape in such a manner that the process liquid 8081a is also supplied into a portion surrounded by an outline 8078a as shown in FIG. 77B.

In the case when the process liquid is supplied to the substrate by applying the dispersing nozzle 8016a of this type to the remover liquid nozzle 8011 or the rinse liquid nozzle 8037 of the substrate processing apparatus 8001, the discharging position of the remover liquid nozzle 8011 or the rinse liquid nozzle 8037 is adjusted and the distance between the substrate and the dispersing nozzle 8016a is adjusted by taking the angle θ2 into consideration. Thus, the process liquid is supplied to the substrate as described below:

In other words, in the cross-section (F77b-F77b cross-section) on the plane including the surface of the substrate W, the process liquid 8081a is allowed to spread in a manner indicated by an elliptical outline 8078a, as shown in FIG. 77B. Here, the outline 8078a includes the rotation center C of the substrate and at least one point on the circumference of the rotation circle P that is formed by the end edge of the rotating substrate. Thus, the process liquid is allowed to hit a comparatively wide range of the surface of the substrate W. Moreover, since the substrate W is rotating at the predetermined number of revolutions, a fresh remover liquid is allowed to uniformly hit the substrate W. Since this liquid arrival portion being hit by the remover liquid is supplied with the remover liquid that has always been adjusted to a predetermined temperature and less susceptible to variations in the component composition, it is possible to ensure the in-plane uniformity in the process.

In the above-mentioned respective aspects, the process liquid is dispersed in an elliptical cone shape. However, the minor axis 8083 may be further shortened so as to disperse the process liquid in the form of a straight line extending in the extending direction of the major axis.

Moreover, in the above-mentioned respective aspects, the discharging direction of the process liquid is set perpendicular to the surface of the substrate W, however, this may be tilted with an angle other than the vertical direction.

Furthermore, in the above-mentioned respective aspects, the dispersion nozzle 8016 is applied to both of the remover liquid nozzle 8011 and the rinse liquid nozzle 8037. This may be applied to either of them, and even in this case, it is possible to ensure the in-plane uniformity in the process of the substrate.

Moreover, upon contact between the remover liquid and deionized water, a strong alkali is generated, resulting in a phenomenon referred to as "pH shock" that causes corrosion on the metal film, etc. For this reason, in the above-mentioned substrate processing method, the intermediate rinse step is prepared. However, in the case of the substrate in which the "pH shock" is ignorable, the intermediate rinse step may be omitted. In this case, of course, the solvent source 8026 and the solvent valve 8025 may be omitted from the substrate processing apparatus 8001.

Furthermore, in the substrate processing in the above-mentioned aspects, the substrate treatment deals with a substrate having a surface on which polymers are formed through dry-etching. The present substrate treatment is more effectively applied to a substrate that has been further subjected to ashing after the dry-etching.

I. Preferred Embodiments According to Ninth Aspect of the Present Invention

1. First Preferred Embodiment of Substrate Processing Apparatus

The following description will discuss a first preferred embodiment of a substrate processing apparatus of the present invention.

Figure 78:
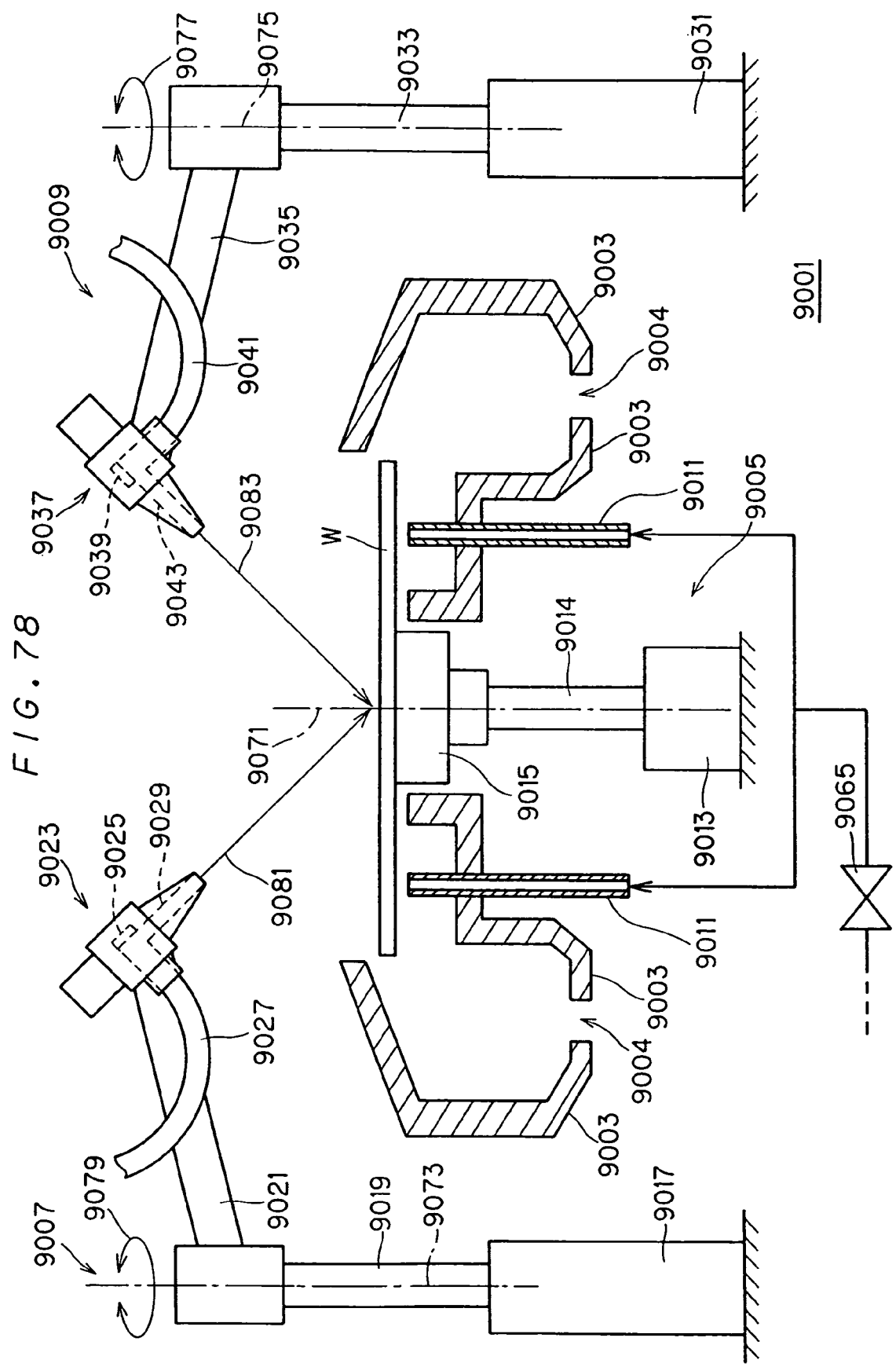
FIG. 78 is a side view of a substrate processing apparatus in accordance with a first preferred embodiment of a ninth aspect.
Figure 79:
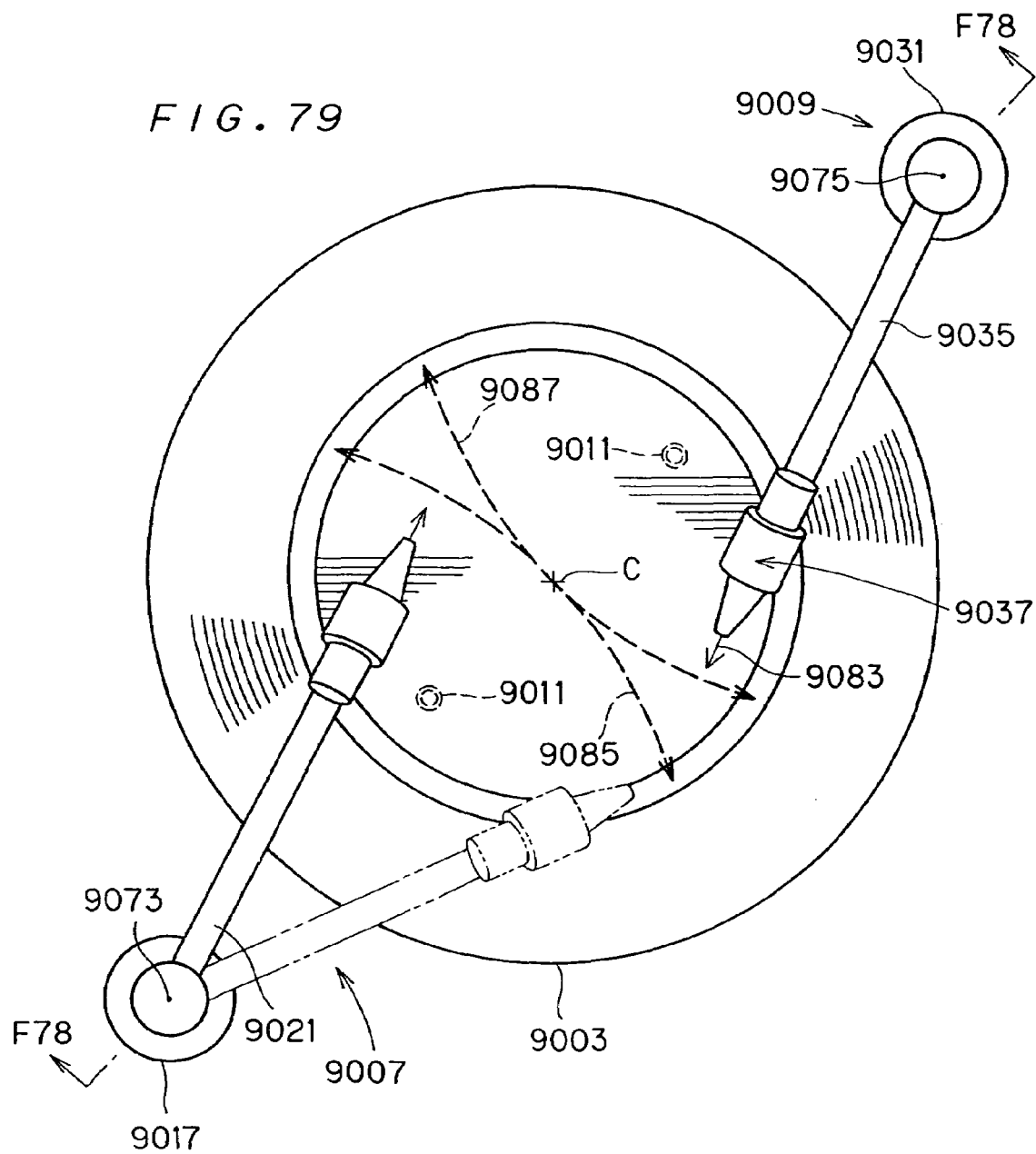
FIG. 79 is a top view of the substrate processing apparatus in accordance with the first preferred embodiment of the ninth aspect.

FIGS. 78 and 79 are drawings that show a construction of a substrate processing apparatus 9001. Here, FIG. 78 is a cross-sectional view taken along line F78-F78 of FIG. 79, and for convenience of explanation, hatching is partially omitted from some portions.

As illustrated in FIG. 78, the substrate processing apparatus 9001 is provided with a cup 9003 which has a virtually U-letter shape in its cross-section, and also has a virtually ring shape with an opening in the center portion thereof as shown in FIG. 78, when viewed from above, a holding rotary means 9005 that is formed in a manner so as to stick out through the opening of the cup 9003 in the vertical direction as shown in FIG. 1 and that rotates while holding a substrate W, a remover liquid nozzle 9007 for supplying a remover liquid to the substrate W held by the holding rotary means 9005 and a deionized water nozzle 9009 for also supplying deionized water to the substrate W held by the holding rotary means 9005. Moreover, the substrate processing apparatus 9001 is also provided with a back surface cleaning nozzle 9011 for supplying deionized water to the back surface of the substrate W held on the holding rotary means 9005.

Here, the remover liquid nozzle 9007 corresponds to a remover liquid supplying means in the present invention, and the deionized water supplying nozzle 9009 corresponds to a deionized water supplying means in the present invention.

The cup 9003 has a plurality of discharging outlets 9004 on the bottom thereof. Thus, an excessive portion of the liquid supplied to the substrate W drops along the inner wall of the cup 9003 to reach the discharging outlets 9004, and is discharged out of the apparatus through the discharging outlets 9004.

The holding rotary means 9005 is provided with a spin motor 9013 which is secured to an apparatus frame, not shown, and has a driving shaft placed in the vertical direction, a spin shaft 9014 that is secured to the driving shaft of the spin motor 9013 and a vacuum chuck 9015 serving as a substrate holding member placed on the top of the spin shaft 9014.

The vacuum chuck 9015 has a suction surface for applying air suction to a substrate on its upper surface, and the suction surface has an area that is smaller than the area of the substrate W. In the present aspect, the vacuum chuck is a virtually column shaped member with the suction surface on its top having a round shape.

The vacuum chuck 9015 has a suction hole, not shown, formed in the suction surface that is the upper surface thereof, and air is sucked through the suction hole. Thus, the substrate W, placed on the vacuum chuck 15, is held by air suction applied through the suction hole. In this manner, the vacuum chuck 15 holds the substrate W by contacting only the back surface of the substrate W.

In this arrangement, the holding rotary means 9005 holds the substrate W placed on the vacuum chuck 9015 through suction applied by the vacuum chuck 9015, and rotates the substrate W held on the vacuum chuck 9015 centered on a shaft 9071 by driving the spin motor 9013.

The remover liquid supplying nozzle 9007 is provided with a first rotary motor 9017 which is secured to the apparatus frame, not shown, and has a driving shaft placed in the vertical direction, a first rotary shaft 9019 secured to the driving shaft of the first rotary motor 9017 and a first arm 9021 connected to the top of the first rotary shaft 9019.

A remover liquid nozzle main body 9023 is attached to the tip of the first arm 9021.

The remover liquid nozzle main body 9023 is provided with a first passage hole 9029 having its axis line direction directed toward the top major surface of the substrate W, and a first tube 9027 is connected to the first passage hole 9029. Moreover, a first vibrator 9025 is placed inside the first passage hole 9029 at a position contacting the remover liquid passing through the first passage hole 9029.

The first passage hole 9029 is designed so that, when the first arm 9021 pivots, centered on the shaft 9073 as indicated by arrow 9079, the arrival point of a remover liquid 9081 discharged through the first passage hole 9029 on the substrate W is allowed to shift over the substrate W along a circular arc as indicated by arrow 9085, passing through the rotation center C of the substrate W, as shown in FIG. 79.

Here, the remover liquid nozzle 9007 discharges the remover liquid in a direction crossing the plane containing the surface of the substrate W. In other words, the angle made by the direction of the remover liquid discharged from the remover liquid nozzle 9007 with respect to the substrate surface is set in the range from greater than 0 degree to not more than 90 degrees. In other words, the remover liquid nozzle 9007 discharges the remover liquid in a direction perpendicular to the substrate W or diagonally from above. Preferably, the angle made by the direction of the remover liquid to be discharged with respect to the surface of the substrate is set to not less than 30 degrees to not more than 60 degrees, more preferably, at 45 degrees.

The first tube 9027 supplies a remover liquid to the first passage hole 9029.

The first vibrator 9025 is allowed to vibrate by an electric signal from an oscillator 9067, which will be described later, so as to apply ultrasonic waves to the remover liquid passing through the first passage hole 9029.

In the remover liquid nozzle 9007 arranged as described above, the first rotary motor 9017 rotates the first rotary shaft 9019 so that the first arm 9021 is allowed to pivot centered on the shaft 9073. Thus, as illustrated in FIG. 79, the arrival point of a remover liquid 9081 discharged from the remover liquid nozzle 9007 with respect to the substrate W is allowed to shift over the substrate W along a circular arc as indicated by arrow 9085, passing through the rotation center C of the substrate W. Thus, the remover liquid to which ultrasonic waves are applied is supplied to the substrate W.

The deionized water nozzle 9009 is provided with a second rotary motor 9031 which is secured to the apparatus frame, not shown, and has a driving shaft placed in the vertical direction, a second rotary shaft 9033 secured to the driving shaft of the second rotary motor 9031 and a second arm 9035 that is connected to the top of the second rotary shaft 9033.

A deionized water nozzle main body 9037 is attached to the tip of the second arm 9035.

The deionized water nozzle main body 9037 is provided with a second passage hole 9043 having its axis line direction directed toward the top major surface of the substrate W, and a second tube 9041 is connected to the second passage hole 9043. Moreover, a second vibrator 9039 is placed inside the second passage hole 9043 at a position contacting deionized water passing through the second passage hole 9043.

The second passage hole 9043 is designed so that, when the second arm 9035 pivots, centered on the shaft 9075 as indicated by arrow 9077, the arrival point of deionized water 9083 discharged through the second passage hole 9043 on the substrate W is allowed to shift over the substrate W along a circular arc as indicated by arrow 9087, passing through the rotation center C of the substrate W, as shown in FIG. 79.

Here, the deionized water nozzle 9009 discharges deionized water in a direction crossing the plane containing the surface of the substrate W. In other words, the angle made by the direction of the deionized water discharged from the deionized water nozzle 9009 with respect to the substrate surface is set in the range from greater than 0 degree to not more than 90 degrees. In other words, the deionized water nozzle 9007 discharges deionized water in a direction perpendicular to the substrate W or diagonally from above. Preferably, the angle made by the direction of the deionized water to be discharged with respect to the surface of the substrate is set to not less than 30 degrees to not more than 60 degrees, more preferably, at 45 degrees.

The second tube 9041 supplies deionized water to the second passage hole 9043.

The second vibrator 9039 is allowed to vibrate by an electric signal from an oscillator 9067, which will be described later, so as to apply ultrasonic waves to the deionized water passing through the second passage hole 9043.

In the deionized water nozzle 9009 arranged as described above, the second rotary motor 31 rotates the second rotary shaft 9033 so that the second arm 9035 is allowed to pivot centered on the shaft 9075. Thus, as illustrated in FIG. 79, the arrival point of deionized water 9083 discharged from the deionized water nozzle 9009 with respect to the substrate W is allowed to shift over the substrate W along a circular arc as indicated by arrow 9087, passing through the rotation center C of the substrate W. Thus, the deionized water to which ultrasonic waves are applied is supplied to the substrate W.

A back surface cleaning nozzle 9011 is a tube-shaped member that penetrates the cup 9003 and extends virtually in the vertical direction toward the back surface of the substrate W, and used for supplying deionized water via a back surface cleaning valve 9065, which will be described later. Thus, it is possible to discharge deionized water onto the back surface of the substrate W.

Figure 80:
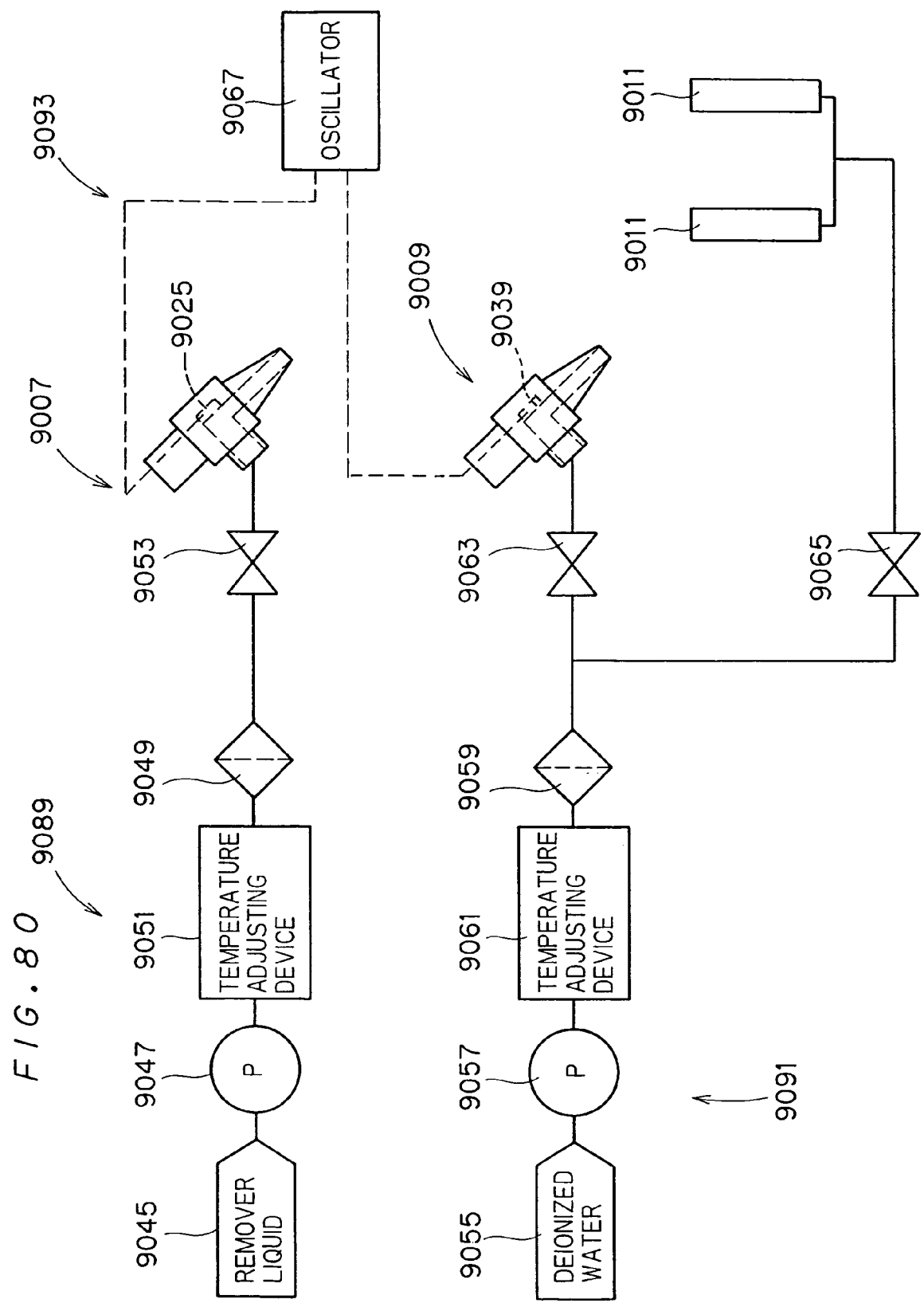
FIG. 80 is a drawing that shows piping of the substrate processing apparatus in accordance with the first preferred embodiment of the ninth aspect.

Referring to FIG. 80, the following description will discuss a remover liquid supplying system to the remover liquid nozzle 9007 as well as a deionized water supplying system 9091 to the deionized water nozzle 9009 and the back surface cleaning nozzle 9011.

The remover liquid supplying system 9089 is provided with a remover liquid pump 9047 for pumping the remover liquid from a remover liquid source 9045 outside the apparatus, a temperature-adjusting device 9051 for adjusting the temperature of the remover liquid by heating or cooling the remover liquid pumped out by the remover liquid pump 9047 to a predetermined temperature, a filter 9049 for filtering contaminants from the remover liquid that has been temperature-adjusted by the temperature-adjusting device 9051, and a remover liquid nozzle valve 9053 for opening and closing the flowing path of the filtered remover liquid to the remover liquid nozzle 9007.

This arrangement allows the remover liquid supplying system 9089 to supply the remover liquid that has been temperature-adjusted to a predetermined temperature by the temperature-adjusting device 9051 and purified by the filter 9049 to the remover liquid nozzle 9007.

The deionized water supplying system 9091 is provided with a deionized water pump 57 for pumping deionized water from a deionized water source 9055 outside the apparatus, a temperature-adjusting device 9061 for adjusting the temperature of the deionized water by heating or cooling the deionized water pumped out by the deionized water pump 9057 to a predetermined temperature, a filter 9059 for filtering contaminants from the deionized water that has been temperature-adjusted by the temperature-adjusting device 9061, and a deionized water nozzle 9063 for opening and closing the flowing path of the filtered deionized water liquid to the deionized water nozzle 9009 as well as a back surface cleaning valve 9065 for opening and closing the flowing path of the deionized water filtered by the filter 9059 to the back surface cleaning nozzle.

This arrangement allows the deionized water supplying system 9091 to supply the deionized water that has been temperature-adjusted to a predetermined temperature by the temperature-adjusting device 9061 and purified by the filter 9059 to the deionized water nozzle 9009.

Next, referring to FIG. 80, an explanation will be given of an ultrasonic wave applying section 9093.

The ultrasonic wave applying section 9093 is provided with a first vibrator 9025 placed inside the remover liquid nozzle 9007 and an oscillator 9067 for vibrating the first vibrator 9025 by transmitting an electric signal to the first vibrator 9025.

With this arrangement, the ultrasonic wave applying section 9093 applies ultrasonic waves to the remover liquid to be supplied to the substrate W from the remover liquid nozzle 9007.

Moreover, the ultrasonic wave applying section 9093 is also provided with a second vibrator 9039 placed inside the deionized water nozzle 9009, and the second vibrator 9039 is vibrated by an electric signal transmitted from the oscillator 9067.

With this arrangement, the ultrasonic wave applying section 9093 applies ultrasonic waves to the deionized water to be supplied to the substrate W from the deionized water nozzle 9009.

In this manner, the remover liquid with the ultrasonic waves applied thereto or the deionized water with the ultrasonic waves applied thereto is supplied to the substrate W, and therefore, it is possible to carry out the removing process of the reaction products more quickly, and consequently to improve the throughput. Here, the throughput can be improved by only applying ultrasonic waves to either the remover liquid or deionized water. However, by applying ultrasonic waves to both of the remover liquid and deionized water, it is possible to remove the reaction products more quickly and to improve the throughput more effectively.

Figure 81:
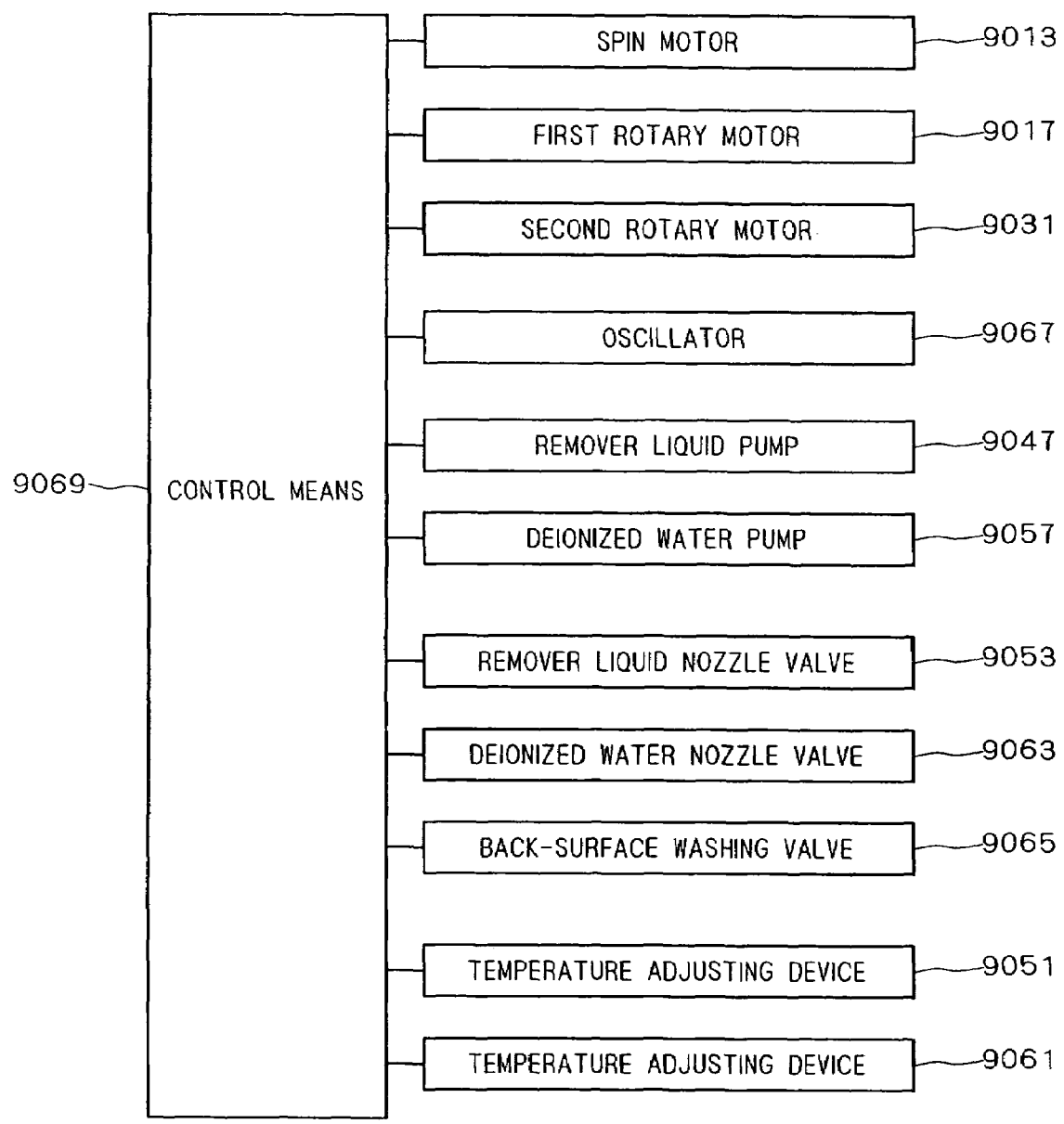
FIG. 81 is a drawing that shows a hardware construction of the substrate processing apparatus in accordance with the first preferred embodiment of the ninth aspect.

Next, referring to FIG. 81, an explanation will be given of the hardware construction of the substrate processing apparatus 9001.

To the control means 9069 are connected the spin motor 9013, the first rotary motor 9017, the second rotary motor 9031, the oscillator 9067, the remover liquid pump 9047, the deionized water pump 9057, the remover liquid nozzle valve 9007, the deionized water nozzle valve 9063, the back surface cleaning valve 9065, the temperature-adjusting device 9051 and the temperature-adjusting device 9061, thus, as will be described in first preferred embodiment and second preferred embodiment of a substrate processing method, the control means 9069 controls these devices connected thereto.

2. First Preferred Embodiment of a Substrate Processing Method

Figure 83:
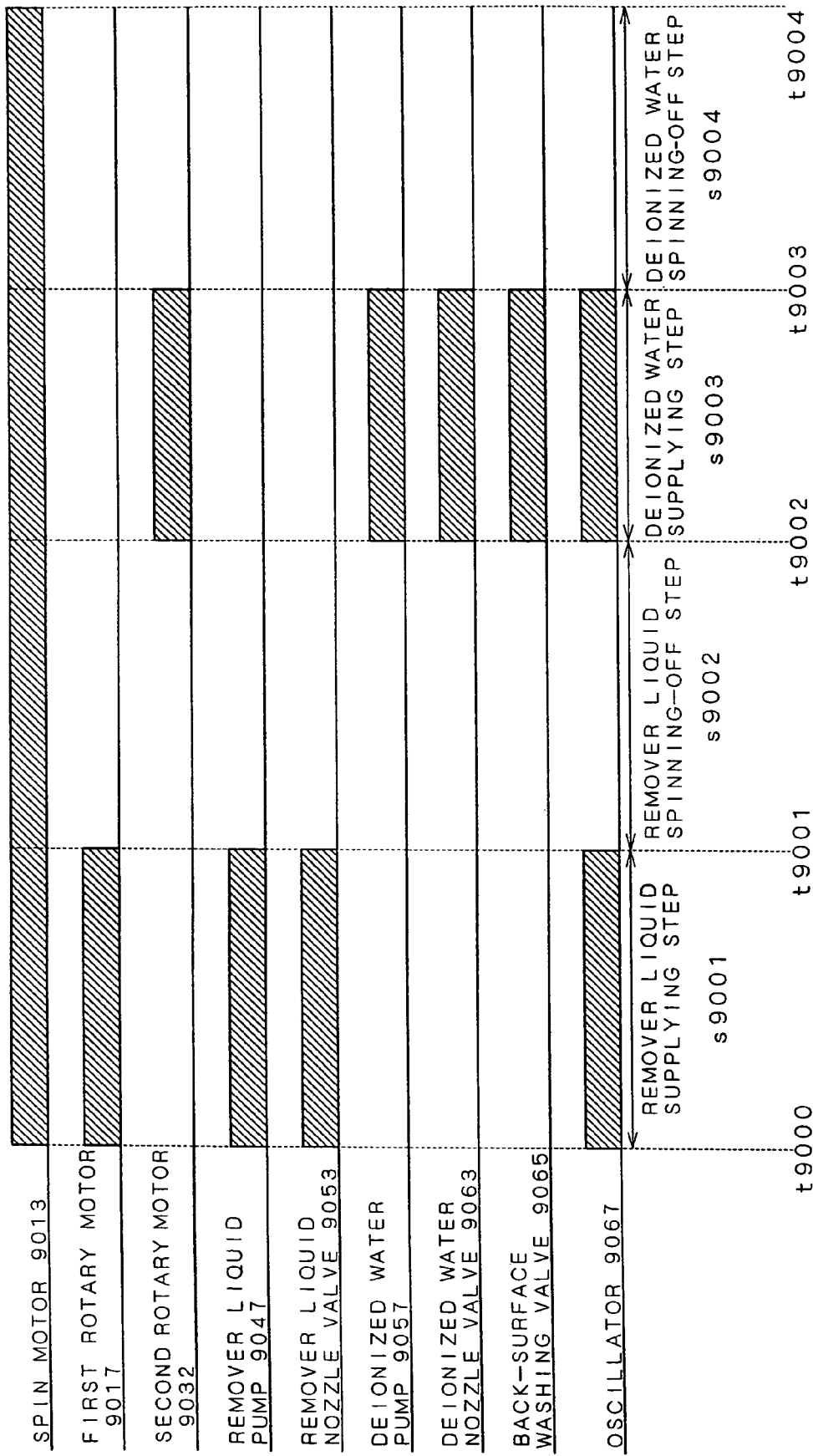
FIG. 83 is a detailed flow chart that shows the substrate processing method in accordance with the first preferred embodiment of the ninth aspect.

FIG. 82 is a drawing that shows a first preferred embodiment of a substrate processing method in which the above-mentioned substrate processing apparatus 9001 is used. As illustrated in FIG. 82, the substrate processing method of the present preferred embodiment includes a remover liquid supplying step s9001, a remover liquid spinning-off step s9002, a deionized water supplying step s9003, and a deionized water spinning-off step s9004. Referring to FIG. 83, the following description will discuss the respective steps.

(1. Remover Liquid Supplying Step s9001)

First, the control means 9069 has controlled the temperature-adjusting devices 9051 and 9061 so that the temperatures of the remover liquid and deionized water are set to predetermined temperatures before the sequence has reached time t9000.

Moreover, before the sequence has reached time t9000, the control means 9069 drives the spin motor 9013 to rotate the substrate W so that at time t9000, the substrate W is being rotated at a predetermined number of revolutions.

Then at time t9000, the control means 9069 rotates the first rotary motor 9017 so as to allow the remover liquid nozzle 9007 to pivot.

Furthermore, at time t9000, the control means 9069 drives the remover liquid pump 9017 so as to send the remover liquid to the remover liquid nozzle 9007, and also allows the remover liquid nozzle valve 9053 to open so as to supply the remover liquid from the remover liquid nozzle 9007 to the substrate W. With these steps, the remover liquid, supplied from the remover liquid nozzle 9007, is supplied onto the substrate W in such a manner that the arrival point thereof onto the substrate W is shifted on a circular arc that passes through the rotation center C of the substrate W, and crosses the end edge of the substrate W at at least two different points in the horizontal surface including the surface of the substrate W, as indicated by arrow 9085 in FIG. 79. In this manner, the remover liquid supplying step s9001 is executed.

Here, at time t9000, the control means 9069 allows the oscillator 9067 to transmit an electric signal to the first vibrator 9025 within the remover liquid nozzle 9007 so as to oscillate the first vibrator 9025. Thus, ultrasonic waves are applied to the remover liquid supplied from the remover liquid nozzle 9007. Consequently, the reaction products adhering to the substrate W are subjected to ultrasonic vibration, and thus easily separated from the substrate W.

At time t9001 after a lapse of a predetermined time, the control means 9069 stops the driving operation of the first rotary motor 9017 in a state where the remover liquid nozzle 9007 has retreated from a position above the cup 9003. Moreover, the control means 9069 closes the remover liquid nozzle valve 9053, and also stops the driving operation of the remover liquid pump 9047 so as to stop the supply of the remover liquid from the remover liquid nozzle 9007. Moreover, at time t9001, the control means 9069 stops the transmission of the electric signal from the oscillator 9067 to the first vibrator 9025.

(2. Remover Liquid Spinning-Off Step s9002)

Next, at time t9001, the control means 9069 stops the supply of the remover liquid to the substrate W, while it successively rotates the spin motor 9013 so as to maintain the rotating state of the substrate W. Thus, a remover liquid spinning-off step s9002 is executed.

In this remover liquid spinning-off step s9002, the substrate W is rotated at not less than 500 rpm, more preferably, in the range from 1000 rpm to 4000 rpm to spin off or disperse the remover liquid from the substrate W.

Moreover, the time during which the rotation is maintained is set to not less than 1 second, preferably, in the range of 2 to 5 seconds.

In this manner, the rotating state of the substrate is maintained with the supply of the remover liquid being stopped with respect to the substrate W, the remover liquid on the substrate W is spun off from the substrate W by a centrifugal force.

Furthermore, since the substrate is rotated while being maintained in the horizontal state, the remover liquid is spun off from the substrate W uniformly. Thus, it is possible to maintain the in-plane uniformity of the substrate W.

Since the vacuum chuck 9015 is kept in contact with only the back surface of the substrate W, there are no parts contacting the edge of the substrate W. Consequently, since there are no parts that intervene with the progress the remover liquid that is spun off in the horizontal direction toward the outside of the substrate W from the top major surface of the substrate W, the time required for the remover liquid to be spun off from the substrate is shortened. Thus, it is possible to improve the throughput.

Moreover, since the holding rotary means 9005 only needs to hold a single sheet of the substrate W, it is possible to easily increase the number of revolutions of the substrate W. For this reason, the time required for the remover liquid to be spun off from the substrate is shortened. Thus, it is possible to improve the throughput.

(3. Deionized Water Supplying Step s9003)

Next, at time t9002, the control means 9069 rotates the second rotary motor 9032 so as to allow the deionized water nozzle 9009 to pivot.

At time t9002 also, the control means 9069 drives the deionized water pump 9057 so as to send deionized water to the deionized water nozzle 9009, and also allows the deionized water nozzle valve 9063 to open so as to supply the deionized water from the deionized water nozzle 9009 to the substrate W. With these steps, the deionized water, supplied from the deionized water nozzle 9009, is supplied onto the substrate W in such a manner that the arrival point thereof onto the substrate W is shifted on a circular arc that passes through the rotation center C of the substrate W, and crosses the end edge of the substrate W at at least two different points in the horizontal surface including the surface of the substrate W as indicated by arrow 9087 in FIG. 79. In this manner, the deionized water supplying step s9003 is executed.

Here, at time t9002, the control means 9069 allows the oscillator 67 to transmit an electric signal to the second vibrator 9039 within the deionized water nozzle 9009 so as to oscillate the second vibrator 9039. Thus, ultrasonic waves are applied to the deionized water supplied from the deionized water nozzle 9009. Consequently, the reaction products adhering to the substrate W are subjected to ultrasonic vibration, and thus easily separated from the substrate W.

Moreover, at time t9002, the control means 9069 allows the back surface cleaning valve 9065 to open so as to supply deionized water to the back surface of the substrate W from the back surface cleaning nozzle 9011, thereby also cleaning the back surface of the substrate W.

At time t9003 after a lapse of a predetermined time, the control means 9069 stops the driving operation of the second rotary motor 9031 in a state where the deionized water nozzle 9009 has retreated from a position above the cup 3. Moreover, the control means 9069 closes the deionized water nozzle valve 9063, and also stops the driving operation of the deionized water pump 9057 so as to stop the supply of the deionized water from the deionized water nozzle 9009. Moreover, at time t9003, the control means 9069 stops the transmission of the electric signal from the oscillator 9067 to the second vibrator 9039.

(4. Deionized Water Spinning-Off Step s9004)

At time t9003, the control means 9069 stops the supply of the deionized water to the substrate W, while it successively rotates the spin motor 9013 so as to maintain the rotating state of the substrate W. Thus, a deionized water spinning-off step s9004 to spin off or disperse the deionized water from the substrate W is executed.

In this manner, the remover liquid and deionized water are supplied to the substrate W so that the reaction products are removed.

In accordance with the present preferred embodiment, at the remover liquid spinning-off step s9002, the remover liquid on the substrate W is spun off so that the remover liquid remaining on the substrate W becomes very little, or no longer exists. Therefore, in the case when, in this state, the deionized water is supplied to the substrate W at the deionized water supplying step s9003, the amount of the remover liquid that comes to contact the deionized water becomes very little or none, and therefore, even in the event of a pH shock, hardly any adverse effect is given to the substrate W, or no pH shock occurs. Therefore, no intermediate rinse process is required, and the throughput is consequently improved. Moreover, by omitting the intermediate rinse process, the costs can be reduced, and since an organic solvent, used for the intermediate rinse process, is no longer required, it is possible to improve the safety of the apparatus.

Moreover, since the remover liquid and deionized water to which ultrasonic waves have been applied are supplied, it is possible to remove the reaction products more quickly.

Here, in the substrate processing method of the present preferred embodiment, the rotation of the substrate W has not been stopped from the start of the remover liquid supplying step s9001 to the completion of the deionized water spinning-off step s9004. However, the rotation of the substrate W may be temporarily stopped at any one of the intervals between the remover liquid supplying step s9001 and the remover liquid spinning-off step s9002, between the remover liquid spinning-off step s9002 and the deionized water supplying step s9003 and between the deionized water supplying step s9003 and the deionized water spinning-off step s9004.

The essential thing is to provide at least a step for reducing the remover liquid on the substrate W by rotating the substrate W even in a short time, prior to the start of the deionized water supplying step s9003.

Moreover, with respect to the number of revolutions of the substrate W, it may be the same or respectively different in the remover liquid supplying step s9001, the remover liquid spinning-off step s9002, the deionized water supplying step s9003 and the deionized water spinning-off step s9004.

3. Second Preferred Embodiment of the Substrate Processing Method

Figure 84:
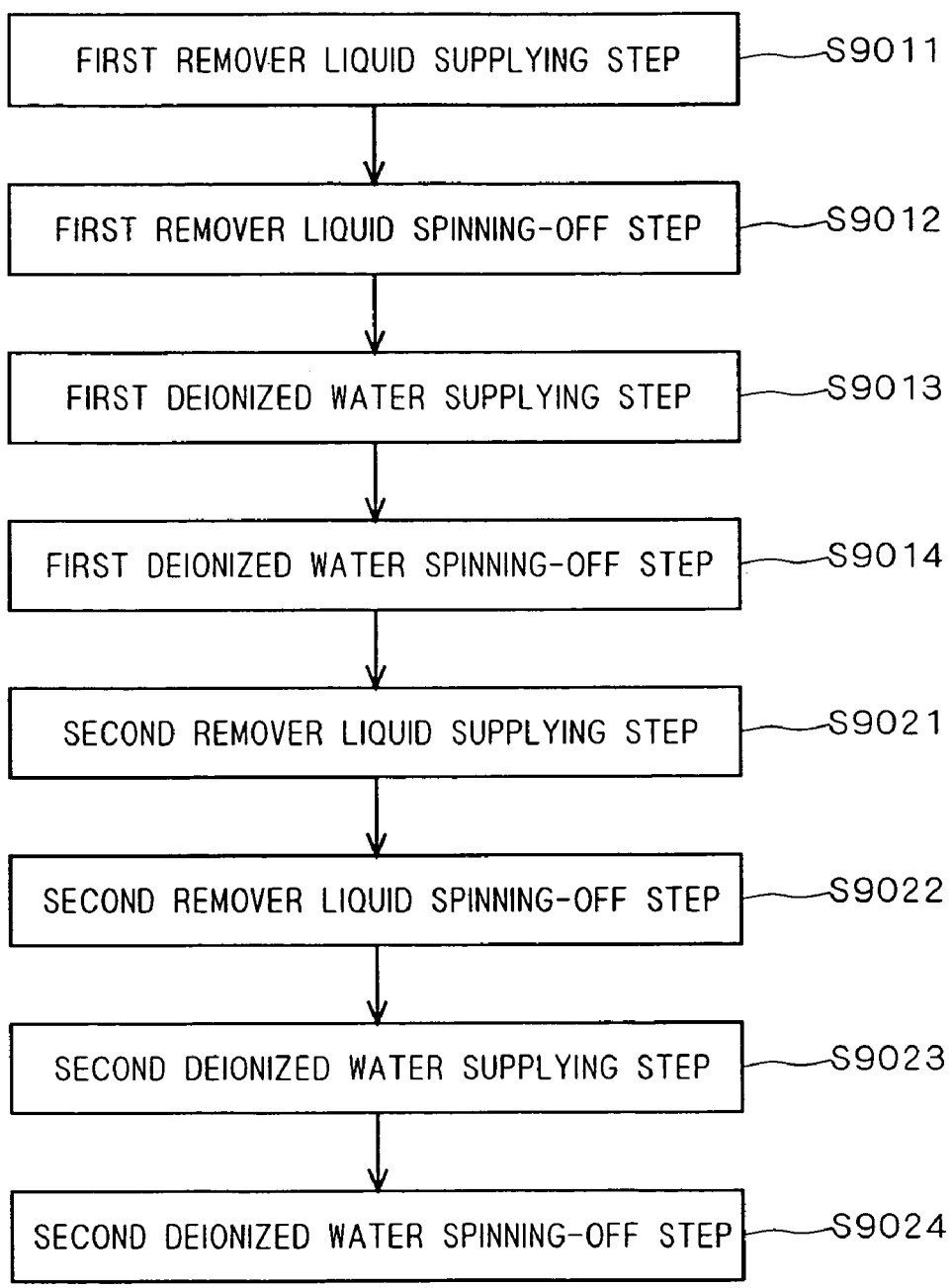
FIG. 84 is a flow chart that shows a substrate processing method in accordance with a second preferred embodiment of the ninth aspect.

Referring to FIG. 84, an explanation will be given of the substrate processing method in accordance with a second preferred embodiment.

The substrate processing method of the second preferred embodiment repeats the substrate processing method of the first preferred embodiment twice.

In other words, the substrate processing method of the present invention includes a first remover liquid supplying step s9011, a first remover liquid spinning-off step s9012, a first deionized water supplying step s9013, a first deionized water spinning-off process s9014, a second remover liquid supplying-step s9021, a second remover liquid spinning-off step s9022, a second deionized water supplying step s9023 and a second deionized water spinning-off step s9024.

The first remover liquid supplying step s9011 and the second remover liquid supplying step s9021 are the same as the remover liquid spinning-off step s9002 of the first preferred embodiment.

Moreover, the first remover liquid spinning-off step s9012 and the second remover liquid spinning-off step s9022 are the same as the remover liquid spinning-off step s9002 of the first preferred embodiment.

The first deionized water supplying step s9013 and the second deionized water supplying step s9023 are the same as the deionized water supplying step s9003 of the first preferred embodiment.

Moreover, the first deionized water spinning-off step s9014 and the second deionized water spinning-off step s9024 are the same as the deionized water spinning-off step s9004 of the first preferred embodiment.

In the substrate processing method of the second preferred embodiment, the first deionized water spinning-off step s9014 is placed between the first deionized water supplying step s9013 and the second remover liquid supplying step s9021. For this reason, the deionized water, which has been supplied on the substrate W at the first deionized water supplying step s9013, is spun off by the first deionized water spinning-off process s9014 so that the remaining deionized water on the substrate W becomes very little or none. Therefore, in the case when, in this state, the remover liquid is supplied to the substrate W, the amount of the deionized water that comes to contact the remover liquid becomes very little or none. Consequently, even in the event of a pH shock, hardly any adverse effect is given to the substrate W, or no pH shock occurs.

Here, in the present preferred embodiment, the substrate processing method of the first preferred embodiment is repeated twice. However, this method may be repeated not less than twice.

4. Second Preferred Embodiment of the Substrate Processing Apparatus

Figure 85:
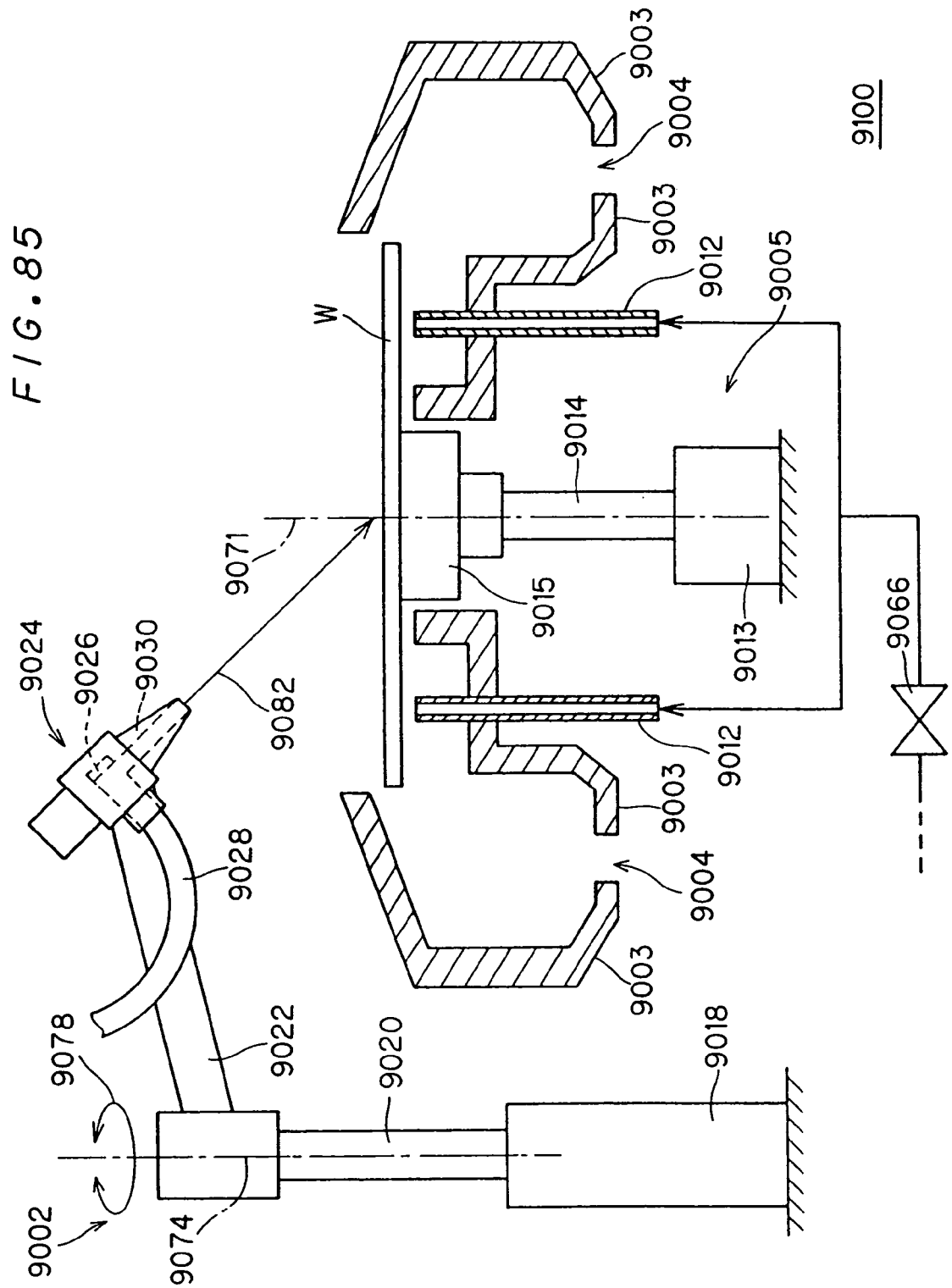
FIG. 85 is a side view of a substrate processing apparatus in accordance with the second preferred embodiment of the ninth aspect.
Figure 86:
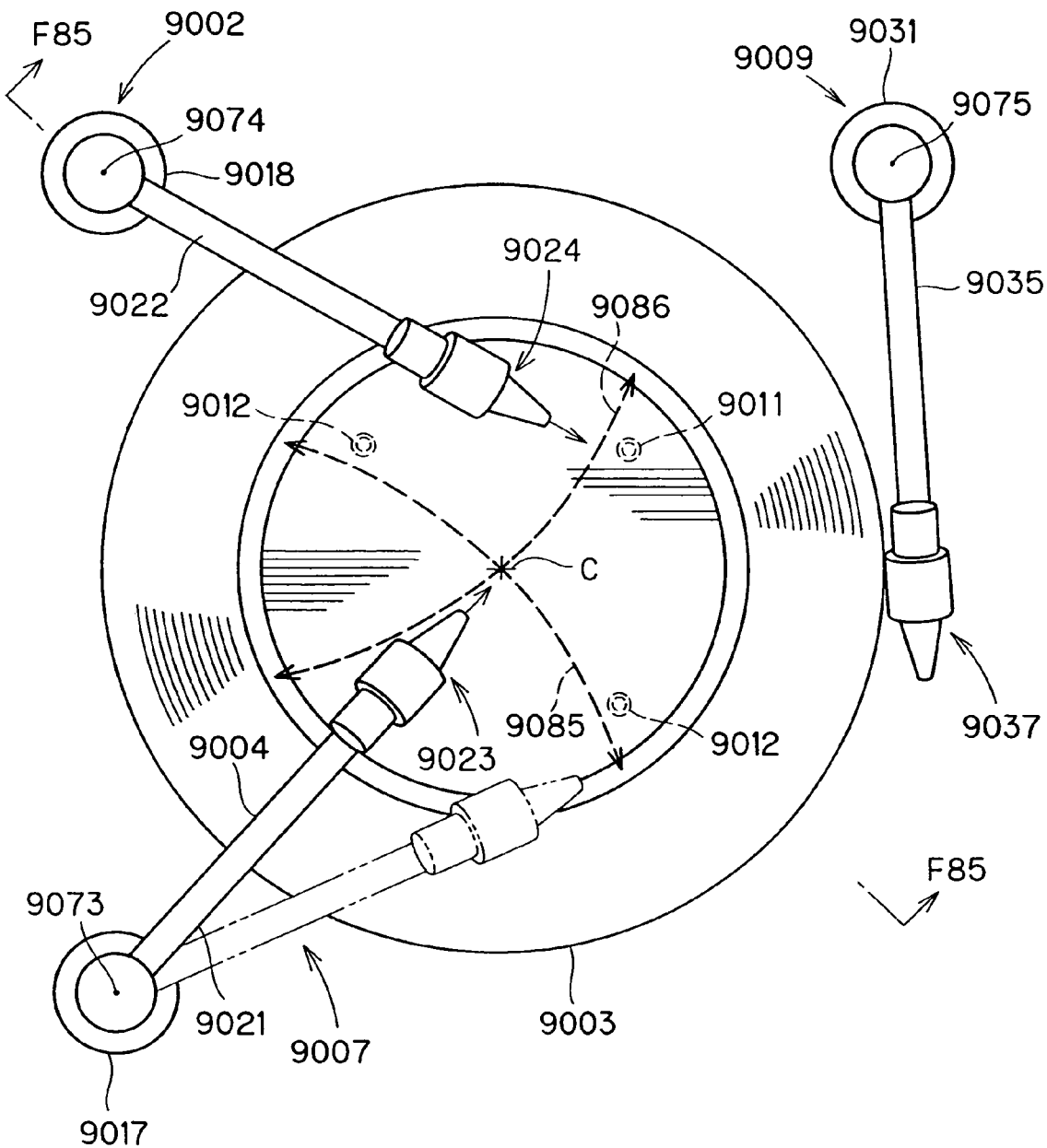
FIG. 86 is a top view of the substrate processing apparatus in accordance with the second preferred embodiment of the ninth aspect.

Referring to FIGS. 85 and 86, an explanation will be given of a second preferred embodiment of the substrate processing apparatus of the 9$^{th}$ embodiment. Here, FIG. 85 is a cross-sectional view taken along line F85-F85 of FIG. 86, and, for convenience of explanation, hatching is omitted from some portions.

A substrate processing apparatus 9100 of the second preferred embodiment is provided with a solvent nozzle 9002 serving as an intermediate rinse supplying section, in addition to the substrate processing apparatus 1 of the first preferred embodiment.

The substrate processing apparatus 9100 of the second preferred embodiment has many parts that are in common with the substrate processing apparatus 9001 of the first preferred embodiment, and therefore, those parts in common with the substrate processing apparatus 9001 are indicated by the same reference numerals, and description thereof is omitted.

As illustrated in FIG. 85, the substrate processing apparatus 9100 has the solvent nozzle 9002.

The solvent nozzle 9002 is provided with a third rotary motor 9018 which is secured to the apparatus frame, not shown, and has a driving shaft placed in the vertical direction, a third rotary shaft 9020 secured to the rotary shaft of the third rotary motor 9018 and a third arm 9022 connected to the top of the third rotary shaft 9020.

A solvent nozzle main body 9024 is installed on the tip of the third arm 9022.

The solvent nozzle main body 9024 is provided with a third passage hole 9030 that directs the axis line direction of an organic solvent to be discharged toward the top major surface of the substrate W, and a third tube 9028 is connected to the third passage hole 9030. Moreover, a third vibrator 9026 is installed inside the third passage hole 9030 at a position contacting the organic solvent that passes through the third passage hole 9030.

The third passage hole 9030 is designed so that, when the third arm 9022 pivots, centered on the shaft 9074, the arrival point of an organic solvent 9081 discharged through the third passage hole 9030 on the substrate W is allowed to shift over the substrate W along a circular arc as indicated by arrow 9086, passing through the rotation center C of the substrate W, as shown in FIG. 86.

The solvent nozzle 9002 discharges the organic solvent in a direction crossing the plane containing the surface of the substrate W. In other words, the angle made by the direction of the organic solvent discharged from the solvent nozzle 9002 with respect to the substrate surface is set in the range from greater than 0 degree to not more than 90 degrees. In other words, the solvent nozzle 9002 discharges the organic solvent in a direction perpendicular to the substrate W or diagonally from above. Preferably, the angle made by the direction of the organic solvent to be discharged with respect to the surface of the substrate is set to not less than 30 degrees to not more than 60 degrees, more preferably, at 45 degrees.

The third tube 9028 supplies an organic solvent to the third passage hole 9030.

The third vibrator 9026 is allowed to vibrate by an electric signal from an oscillator 9067 so as to apply ultrasonic waves to the organic solvent passing through the third passage hole 9030.

In the solvent nozzle 9002 arranged as described above, the third rotary motor 9018 rotates the third rotary shaft 9020 so that the third arm 9022 is allowed to pivot centered on the shaft 9074 as indicated by arrow 9078. Thus, as illustrated in FIG. 86, the arrival point of the organic solvent 9081 discharged from the solvent nozzle 9002 with respect to the substrate W is allowed to shift over the substrate W along a circular arc as indicated by arrow 9086, passing through the rotation center C of the substrate W. Thus, the organic solvent to which ultrasonic waves have been applied is supplied to the substrate W.

A back surface solvent nozzle 9012 is a tube-shaped member that penetrates the cup 9003 and extends virtually in the vertical direction toward the back surface of the substrate W, and used for supplying the organic solvent via a back surface solvent valve 9066, which will be described later. Thus, it is possible to discharge the organic solvent onto the back surface of the substrate W.

Figure 87:
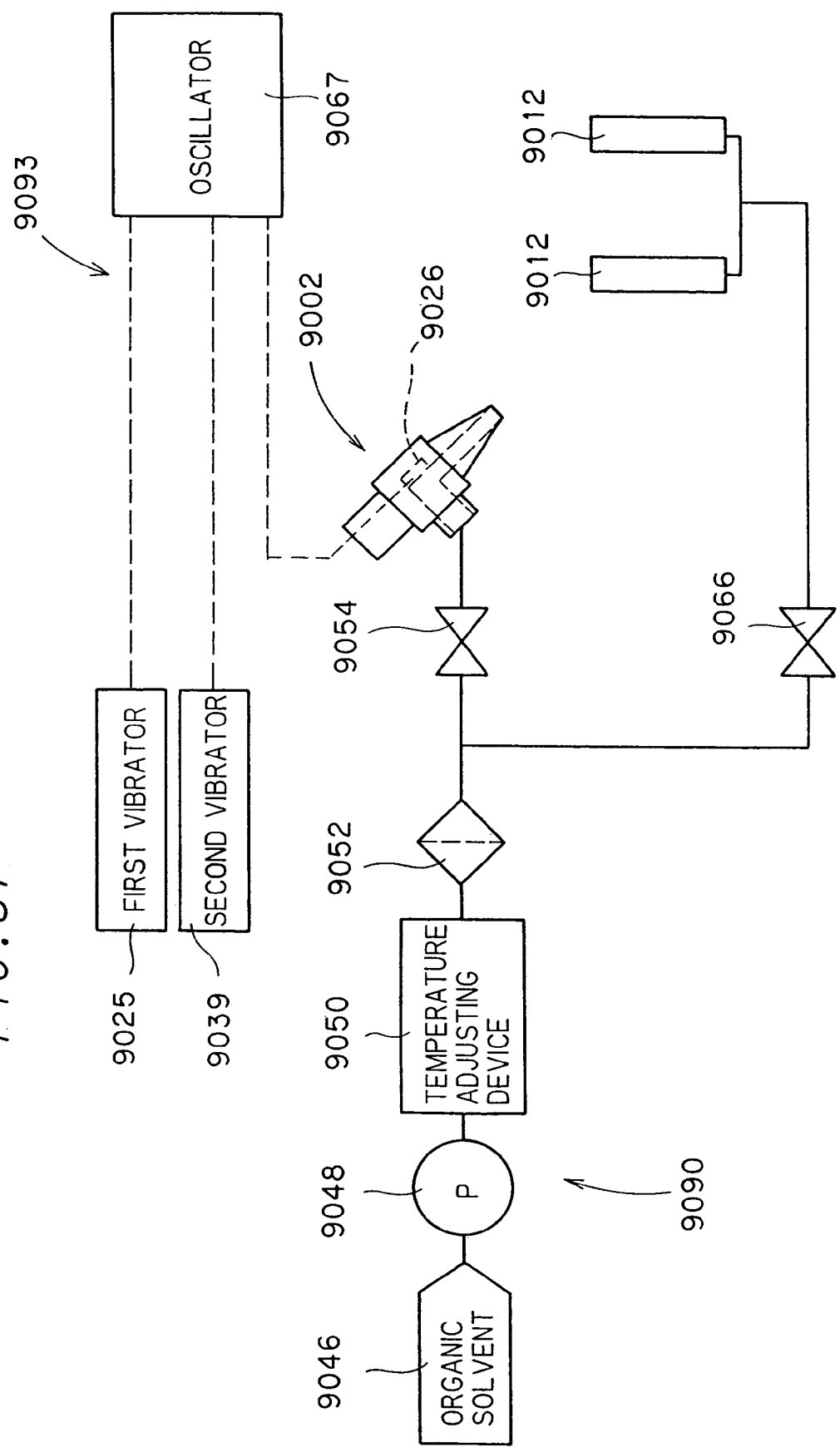
FIG. 87 is a drawing that shows piping of the substrate processing apparatus in accordance with the second preferred embodiment of the ninth aspect.

FIG. 87 shows an organic solvent supplying system 9090 for supplying the organic solvent to the organic solvent nozzle 9002.

The organic solvent supplying system 9090 is provided with a solvent pump 9048 for pumping the organic solvent from a solvent source 9046 outside the apparatus, a temperature-adjusting device 9052 for adjusting the temperature of the organic solvent by heating or cooling the organic solvent pumped out by the solvent pump 9048 to a predetermined temperature, a filter 9050 for filtering contaminants from the organic solvent that has been temperature-adjusted by the temperature-adjusting device 9052, a solvent nozzle valve 9054 for opening and closing the flowing path of the filtered organic solvent to the solvent nozzle 9002, and a back surface solvent valve 9066 for opening and closing the flowing path of the organic solvent filtered by the filter 9050 to the back surface solvent nozzle 9012.

This arrangement allows the solvent supplying system 9090 to supply the organic solvent that has been temperature-adjusted to a predetermined temperature by the temperature-adjusting device 9052 and purified by the filter 9050 to the solvent nozzle 9002.

Moreover, the ultrasonic wave applying section 9093 is provided with a third vibrator 9026 placed inside the solvent nozzle 9002, and the third vibrator 9026 is allowed to vibrate by an electric signal transmitted from the oscillator 9067.

With this arrangement, the ultrasonic wave applying section 9093 applies ultrasonic waves to the organic solvent to be supplied from the solvent nozzle 9002.

In this manner, the organic solvent with the ultrasonic waves applied thereto is supplied to the substrate W, and therefore, it is possible to carry out the removing process of the reaction products more quickly, and consequently to improve the throughput. Here, the throughput can be improved by only applying ultrasonic waves to any one of the remover liquid, the organic solvent and deionized water, however, by applying ultrasonic waves to any two or all of the remover liquid, the organic solvent and deionized water, it becomes possible to remove the reaction products more quickly and to improve the throughput more effectively.

Figure 88:
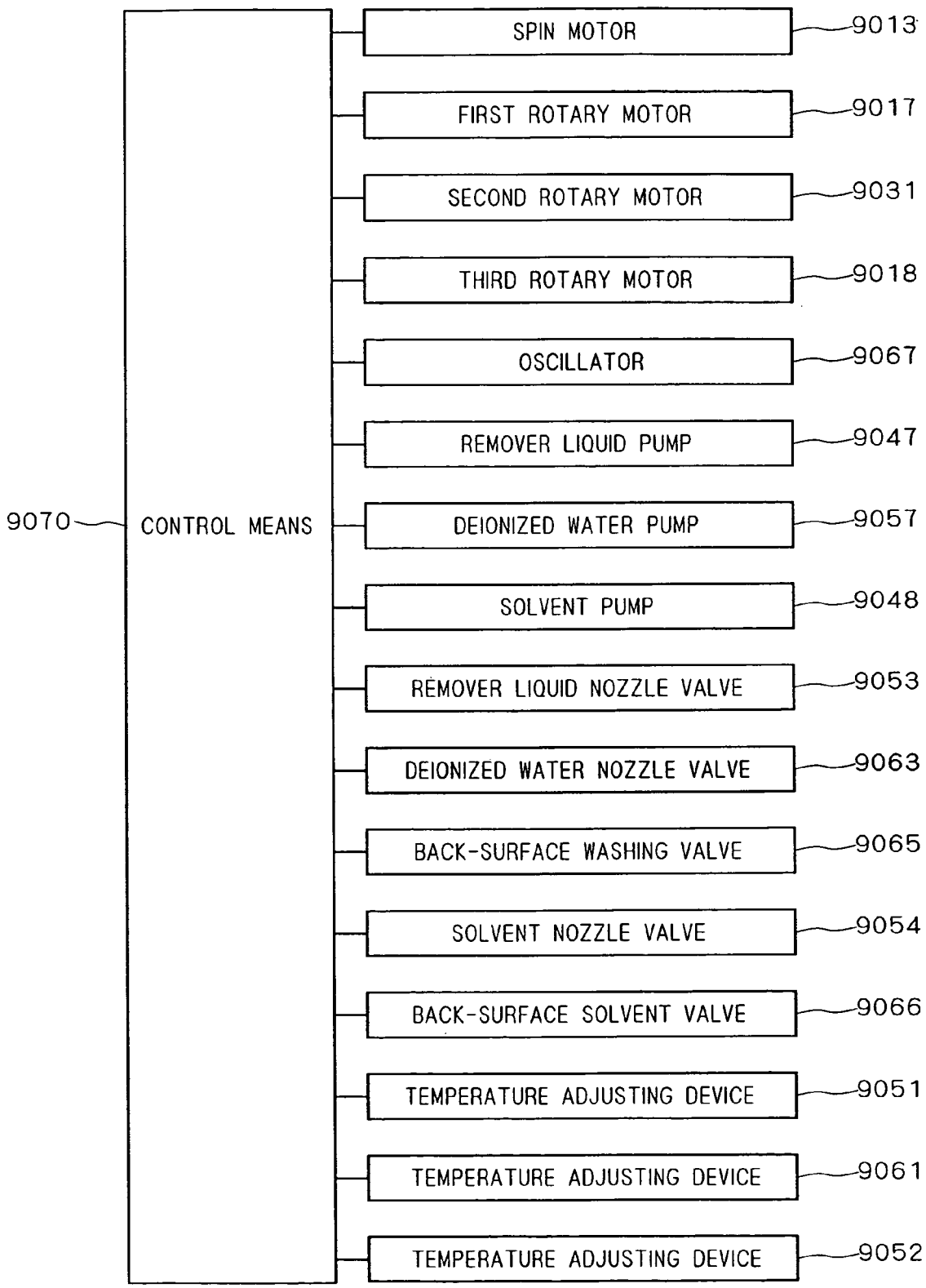
FIG. 88 is a drawing that shows a hardware construction of the substrate processing apparatus in accordance with the second preferred embodiment of the ninth aspect.

Next, referring to FIG. 88, an explanation will be given of the hardware construction of the substrate processing apparatus 9100.

In the same manner as the control means 9069 in the first preferred embodiment, to the control means 9070 are connected the spin motor 9013, the first rotary motor 9017, the second rotary motor 9031, the oscillator 9067, the remover liquid pump 9047, the deionized water pump 9057, the remover liquid nozzle valve 9007, the deionized water nozzle valve 9063, the back surface cleaning valve 9065, the temperature-adjusting device 9051 and the temperature-adjusting device 9061.

Moreover, to the control means 9070 are further connected the third rotary motor 9018, the solvent pump 9048, the solvent nozzle 9054, the back surface solvent valve 9066 and the temperature-adjusting device 9052.

Thus, as will be described in third and fourth preferred embodiments of a substrate processing method, the control means 9070 controls these devices connected thereto.

5. Third Preferred Embodiment of the Substrate Processing Method

Referring to FIG. 89, an explanation will be given of the substrate processing method in accordance with a third preferred embodiment in which the above-mentioned substrate processing apparatus 9100 is used.

The substrate processing method of the present preferred embodiment is provided with: a remover liquid supplying step s9031, a remover liquid spinning-off step s9032, a solvent supplying step s9033 serving as an intermediate rinse step, a deionized water supplying step s9034 and a deionized water spinning-off process s9035.

The substrate processing method of the present preferred embodiment is virtually designed by interpolating the solvent supplying step between the remover liquid spinning-off step s9002 and the deionized water supplying step s9003 in the substrate processing method of the first preferred embodiment including the remover liquid supplying step s9001, the remover liquid spinning-off step s9002, the deionized water supplying step s9003 and the deionized water spinning-off process s9004.

Therefore, the above-mentioned remover liquid supplying step s9031, the remover liquid spinning-off step s9032, the deionized water supplying step s9034 and the deionized water spinning-off step s9035 are respectively the same as the remover liquid supplying step s9001, the remover liquid spinning-off step s9002, the deionized water supplying step s9003 and the deionized water spinning-off step s9004 in the substrate processing method of the first preferred embodiment, and therefore, the description thereof is omitted.

Figure 90:
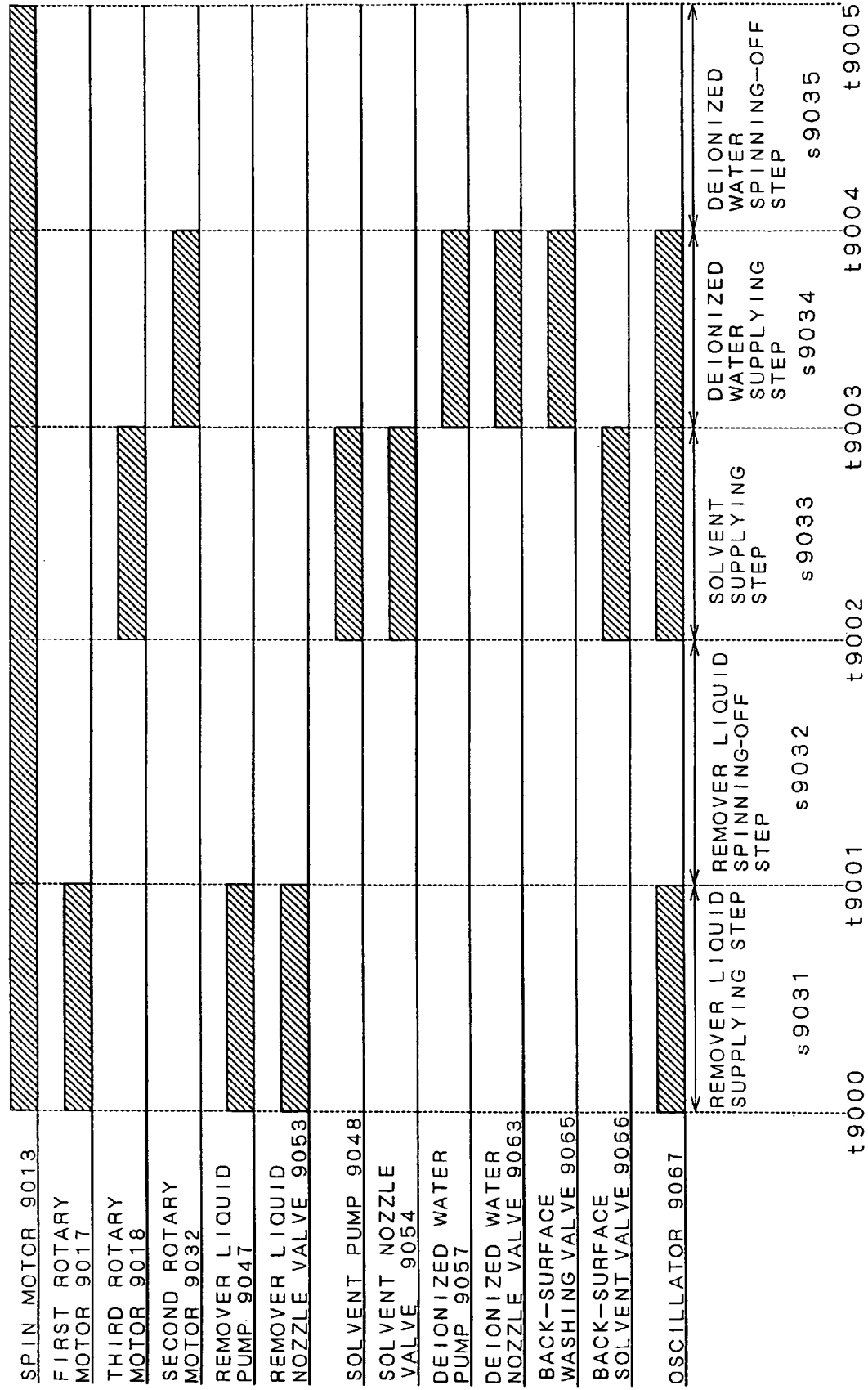
FIG. 90 is a detailed flow chart that shows the substrate processing method in accordance with the third preferred embodiment of the ninth aspect.
Figure 91A:
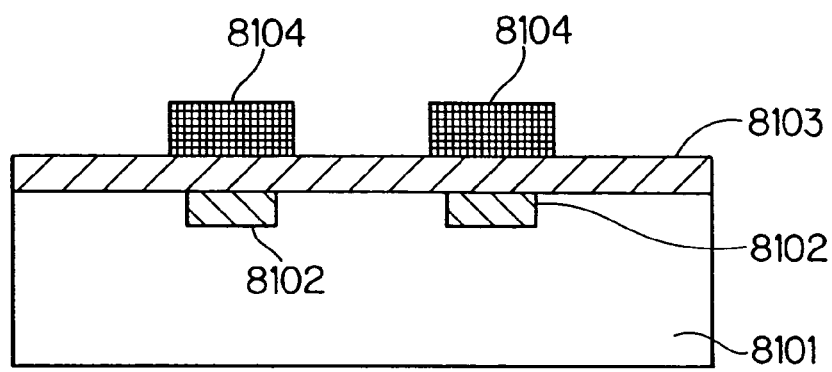
FIGS. 91A to 91C are drawings that explain a conventional technique.
Figure 91B:
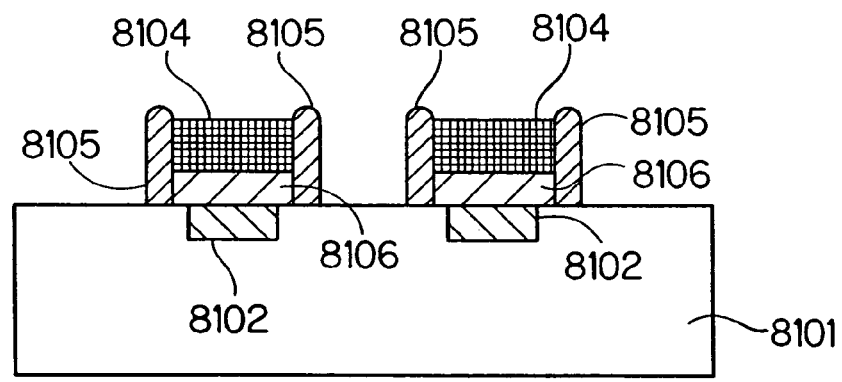
Figure 91C:
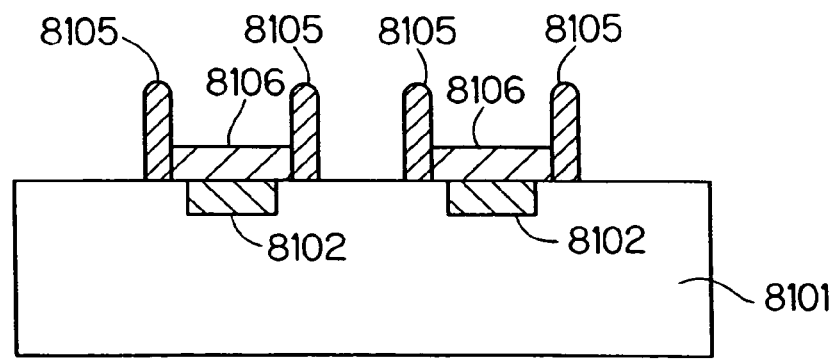
Figure 92:
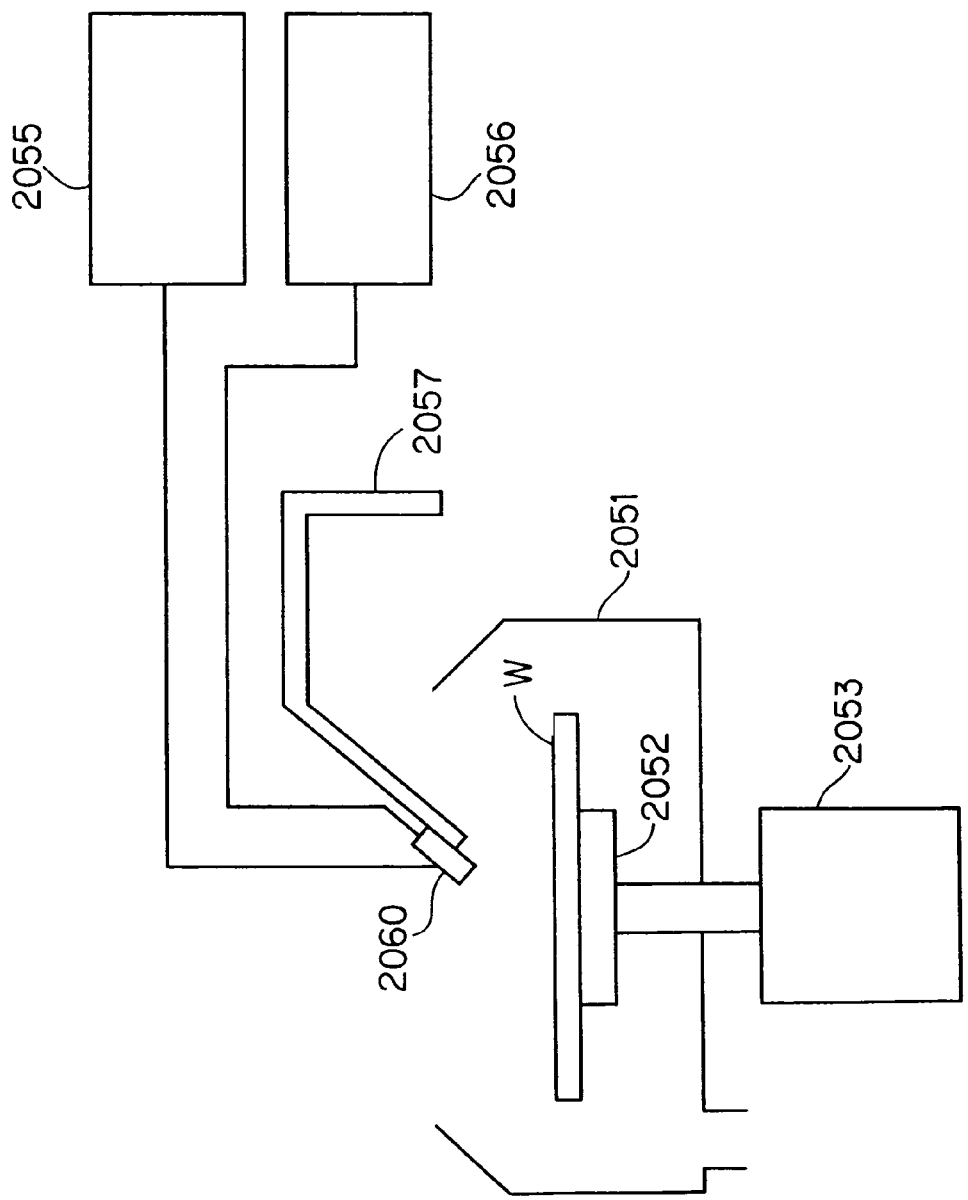
FIG. 92 is an explanatory drawing that shows a conventional cleaning device.
Figure 93:
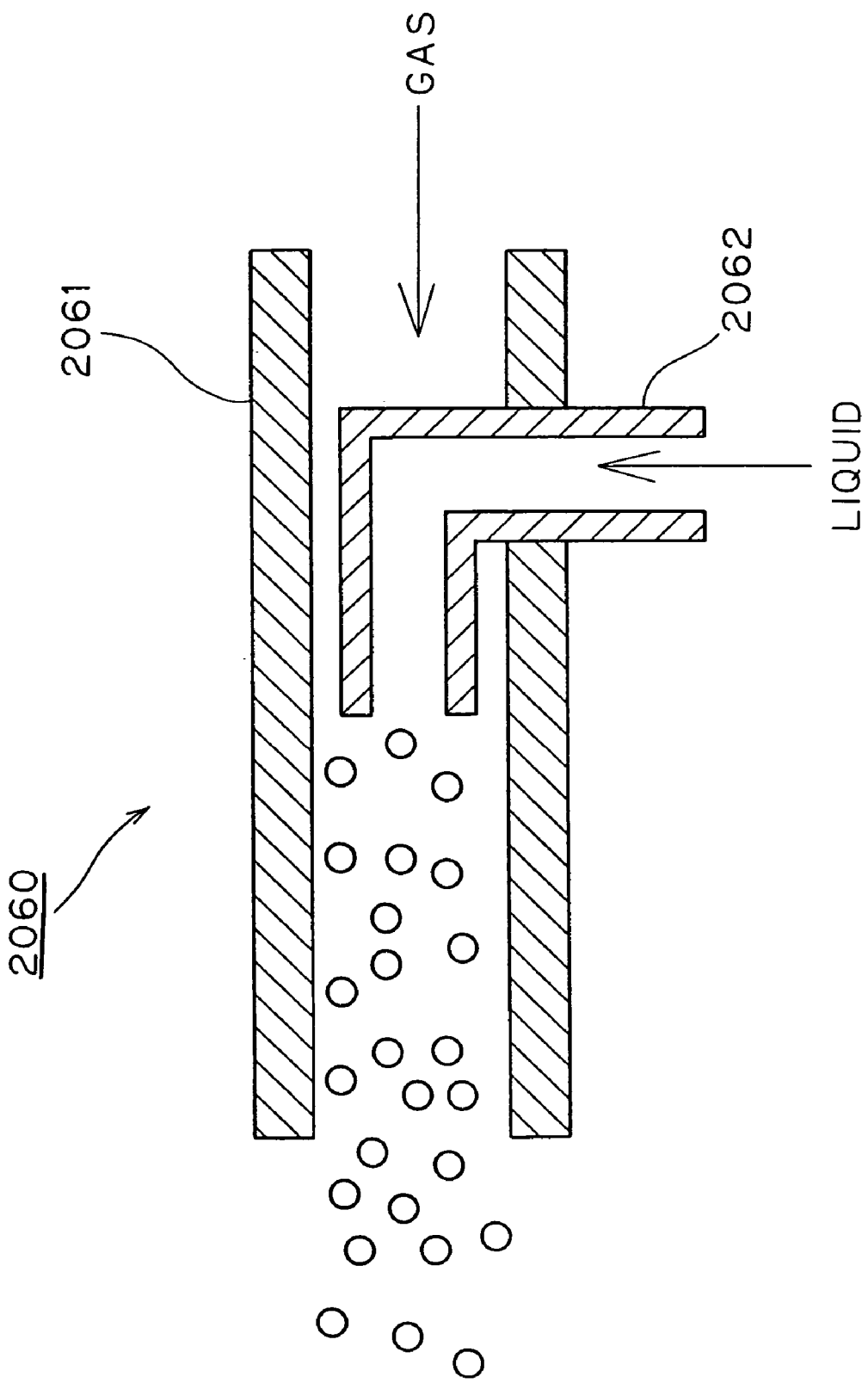
FIG. 93 is an explanatory drawing that shows a conventional cleaning nozzle.

Next, an explanation will be given of the solvent supplying step s9033 of the present preferred embodiment. As illustrated in FIG. 90, the solvent supplying step s9033 is carried out after the remover liquid supplying step s9031 and the remover liquid spinning-off step s9032 have been finished. In the remover liquid spinning-off process s9032, the substrate is kept rotating with the supply of the remover liquid to the substrate W being stopped so that the remover liquid on the substrate W is spun off from the substrate W by a centrifugal force. Thus, the remover liquid remaining on the substrate W is reduced to a minimum.

Next, at time t9002, the control means 9070 rotates the third rotary motor 9018, thereby allowing the solvent nozzle 9002 to pivot.

At time t9002 also, the control means 9070 drives the solvent pump 9048 so as to send the organic solvent to the solvent nozzle 9002, also drives the temperature-adjusting device 9052 to set the organic solvent to a predetermined temperature, and then opens the solvent nozzle valve 9054 so as to supply the organic solvent from the solvent nozzle 9002. With these steps, the organic solvent, supplied from the solvent nozzle 9002, is supplied onto the substrate W in such a manner that the arrival point thereof onto the substrate W is shifted on a circular arc that passes through the rotation center C of the substrate W, and crosses the end edge of the substrate W at least two different points in the horizontal surface including the surface of the substrate W as indicated by arrow 9086 in FIG. 86. In this manner, the solvent supplying step s9033 is executed.

Here, at time t9002, the control means 9070 allows the oscillator 9067 to transmit an electric signal to the third vibrator 9026 within the solvent nozzle 9002 so as to vibrate the third vibrator 9026. Thus, ultrasonic waves are applied to the organic solvent supplied from the solvent nozzle 9002.

Consequently, the reaction products adhering to the substrate W are subjected to ultrasonic vibration, and thus easily separated from the substrate W.

Moreover, at time t9002, the control means 9070 allows the back surface solvent valve 9066 to open so as to supply the organic solvent to the back surface of the substrate W from the back surface solvent nozzle 9012, thereby also cleaning the remover liquid away from the back surface of the substrate W.

As described above, in the solvent supplying step s9033, the remover liquid is completely washed away from the substrate W by supplying the organic solvent to the substrate W. For this reason, even when deionized water is supplied to the substrate W in the succeeding deionized water supplying step s9034, the remover liquid contacting deionized water no longer exists, thereby making it possible to prevent the occurrence of a pH shock. Consequently, it becomes possible to prevent damages to thin films on the substrate W.

Moreover, in the present preferred embodiment, since the remover liquid has been spun off from the substrate W in the remover liquid spinning-off step s9032, the remover liquid remaining on the substrate W at this point of time is very little. For this reason, it is possible to shorten the time required for the organic solvent to remove the remover liquid in the solvent supplying process s9033. Thus, it becomes possible to improve the throughput. In the same manner, since the remover liquid remaining on the substrate W is very little, it is possible to reduce the amount of the organic solvent to be required for the solvent supplying step s9033, and consequently to reduce the costs.

Here, in the present preferred embodiment, the deionized water supplying step s9034 is executed immediately after the solvent supplying step s9033. However, a solvent spinning-off process for spinning the solvent on the substrate W off may be placed between the solvent supplying step s9033 and the deionized water supplying step s9034.

Moreover, in the present preferred embodiment, the rotation of the substrate W has not been stopped from the start of the remover liquid supplying step s9031 to the completion of the deionized water spinning-off step s9035. However, the rotation of the substrate W may be temporarily stopped at any one of the intervals between the remover liquid supplying process s9031 and the remover liquid spinning-off step s9032, between the remover liquid spinning-off step s9032 and the solvent supplying step s9033, between the solvent supplying step s9033 and the deionized water supplying step s9034, and between the deionized water supplying step s9034 and the deionized water spinning-off step s9035.

The essential thing is to provide at least a step for reducing the remover liquid on the substrate W by rotating the substrate W even in a short time, prior to the start of the solvent supplying step s9033. Consequently, it is possible to shorten the time required for the solvent supplying step s9035, to improve the throughput, and also to reduce the costs.

Moreover, in the present preferred embodiment, the remover liquid, the organic solvent and deionized water to which ultrasonic waves are applied are supplied so that it is possible to remove the reaction products more quickly.

Furthermore, in the present preferred embodiment, a sequence of steps including the remover liquid supplying step s9031, the remover liquid spinning-off step s9032, the solvent supplying step s9033, the deionized water supplying step s9034 and the deionized water spinning-off step s9035 are carried out once. However, this sequence of steps may be repeated several times.

In each of the above-mentioned preferred embodiments, the holding rotary means rotates the substrate while maintaining it horizontally. However, the holding rotary means may rotate the substrate with its major surface being tilted with respect the horizontal surface, or may rotate the substrate with its major surface being maintained in the vertical direction.

In each of the above-mentioned preferred embodiments, the holding rotary means holds only one substrate. However, the holding rotary means may be designed to hold a plurality of substrates.

Furthermore, in each of the above-mentioned preferred embodiments, the substrate treatment deals with a substrate having a surface on which polymers are formed through dry-etching. However, the present substrate treatment is more effectively applied to a substrate that has been further subjected to ashing after the dry-etching.

The ashing is carried out with a substrate having a resist film being placed in an oxygen plasma, and after the ashing, more polymers are generated. For this reason, in the case when a process for removing polymers from the substrate that has been subjected to the dry-etching and ashing, the present invention makes it possible to further improve the throughput, and to reduce the costs more effectively.

Moreover, in the case when the substrate is rotated while being horizontally maintained, since the liquid is allowed to enter the irregularities of the substrate uniformly, it is possible to carry out the process desirably.

Furthermore, the liquids such as the remover liquid and deionized water are supplied at least in the rotation center C of the substrate, with the substrate W being rotated, the liquids given to the substrate are evenly supplied to the circumferential portion. In particular, in the case when the substrate is rotated while being horizontally maintained, since the liquids are evenly supplied to the entire surface of the substrate W, it is possible to carry out a uniform processing operation.

Since the vacuum chuck 9015 is allowed to hold the substrate W while contacting only the back surface of the substrate W, the liquids are evenly supplied to the entire surface of the substrate W, in particular, even onto the circumferential portion of the surface of the substrate W. Thus, it is possible to prevent degradation in the process quality.

In the same manner, since the vacuum chuck 9015 is allowed to hold the substrate W while contacting only the back surface of the substrate W, there are no parts contacting the circumferential portion of the substrate. Therefore, when the liquid is spun off from the substrate W, the liquid is smoothly discharged from the substrate W.

The above-mentioned preferred embodiments have disclosed an arrangement in which polymers, generated at the time of dry-etching, are removed from the substrate that has been subjected to the dry-etching process. However, the present invention is not intended to be limited by this arrangement in which, from the substrate having polymers generated at the time of dry-etching, the polymers are removed.

For example, as described earlier, the present invention also includes a case in which polymers, generated at the time of plasma ashing are removed from the substrate. Thus, the present invention includes cases in which, in various processes not limited to the dry-etching, polymers generated due to resist are removed from the substrate.

Moreover, not limited to the cases in which polymers, generated by the processes such as the dry-etching and plasma ashing, are removed, the present invention includes a case in which various reaction products derived from resist are removed from the substrate.

Furthermore, not limited to the case in which the reaction products derived from resist are removed from the substrate, the present invention includes a case in which resist itself is removed from the substrate.

For example, the present invention includes the following case: with respect to a substrate to which resist is applied, the resist is exposed in a pattern such as a wiring pattern, the resulting resist is developed, and a lower-layer processing is executed on the lower layer of the resist (for example, etching to a thin film serving as the lower layer), the resist film, which has become unnecessary after the completion of the lower-layer processing, is removed.

In this case, simultaneously as the unnecessary resist film is removed, if there are any reaction products derived from a denatured resist film, these are also removed; therefore, it is possible to improve the throughput, and also to cut costs. For example, in the above-mentioned lower-layer processing, when the thin film serving as the lower layer is subjected to dry-etching, reaction products are also generated. Therefore, the resist film itself, used for masking the lower layer at the time of the dry-etching, and the reaction products derived from the denatured resist film are simultaneously removed.

Moreover, not limited to the cases in which the reaction products derived from resist and the resist itself are removed from the substrate, the present invention is also applied to a case in which, organic substances that are not derived from resist, for example, fine contaminants derived from the human body, are removed from the substrate.

The deionized water supplying means is installed in the substrate processing apparatus in the above-mentioned preferred embodiments. However, this may be replaced by a rinse liquid supplying means. In this case, a rinse liquid source is installed in place of the deionized water source, and a rinse liquid from the rinse liquid source is supplied. In this case, the rinse liquid is a liquid that turns into water, if left at room temperature (approximately, 20 degrees to 28 degrees in Celsius) under a normal pressure (approximately, 1 atmospheric pressure). Examples thereof include ozone water prepared by dissolving ozone in deionized water, hydrogen water prepared by dissolving hydrogen in deionized water and water liquid of carbonic acid prepared by dissolving carbon dioxide in deionized water. In particular, in the case when ozone water is used as the rinse liquid in place of deionized water, it is possible to more completely remove organic substances, reaction products derived from the denatured resist and polymers. Therefore, this case makes it possible to achieve the objective of improving the process quality in the processing for removing organic substances, reaction products derived from the denatured resist and polymers from the substrate.

In the substrate processing method in the above-mentioned preferred embodiments, deionized water is supplied to the substrate in the deionized water supplying step, and the deionized water is spun off from the substrate in the deionized water spinning-off step. However, the deionized water supplying step may be replaced by the rinse liquid supplying step, and the deionized water spinning-off step may be replaced by the rinse liquid spinning-off step.

In this case, the rinse liquid is supplied to the substrate in the rinse liquid supplying step, and the rinse liquid is spun off from the substrate in the rinse liquid spinning-off process.

Therefore, in the above-mentioned preferred embodiments, the rinse liquid supplying step and the rinse liquid spinning-off step may be carried out succeeding to the remover liquid spinning-off step or the intermediate rinse step.

Here, in the case when the rinse liquid used in the rinse liquid supplying step is ozone water, it is possible to more completely remove organic substances, reaction products derived from the denatured resist and polymers. Therefore, this case makes it possible to achieve the objective of improving the process quality in the processing for removing organic substances, reaction products derived from the denatured resist and polymers from the substrate.

While the invention has been shown and described in detail, the foregoing description is in all aspects illustrative and not restrictive. It is therefore understood that numerous other modifications and variations can be devised without departing from the scope of the invention.

The invention claimed is:

1. An apparatus for removing reaction products generated on a substrate, the substrate having been subjected to a dry-etching process, the dry-etching process using a resist film as a mask to dry-etch a thin film formed on a surface of the substrate, said apparatus comprising:
   a) a spin mechanism for holding and rotating said substrate;
   b) a deionized water supply unit for supplying deionized water onto said substrate being rotated and having:
      b-1) a deionized water discharging unit for discharging deionized water onto said substrate being rotated; and
      b-2) a first driving unit for moving said deionized water discharging unit to scan said substrate with said deionized water;
   c) a remover liquid supply unit for supplying remover liquid whose temperature is adjusted to become higher than the room temperature onto said substrate being rotated to remove said residuary pollution and having:
      c-1) a remover liquid discharging unit for discharging said remover liquid onto said substrate being rotated;
      c-2) a second driving unit for moving said remover liquid discharging unit to scan said substrate with said remover liquid; and
      c-3) a first temperature controller for controlling a temperature of said remover liquid; and
   d) a controller configured to:
      i) move a reach point of said remover liquid whose temperature is higher than the room temperature on a substrate along a path connecting a rotation center of said substrate and a rotation circle defined by an edge of the substrate being rotated by moving said remover liquid discharging unit by said second driving unit and by rotating said substrate by said spin mechanism,
      ii) spin off remover liquid on said substrate by rotating said substrate by said spin mechanism after supplying remover liquid, and
      iii) move a reach point of said deionized water on a substrate along a path connecting a rotation center of said substrate and a rotation circle defined by an edge of the substrate being rotated by moving said deionized water discharging unit by said first driving unit and by rotating said substrate by said spin mechanism after spinning off the remover liquid.

2. The apparatus in accordance with claim 1, wherein said path is an arc connecting said rotation center of said substrate and said rotation circle.

3. The apparatus in accordance with claim 1, wherein said remover liquid supply unit further comprises:
a transmission mechanism for transmitting said remover liquid whose temperature is controlled to said substrate.

4. The apparatus in accordance with claim 1, further comprising:
ultrasonic wave is applied to said remover liquid.

5. The apparatus in accordance with claim 4, wherein said ultrasonic wave is applied to said remover liquid before said remover liquid is applied onto said substrate.

6. The apparatus in accordance with claim 5, wherein said remover liquid discharging unit comprises an ultrasonic oscillator contacting said remover liquid to apply said ultrasonic wave to said remover liquid.

7. The apparatus in accordance with claim 4, wherein said ultrasonic wave is applied directly to said remover liquid supplied onto and remaining on said substrate.

8. The apparatus in accordance with claim 1, wherein said path is a line connecting said rotation center and two points on said rotation circle.

9. The apparatus in accordance with claim 1, wherein said deionized water supply unit further comprises:

a second temperature adjusting part corresponding to a first temperature adjusting part for controlling a temperature of said deionized water, wherein said controller is configured to move a reach point of said deionized water whose temperature is higher than the room temperature on a substrate along a path connecting a rotation center of said substrate and a rotation circle defined by an edge of the substrate being rotated by moving said deionized water discharging unit by said first driving unit and by rotating said substrate by said spin mechanism after spinning off the remover liquid.

10. The apparatus in accordance with claim 1, wherein said substrate has a metal thin film.

11. A method for removing residuary pollution caused in a dry-etching process from a substrate, said method comprising the steps of:
   (a) discharging said remover liquid from said remover liquid discharging unit while moving a remover liquid discharging unit by a first driving unit and rotating said substrate held by a spin mechanism to move a reach point of said remover liquid whose temperature is higher than the room temperature on a substrate along a path connecting a rotation center of said substrate and a rotation circle defined by an edge of said substrate being rotated;
   (b) spinning off remover liquid on said substrate by rotating said substrate by said spin mechanism after supplying remover liquid by said step (a); and
   (c) discharging a deionized water from said deionized water discharging unit while moving a deionized water discharging unit by a second driving unit and rotating said substrate held by said spin mechanism to move a reach point of said deionized water on a substrate along a path connecting a rotation center of said substrate and a rotation circle defined by an edge of said substrate being rotated after spinning off remover liquid by said step (b).

12. The method in accordance with claim 11, wherein said path is an arc connecting said rotation center of said substrate and said rotation circle.

13. The method in accordance with claim 11, wherein temperature of said remover liquid discharged by said step (a) is controlled.

14. The method in accordance with claim 11, wherein ultrasonic wave is applied to said remover liquid discharged by said step (a).

15. The method in accordance with claim 14, wherein said ultrasonic wave is applied to said remover liquid before said remover liquid is applied onto said substrate.

16. The method in accordance with claim 15, wherein said remover liquid discharging unit comprises an ultrasonic oscillator contacting said remover liquid to apply said ultrasonic wave to said remover liquid.

17. The method in accordance with claim 14, wherein said ultrasonic wave is applied directly to said remover liquid supplied onto and remaining on said substrate.

18. The method in accordance with claim 11, wherein said path is a line connecting said rotation center and two points on said rotation circle.

19. The method in accordance with claim 11, wherein temperature of said deionized water discharged by said step (c) is higher than the room temperature.

* * * * *